US008629238B2

(12) United States Patent
Dueggeli et al.

(10) Patent No.: US 8,629,238 B2
(45) Date of Patent: Jan. 14, 2014

(54) DIKETOPYRROLOPYRROLE POLYMERS FOR USE IN ORGANIC SEMICONDUCTOR DEVICES

(75) Inventors: Mathias Dueggeli, Thuernen (CH); Olivier Frederic Aebischer, Duedingen (CH); Pascal Hayoz, Hofstetten (CH); Marta Fonrodona Turon, Blanes (ES); Mathieu G. R. Turbiez, Rixheim (FR); Jean-Charles Flores, Mulhouse (FR); Hans Juerg Kirner, Basel (CH); Peter Murer, Oberwil (CH); Natalia Chebotareva, Hagenthal le Bas (FR); Thomas Schaefer, Liestal (CH)

(73) Assignee: BASF SE, Ludwigshafen (DE)

( * ) Notice: Subject to any disclaimer, the term of this patent is extended or adjusted under 35 U.S.C. 154(b) by 93 days.

(21) Appl. No.: 13/322,668

(22) PCT Filed: May 18, 2010

(86) PCT No.: PCT/EP2010/056778
§ 371 (c)(1),
(2), (4) Date: Nov. 28, 2011

(87) PCT Pub. No.: WO2010/136353

PCT Pub. Date: Dec. 2, 2010

(65) Prior Publication Data

US 2012/0071617 A1 Mar. 22, 2012

(30) Foreign Application Priority Data

May 27, 2009 (EP) .................................... 09161243
Aug. 21, 2009 (EP) .................................... 09168352

(51) Int. Cl.
*C08G 64/00* (2006.01)
*C08G 63/02* (2006.01)

(52) U.S. Cl.
USPC .......................................................... 528/377

(58) Field of Classification Search
USPC .......................................................... 528/377
See application file for complete search history.

(56) References Cited

U.S. PATENT DOCUMENTS

| | | | |
|---|---|---|---|
| 5,354,869 | A | 10/1994 | Langhals et al. |
| 6,451,459 | B1 | 9/2002 | Tieke et al. |
| 6,690,029 | B1 | 2/2004 | Anthony et al. |
| 2003/0021913 | A1 | 1/2003 | O'Neill et al. |
| 2006/0013549 | A1 | 1/2006 | Shtein et al. |
| 2007/0079867 | A1 | 4/2007 | Chittibabu et al. |
| 2007/0228359 | A1 | 10/2007 | Heim et al. |
| 2009/0302311 | A1 | 12/2009 | Turbiez et al. |

FOREIGN PATENT DOCUMENTS

| | | |
|---|---|---|
| EP | 0 648 770 | 4/1995 |
| EP | 0 648 817 | 4/1995 |
| EP | 0 742 255 | 11/1996 |
| EP | 0 761 772 | 3/1997 |
| EP | 1 078 970 | 2/2001 |
| EP | 1 086 984 | 3/2001 |
| EP | 2 034 537 | 3/2009 |
| JP | 2007 266285 | 10/2007 |
| WO | 98 32802 | 7/1998 |
| WO | 98 45757 | 10/1998 |
| WO | 98 58027 | 12/1998 |
| WO | 99 01511 | 1/1999 |
| WO | 00 17275 | 3/2000 |
| WO | 00 36210 | 6/2000 |
| WO | 00 39221 | 7/2000 |
| WO | 00 63297 | 10/2000 |
| WO | 03 022848 | 3/2003 |
| WO | 03 052841 | 6/2003 |
| WO | 2004 101581 | 11/2004 |
| WO | 2004 112161 | 12/2004 |
| WO | 2005 016882 | 2/2005 |
| WO | 2005 031891 | 4/2005 |
| WO | 2005 049695 | 6/2005 |
| WO | 2006 097419 | 9/2006 |
| WO | 2007 082584 | 7/2007 |
| WO | 2008 000664 | 1/2008 |
| WO | 2008 001123 | 1/2008 |
| WO | 2008 107089 | 9/2008 |
| WO | 2009 047104 | 4/2009 |
| WO | 2010 006852 | 1/2010 |
| WO | 2010 049321 | 5/2010 |
| WO | 2010 049323 | 5/2010 |
| WO | 2010 108873 | 9/2010 |
| WO | 2010 115767 | 10/2010 |

OTHER PUBLICATIONS

International Search Report Issued Jun. 23, 2010 in PCT/EP10/56778 Filed May 18, 2010.
U.S. Appl. No. 13/246,003, filed Sep. 27, 2011, Wuerthner, et al.
U.S. Appl. No. 13/322,506, filed Dec. 21, 2011, Kirner, et al.
U.S. Appl. No. 13/516,117, filed Aug. 27, 2012, Molt, et al.

*Primary Examiner* — Terressa Boykin
(74) *Attorney, Agent, or Firm* — Oblon, Spivak, McClelland, Maier & Neustadt, L.L.P.

(57) ABSTRACT

This invention relates to a polymer containing a unit of formula -[A]-, a unit of formula -[COM$^1$]-, and a unit of formula -[COM$^2$]-, wherein A is a repeating unit of formula (I):

(I)

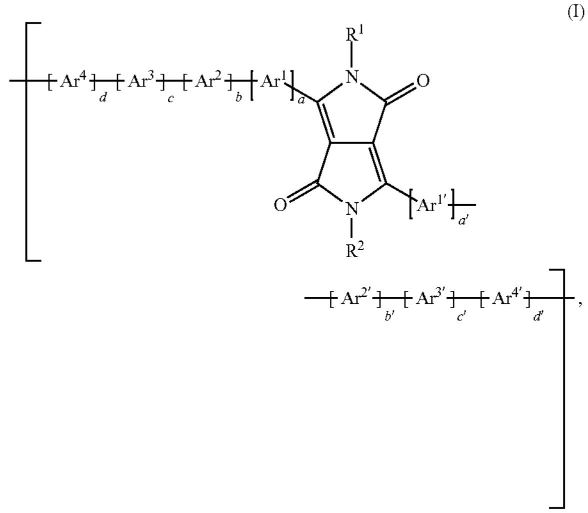

COM[1] is a repeating unit of formula:
(Xa)
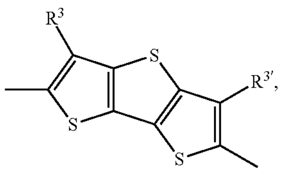
(Xb)
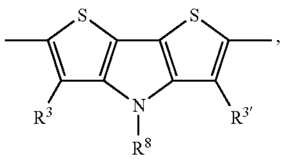
(Xc)
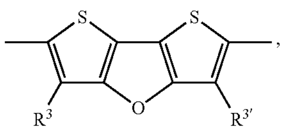
(Xd)
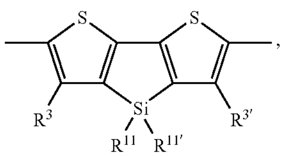
(Xe)
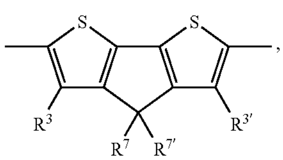
(Xf)
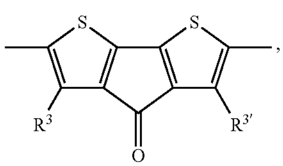
(Xg)
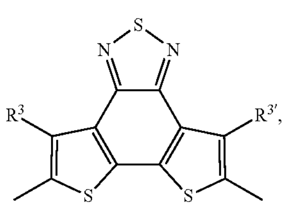
(Xh)
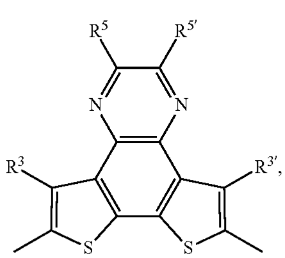
-continued
(Xi)
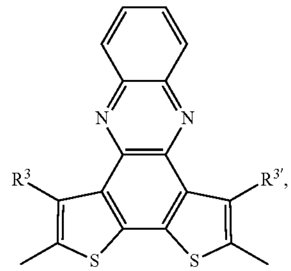
(Xj)
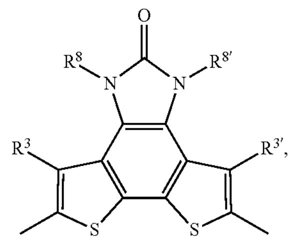
(Xk)
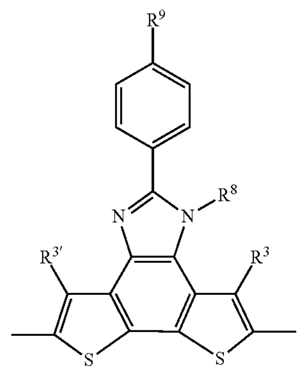
(Xl)
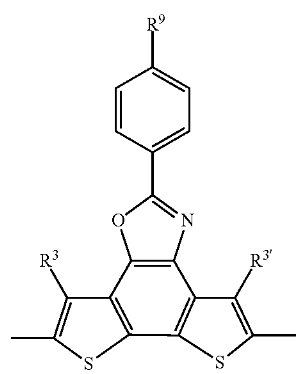
or
(Xm)
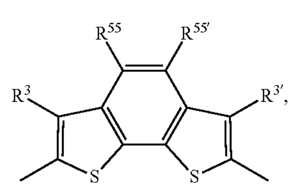

and

COM$^2$- is a second repeating unit -COM$^1$-, which is different from the first repeating unit -COM$^1$-, a second repeating unit -A-, which is different from the first repeating unit -A-, or a repeating unit of formula:

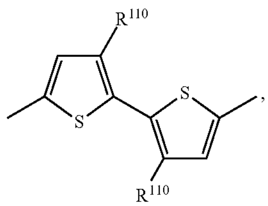

,
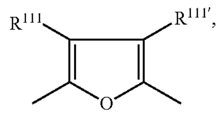

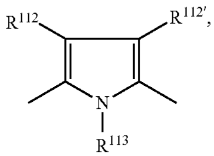

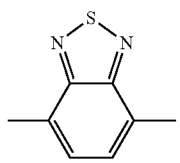

,

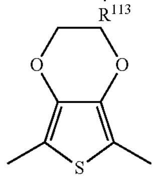

,
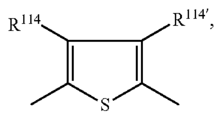

-continued

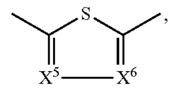

,
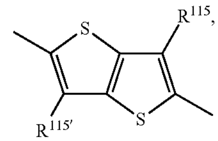

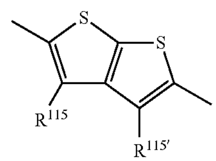

, or
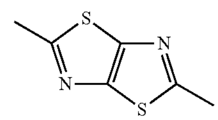

,

The invention also relates to articles and devices containing the polymer above, as well as processes for preparing the polymer and the articles and devices containing the polymer.

17 Claims, No Drawings

DIKETOPYRROLOPYRROLE POLYMERS FOR USE IN ORGANIC SEMICONDUCTOR DEVICES

CROSS-REFERENCE TO RELATED APPLICATIONS

This application is a national stage of PCT/EP2010/056778 filed on May 18, 2010. This application is based upon and claims the benefit of priority to European Application No. 09161243.2 filed on May 27, 2009, and to European Application No. 09168352.4 filed on Aug. 21, 2009.

BACKGROUND OF THE INVENTION

The present invention relates to polymers comprising one or more (repeating) unit(s) of the formula *-[A]-* and *-[COM$^1$]-*, and their use as organic semiconductor in organic devices, especially in organic photovoltaics (solar cells) and photodiodes, or in a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics (solar cells) and photodiodes.

U.S. Pat. No. 6,451,459 (EP1078970; cf. B. Tieke et al., Synth. Met. 130 (2002) 115-119; Macromol. Rapid Commun. 21 (4) (2000) 182-189) describes diketopyrrolopyrrole based polymers and copolymers comprising the following units

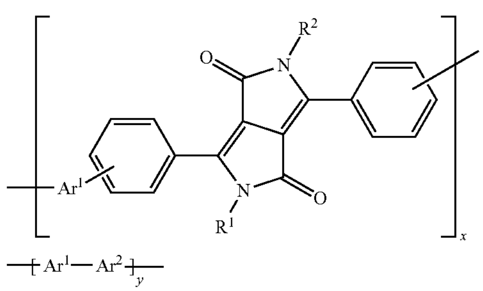

wherein x is chosen in the range of from 0.005 to 1, preferably from 0.01 to 1, and y from 0.995 to 0, preferably 0.99 to 0, and wherein x+y=1, and wherein Ar$^1$ and Ar$^2$ independently from each other stand for

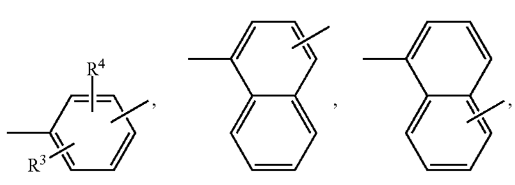

-continued

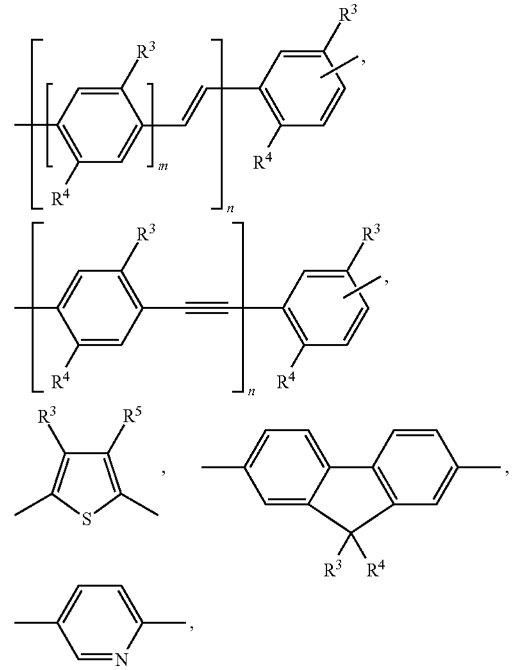

and m, n being numbers from 1 to 10, and

R$^1$ and R$^2$ independently from each other stand for H, $C_1$-$C_{18}$alkyl, —C(O)O—$C_1$-$C_{18}$alkyl, perfluoro-$C_1$-$C_{12}$alkyl, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, $C_1$-$C_{12}$alkyl-$C_6$-$C_{12}$aryl, or $C_6$-$C_{12}$aryl-$C_1$-$C_{12}$alkyl, R$^3$ and R$^4$ preferably stand for hydrogen, $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl or perfluoro-$C_1$-$C_{12}$alkyl, and R$^5$ preferably stands for $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, or perfluoro-$C_1$-$C_{12}$alkyl, and their use in EL devices. The following polymer

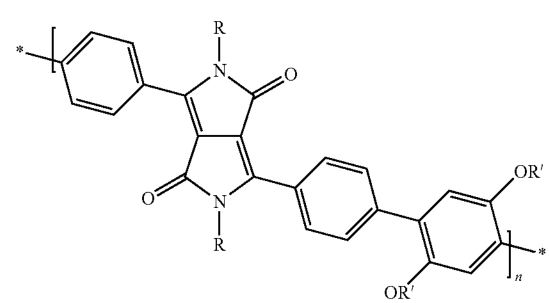

is explicitly disclosed in Tieke et al., Synth. Met. 130 (2002) 115-119. The following polymers

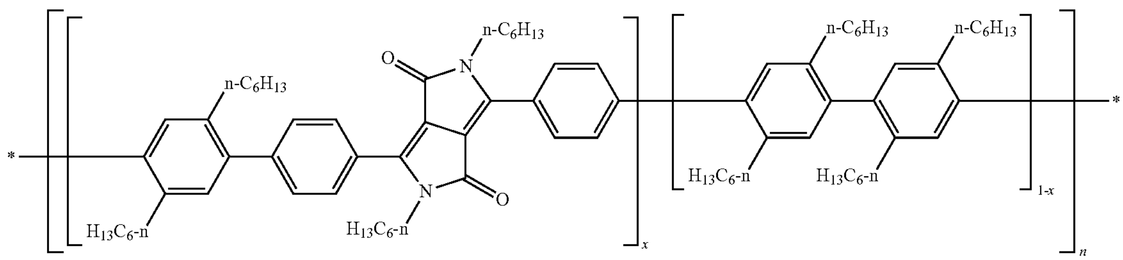

are explicitly disclosed in Macromol. Rapid Commun. 21 (4) (2000) 182-189.

M. Smet et al., Tetrahedron Lett. 42 (2001) 6527-6530 describe the preparation of rod-like diketopyrrolopyrrole oligomers by a stepwise sequence of Suzuki couplings using brominated 1,4-dioxo-3,6-diphenylpyrrolo[3,4-c]pyrrole (DPP) derivatives and 1,4-dibromo-2,5-di-n-hexylbenzene as the monomers.

Y. Zhu et al., Macromolecules 40 (2007) 6981-6989 describes five new soluble conjugated polymers, which were prepared upon Suzuki polycondensation reactions. The polymers were prepared from 1,4-diketo-2,5-dihexyl-3,6-bis(4-bromophenyl)pyrrolo[3,4-c]pyrrole (1a), 1,4-diketo-2,5-di-(2-ethylhexyl)-3,6-bis(4-bromophenyl)pyrrolo[3,4-c]pyrrole (1b), or 1,4-diketo-2,5-dihexyl-3,6-bis(4-(4,4,5,5-tetramethyl-1,3,2-dioxaborolan-2-yl)phenyl)pyrrolo[3,4-c]pyrrole (1c), and 3,6-bis(4,4,5,5-tetramethyl-1,3,2-dioxaborolan-2-yl)-9-ethylhexylcarbazole (2), 4,4'-dibromotriphenylamine (3), 4,4'-bis(4,4,5,5-tetramethyl-1,3,2-dioxaborolan-2-yl)triphenylamine (4), 2,7-bis(4,4,5,5-tetramethyl-1,3,2-dioxaborolan-2-yl)-9,9-dihexylfluorene (5), 9,10-anthracenebispinacolatoboron ester (6), and 4,7-dibromo-2,1,3-benzothiadiazole (7). The polymers exhibit brilliant red colors. Polymer solutions are highly fluorescent with photoemission maxima between 552 and 600 nm.

A. Kuehne et al., Tetrahedron Letters 49 (2008) 4722-4724 discloses the synthesis of the following polymer

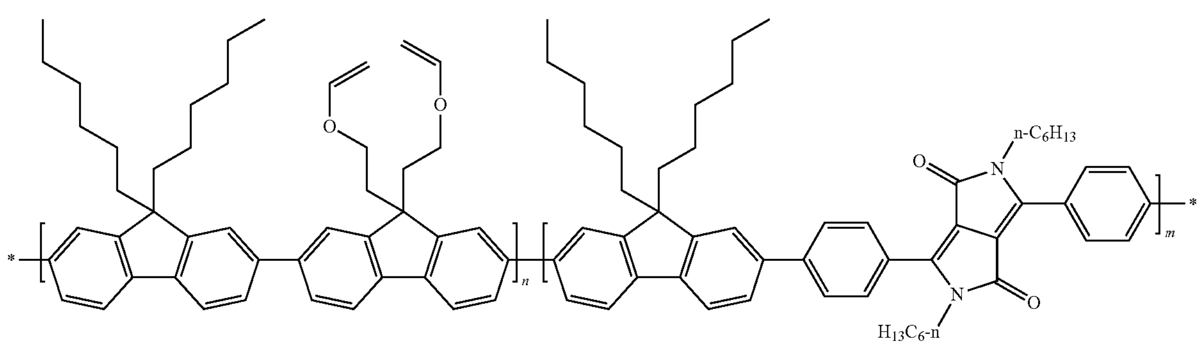

by Suzuki coupling. The vinyl ether functionality allows for active incorporation of the light emitting polymers into standard vinyl ether and glycidyl ether photoresist materials.

K. Zhang et al., Makcromolecules 41 (2008) 7287-7295 describes the synthesis and characteristic properties of polymers P-1-P-3 containing the 2,3,5,6-tetraarylated pyrrolo[3,4-c]pyrrole-1,4-dione unit in the main chain. P-1 is prepared from 2,5-bis(4-t-butylphenyl)-3,6-bis(4'-bromophenyl)pyrrolo[3,4-c]pyrrole-1,4-dione (DPP1) and 9,9-di-n-hexylfluorene-2,7'-bispinacolatoboronester 3, P-2 from 2,5-bis(4'-bromo-phenyl)-3,6-bis(4-t-butylphenyl)pyrrolo[3,4-c]pyrrole-1,4-dione (DPP2) and 3, and P-3 from DPP1, 3, and 2,5-bis(n-hexyloxybenzene)-1,4-bispinacolatoboronester 4 via Pd-catalyzed Suzuki coupling. Molecular weights of the polymers are about 8000-10 000 Da.

WO05/049695 discloses diketopyrrolopyrrole (DPP) based polymers and their use in PLEDs, organic integrated circuits (O-ICs), organic field effect transistors (OFETs), organic thin film transistors (OTFTs), organic solar cells (O-SCs), or organic laser diodes, but fails to disclose the specific DPP based polymers of formula I.

A preferred polymer of WO05/049695 comprises a repeating unit of formula

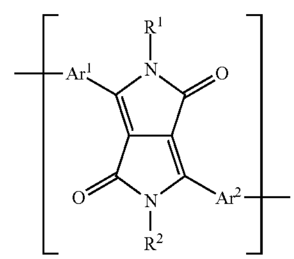

and a repeating unit $-[Ar^3]-$, wherein $R^1$ and $R^2$ are independently of each other a $C_1$-$C_{25}$alkyl group, especially a $C_4$-$C_{12}$alkyl group, which can be interrupted by one or more oxygen atoms, and $Ar^1$ and $Ar^2$ are independently of each other a group of formula

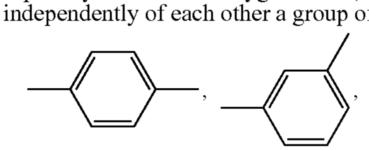

-continued

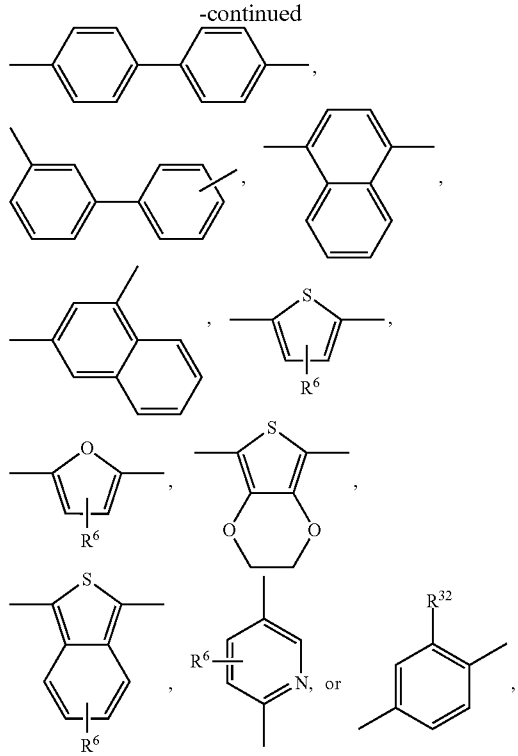

wherein —$Ar^3$— is a group of formula

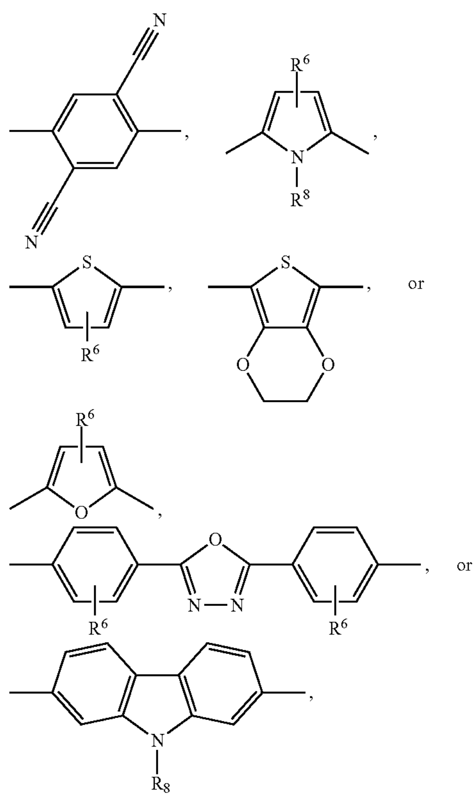

wherein $R^6$ is hydrogen, $C_1$-$C_{18}$alkyl, or $C_1$-$C_{18}$alkoxy, and $R^{32}$ is methyl, Cl, or OMe, and $R^8$ is H, $C_1$-$C_{18}$alkyl, or $C_1$-$C_{18}$alkyl which is substituted by E and/or interrupted by D, especially $C_1$-$C_{18}$alkyl which is interrupted by —O—.

In another preferred embodiment WO05/049695 is directed to polymers comprising a repeating unit of formula (I)

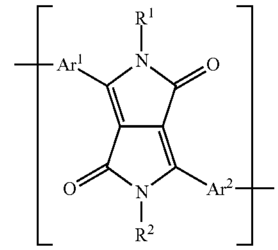

and a repeating unit $-[Ar^3]-$, wherein $R^1$ and $R^2$ are independently of each other a $C_1$-$C_{25}$alkyl group, especially a $C_4$-$C_{12}$alkyl group, which can be interrupted by one or more oxygen atoms, and $Ar^1$ and $Ar^2$ are independently of each other a group of formula

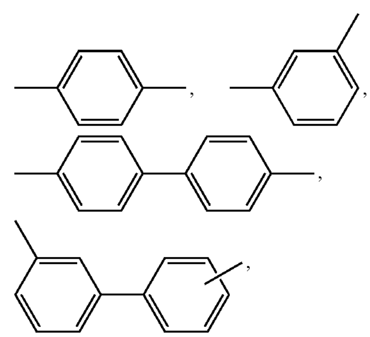

especially

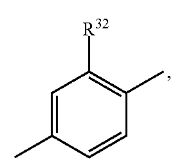

wherein $R^{32}$ is methyl, Cl, or OMe,

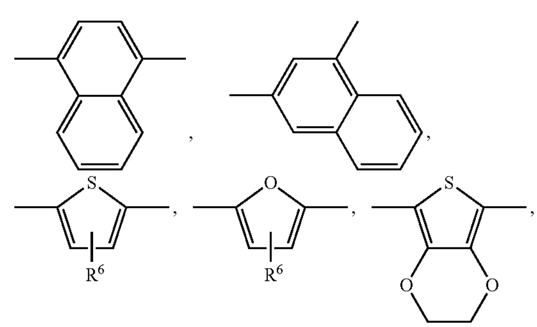

-continued

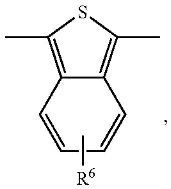
, or
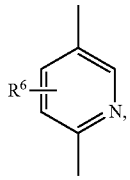

and —$Ar^3$— is a group of formula

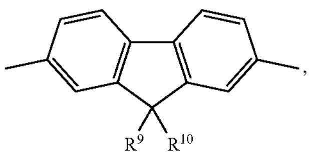

wherein $R^6$ is hydrogen, $C_1$-$C_{18}$alkyl, or $C_1$-$C_{18}$alkoxy, $R^9$ and $R^{10}$ are independently of each other H, $C_1$-$C_{18}$alkyl, which can optionally be interrupted by O, or $C_1$-$C_{18}$alkoxy, which can optionally be interrupted by O, $R^9$ and $R^{10}$ together form a group of formula $=CR^{100}R^{101}$, wherein $R^{100}$ and $R^{101}$ are independently of each other H, $C_1$-$C_{18}$alkyl, or $R^9$ and $R^{10}$ together form a five or six membered ring, which optionally can be substituted by $C_1$-$C_{18}$alkyl.

WO08/000,664 describes polymers comprising (repeating) unit(s) of the formula

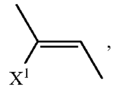

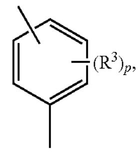
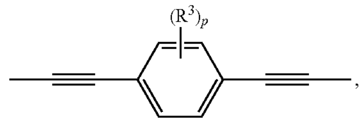
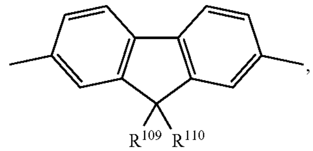
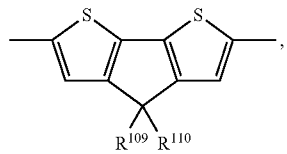
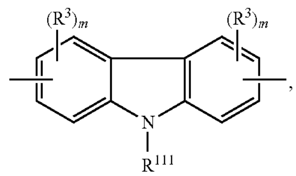
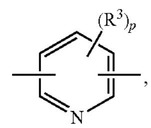
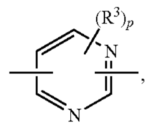
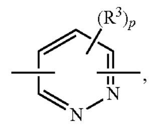
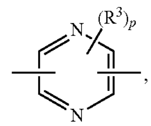

(I)

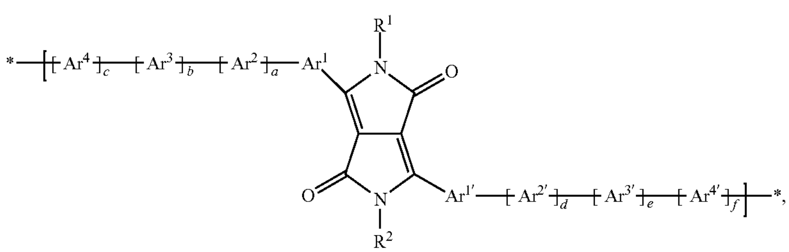

wherein a, b, c, d, e and f are 0 to 200, especially 0, 1, 2, or 3;

$Ar^1$ and $Ar^{1'}$ are independently of each other a group of formula

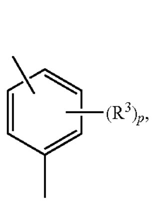
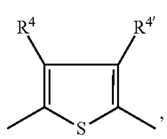
, or
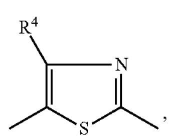

$Ar^2$, $Ar^{2'}$, $Ar^3$, $Ar^{3'}$, $Ar^4$ and $Ar^{4'}$ are independently of each other a group of formula -continued

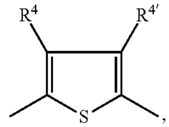
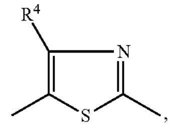
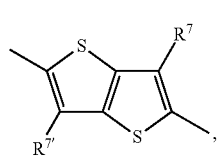
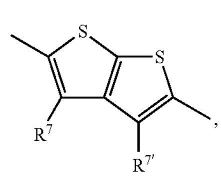
or

-continued

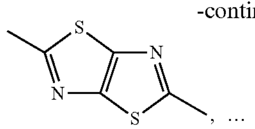

In a preferred embodiment WO08/000,664 is directed to polymers of formula $$*\!-\!\!\![A]_v\!\!-\!* \quad *\!-\!\!\![COM^1]_w\!\!-\!*, \text{ or} \tag{VIIa}$$

$$*\!-\!\!\![A]_v\!\!-\!* \quad *\!-\!\!\![COM^2]_w\!\!-\!*, \tag{VIIb}$$

wherein A is as defined above and -COM$^1$- is selected from repeating units of formula:

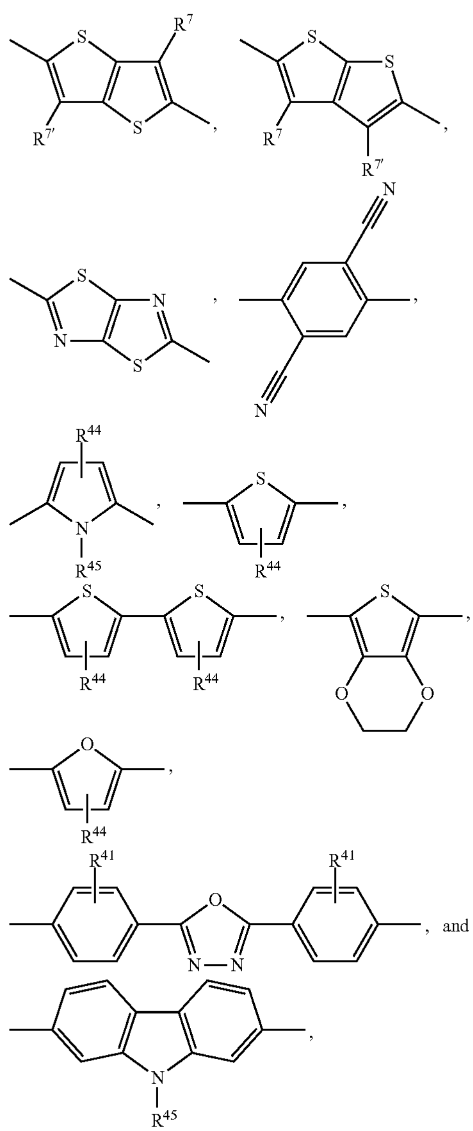

wherein $R^7$ and $R^{7'}$ are . . . , $R^{44}$ and $R^{41}$ are hydrogen, $C_1$-$C_{18}$alkyl, or $C_1$-$C_{18}$alkoxy, and $R^{45}$ is H, $C_1$-$C_{18}$alkyl, or $C_1$-$C_{18}$alkyl which is substituted by E and/or interrupted by D, especially $C_1$-$C_{18}$alkyl which is interrupted by —O—, wherein D and E are as defined above, and -COM$^2$- is a group of formula

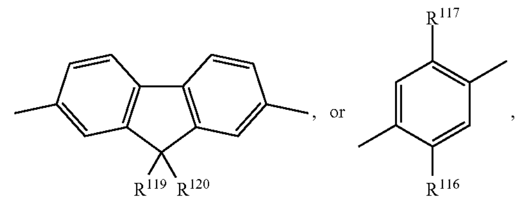

wherein $R^{116}$ and $R^{117}$ are independently of each other H, $C_1$-$C_{18}$alkyl, which can optionally be interrupted by O, or $C_1$-$C_{18}$alkoxy, which can optionally be interrupted by O, $R^{119}$ and $R^{120}$ are independently of each other H, $C_1$-$C_{18}$alkyl, which can optionally be interrupted by O, or $R^{119}$ and $R^{120}$ together form a group of formula $=CR^{100}R^{101}$, wherein $R^{100}$ and $R^{101}$ are independently of each other H, $C_1$-$C_{18}$alkyl, or $R^{119}$ and $R^{120}$ together form a five or six membered ring, which optionally can be substituted by $C_1$-$C_{18}$alkyl.

Martijn M. Wienk et al., Advanced Materials 20 (2008) 2556-2560 relates to narrow-bandgap diketo-pyrrolo-pyrrole polymer solar cells. Photovoltaic devices were made by coating the appropriate pBBTDPP2: fullerene film on patterned indium-oxide-coated glass substrates covered with 60 nm of poly(3,4-ethylenedioxythiophene):poly(styrenesulfonate) (PEDOT:PSS). Lithium fluoride (1 nm) and aluminum (100 nm) were used as metal electrode.

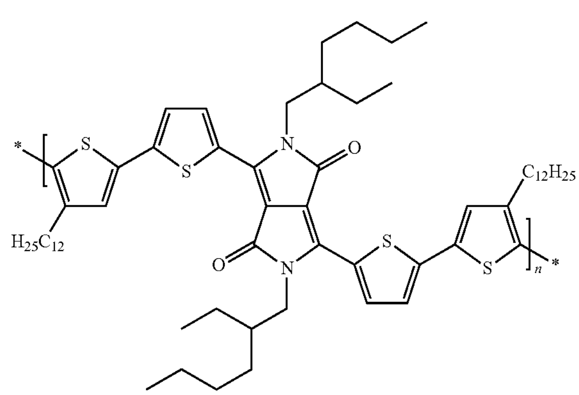

pBBTDPP2 pBBTDPP2 is also mentioned in J. Chen et al., Accounts of Chemical Research xx (2009) 1-10 (doi: 10.21/ar90006lz; publication date: 2.07.2009).

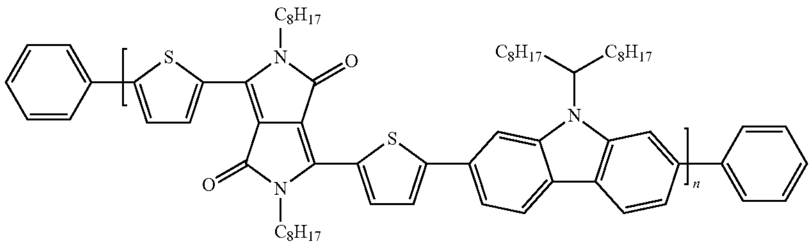

Mario Leclerc et al., Macromolecules, 42 (2009) 2891-2894 (online publication date: 26.03.2009; DOI: 10.1021/ma8027003) disclose a poly(2,7-carbazole) derivative (PCBTDPP), namely poly[N-9'-heptadecanyl-2,7-carbazole-alt-3,6-bis(thiophen-5-yl)-2,5-dioctyl-2,5-dihydropyrrolo[3,4-]pyrrole-1,4-dione]. The conjugated polymer exhibits a high hole mobility, optimized HOMO-LUMO energy levels together with good thermal and air stability.

E. Zhou et al., Macromolecules 43 (2010) 821-826 (Online publication date: 28.12.2009; DOI: 10.1021/ma902398q) discloses the synthesis of a highly effective photovoltaic polymer with near-infrared response, poly{N-[1-(2-ethylhexyl)-3-ethylheptanyl]dithieno[3,2-b:2',3'-d]pyrrole-3,6-dithien-2-yl-2,5-dibutylpyrrolo[3,4-c]pyrrole-1,4-dione-5',5''-diyl} {P DTPDTDPP(Bu)}. The polymer has high molecular weight, good solubility, and a broad absorption spectrum in the range of 500-1100 nm. Field effect transistor charge mobility of PDTPDTDPP(Bu) arrived 0.05 $cm^2 V^{-1} s^{-1}$. Bulk heterojunction type polymer solar cells based on PDTPDTDPP(Bu) and PC70BM have broad photocurrent response wavelength range from 300 nm to 1.1 μm.

WO09/047104 relates to small molecule DPP compounds of the formula

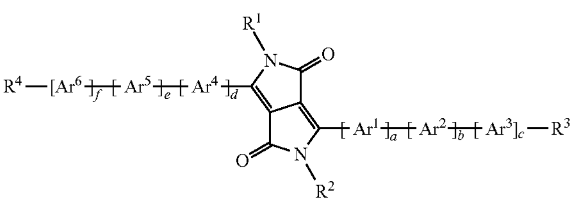

wherein . . . $Ar^1$ and $Ar^4$ are independently of each other a bivalent group of the formula

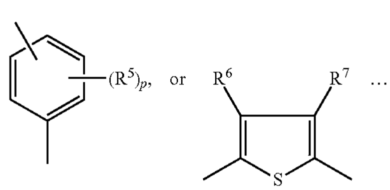

$Ar^2$, $Ar^3$, $Ar^5$, and $Ar^6$ are independently of each other a bivalent group of one of the formulae IV to X and L, (IV)

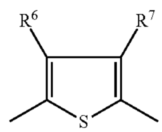

(V)

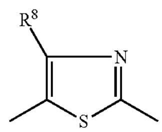

(VI)

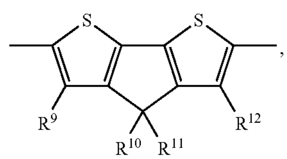

(VII)

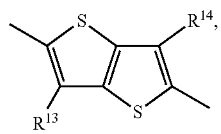

(VIII)

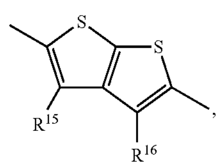

(IX)

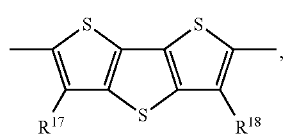

(X)

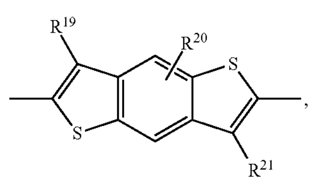

(L)

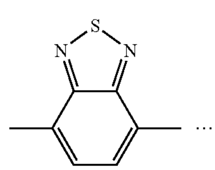

EP2034537A2 discloses polymers of formula

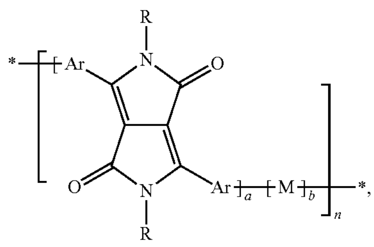

wherein each R is independently selected from hydrogen, an optionally substituted hydrocarbon, and a hetero-containing group; each Ar is independently selected from optionally substituted aryl and heteroaryl groups; each M is an optional, conjugated moiety; a represents a number that is at least 1; b represents a number from 0 to 20; and n represents a number that is at least 1. Among others M can be selected from

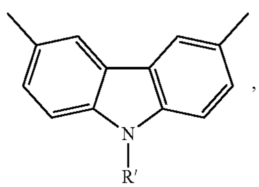

, and

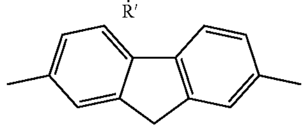

and substituted derivatives thereof.

PCT/EP2009/063767 discloses polymers comprising one or more (repeating) unit(s) of the formula

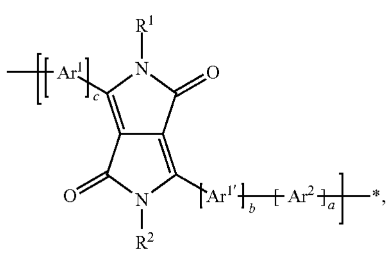

, or

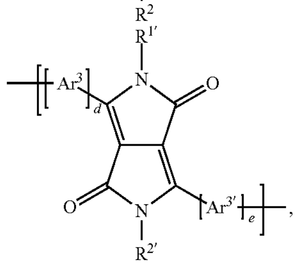

wherein $Ar^1$, $Ar^{1'}$, $Ar^3$ and $Ar^{3'}$ are independently of each other a group of formula

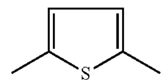

, or

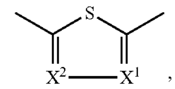

$Ar^2$ is a group of formula

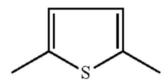

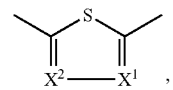

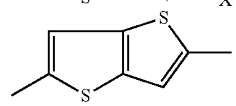

, or

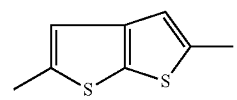

one of $X^1$ and $X^2$ is N and the other is CH, and their use as organic semiconductor in organic devices.

PCT/EP2009/063769 relates to polymers comprising one or more (repeating) unit(s) of the formula —[A-D]—, and at least one (repeating) unit(s) which is selected from repeating units of the formula —[B-D]—, —[A-E]—, and —[B-E]—, a polymer comprising one or more (repeating) unit(s) of the formula

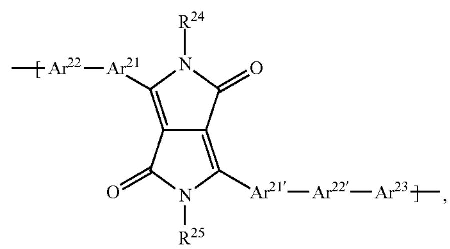

or a polymer comprising one or more (repeating) unit(s) of the formula

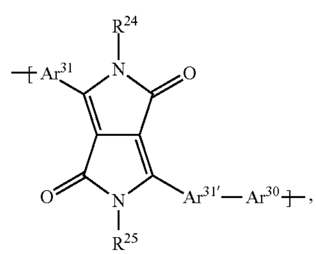

wherein A is a group of formula

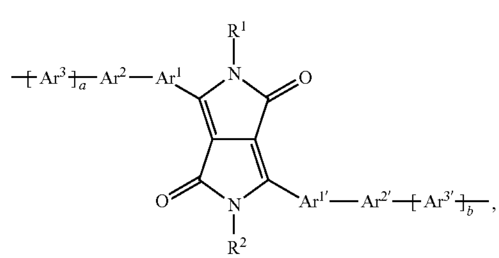

-continued

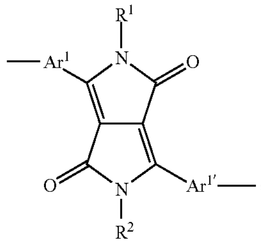

or

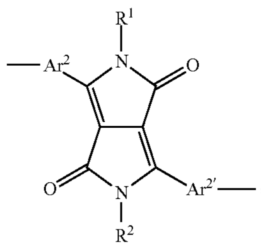

$Ar^{21}$, $Ar^{21'}$, $Ar^{31}$, $Ar^{31'}$, $Ar^{1}$ and $Ar^{1'}$ are independently of each other a group of formula

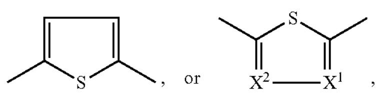

$Ar^{2}$, and $Ar^{2'}$ are independently of each other a group of formula

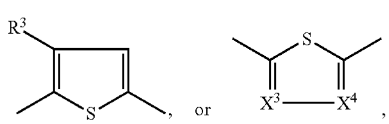

B, D and E are independently of each other a group of formula

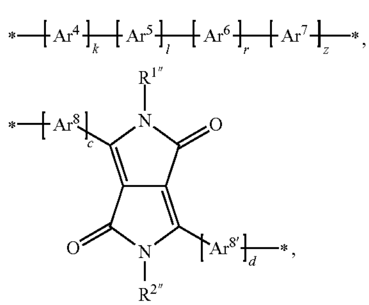

or formula

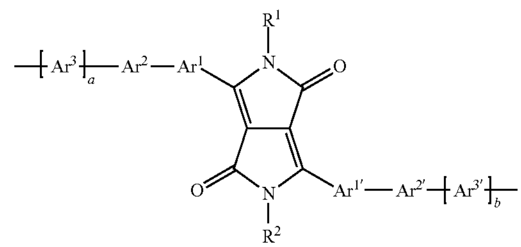

$Ar^{8}$ and $Ar^{8'}$ are independently of each other a group of formula

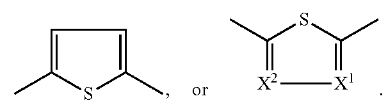

JP2007266285 relates to a field effect transistor comprising a compound represented by a formula (1)

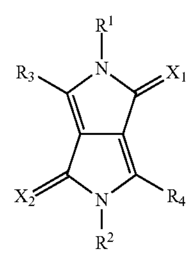

as a semiconductor material, wherein $X^1$ and $X^2$ each independently denote an oxygen atom, a sulfur atom, or a selenium atom, and $R_1$; $R_2$, $R_3$ and $R_4$ each independently denote a hydrogen atom, a substitutable aliphatic hydrocarbon group, or a substitutable aromatic group. The following DPP compound is explicitly disclosed:

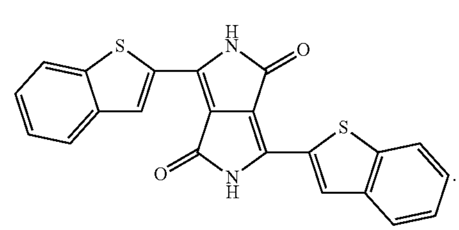 [SMILES: O=C1NC(c2cc3ccccc3s2)=C2C(=O)NC(c3cc4ccccc4s3)=C12]

PCT/EP2010/053655 relates to polymers comprising one or more (repeating) unit(s) of the formula (I)

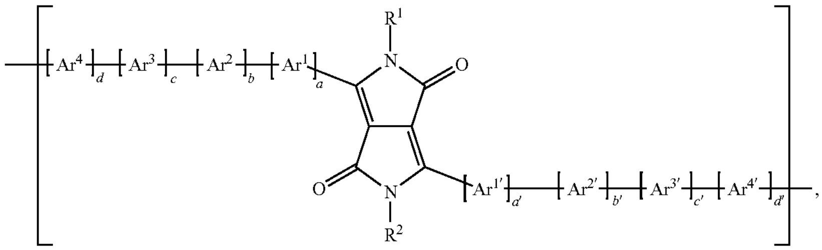

wherein $Ar^1$ and $Ar^{1'}$ are independently of each other are an annulated (aromatic) heterocyclic ring system, containing at least one thiophene ring, which may be optionally substituted by one, or more groups.

PCT/EP2010/054152 comprising a repeating unit of formula

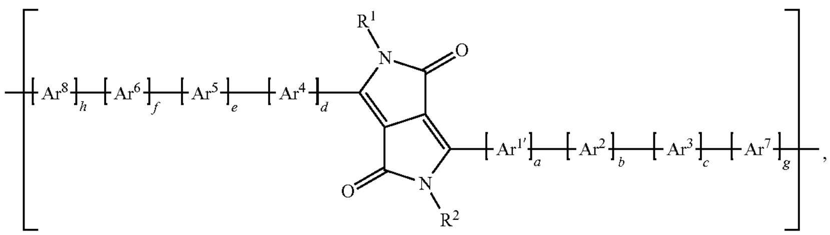

wherein $Ar^{1'}$ is an annulated (aromatic) heterocyclic ring system, containing at least one thiazole ring, which may be optionally substituted by one, or more groups, E. Zhou et al., Chem. Mater. 21 (2009) 4055-4061 (Online publication date: 05.08.2009; DOI:10.1021/cm901487f) discloses three kinds of diketopyrrolopyrrole-based donor-acceptor (D-A) type copolymers, poly{9,9-di(2-ethylhexyl)fluorene-2,7-diyl-alt-3,6-dithien-2-yl-2,5-di(2-ethylhexyl)-pyrrolo[3,4-c]pyrrole-1,4-dione-50,500-diyl}(PF-DTDPP), poly{N-(1-decylundecyl)carbazole-2,7-diyl-alt-3,6-dithien-2-yl-2,5-di(2-ethylhexyl)-pyrrolo[3,4-c]pyrrole-1,4-dione-5',5"-diyl}(PC-DTDPP), and poly{N-[1-(2-ethylhexyl)-3-ethylheptanyl]dithieno[3,2-b:2',3'-d]pyrrole-3,6-dithien-2-yl-2,5-di(2-ethylhexyl)-pyrrolo[3,4-c]pyrrole-1,4-dione-5',5"-diyl}(PDTP-DTDPP). By changing the donor segments, the absorption ranges of DTDPP-containing copolymers can be tuned. PF-DTDPP and PC-DTDPP showed absorption bands in the range of 500-700 nm, while PDTP-DTDPP showed broad absorption in the range of 500-1000 nm in the solutions. The power conversion efficiencies (PCE) of the polymer solar cells (PSCs) based on these copolymers and [6,6]-phenyl $C_{61}$ butyric acid methyl ester (PCBM) were 0.88% (PF-DTDPP), 2.26% (PC-DTDPP), and 1.12% (PDTP-DTDPP), respectively, under the illumination of AM 1.5 (100 mW/cm$^2$).

L. Huo et al., Macromolecules 2009, 42, 6564-6571 (Online publication date: 06.08.2009; DOI: 10.1021/ma9012972) discloses a series of low-bandgap polymers based on a soluble chromophore of 3,6-dithiophen-2-yl-2,5-dihydropyrrolo[3,4-c]pyrrole-1,4-dione (DPP) unit and different electron-rich building blocks copolymerized with DPP unit. Four new DPP-based polymers,

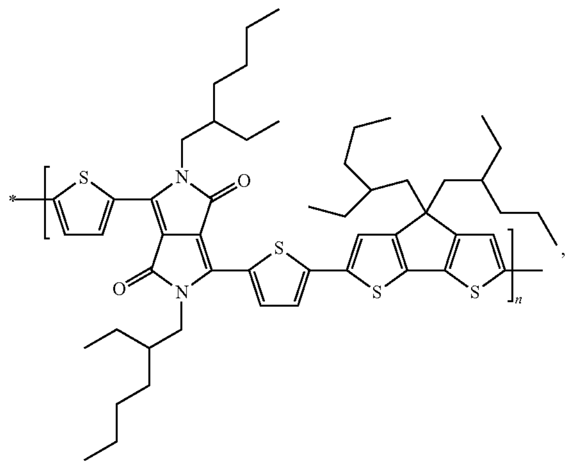

(PDPP-DTS)

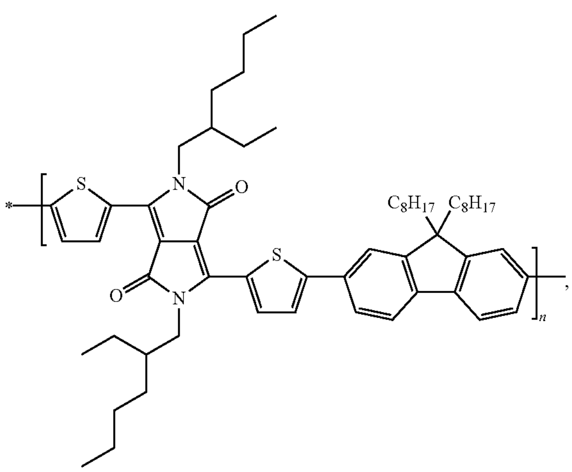

(PDPP-F)

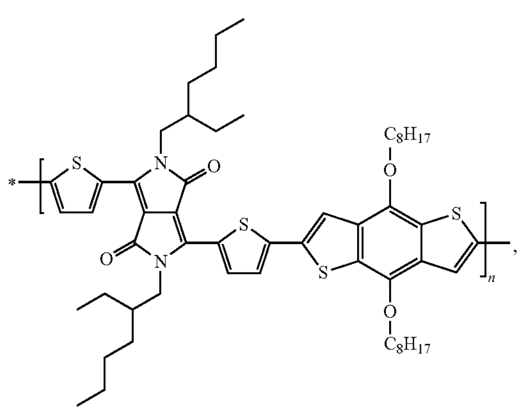

(PDPPBDT)

, and

-continued

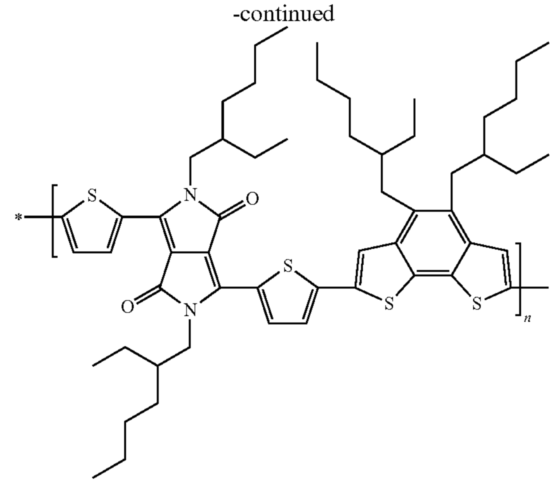

(PDPP-BDP)

were synthesized.

In order to investigate their photovoltaic properties, polymer solar cell (PSC) devices based on PDPP-DTS, PDPP-F, PDPP-BDT, and PDPP-BDP were fabricated with a structure of ITO/PEDOT:PSS/polymers:PC70BM(1:2,w/w)/Ca/Al under the illumination of AM 1.5G, 100 mW/cm$^2$.

N. Allard et al., Macromolecules 2010, 43, 2328-2333 (Online publication date: 28.01.2010; DOI: 10.1021/ma9025866) discloses the synthesis of poly[2,7-(9,9-di-n-octylgermafluorene)-alt-3,6-bis(thiophen-5-yl)-2,5-dioctylpyrrolo[3,4-]pyrrole-1,4-dione] and poly[2,7-(9,9-di-n-butylgerma-fluorene)-alt-3,6-bis(thiophen-5-yl)-2,5-dioctylpyrrolo[3,4-]pyrrole-1,4-dione], which shows a hole mobility up to 0.04 cm$^2$ $(V\ 3\ s)^{-1}$ with an $I_{on}/I_{off}$ ratio of $1.0\times10^6$. G. Chen et al., Polymer Chemistry 48 (2010) 1669-1675 [DOI: 10.1002/pola.23931] discloses the synthesis of a narrow-bandgap conjugated polymer (PCTDPP) containing alternating cyclopentadithiophene (CT) and diketo-pyrrolo-pyrrole (DPP) units by Suzuki coupling.

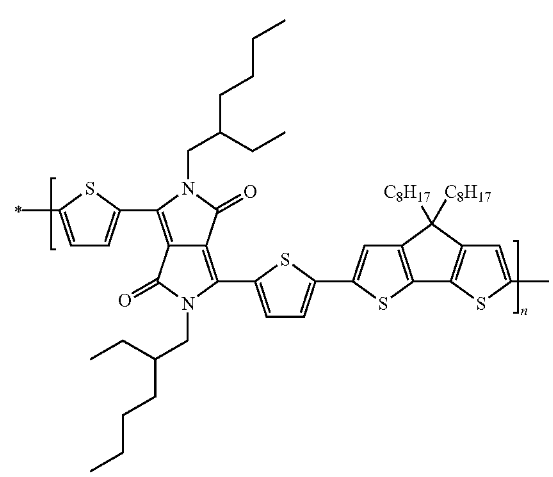

This PCTDPP exhibits a low band gap of 1.31 eV and a broad absorption band from 350 to 1000 nm. A bulk heterojunction polymer solar cell incorporating PCTDPP and C70 at a blend ratio of 1:3 exhibited a high short-circuit current of 10.87 $mA/cm^2$ and a power conversion efficiency of 2.27%.

It is the object of the present invention to provide polymers, which show high efficiency of energy conversion, excellent field-effect mobility, good on/off current ratios and/or excellent stability, when used in organic field effect transistors, organic photovoltaics (solar cells) and photodiodes.

BRIEF DESCRIPTION OF THE INVENTION

Said object has been solved by polymers, comprising (repeating) unit(s) of the formula *-[A]-*, *-[$COM^1$]-* and optionally *-[$COM^2$]-*, wherein A is a repeating unit of the formula

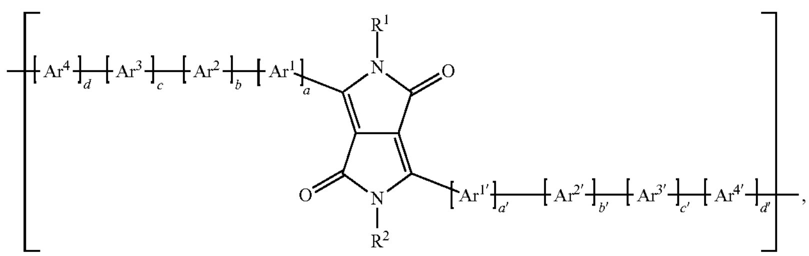

(I)

wherein a is 1, 2, or 3, a' is 0, 1, 2, or 3; b is 0, 1, 2, or 3; b' is 0, 1, 2, or 3; c is 0, 1, 2, or 3; c' is 0, 1, 2, or 3; d is 0, 1, 2, or 3; d' is 0, 1, 2, or 3; with the proviso that b' is not 0, if a' is 0; $R^1$ and $R^2$ may be the same or different and are selected from hydrogen, a $C_1$-$C_{100}$alkyl group, —$COOR^{103}$, a $C_1$-$C_{100}$alkyl group which is substituted by one or more halogen atoms, hydroxyl groups, nitro groups, —CN, or $C_6$-$C_{18}$aryl groups and/or interrupted by —O—, —COO—, —OCO—, or —S—; a $C_7$-$C_{100}$arylalkyl group, a carbamoyl group, $C_5$-$C_{12}$cycloalkyl, which can be substituted one to three times with $C_1$-$C_8$alkyl and/or $C_1$-$C_8$alkoxy, a $C_6$-$C_{24}$aryl group, in particular phenyl or 1- or 2-naphthyl which can be substituted one to three times with $C_1$-$C_8$alkyl, $C_1$-$C_8$thioalkoxy, and/or $C_1$-$C_8$alkoxy, or pentafluorophenyl, $R^{103}$ is $C_1$-$C_{50}$alkyl, especially $C_4$-$C_{25}$alkyl;

$Ar^1$ and $Ar^{1'}$ are independently of each other

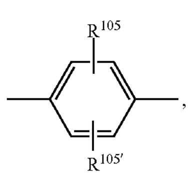,
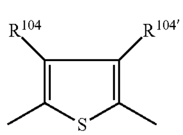,
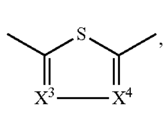,
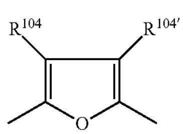,
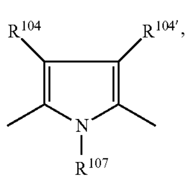,
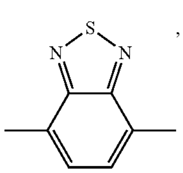, or -continued

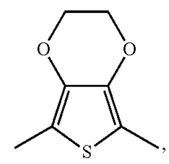, $Ar^2$, $Ar^{2'}$, $Ar^3$, $Ar^{3'}$, $Ar^4$ and $Ar^{4'}$ have the meaning of $Ar^1$, or are independently of each other

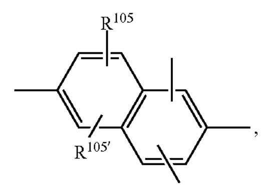, or 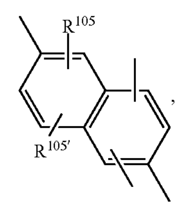, wherein one of $X^3$ and $X^4$ is N and the other is $CR^{99}$, $R^{99}$, $R^{104}$ and $R^{104'}$ are independently of each other hydrogen, halogen, especially F, or a $C_1$-$C_{25}$alkyl group, especially a $C_4$-$C_{25}$alkyl, which may optionally be interrupted by one or more oxygen or sulphur atoms, $C_7$-$C_{25}$arylalkyl, or a $C_1$-$C_{25}$alkoxy group, $R^{105}$ and $R^{105'}$ independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{18}$alkoxy, $R^{107}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; and -$COM^1$- is a repeating unit of formula

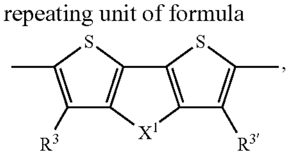, or

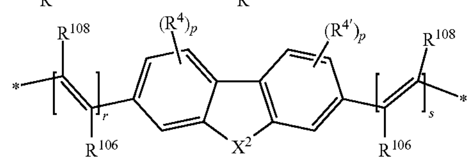, especially

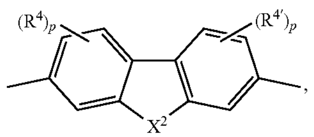

$-COM^2-$ is a second repeating unit $-COM^1-$, which is different from the first repeating unit $-COM^1$, a second repeating unit -A-, which is different from the first repeating unit -A-, or a repeating unit of formula

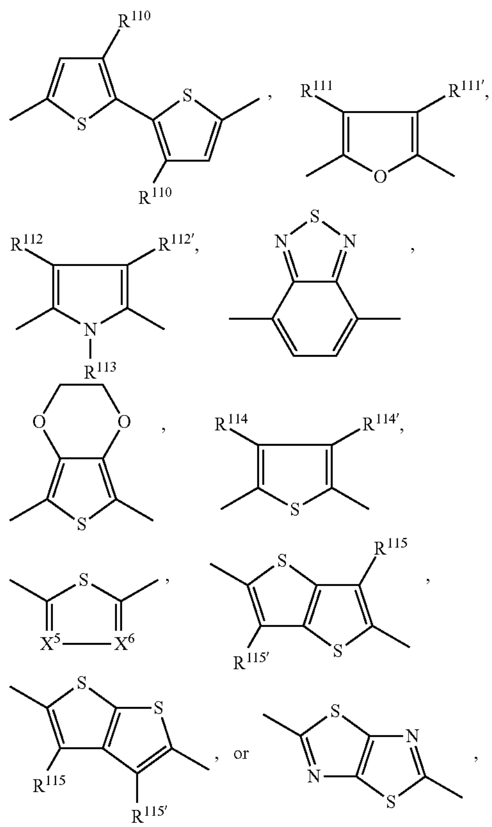

wherein one of $X^5$ and $X^6$ is N and the other is $R^{110}$ is a $C_1$-$C_{25}$alkyl group, especially a $C_4$-$C_{25}$alkyl, which may optionally be interrupted by one or more oxygen or sulphur atoms, $C_7$-$C_{25}$arylalkyl, or a $C_1$-$C_{25}$alkoxy group $R^{111}$, $R^{111'}$, $R^{112}$ and $R^{112'}$ are independently of each other hydrogen, halogen, especially F, or a $C_1$-$C_{25}$alkyl group, especially a $C_4$-$C_{25}$alkyl, which may optionally be interrupted by one or more oxygen or sulphur atoms, $C_7$-$C_{25}$arylalkyl, or a $C_1$-$C_{25}$alkoxy group, $R^{113}$ is $C_6$-$C_{18}$aryl; $C_1$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—;

$R^{114}$, $R^{114'}$, $R^{115}$ and $R^{115'}$ are independently of each other H, or a $C_1$-$C_{25}$alkyl group, especially a $C_6$-$C_{25}$alkyl, which may optionally be interrupted by one or more oxygen atoms;

p is 0, 1, 2, or 3; r is 0, or 1, s is 0, or 1, one of $R^{106}$ and $R^{108}$ is hydrogen and the other is hydrogen, CN, $C_1$-$C_8$alkyl, or $—COOR^{109}$, $R^{109}$ is $C_1$-$C_{25}$alkyl, which may optionally be interrupted by one or more oxygen or sulphur atoms, $C_7$-$C_{25}$arylalkyl, or $C_6$-$C_{24}$aryl, which may optionally be substituted one to three times with $C_1$-$C_8$alkyl and/or $C_1$-$C_8$alkoxy;

$R^3$ and $R^{3'}$ are independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{25}$alkoxy;

$R^4$ and $R^{4'}$ are independently of each other halogen, $C_1$-$C_{25}$alkyl, which may optionally be interrupted by one or more oxygen or sulphur atoms; $C_7$-$C_{25}$arylalkyl, or $C_1$-$C_{25}$alkoxy; or two groups $R^4$ and $R^{4'}$ which are in neighbourhood to each other form a ring, $X^1$ and $X^2$ are independently of each other —O—, —S—, $—Si(R^{11})(R^{11'})—$, $—C(R^7)(R^{7'})—$, —C(=O)—,

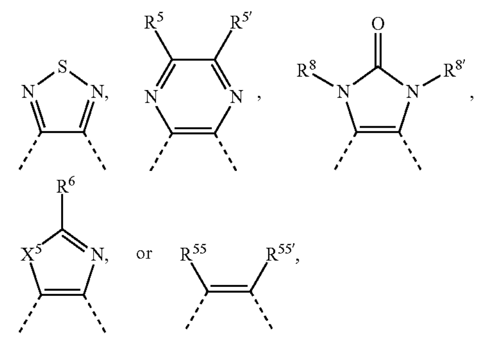

$X^5$ is —O—, or $—NR^8—$;

$R^5$ and $R^{5'}$ are independently of each other hydrogen, halogen, $C_1$-$C_{25}$alkyl, which may optionally be interrupted by one or more oxygen or sulphur atoms; $C_6$-$C_{24}$aryl, which may optionally be substituted one to three times with $C_1$-$C_8$alkyl and/or $C_1$-$C_8$alkoxy;

$C_7$-$C_{25}$arylalkyl, CN, or $C_1$-$C_{25}$alkoxy; or $R^5$ and $R^{5'}$ together form a ring, $R^{55}$ and $R^{55'}$ are independently of each other H, F, $C_1$-$C_{18}$alkyl, $C_1$-$C_{18}$alkyl which is interrupted by O, $C_1$-$C_{18}$alkoxy, $C_1$-$C_{18}$alkoxy which is interrupted by O, $C_1$-$C_{18}$perfluoroalkyl, $C_6$-$C_{24}$aryl, which may optionally be substituted one to three times with $C_1$-$C_8$alkyl and/or $C_1$-$C_8$alkoxy, $C_2$-$C_{20}$heteroaryl, which may optionally be substituted one to three times with $C_8$alkyl and/or $C_1$-$C_8$alkoxy;

$R^6$ is H, $C_1$-$C_{18}$alkyl, which may optionally be interrupted by one or more oxygen or sulphur atoms, $C_1$-$C_{18}$perfluoroalkyl, $C_6$-$C_{24}$aryl, which may optionally be substituted one to three times with $C_1$-$C_8$alkyl and/or $C_1$-$C_8$alkoxy; $C_2$-$C_{20}$heteroaryl, which may optionally be substituted one to three times with $C_1$-$C_8$alkyl and/or $C_1$-$C_8$alkoxy; or CN, $R^7$ and $R^{7'}$ are independently of each other hydrogen, $C_1$-$C_{35}$alkyl, which may optionally be interrupted by one, or more oxygen, or sulphur atoms; or $C_7$-$C_{25}$arylalkyl, $R^8$ and $R^{8'}$ are independently of each other hydrogen, $C_6$-$C_{18}$aryl; $C_6$-$C_{18}$aryl which is substituted by $C_1$-$C_{18}$alkyl, or $C_1$-$C_{18}$alkoxy; $C_1$-$C_{25}$alkyl, especially $C_4$-$C_{25}$alkyl, which may optionally be interrupted by one or more oxygen or sulphur atoms; or $C_7$-$C_{25}$arylalkyl, $R^{11}$ and $R^{11'}$ are independently of each other $C_1$-$C_{35}$alkyl group, $C_7$-$C_{25}$arylalkyl, or a phenyl group, which optionally can be substituted one to three times with $C_1$-$C_8$alkyl and/or $C_1$-$C_8$alkoxy, with the proviso that the following polymers are excluded:

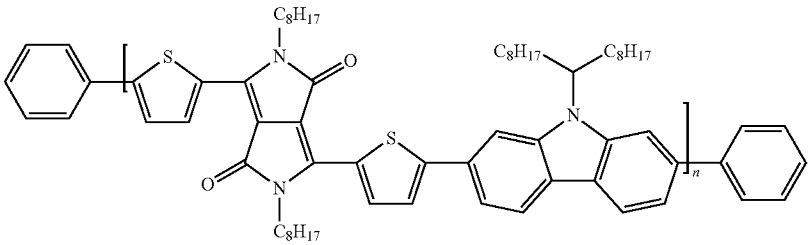

and

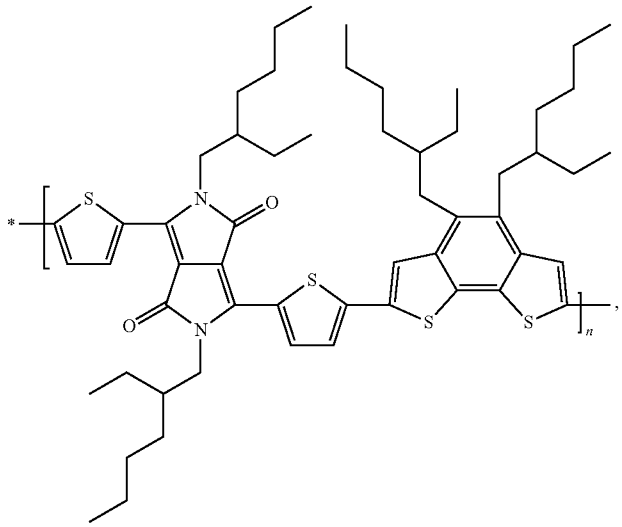

with the further proviso that if A is a group of formula

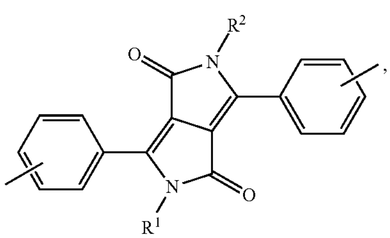

B is not a group of formula

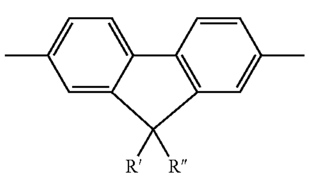

, or

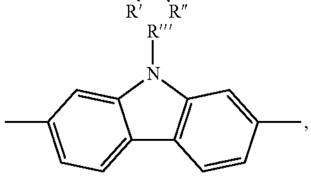

wherein R' and R" stand for hydrogen, $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl or perfluoro-$C_1$-$C_{12}$alkyl and R''' stands for hydrogen, or $C_1$-$C_{18}$alkyl.

Advantageously, the polymer of the present invention, or an organic semiconductor material, layer or component, comprising the polymer of the present invention can be used in organic photovoltaics (solar cells) and photodiodes, or in an organic field effect transistor (OFET).

BRIEF DESCRIPTION OF THE INVENTION

The polymers of the present invention are copolymers. A copolymer is a polymer derived from more than one species of monomer, e.g. bipolymer, terpolymer, quaterpolymer, etc.

The term polymer comprises oligomers as well as polymers. The oligomers of this invention have a weight average molecular weight of <4,000 Daltons. The polymers of this invention preferably have a weight average molecular weight of 4,000 Daltons or greater, especially 4,000 to 2,000,000 Daltons, more preferably 10,000 to 1,000,000 and most preferably 10,000 to 100,000 Daltons. Molecular weights are determined according to high-temperature gel permeation chromatography (HT-GPC) using polystyrene standards. The polymers of this invention preferably have a polydispersibility of 1.01 to 10, more preferably 1.1 to 3.0, most preferred 1.5 to 2.5.

If -COM[1]- is a group of formula XIc, or XId, A is preferably different from a repeating unit of the formula

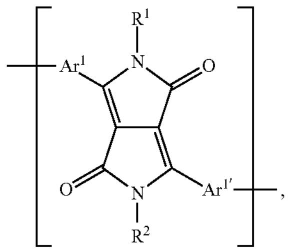

wherein $Ar^1$ and $Ar^1$ are

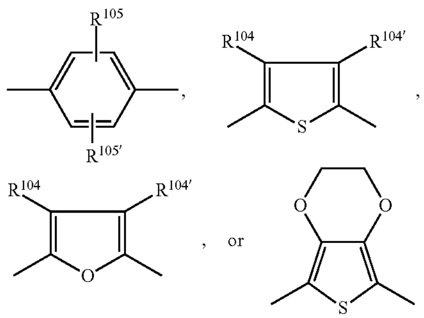

and $R^1$ and $R^2$ are as defined above.

If $-COM^1-$ is a group of formula XIc, or XId, A is preferably different from a repeating unit of the formula

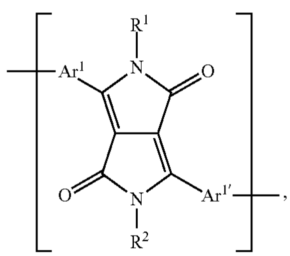

wherein $Ar^1$ and $Ar^{1'}$ are

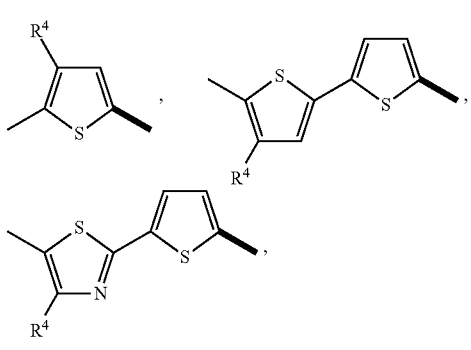

-continued

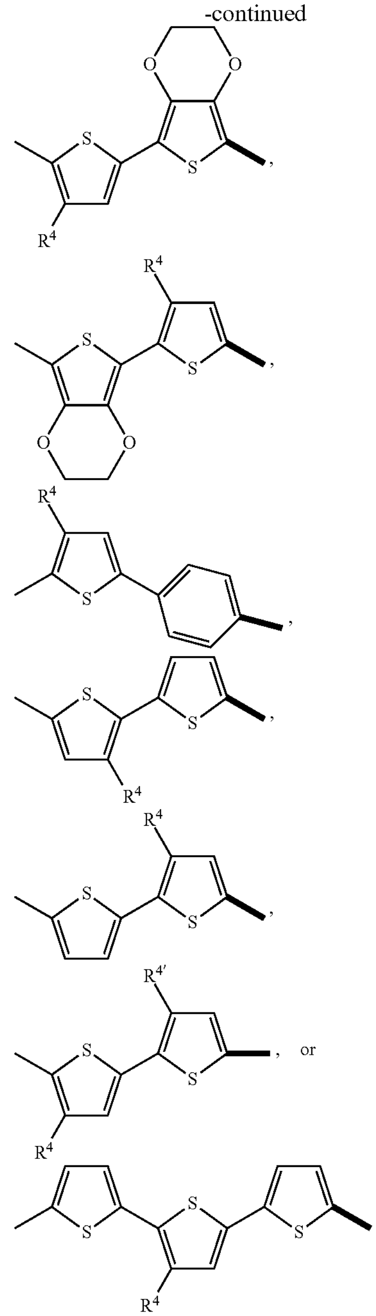

wherein ▬ indicates the bond to the diketopyrrolopyrrole skeleton, and $R^1$ and $R^2$ are as defined above.

$R^1$ and $R^2$ can be hydrogen, but are preferably different from hydrogen.

$R^1$ and $R^2$ can be different, but are preferably the same. Preferably, $R^1$ and $R^2$ independently from each other stand for $C_1$-$C_{100}$alkyl, $C_5$-$C_{12}$cycloalkyl, which can be substituted one to three times with $C_1$-$C_8$alkyl and/or $C_1$-$C_8$alkoxy, phenyl or 1- or 2-naphthyl which can be substituted one to three times with $C_1$-$C_8$alkyl and/or $C_1$-$C_8$alkoxy, or —$CR^{101}R^{102}$—$(CH_2)_u$-$A^3$, wherein $R^{101}$ and $R^{102}$ stand for hydrogen, or $C_1$-$C_4$alkyl, $A^3$ stands for phenyl or 1- or 2-naphthyl, which can be substituted one to three times with $C_1$-$C_8$alkyl and/or $C_1$-$C_8$alkoxy, and u stands for 0, 1, 2 or 3. $R^1$ and $R^2$ are more preferably a $C_1$-$C_{36}$alkyl group, such as methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, especially n-dodecyl, tridecyl, tetradecyl, pentadecyl, hexadecyl, 2-ethyl-hexyl, 2-butyl-hexyl, 2-butyloctyl, 2-hexyldecyl, 2-decyl-tetradecyl, heptadecyl, octadecyl, eicosyl, heneicosyl, docosyl, or tetracosyl. In a particularly preferred embodiment of the present invention $R^1$ and $R^2$ are a 2-hexyldecyl, or 2-decyl-tetradecyl group.

Advantageously, the groups $R^{1'}$ and $R^{2'}$ can be represented by formula

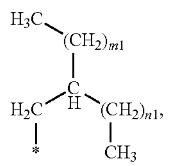

wherein m1=n1+2 and m1+n1≤24. Chiral side chains, such as $R^{1'}$ and $R^{2'}$, can either be homochiral, or racemic, which can influence the morphology of the polymers.

As indicated by the formula

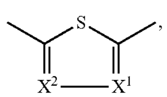

the group

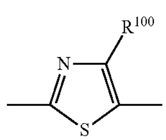

can be arranged in the polymer chain in two ways

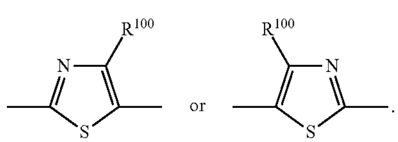

The notation

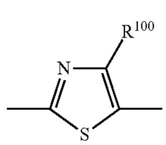

should comprise both possibilities. The same applies for other groups, which can be arranged in different ways in the monomer and/or polymers.

$Ar^1$ and $Ar^{1'}$ are preferably a group of formula

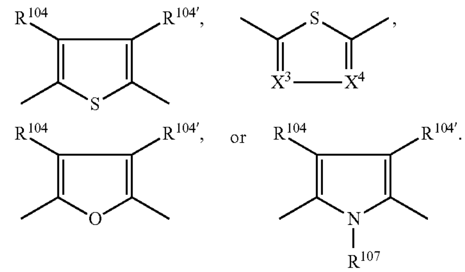

If -$COM^1$- is derived from a group of formula

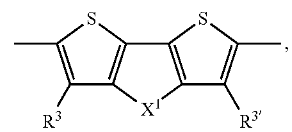

it is preferably a repeating unit of formula (Xa)

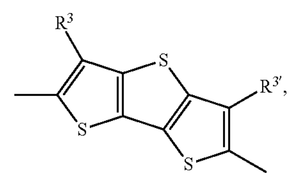

(Xb)

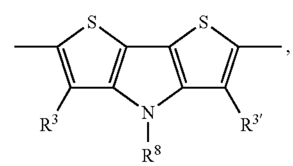

(Xc)

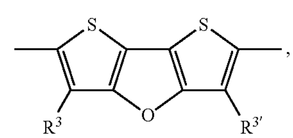

(Xd)

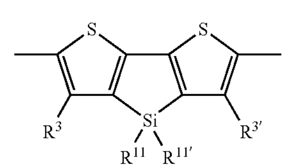

(Xe)

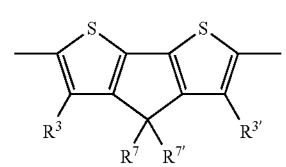

(Xf)

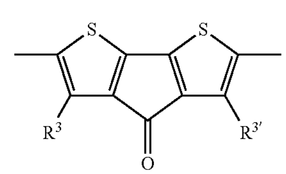

-continued (Xg)

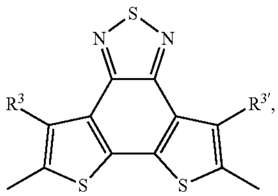

(Xh)

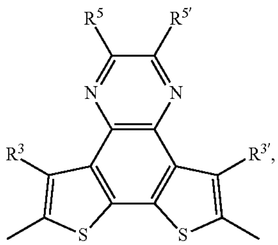

(Xi)

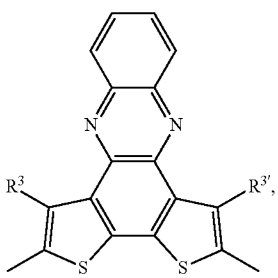

(Xj)

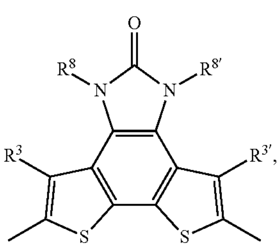

(Xk)

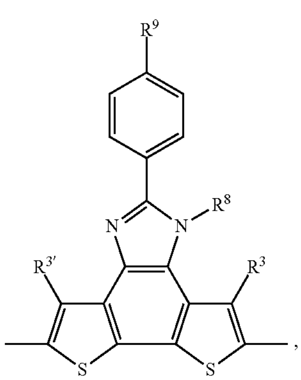

-continued (Xl)

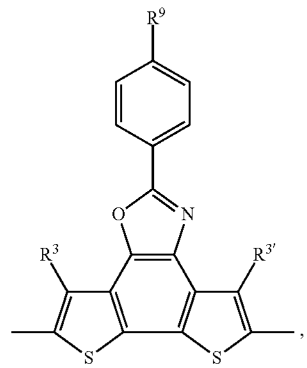

or (Xm)

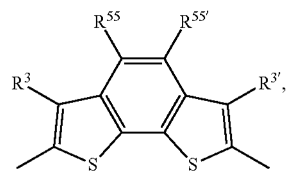

wherein $R^3$, $R^{3'}$, $R^5$, $R^{5'}$, $R^{55}$, $R^{55'}$, $R^7$, $R^{7'}$, $R^8$, $R^{8'}$, $R^{11}$ and $R^{11'}$ are as defined above and $R^9$ is $C_1$-$C_{25}$alkyl, which may optionally be interrupted by one or more oxygen or sulphur atoms, $C_1$-$C_{25}$ perfluoroalkyl, $C_1$-$C_{25}$alkoxy, or CN. Groups of formula Xe to Xl are preferred, groups of formula Xd, Xe, Xf, Xg, Xh and Xk are more preferred, groups of formula Xd, Xe, Xh and Xk are most preferred.

In a preferred embodiment of the present invention -COM$^1$- is a group of formula Xm, wherein $R^3$ and $R^{3'}$ are hydrogen, and $R^{55}$ and $R^{55'}$ are hydrogen, $C_1$-$C_{18}$alkoxy, or $C_1$-$C_{18}$alkoxy, which is interrupted by O; $R^3$ and $R^{3'}$ are different from hydrogen, and $R^{55}$ and $R^{55'}$ are as defined above.

If -COM$^1$- is derived from a group of formula

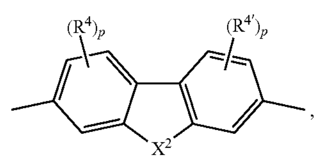

it is preferably a repeating unit of formula (XIa)

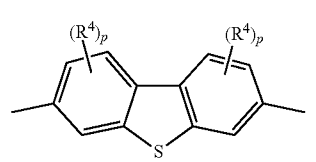

(XIb)

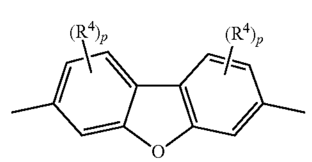

-continued
(XIc)
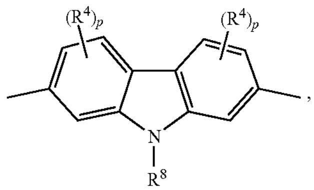
(XId)
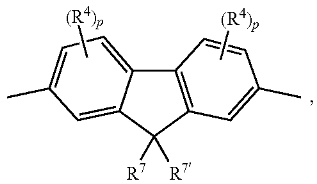
(XIe)
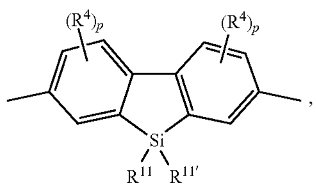
(XIf)
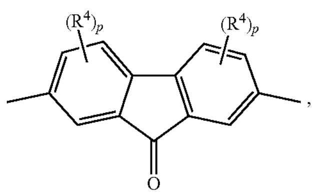
(XIg)
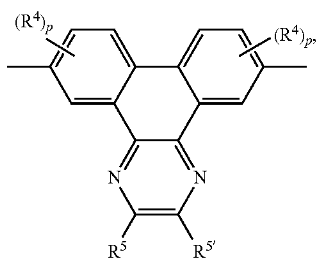
(XIh)
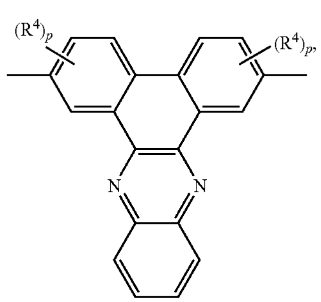
-continued
(XIi)
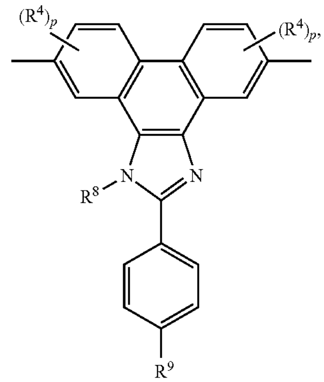
(XIj)
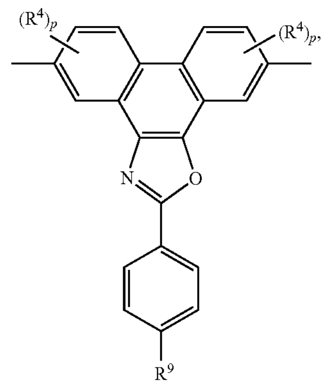
(XIk)
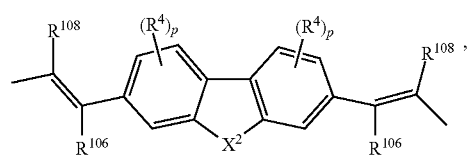
especially
(XIl)
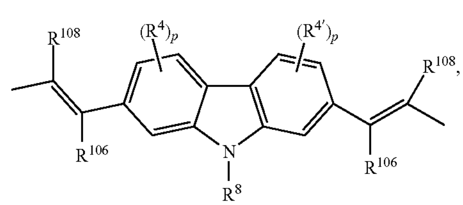
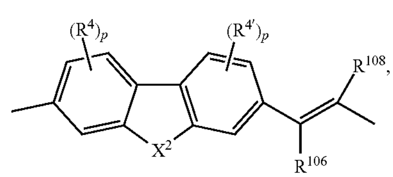

especially (XIm)

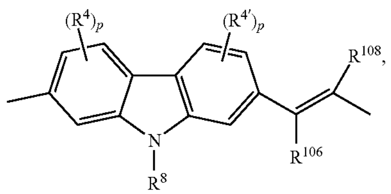

or

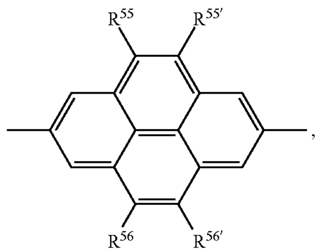

wherein $R^{56}$ and $R^{56'}$ independently of each other have the meaning of $R^{55}$, p, $X^2$, $R^4$, $R^5$, $R^{5'}$, $R^7$, $R^{7'}$, $R^8$, $R^{106}$, $R^{108}$, $R^{11}$ and $R^{11'}$ are as defined above and $R^9$ is $C_1$-$C_{25}$alkyl, which may optionally be interrupted by one or more oxygen or sulphur atoms, $C_1$-$C_{25}$ perfluoroalkyl, $C_1$-$C_{25}$alkoxy, or CN.

Groups of formula XIk and XIl are less preferred.

In a preferred embodiment of the present invention $COM^1$ is a group of formula XIc, wherein $R^8$ is $C_6$-$C_{18}$aryl which is substituted by $C_1$-$C_{18}$alkyl, or $C_1$-$C_{18}$alkoxy; linear $C_1$-$C_{25}$alkyl, especially linear $C_4$-$C_{25}$alkyl, which may optionally be interrupted by one or more oxygen or sulphur atoms; or $C_7$-$C_{25}$arylalkyl, $R^4$ and p are as defined above; or $R^8$ and $R^4$ are as defined above and p is 1, 2, or 3, especially 1.

If $COM^1$ is a group of formula XIc, or XId and $Ar^1$ and $Ar^{1'}$

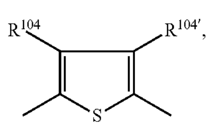

or

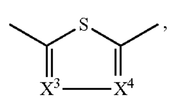

b and b' are different from 0 and $Ar^1$ and $Ar^{1'}$ are preferably

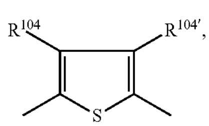

or

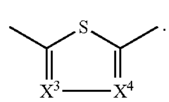

If $COM^1$ is a group of formula Xe, or XId, $R^7$ and $R^{7'}$ are preferably $C_1$-$C_{25}$alkyl, such as methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl.

Groups of formula XIa, XIb, XIe, XIf, XIg, XIh, XIi, XIj and XIm are preferred, groups of formula XIg and XIi are most preferred. -$COM^2$- is preferably a repeating unit of formula

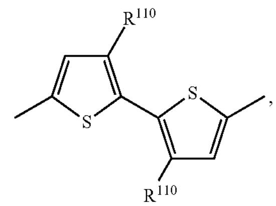

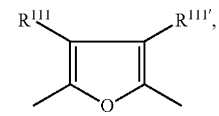

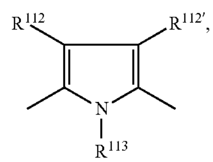

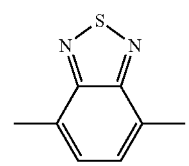

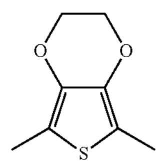

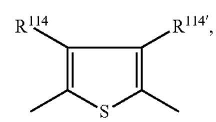

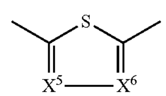

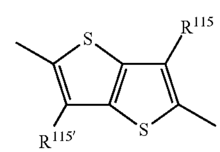

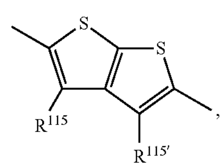

or

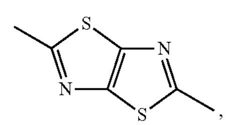

wherein one of $X^5$ and $X^6$ is N and the other is $CR^{114}$, $R^{110}$ is a $C_1$-$C_{25}$alkyl group, especially a $C_4$-$C_{25}$alkyl, $R^{111}$, $R^{111'}$, $R^{112}$ and $R^{112'}$ are independently of each other hydrogen, or a $C_1$-$C_{25}$alkyl group, especially a $C_4$-$C_{25}$alkyl, $R^{113}$ is $C_6$-$C_{18}$aryl; $C_6$-$C_{18}$aryl which is substituted by $C_1$-$C_{18}$alkyl, or $C_1$-$C_{18}$alkoxy; or $C_1$-$C_{18}$alkyl;

$R^{114}$, $R^{114'}$, $R^{115}$ and $R^{115'}$ are independently of each other H, or a $C_1$-$C_{25}$alkyl group, especially a $C_6$-$C_{25}$alkyl.

In a preferred embodiment of the present invention A is a group of formula

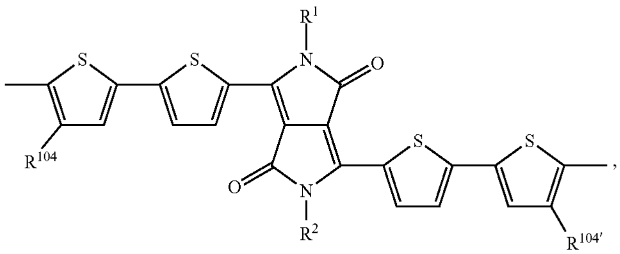
(Ia)
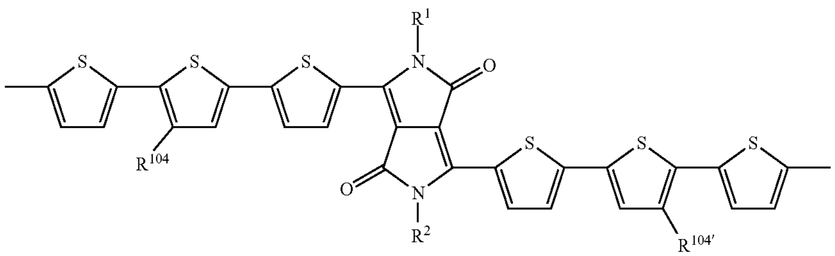
(Ib)
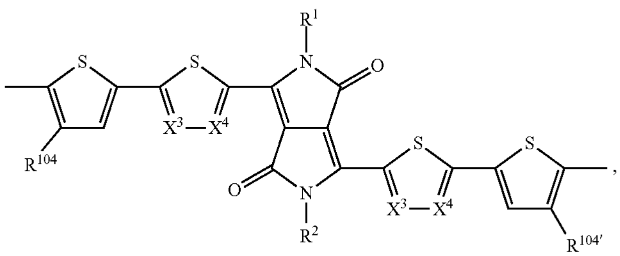
(Ic)
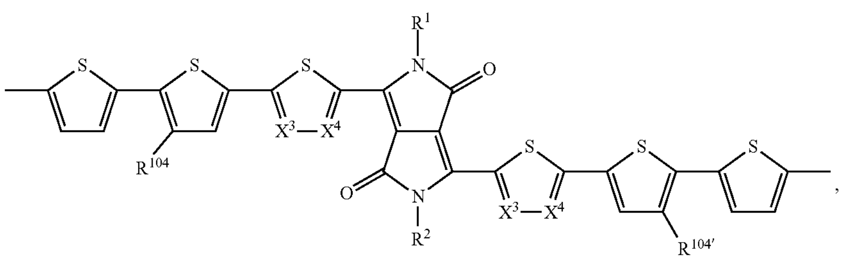
(Id)
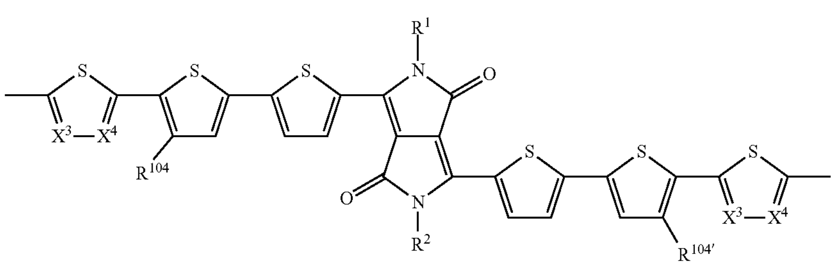
(Ie)
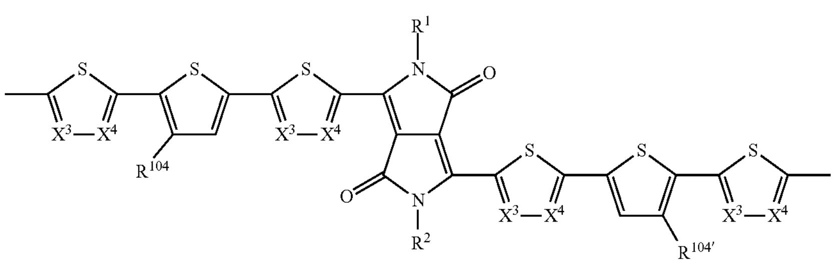
(If)

-continued
(Ig)
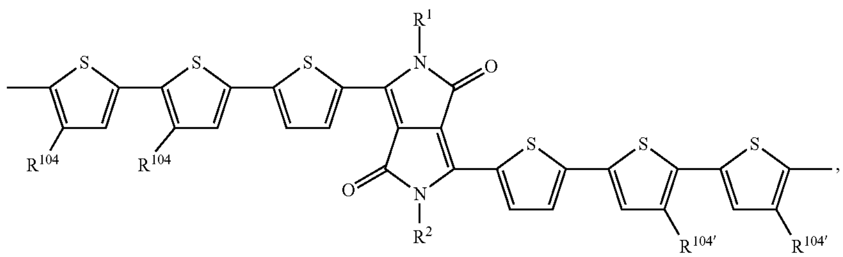
(Ih)
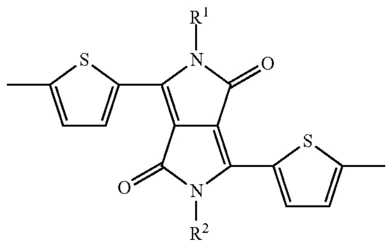
(Ii)
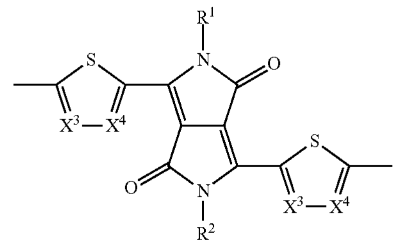
(Ij)
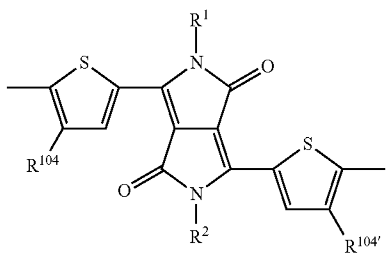
(Ik)
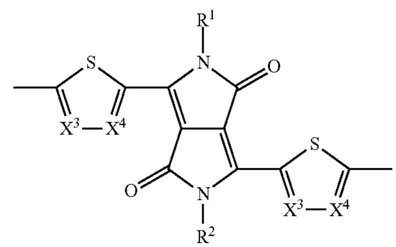
(Il)
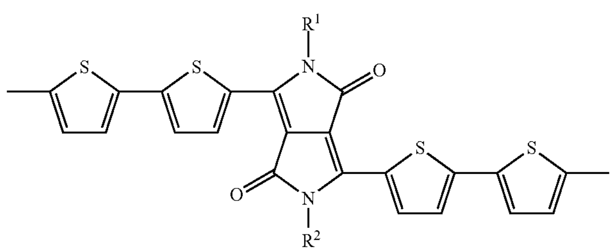
(Im)
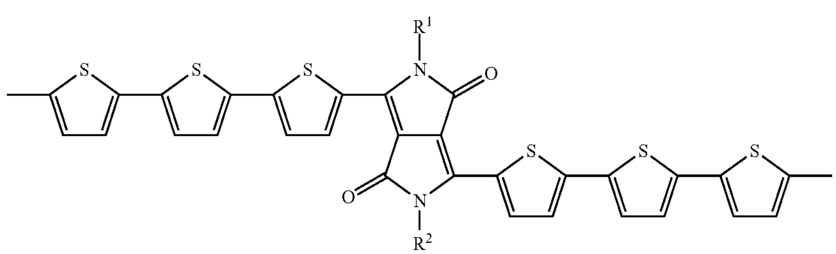
(In)
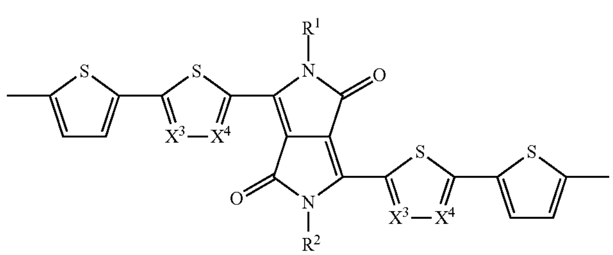

-continued
(Io)
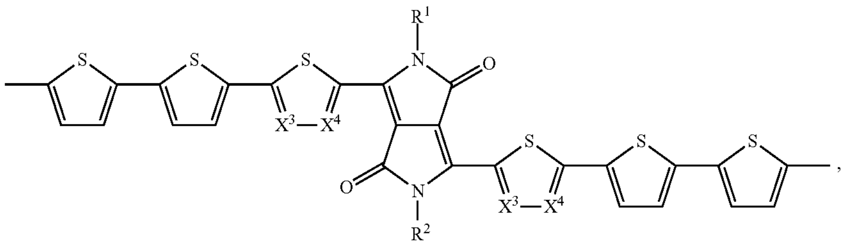
(Ip)
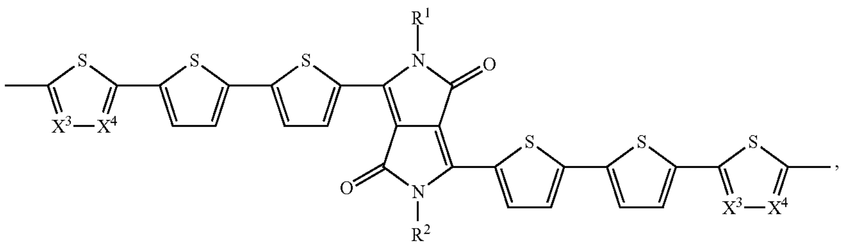
(Iq)
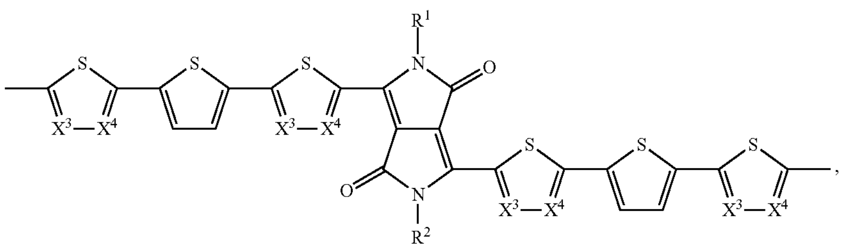
(Ir)
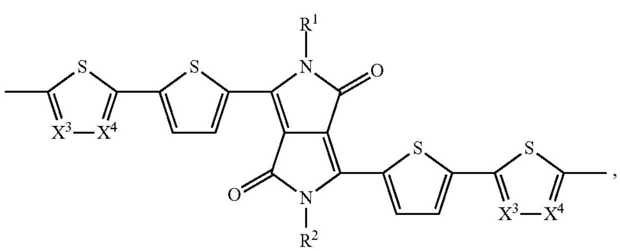
(Is)
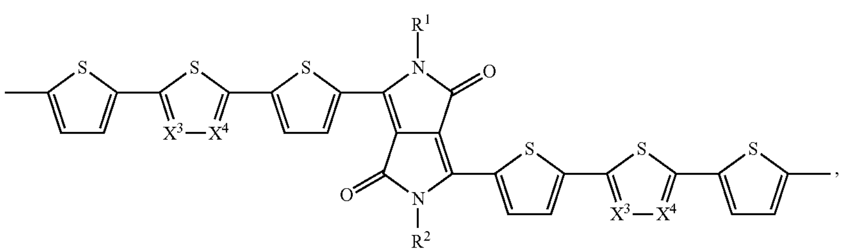
(It)
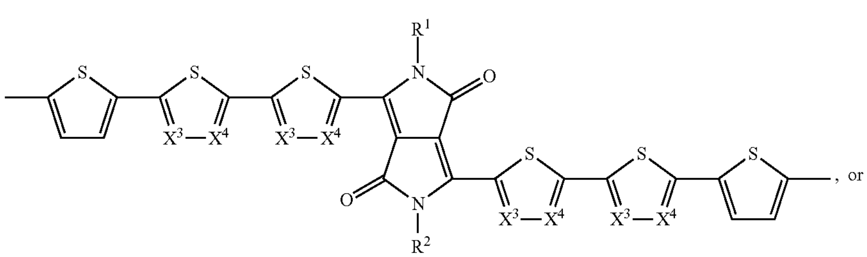

-continued (Iu)

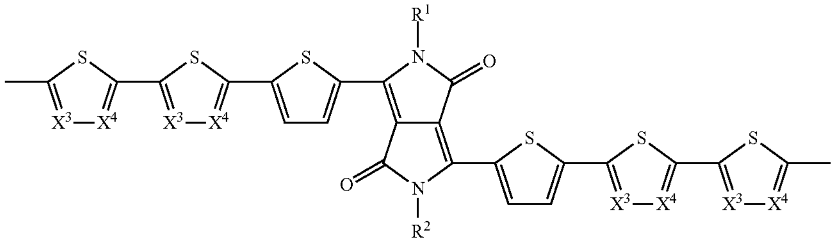

wherein $X^3$, $X^4$, $R^1$ and $R^2$ are as defined above, and $R^{104}$ and $R^{104'}$ are independently of each other hydrogen, or a $C_1$-$C_{25}$alkyl group, especially a $C_4$-$C_{25}$alkyl, which may optionally be interrupted by one or more oxygen or sulphur atoms, $C_7$-$C_{25}$arylalkyl, or a $C_1$-$C_{25}$alkoxy group.

A is preferably a group of formula Ia, Ih, or Il, wherein $R^1$ and $R^2$ can be different, but are preferably the same and are a $C_1$-$C_{35}$alkyl group, and $R^{104}$ and $R^{104'}$ are H, or a $C_1$-$C_{25}$alkyl group.

In a preferred embodiment of the present invention the polymer is a copolymer of the formula *-[A]-* and *-[COM$^1$]-* (IV), especially $$*\!-\!\!\left[A-COM^1\right]_n\!\!-\!*, \qquad (IVa)$$

wherein n is 4 to 1000, especially 4 to 200, very especially 5 to 100,

A is a group of formula Ia to Iu as defined above, and $COM^1$ is a group of formula Xa to Xm as defined in claim 2, or a group of formula XIa to XIm as defined above.

A, $COM^1$ and $COM^2$ are different from each other. If the polymers comprise repeating units of the formula *-[A-COM$^1$]-* and *-[A-COM$^2$]-*, they are preferably (random) copolymers of formula $$*\!-\!\!\left[A-COM^1\right]_x\!\!-\!\!\left[A-COM^2\right]_y\!\!-\!*.$$

If the polymers comprise repeating units of the formula *-[A-COM$^1$]-* and *-[COM$^2$-COM$^2$]-*, they are preferably (random) copolymers of formula $$*\!-\!\!\left[A-COM^1\right]_x\!\!-\!\!\left[COM^1-COM^2\right]_y\!\!-\!*.$$

x=0.995 to 0.005, y=0.005 to 0.995, especially x=0.2 to 0.8, y=0.8 to 0.2, and wherein x+y=1.

In a preferred embodiment of the present invention the polymer is a copolymer of the formula (IIa)

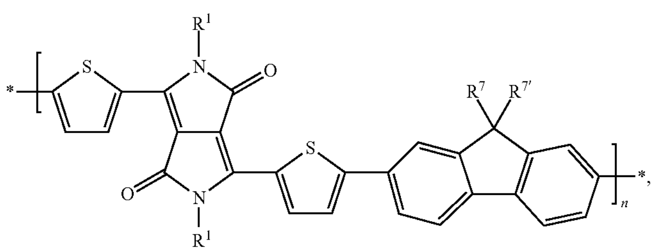

(IIb)

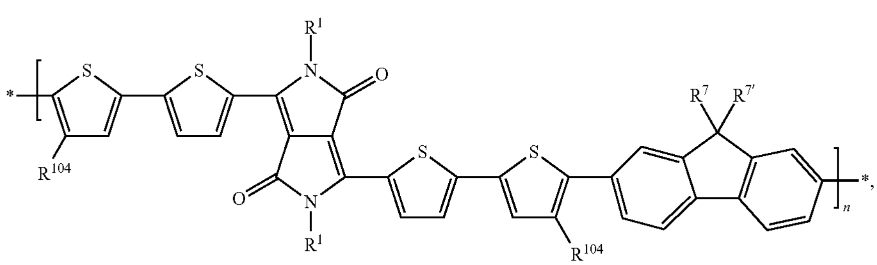

-continued
(IIc)
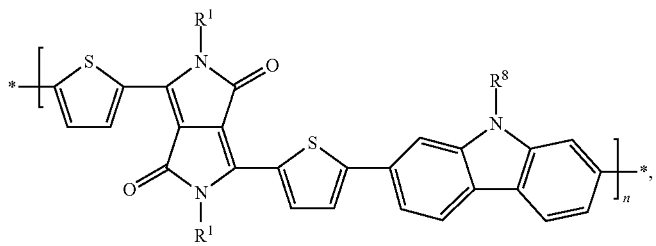
(IId)
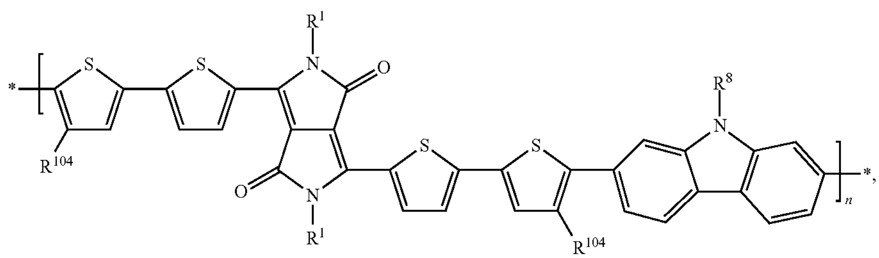
(IIe)
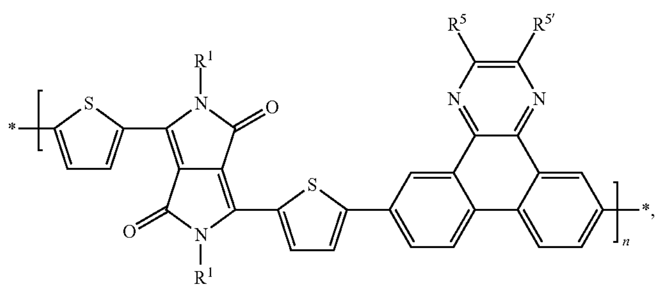
(IIf)
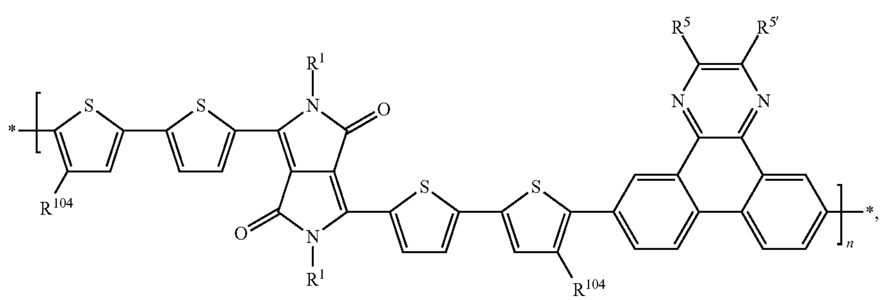
(IIg)
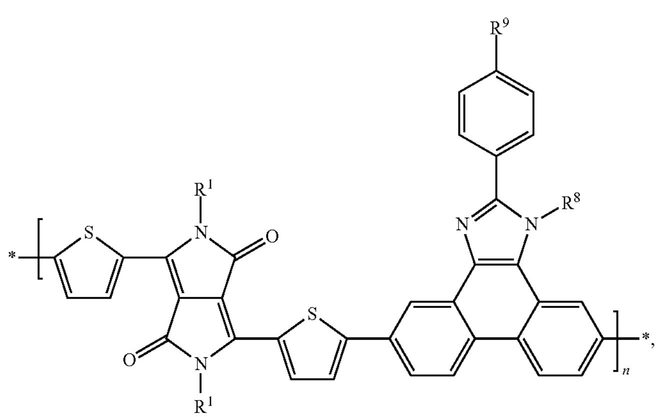

-continued
(IIh)
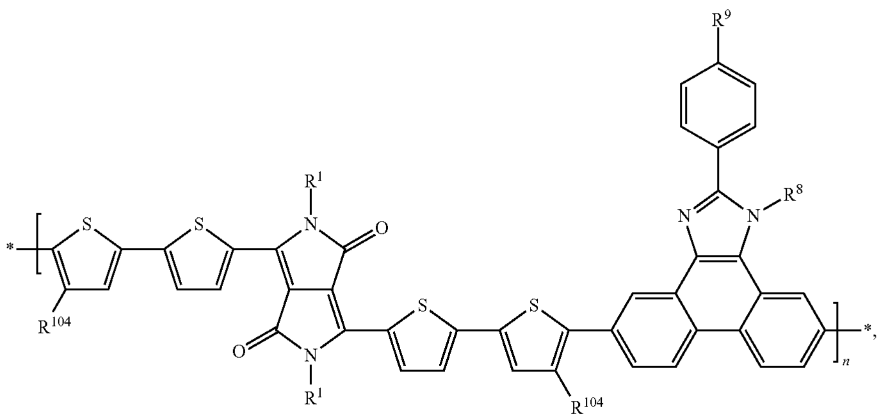
(IIi)
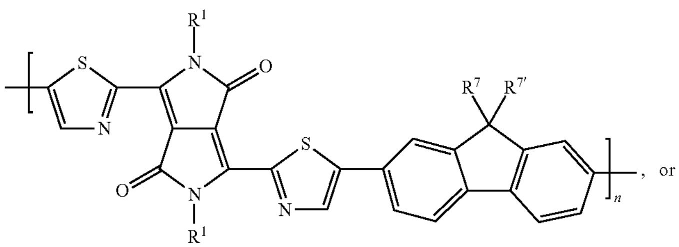
(IIj)
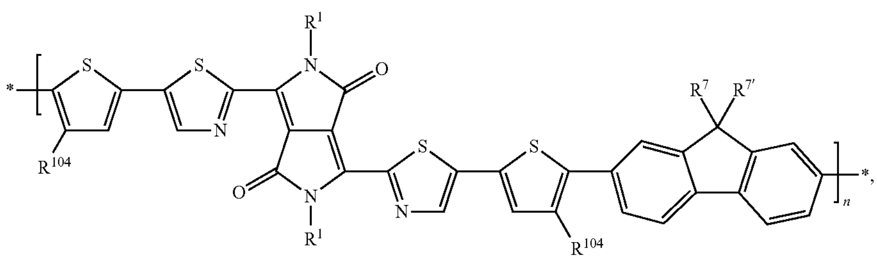
(IIk)
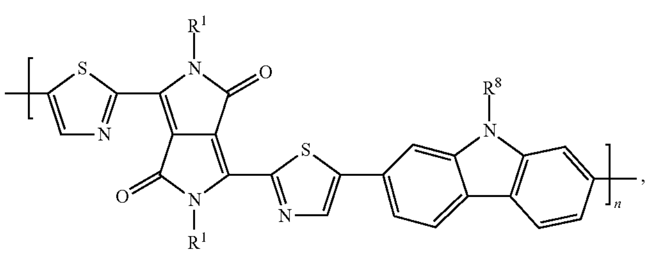
(IIl)
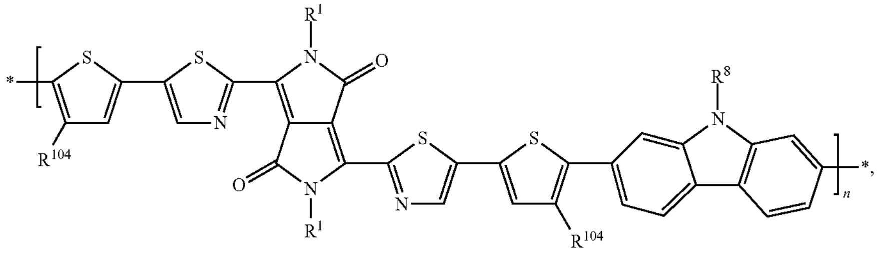

-continued
(IIm)
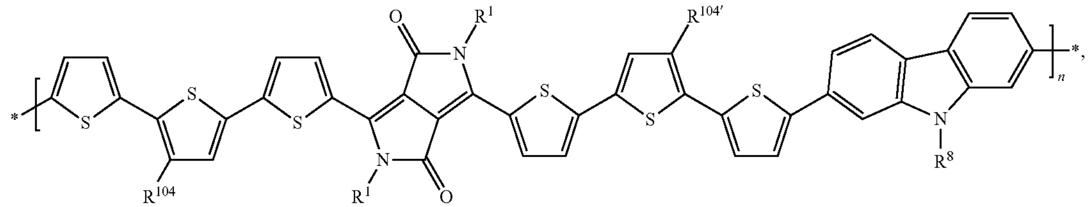
(IIn)
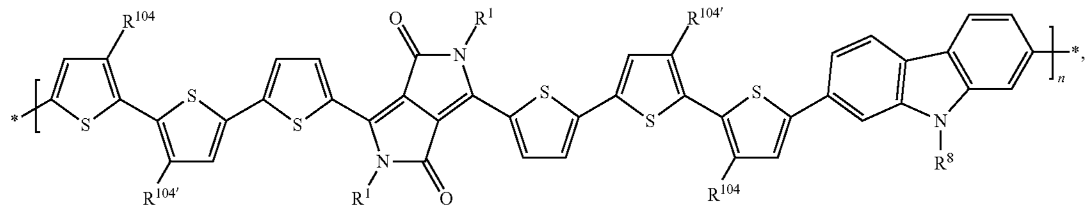
(IIo)
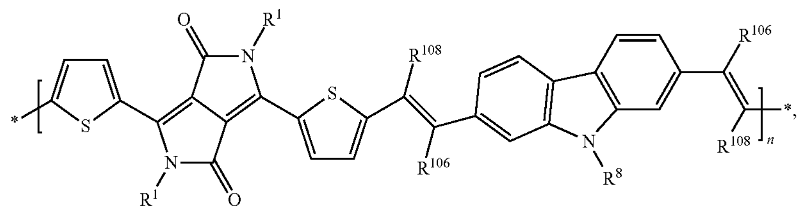
(IIp)
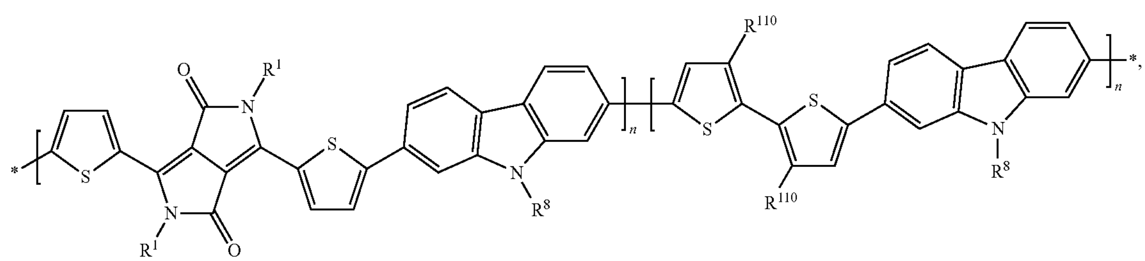
(IIq)
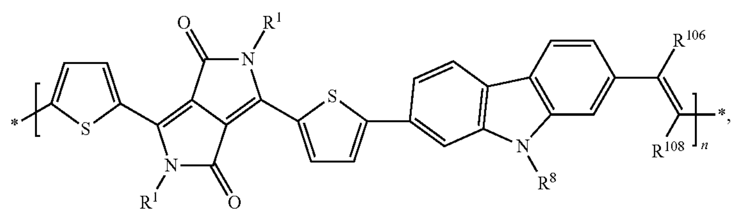
(IIr)
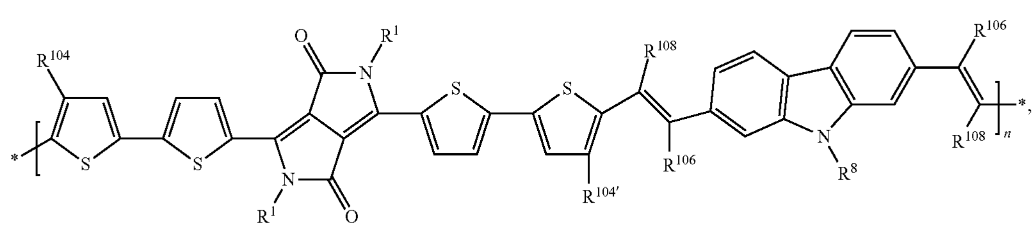

especially
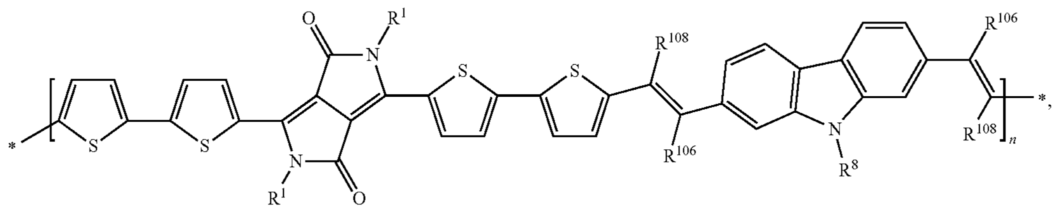
(IIs)
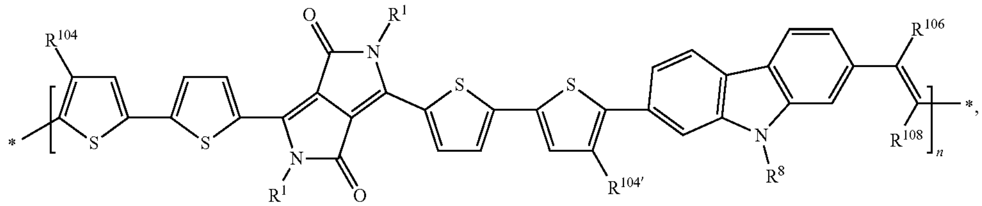
especially
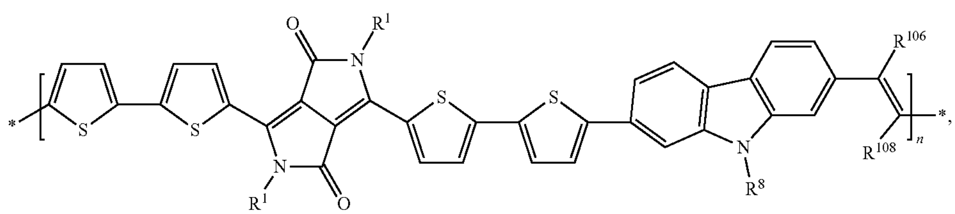
(IIt)
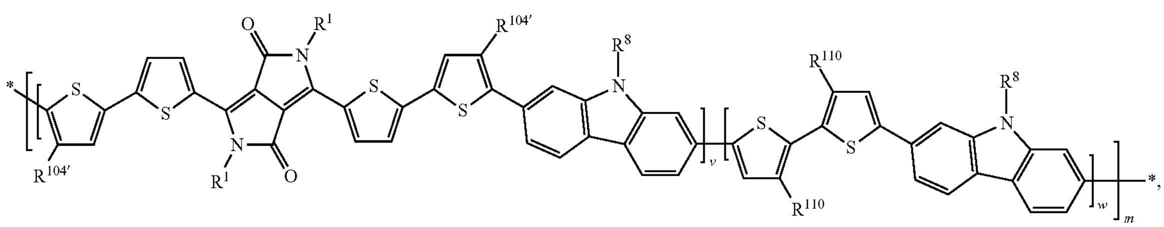
especially
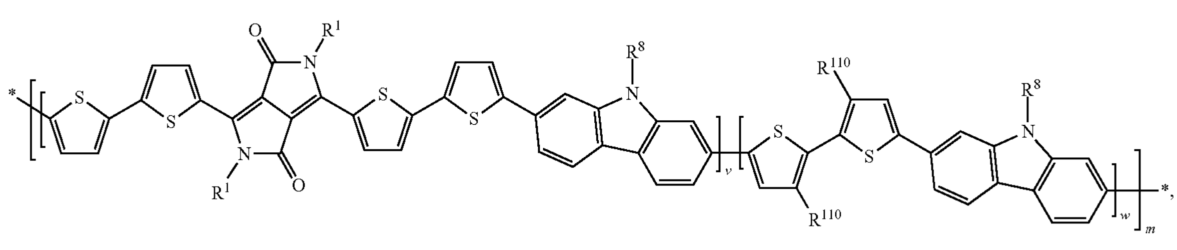
(IIu)
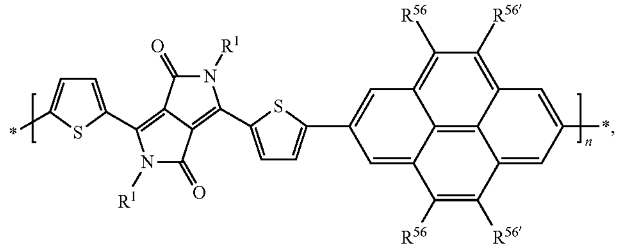

-continued
(IIv)
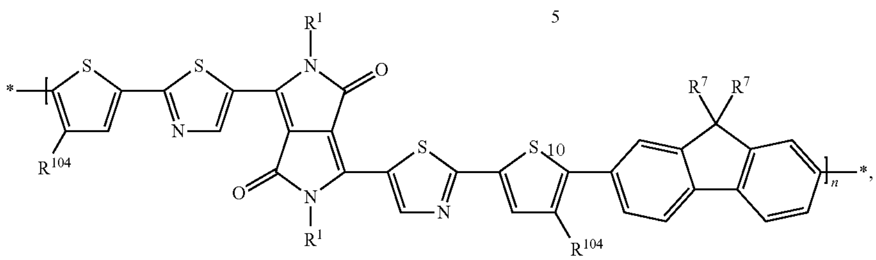
(IIw)
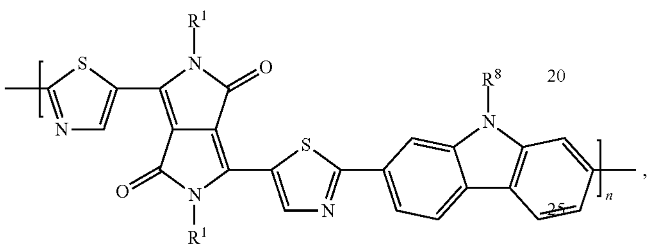
(IIx)
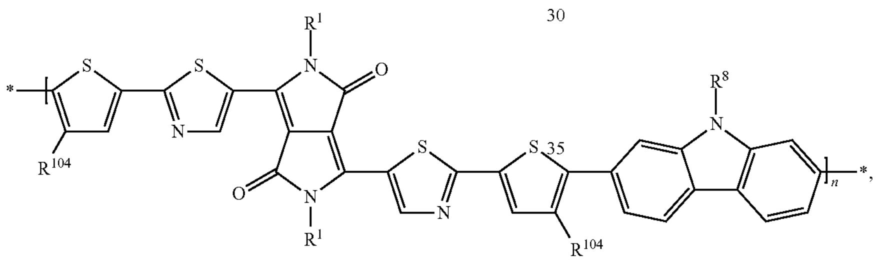
(IIy)
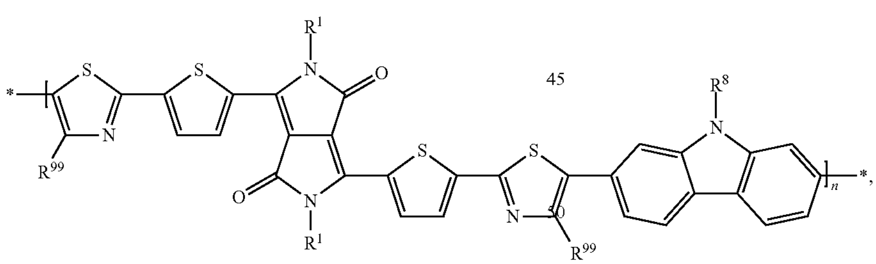
(IIz)
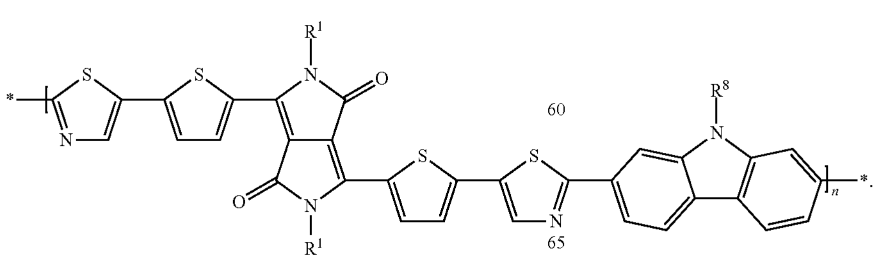

Examples of the polymer of formula IIa are shown below:
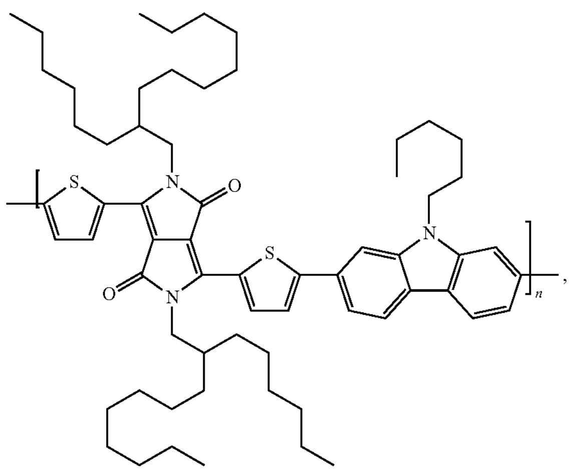
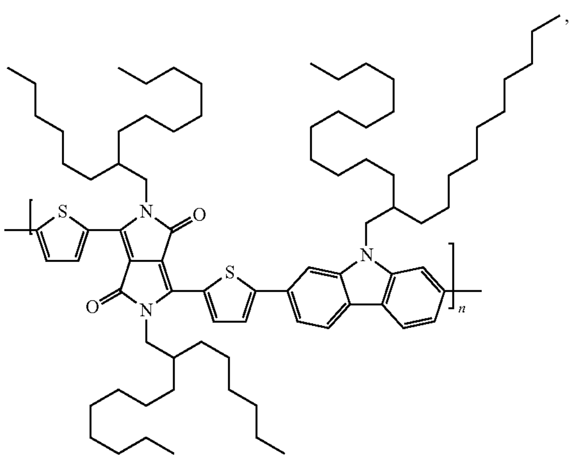
-continued
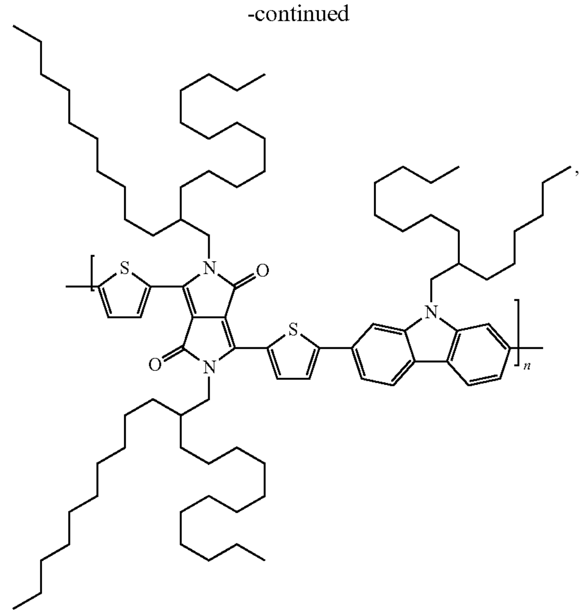
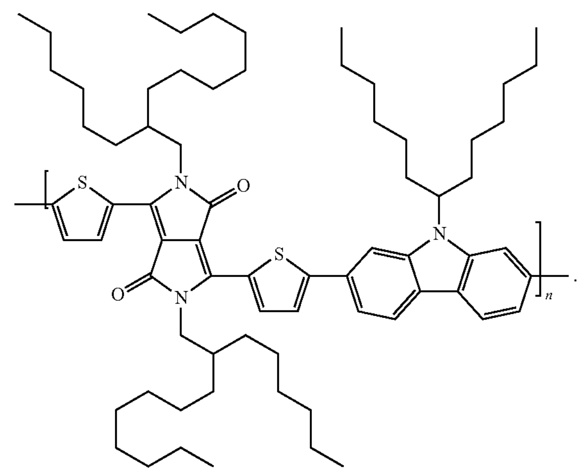
The polymer of formula IId is either a polymer of formula
(IId')
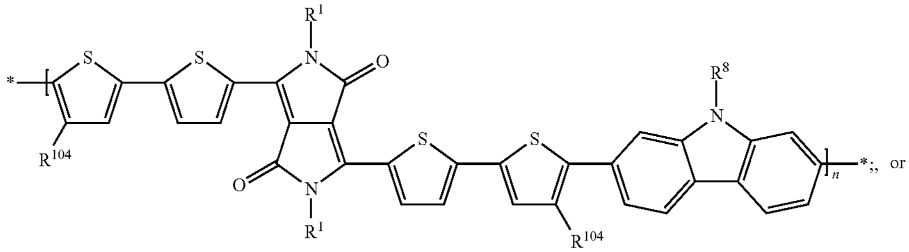
$R^{104} \neq H$ -continued
(IId″)
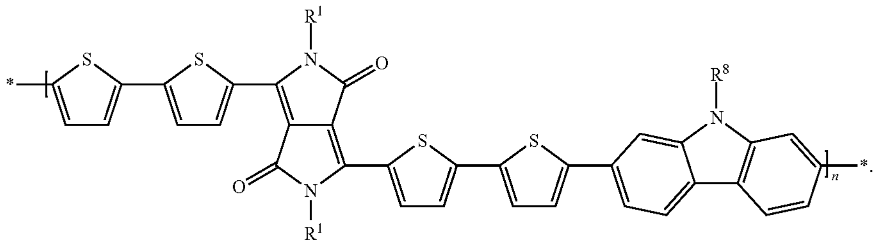
Examples of the polymer of formula IId are shown below:
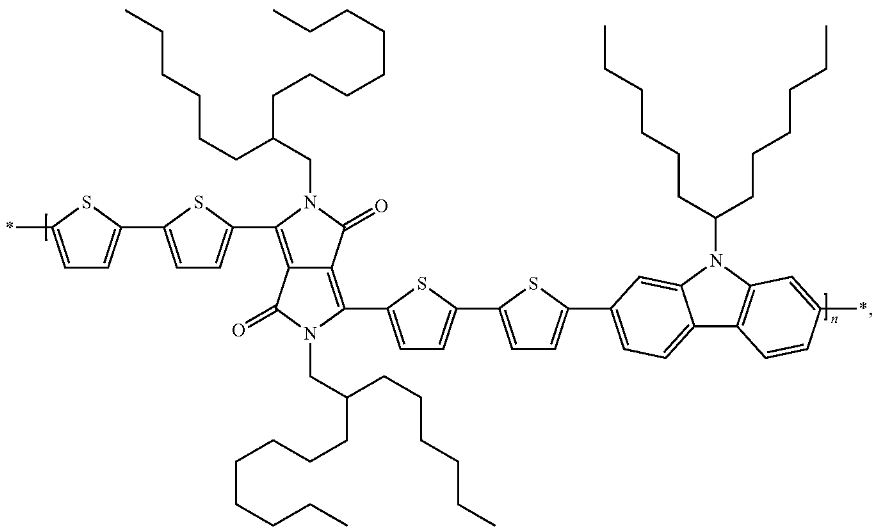
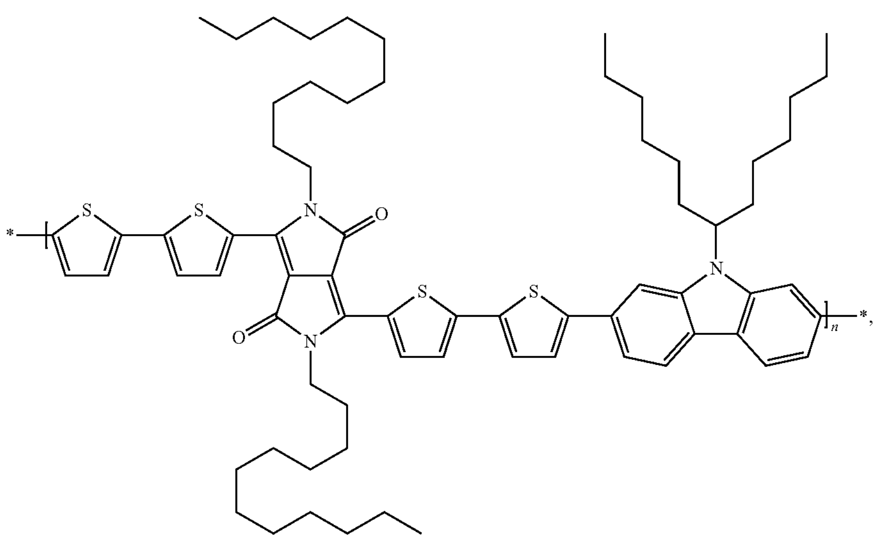

-continued
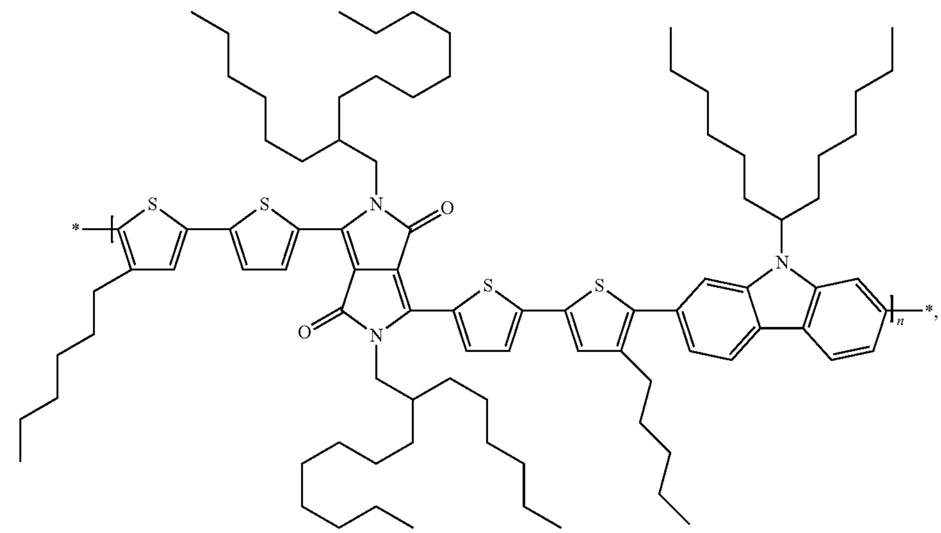
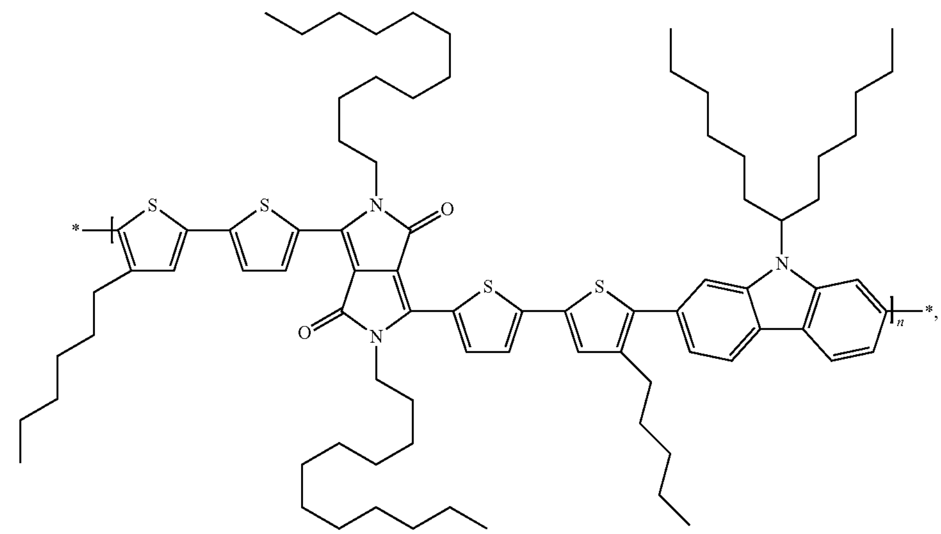
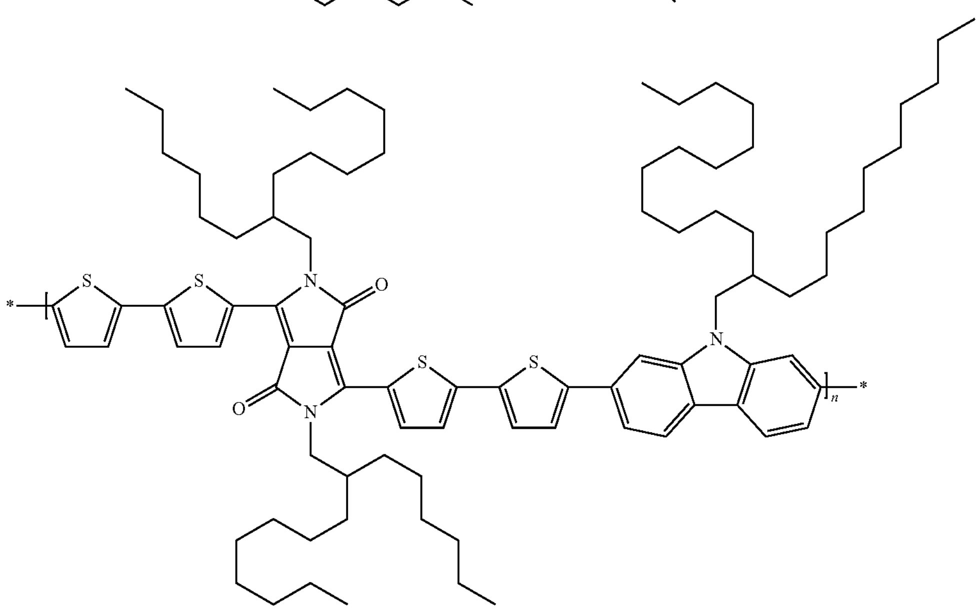
,

-continued
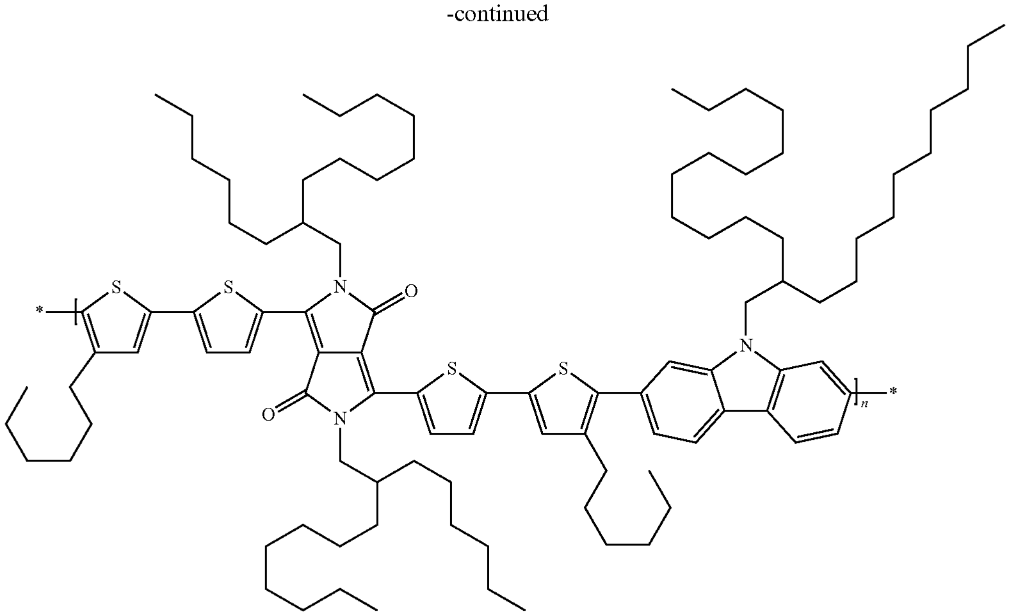
The polymer of formula IIn is preferably a polymer of formula
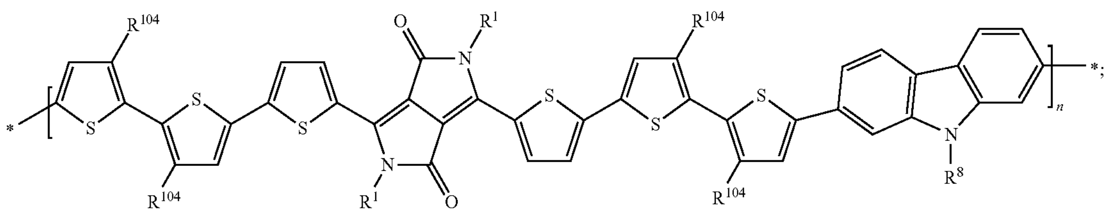
(IIn'
$R^{104} \neq H$).
Examples of the polymer of formula IIn' are shown below:
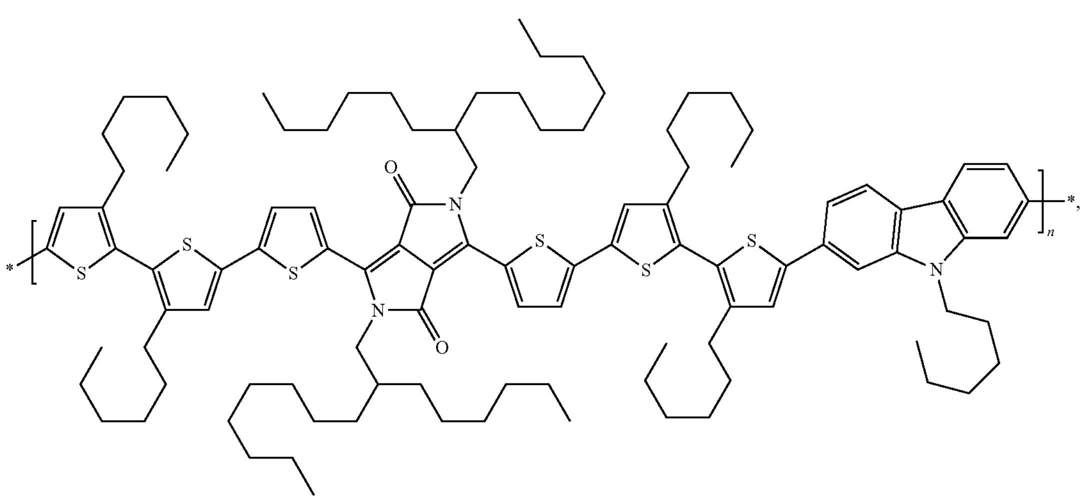

-continued
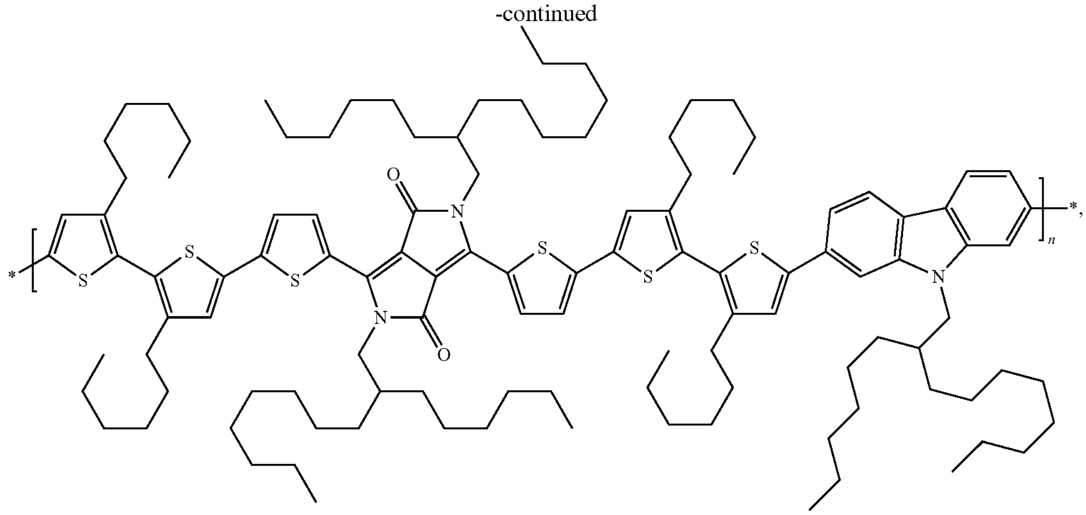
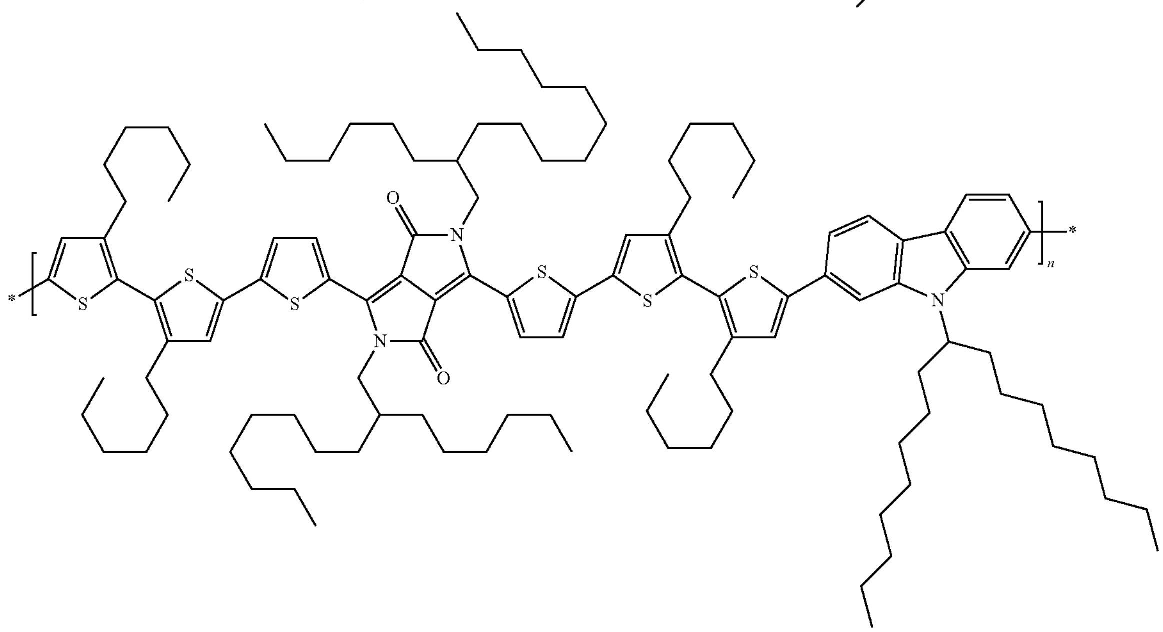
,
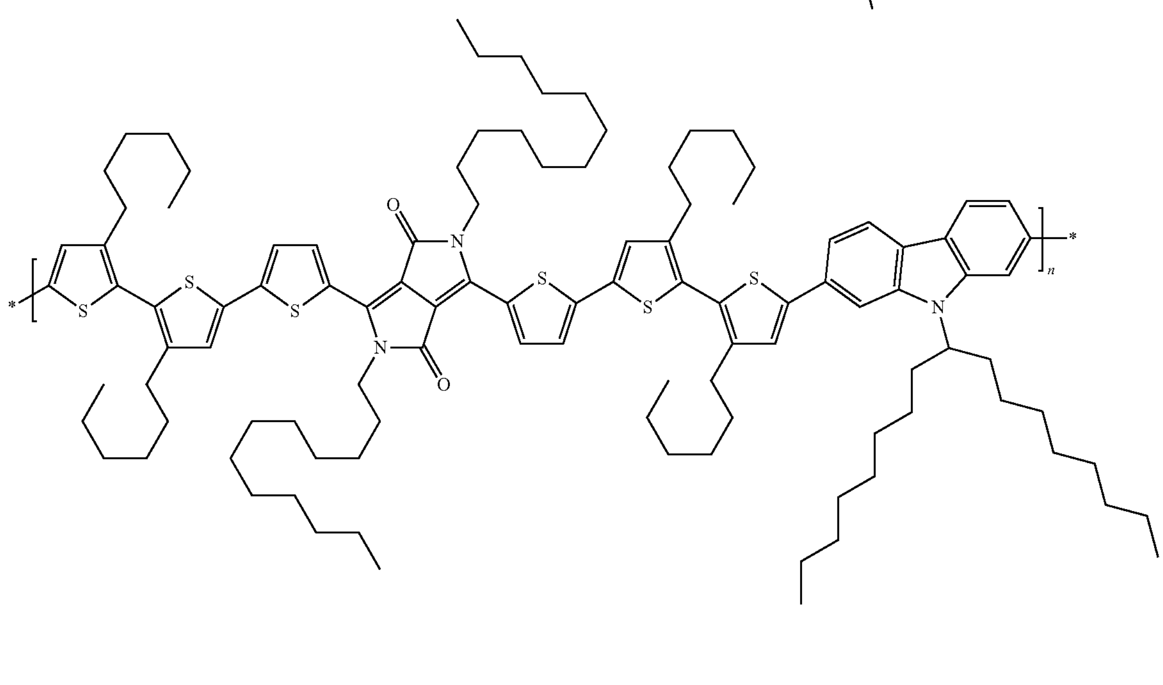
.

Examples of the polymer of formula IIo are shown below:
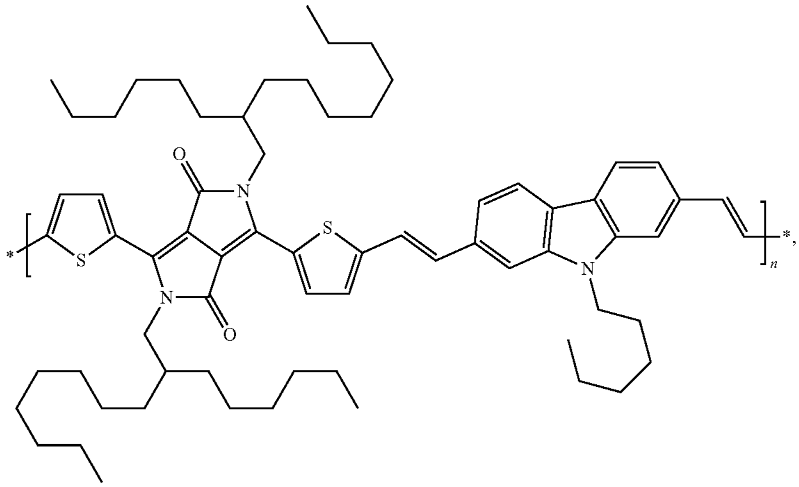
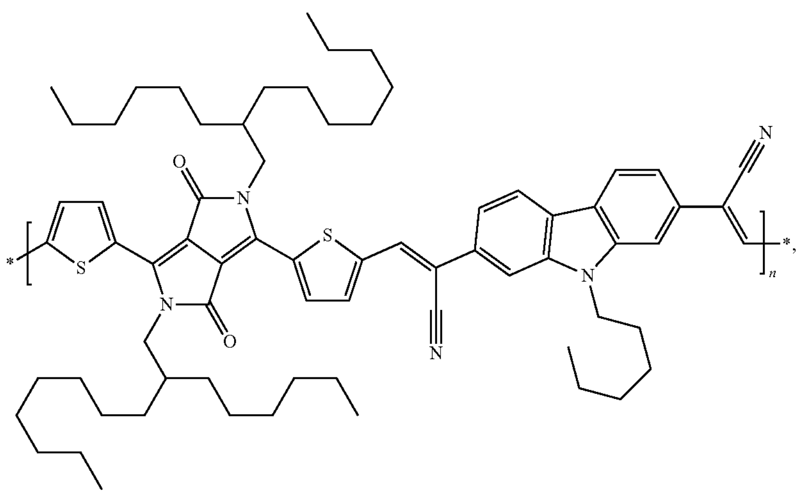
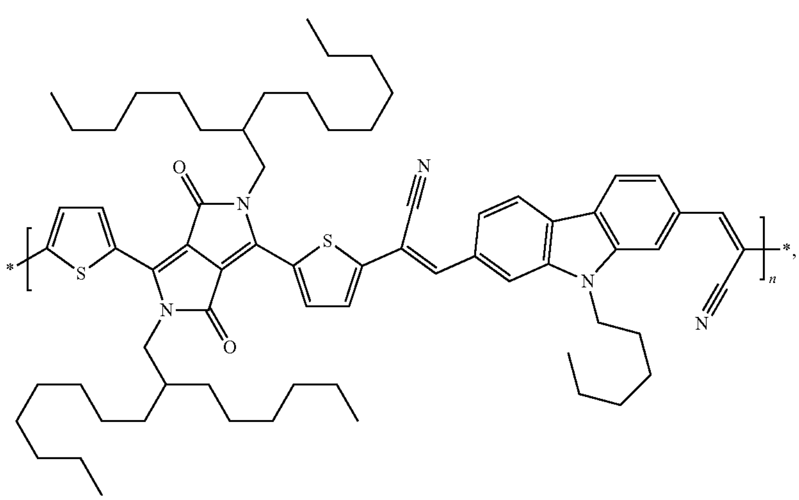

-continued
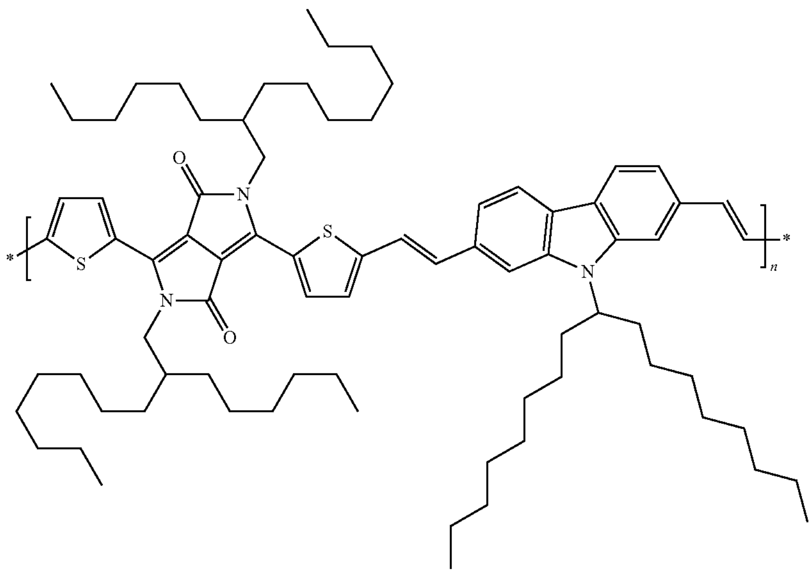
,
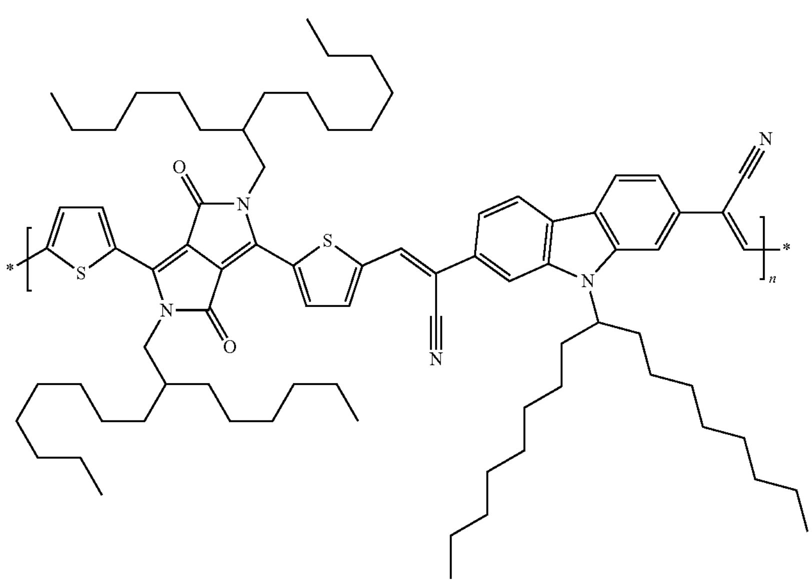
,

-continued
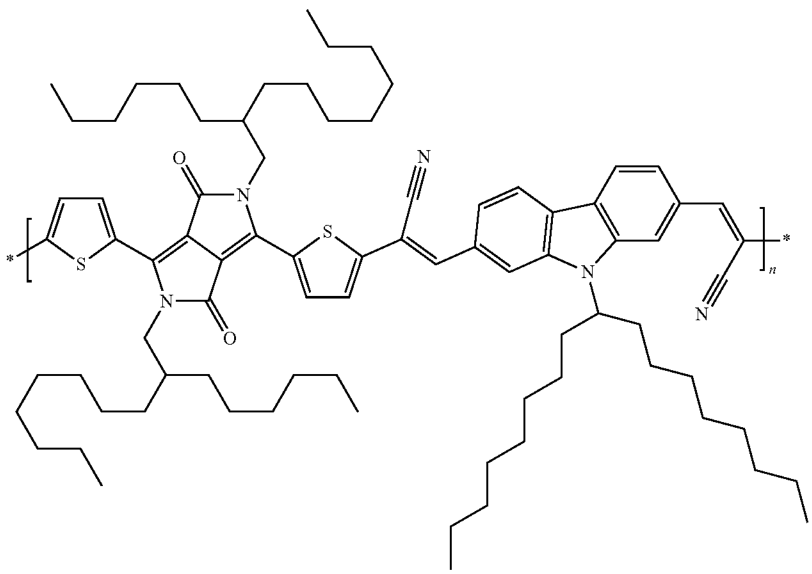
,
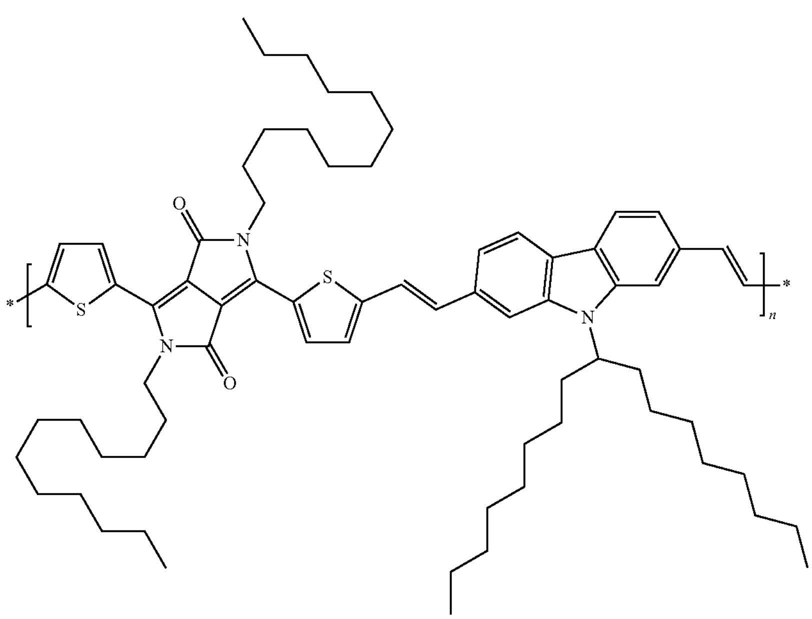
,

Examples of the polymer of formula IIp are shown below:
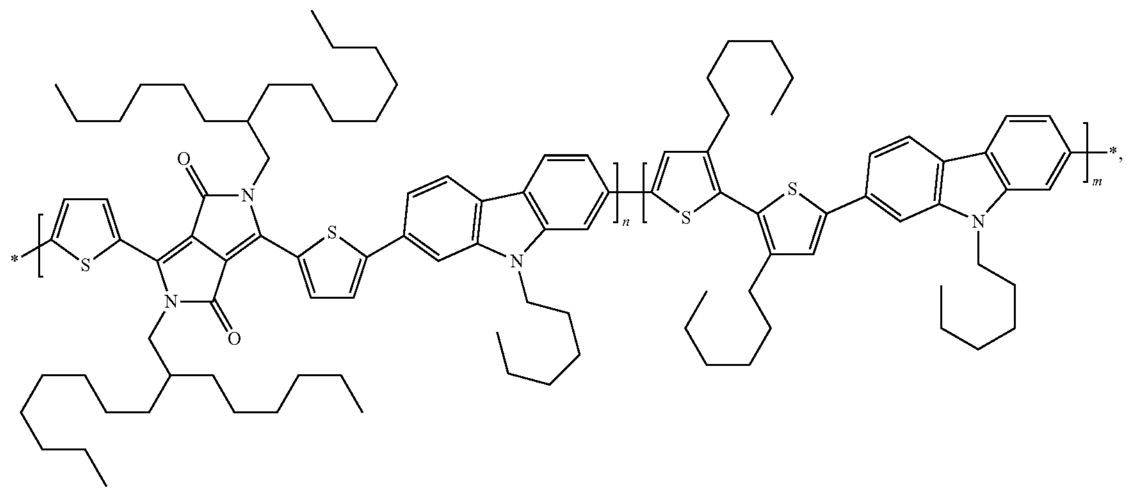
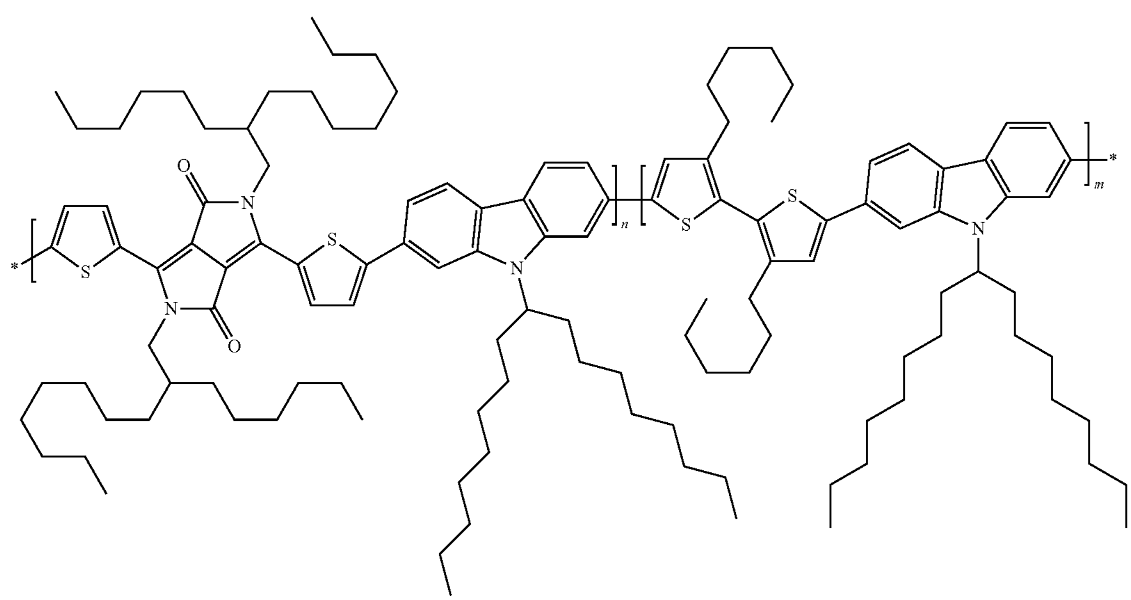
, -continued
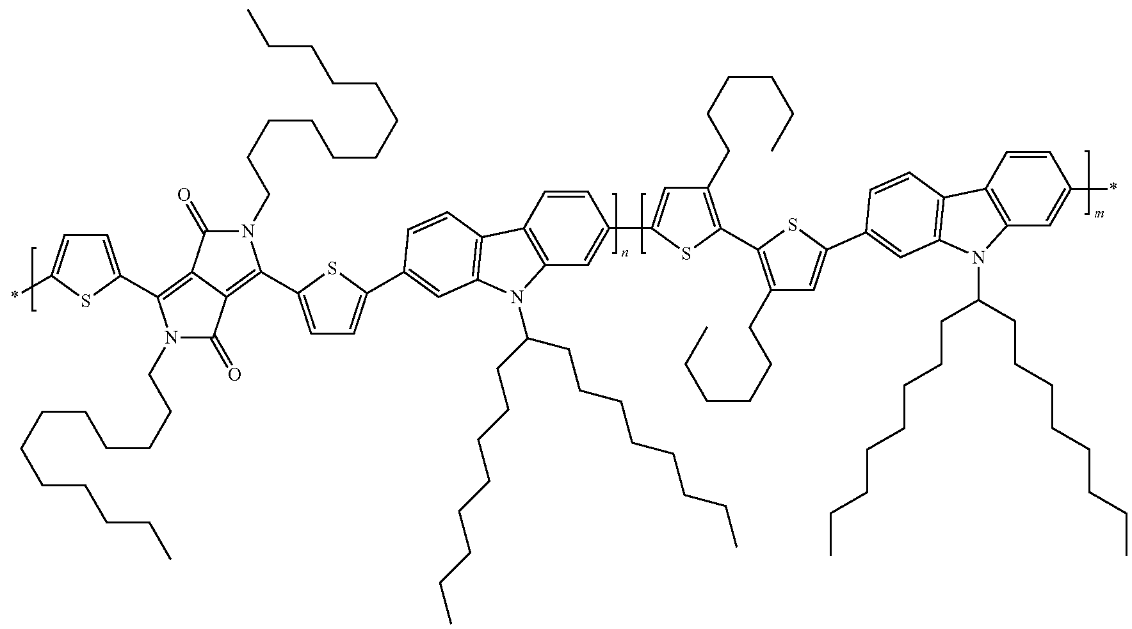
Examples of the polymer of formula IIr are shown below:
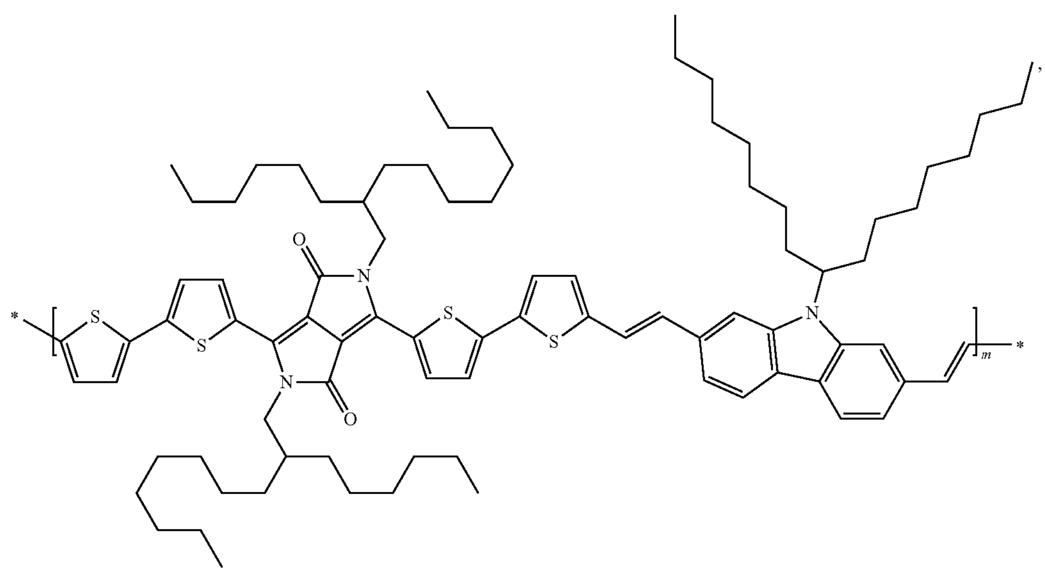

-continued
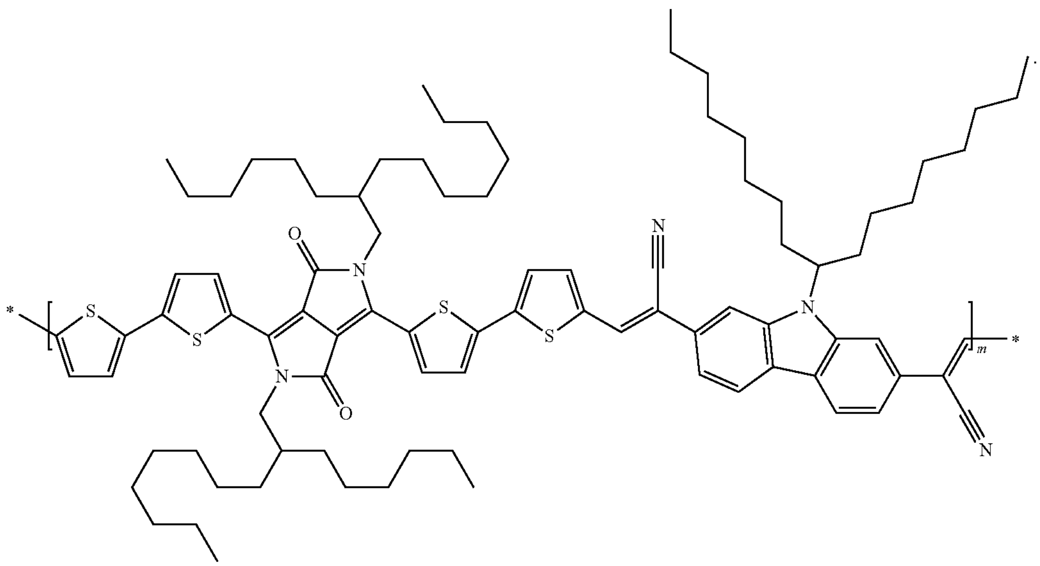
An example of the polymer of formula IIt is shown below:
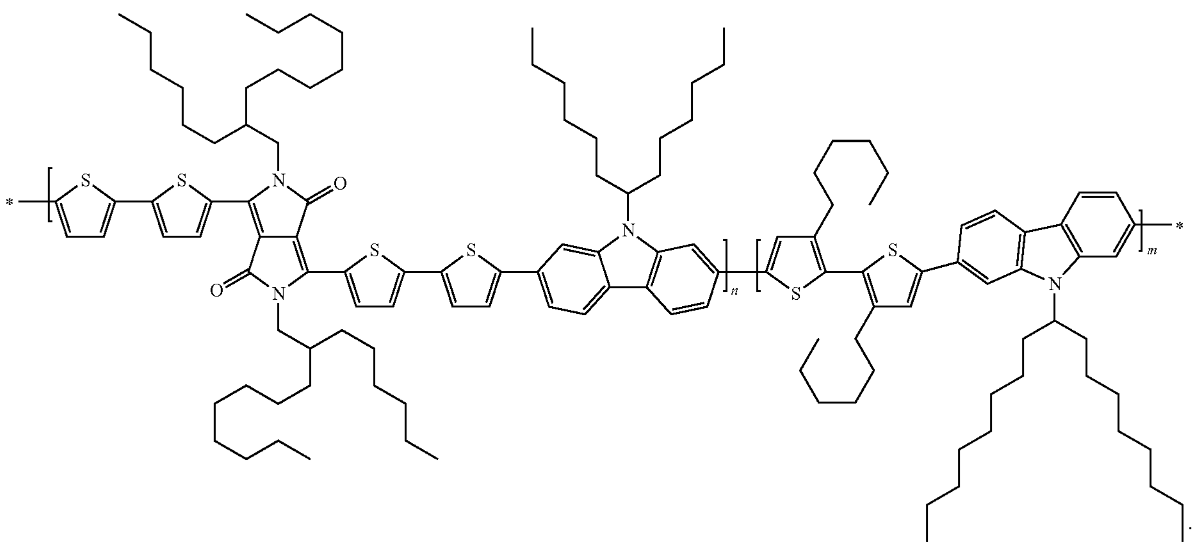
The polymer of formula IIw is preferably a polymer of formula
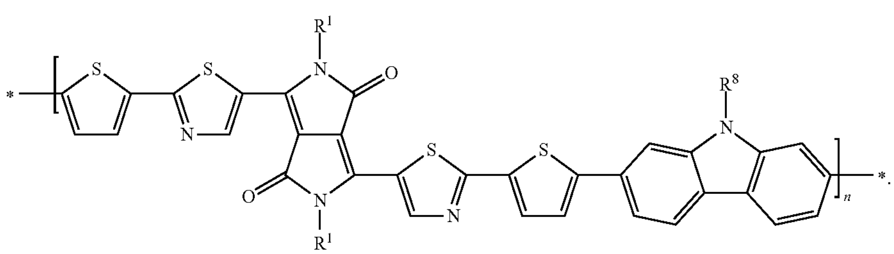

Examples of the polymer of formula IIw are shown below:

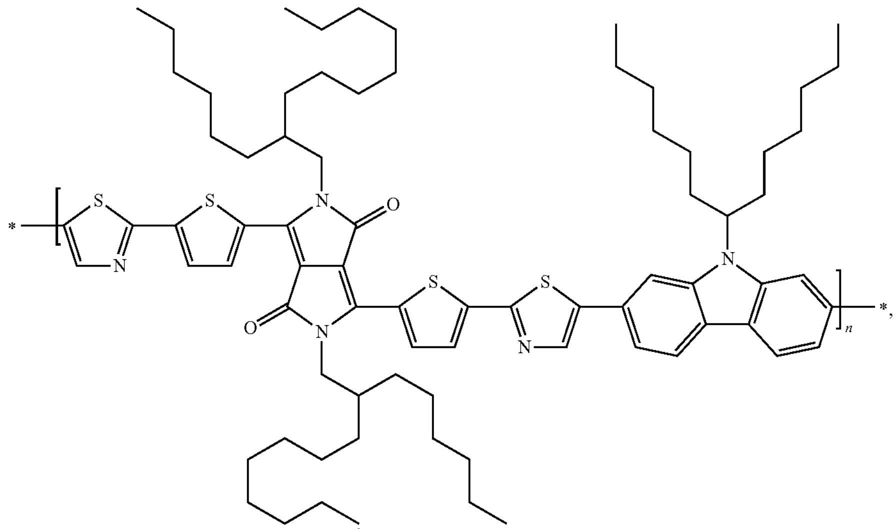

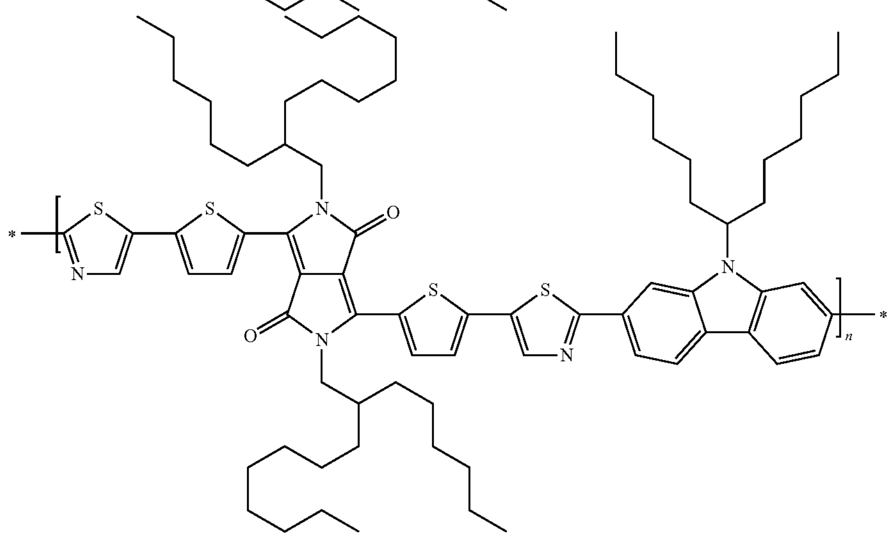

and

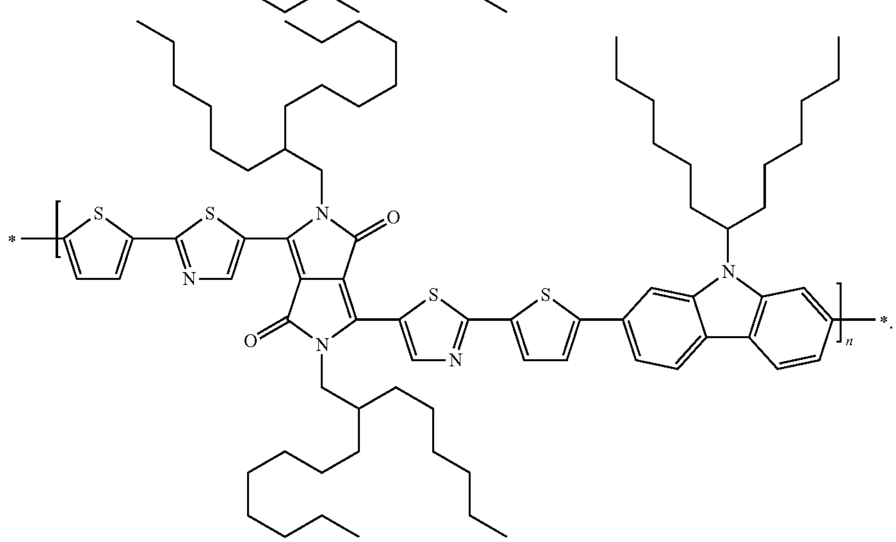

Polymers of formula IIp and IIt can, for example, be prepared by reacting a dihalogenide, such as a dibromide or dichloride, or diiodide, especially a dibromide corresponding to formula Br-A-Br and Br-COM-2-Br with an equimolar amount of a diboronic acid or diboronate corresponding to formula $X^{11}\text{-}[COM^1]\text{-}X^{11}$.

Polymers of formula IIo, IIq, IIr and IIs can be prepared in analogy to the methods described in WO2005016882, WO2005031891 and European patent application no. 09176497.7 (PCT/EP2010/ . . . ).
In a preferred embodiment of the present invention the polymer is a copolymer of the formula
(IIIa)
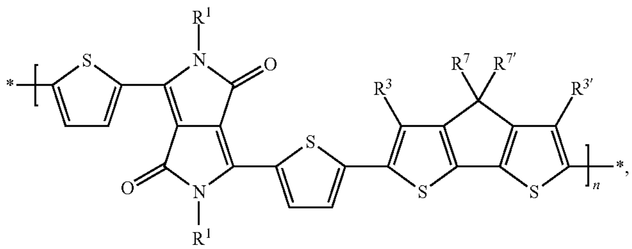
(IIIb)
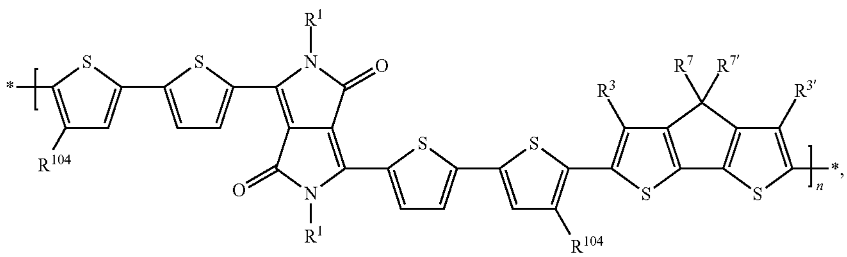
(IIIc)
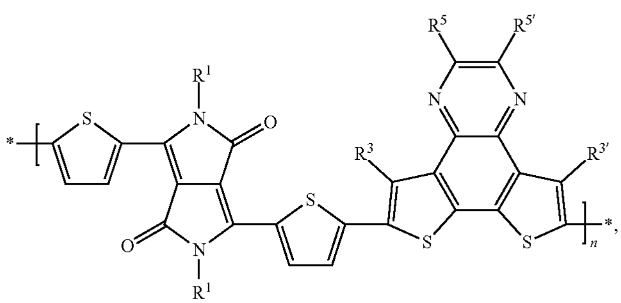
(IIId)
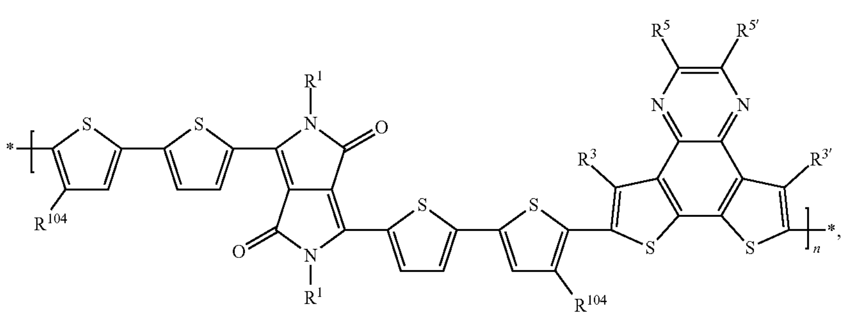

-continued
(IIIe)
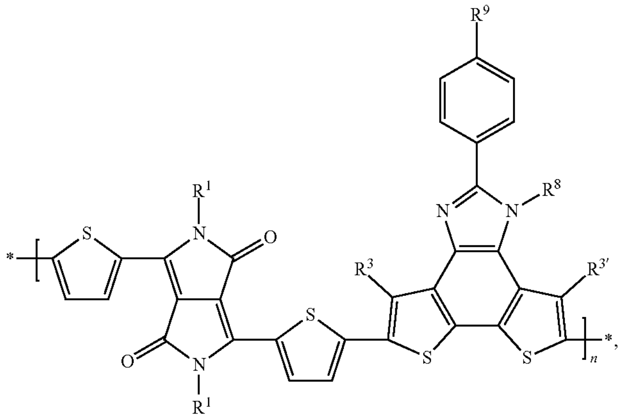
(IIIf)
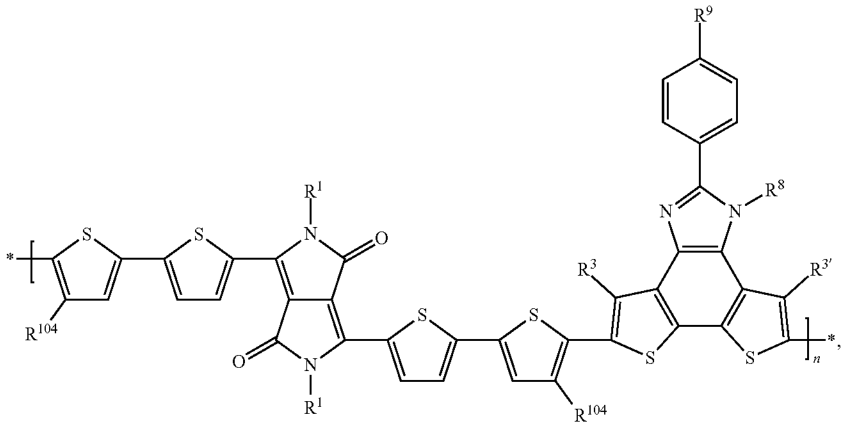
(IIIg)
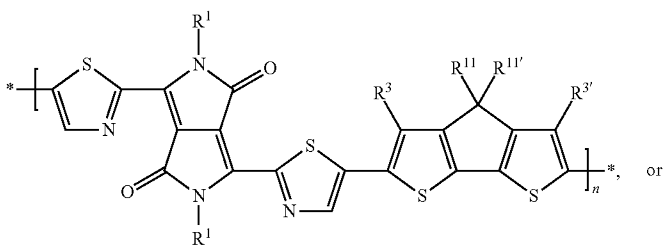
(IIIh)
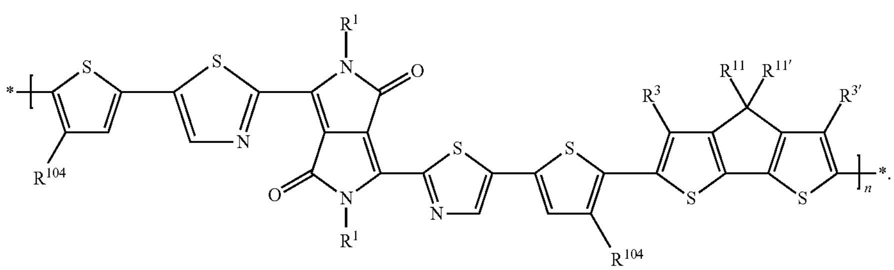
(IIIi)
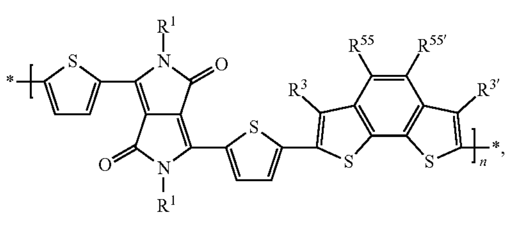
(IIIj)
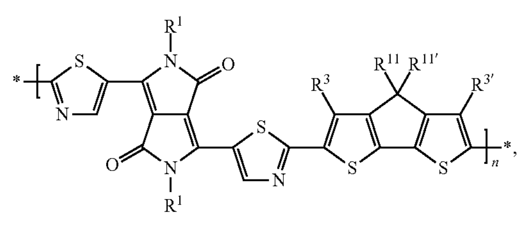

-continued (IIIl)

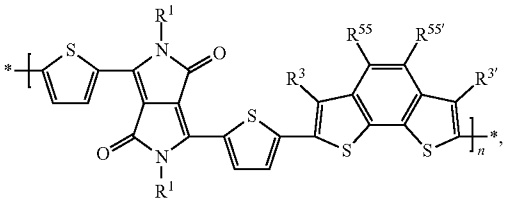

(IIIm)

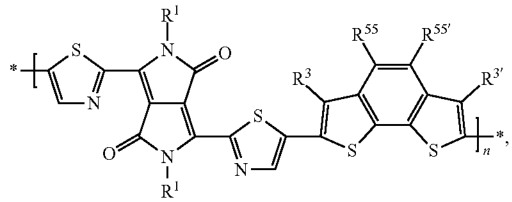

or (IIIn)

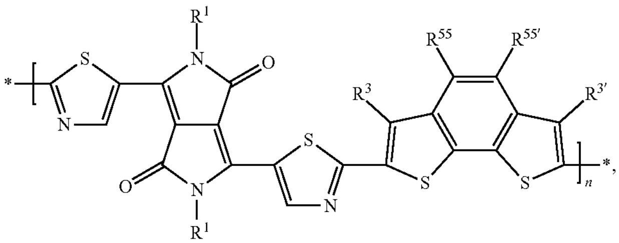

(IIIo)

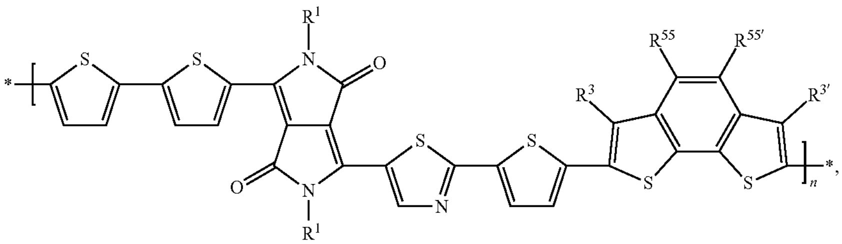

(IIIp)

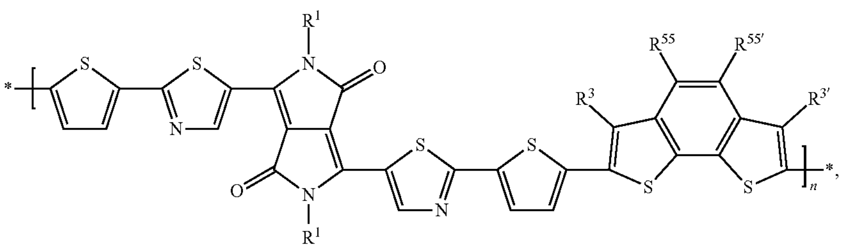

(IIIq)

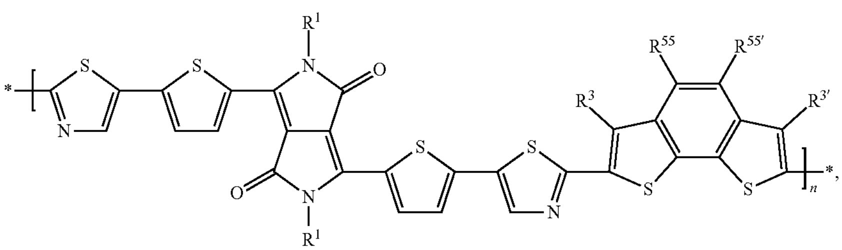

(IIIr)

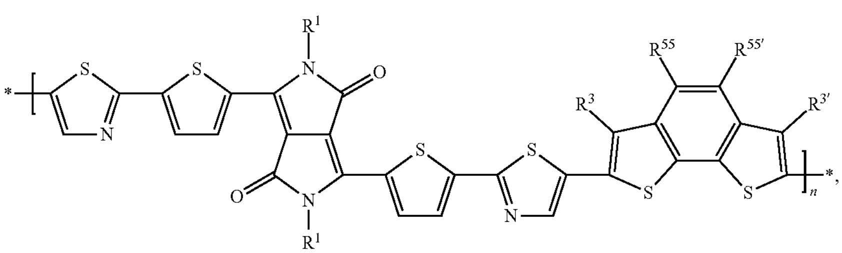

wherein v is 0.995 to 0.005, w is 0.005 to 0.995,
n is 4 to 1000, especially 4 to 200, very especially 5 to 100,
m is 4 to 1000, especially 4 to 200, very especially 5 to 100,
$R^1$ is a $C_1$-$C_{35}$alkyl group, especially a $C_8$-$C_{35}$alkyl group,
$R^3$ and $R^{3'}$ are H, or a $C_1$-$C_{25}$alkyl group,
$R^5$ and $R^{5'}$ are a $C_1$-$C_{25}$alkyl group, or a $C_1$-$C_{25}$alkoxy group,
$R^{55}$ and $R^{55'}$ are H,
$R^{56}$ and $R^{56'}$ are H, a $C_1$-$C_{25}$alkyl group, or a $C_1$-$C_{25}$alkoxy group,
$R^7$, $R^{7'}$, $R^{11}$ and $R^{11'}$ are a $C_1$-$C_{35}$alkyl group, $R^8$ is a $C_1$-$C_{25}$alkyl group,
$R^9$ is a $C_1$-$C_{25}$alkyl group, or a $C_1$-$C_{25}$alkoxy group,
$R^{104}$ is H, or a $C_1$-$C_{25}$alkyl group,
$R^{104}$ is H, or a $C_1$-$C_{25}$alkyl group,
$R^{104}$ is H, or a $C_1$-$C_{25}$alkyl group,
$R^{110}$ is a $C_1$-$C_{25}$alkyl group, and
$R^{108}$ and $R^{106}$ is H; or $R^{108}$ is CN and $R^{106}$ is H; or $R^{106}$ is CN and $R^{108}$ is H.

If the polymer is a copolymer of the formula IIb, or IId, $R^{104}$ is preferably H.

Polymers of formula IIe to IIl, and IIIa, IIIc, IIIe and IIIg are preferred, groups of formula IIe, IIg, IIi, IIIa, IIIc, IIIe and IIIg are most preferred.

Examples of preferred polymers are shown below:

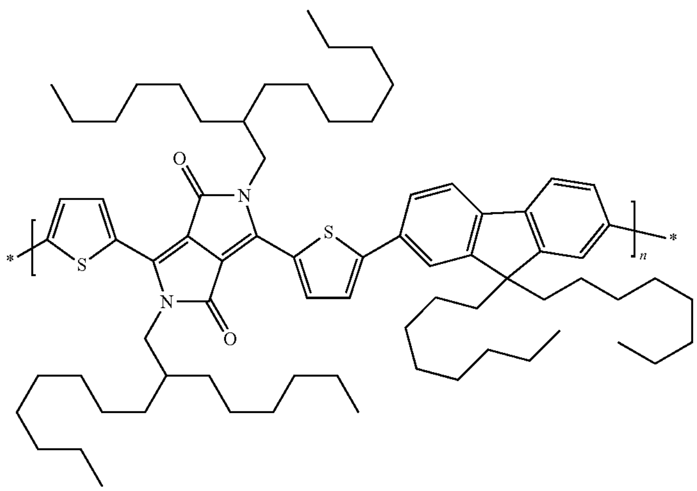

,

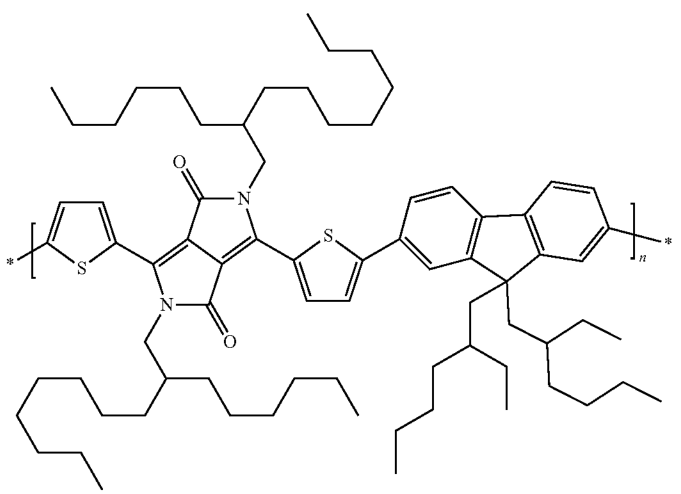

,

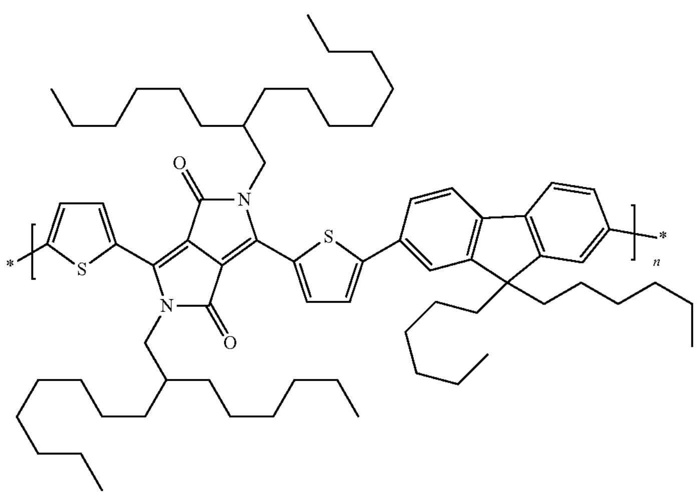

,

-continued
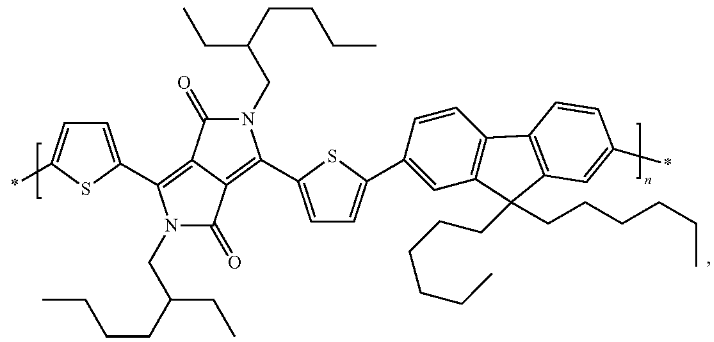
,
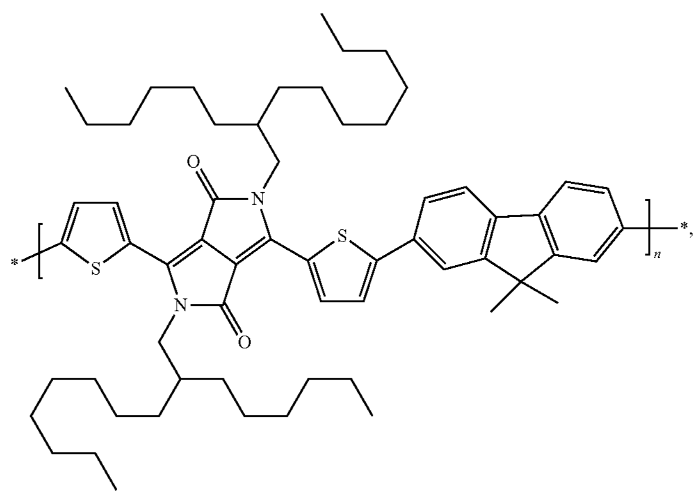
,
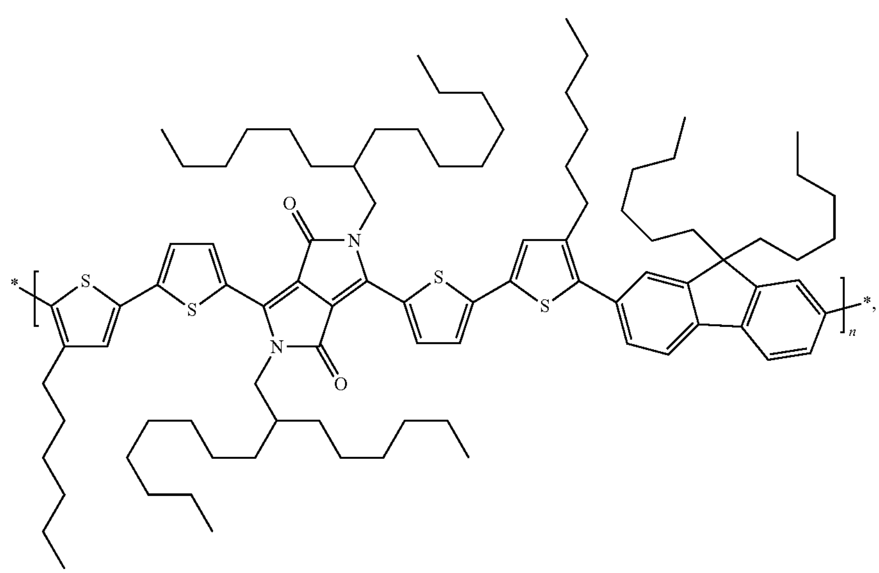
,

-continued
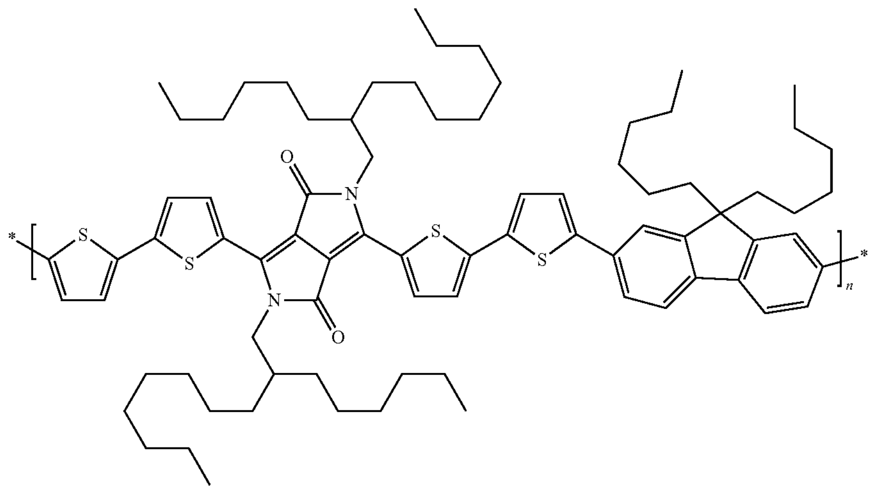
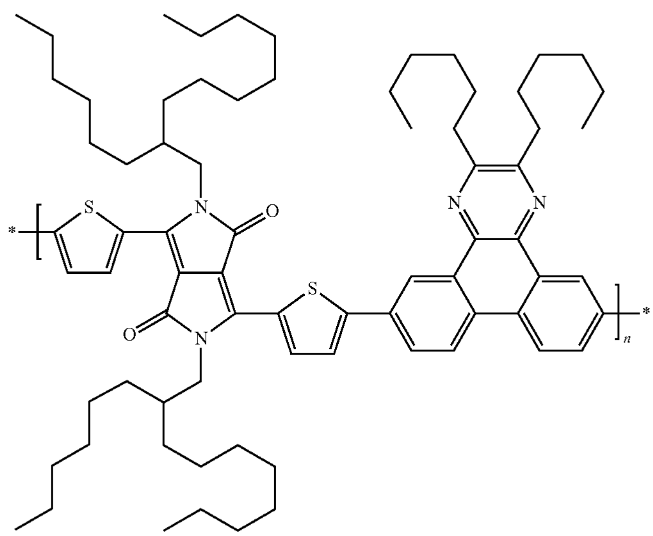
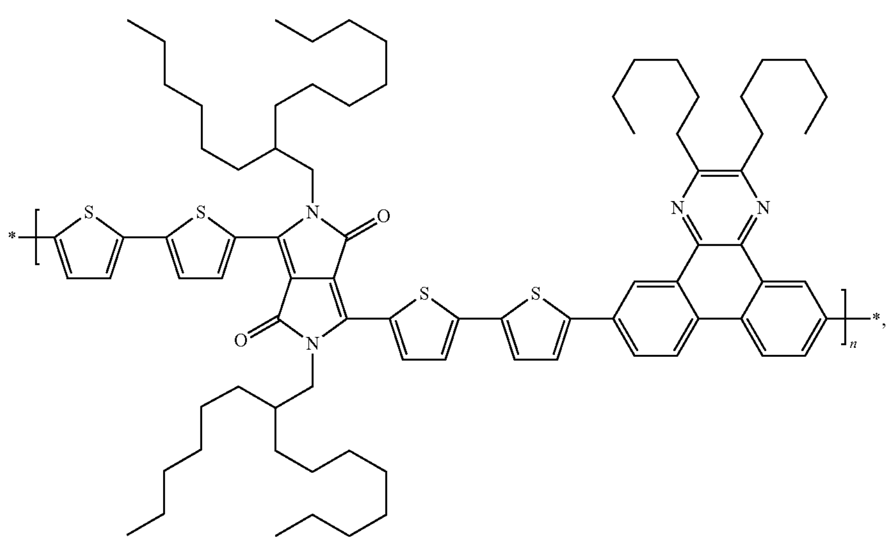

-continued
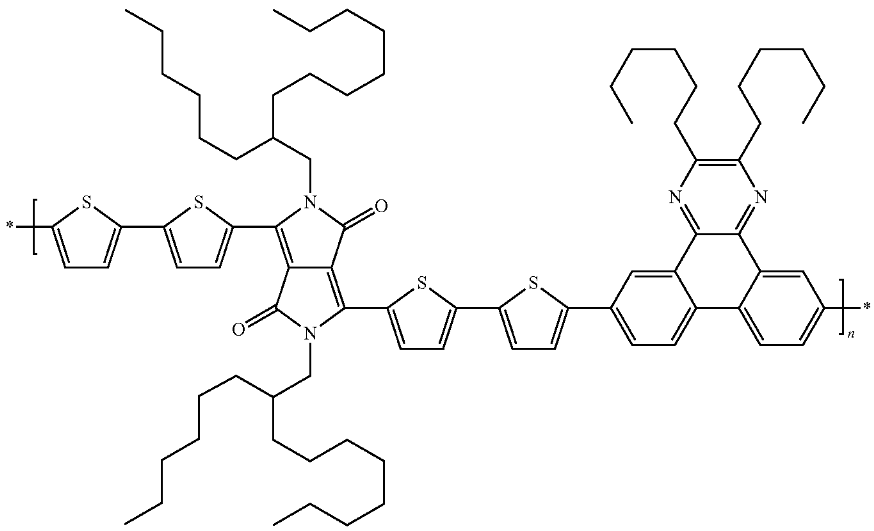
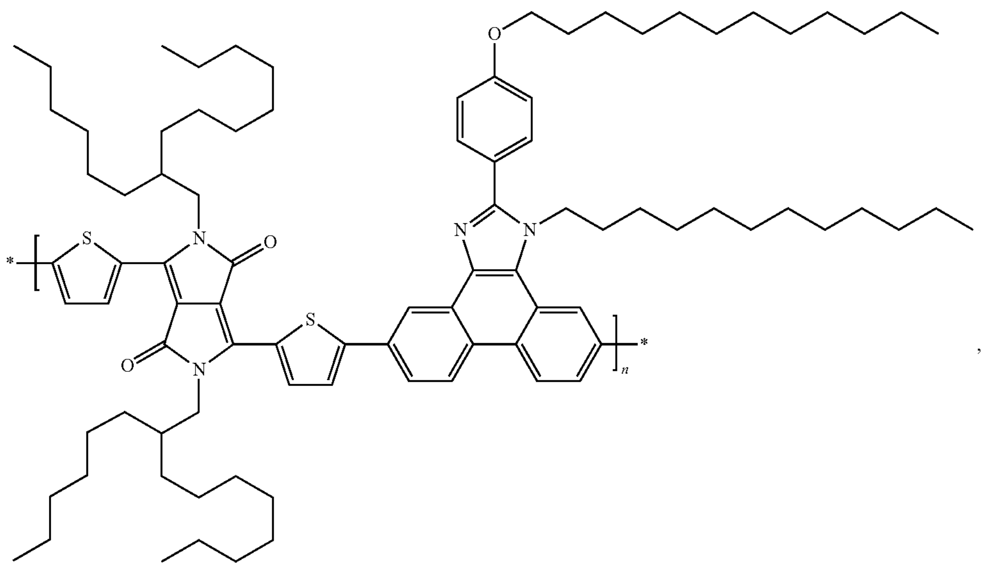
,
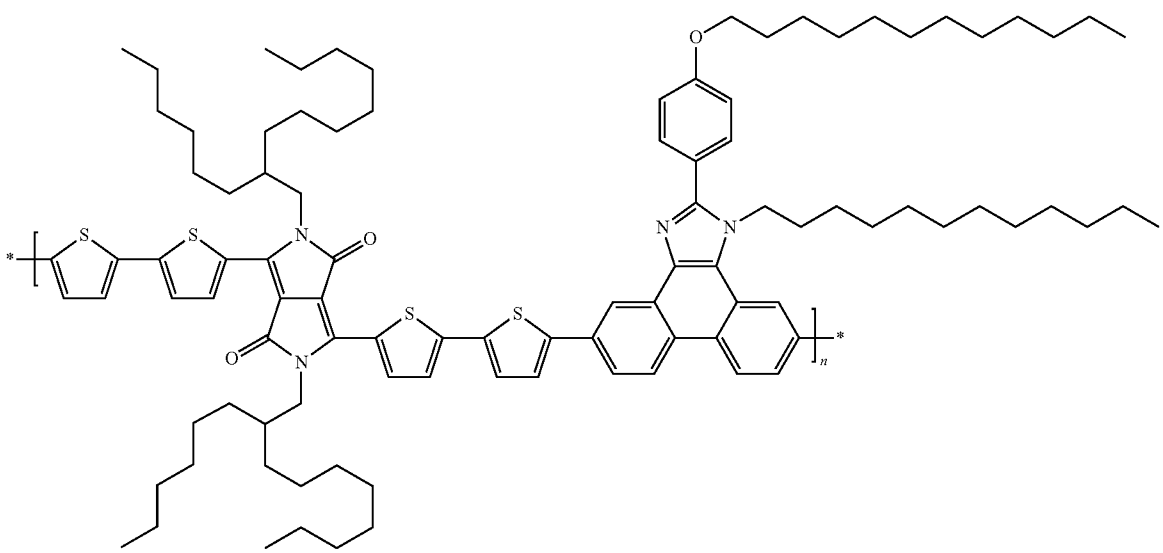
,

-continued
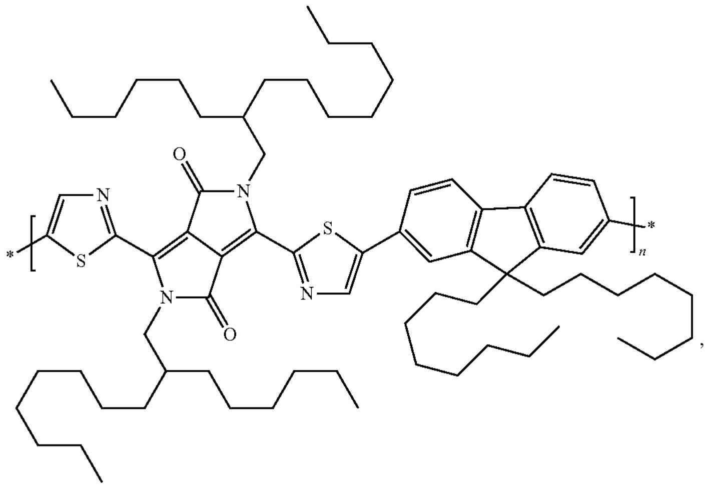
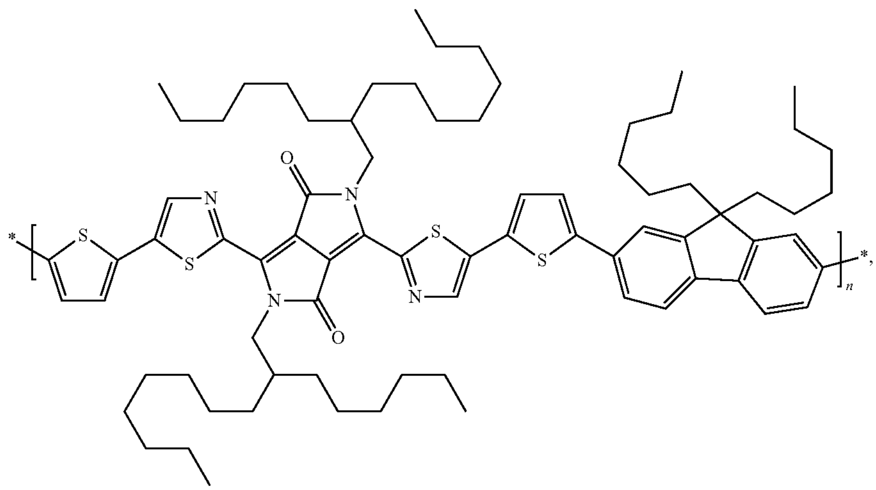
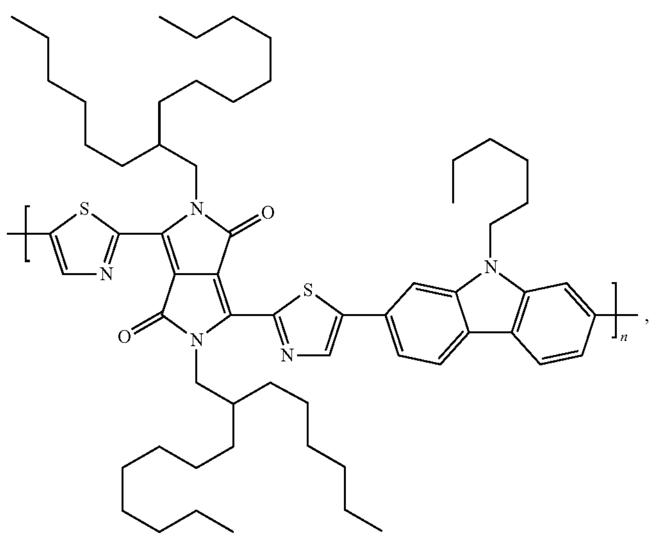

-continued
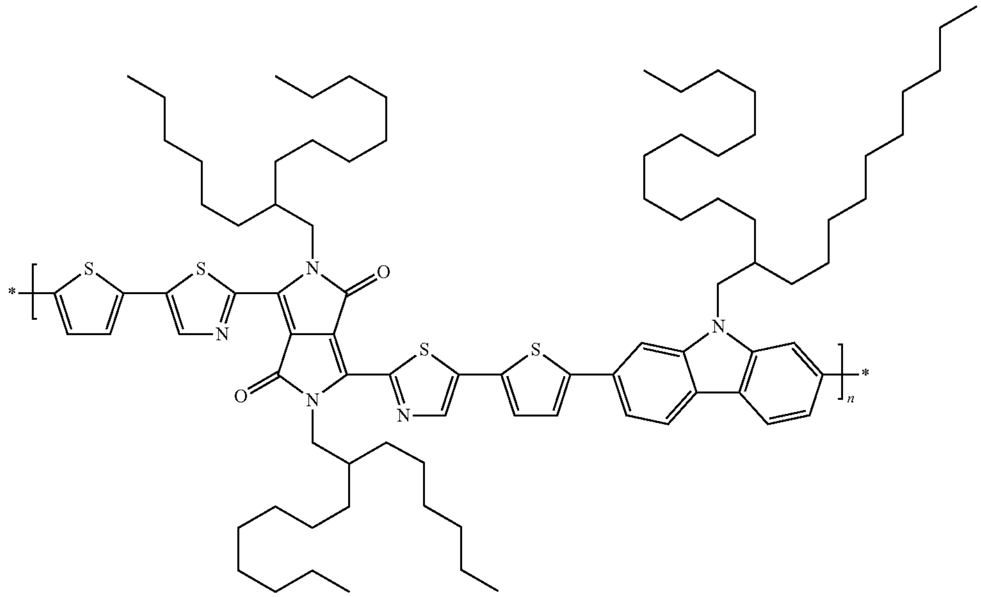
,
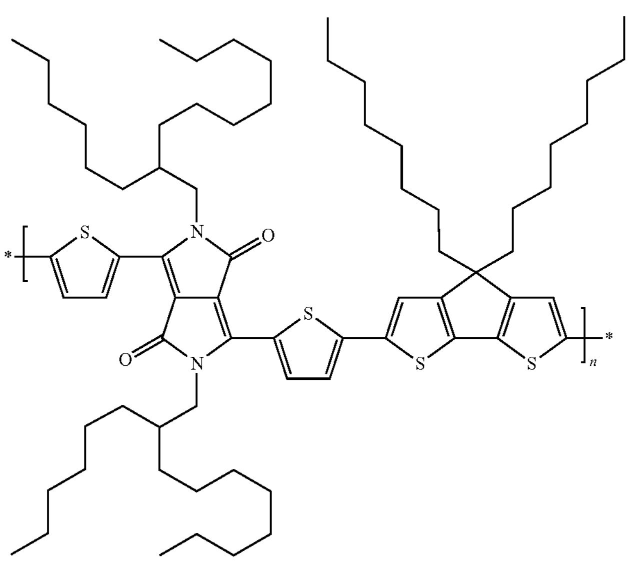
,

-continued
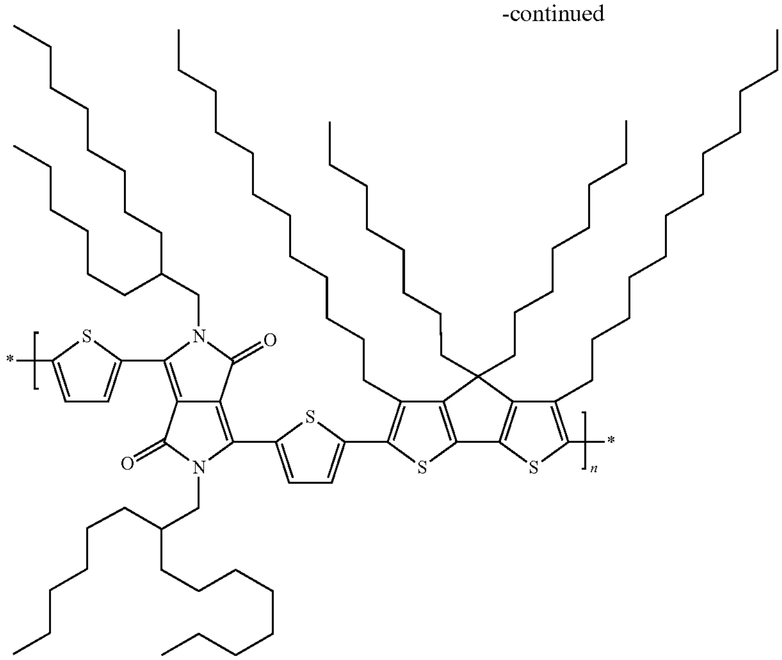
,
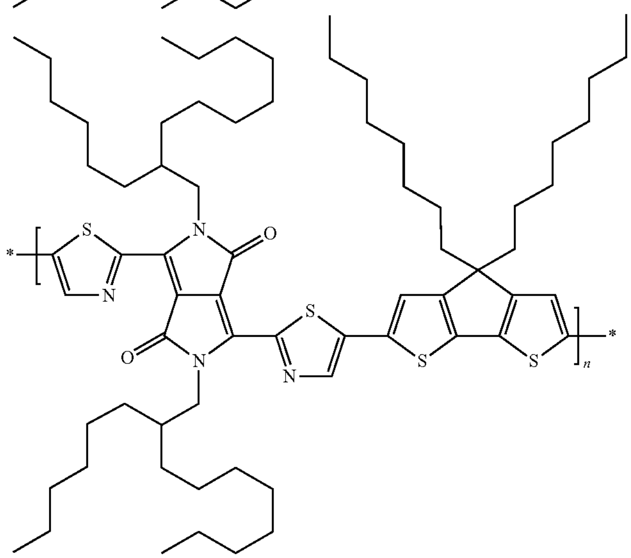
,
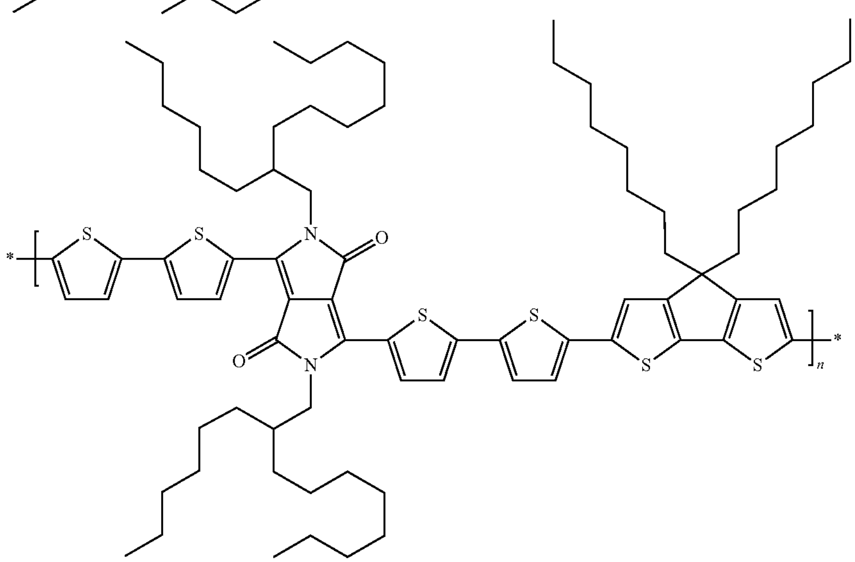
,

-continued
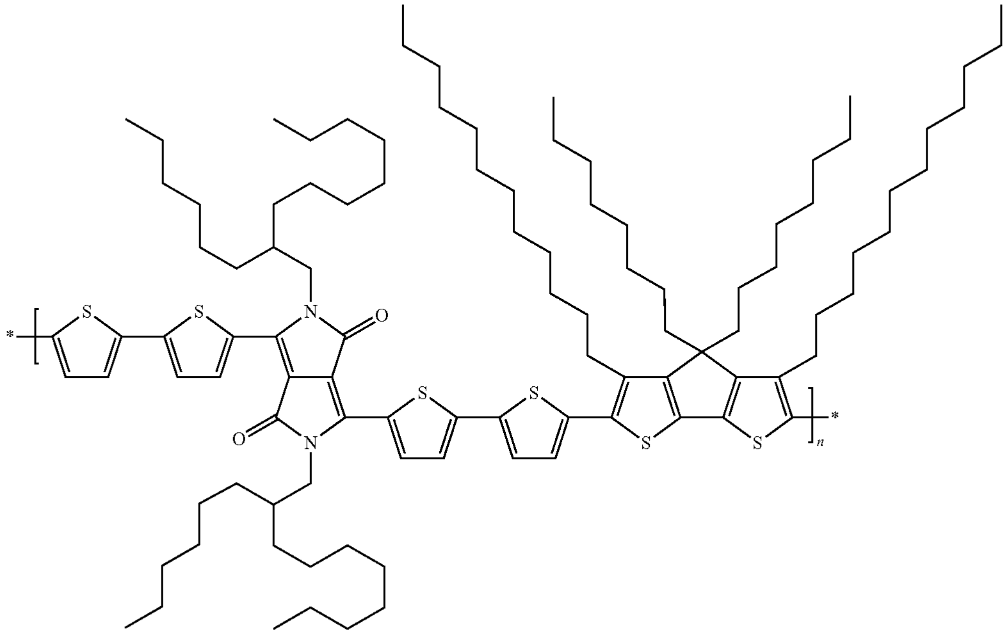
,
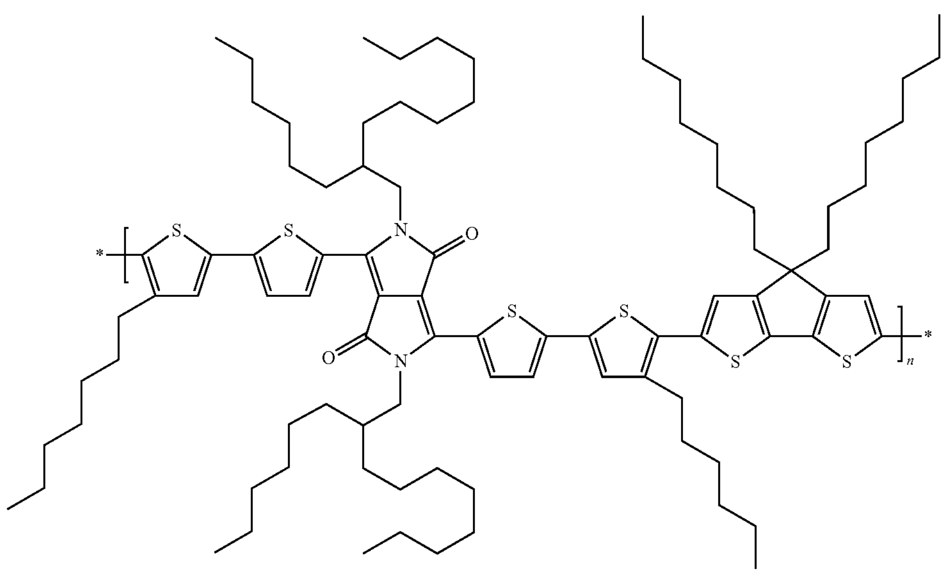
,

-continued
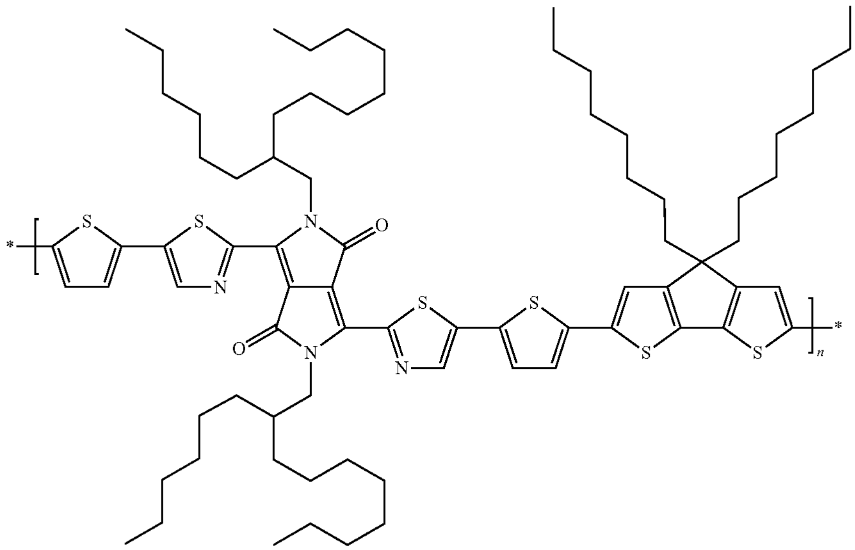
,
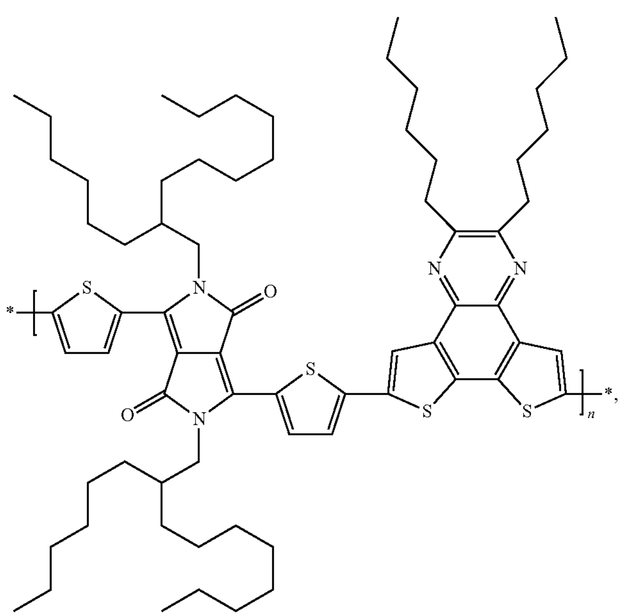
*,

-continued
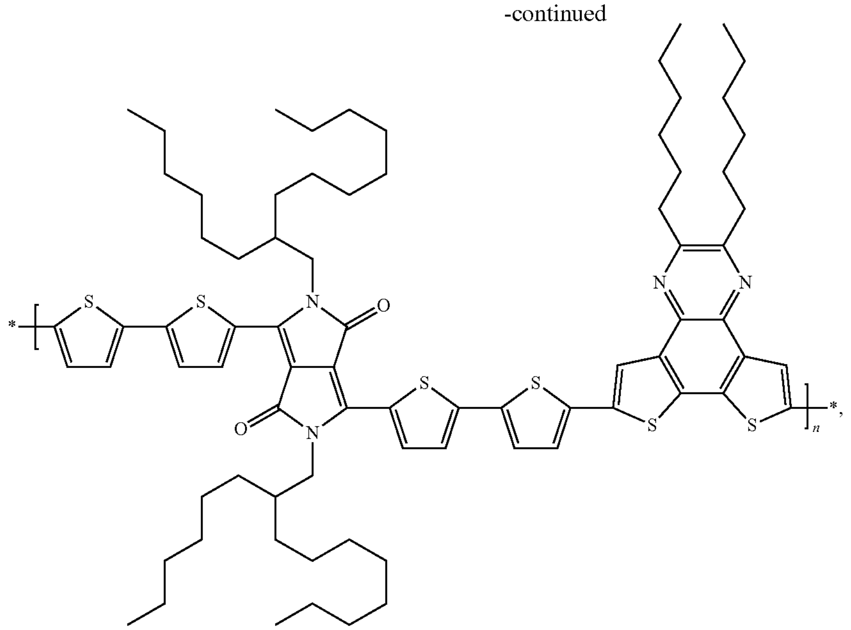
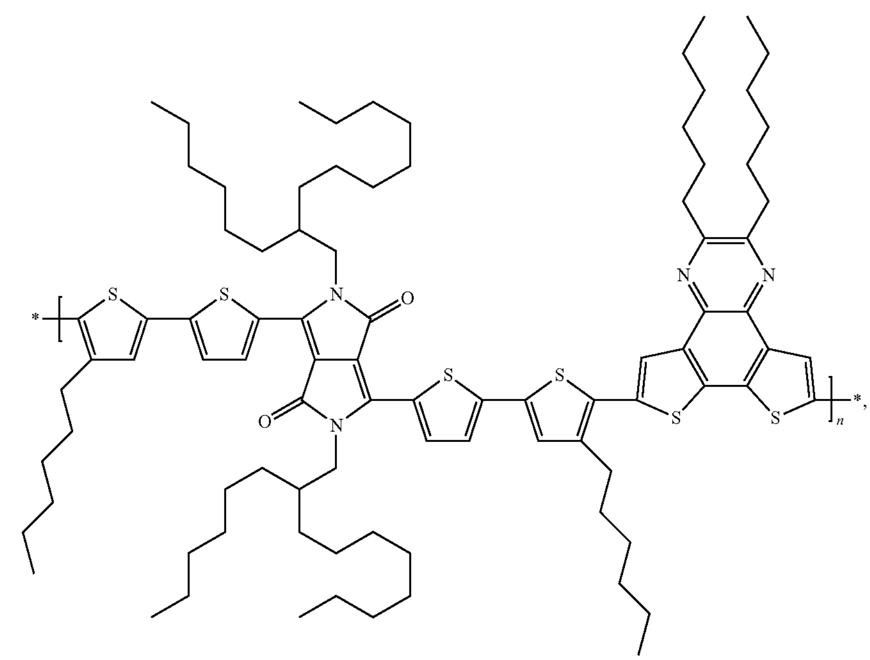

-continued
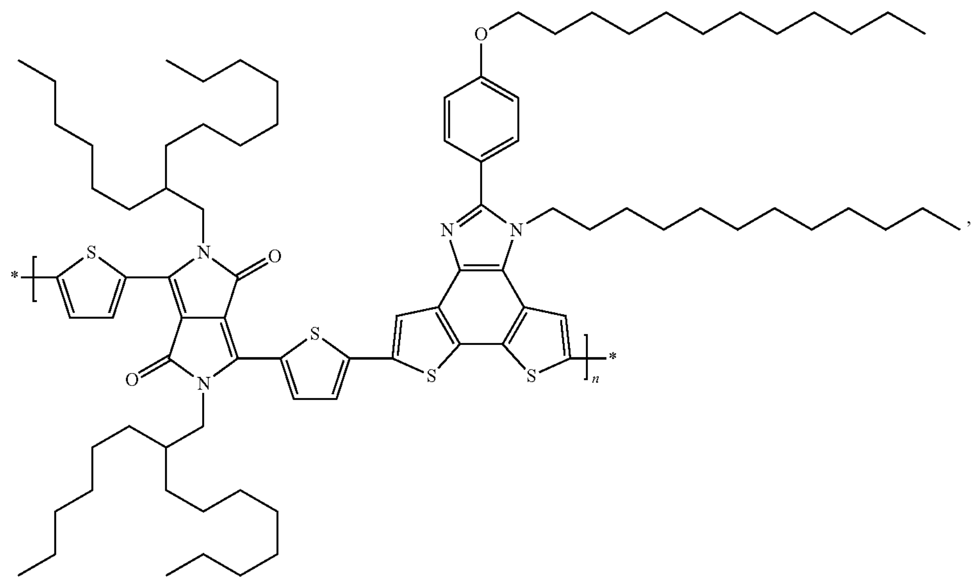
,
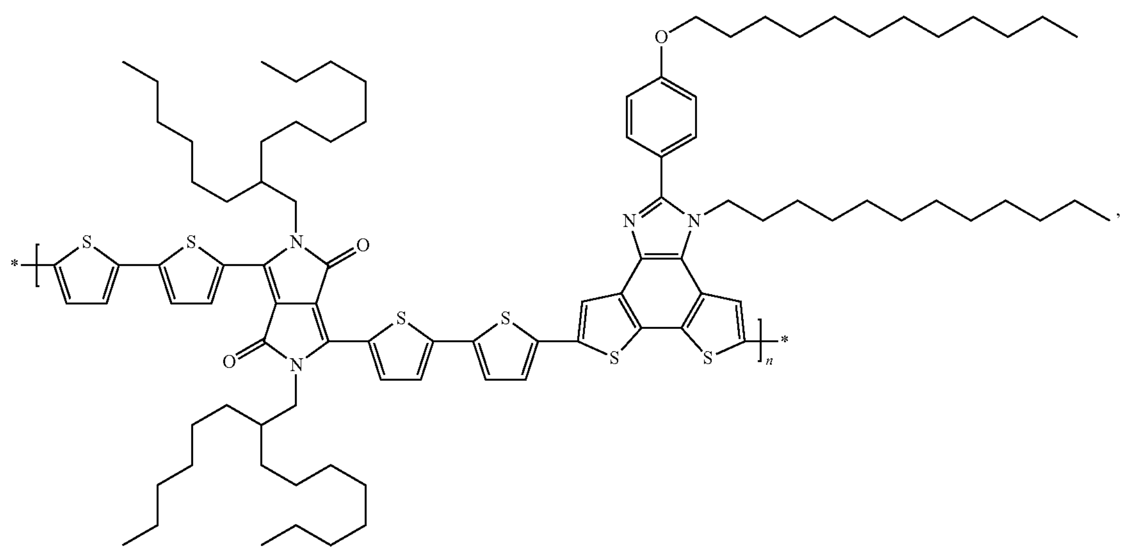
, and

-continued

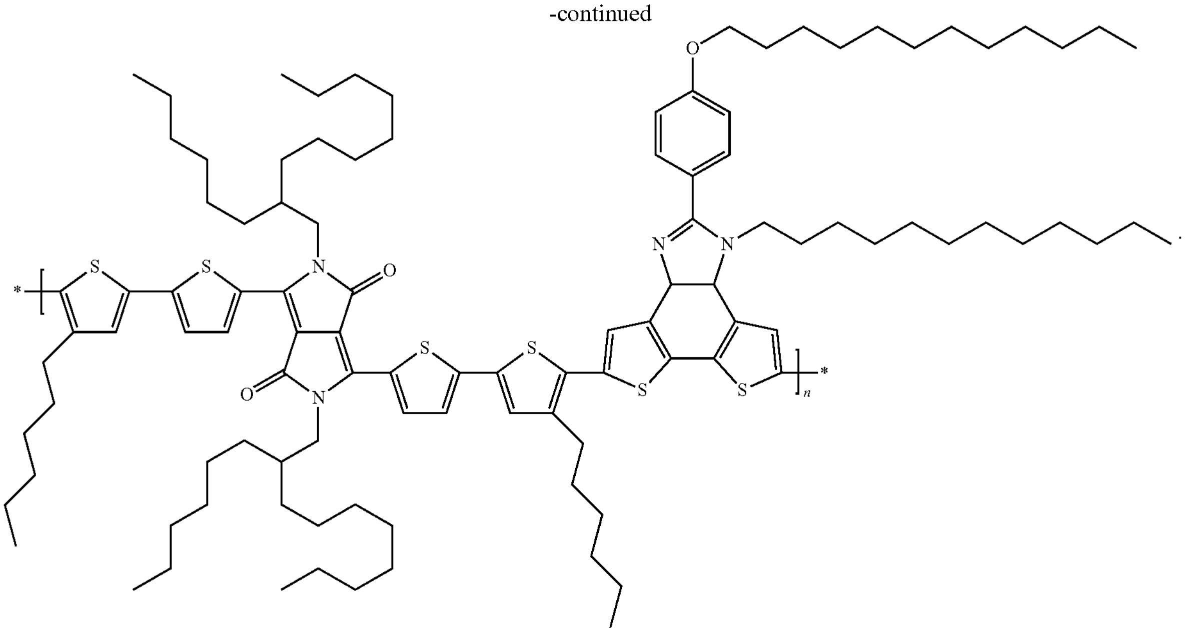

$C_1$-$C_{25}$alkyl ($C_1$-$C_{18}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_1$-$C_{25}$alkoxy groups ($C_1$-$C_{18}$alkoxy groups) are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_5$-$C_{12}$cycloalkyl is typically cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are

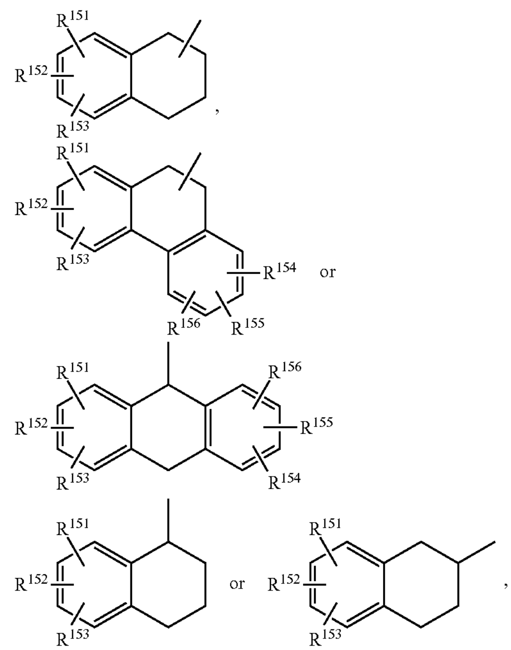

in particular

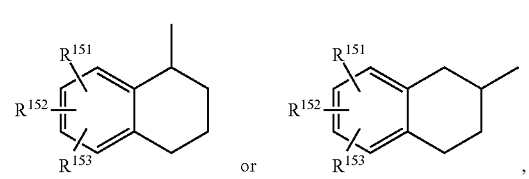

wherein $R^{151}$, $R^{152}$, $R^{153}$, $R^{154}$, $R^{155}$ and $R^{156}$ are independently of each other $C_1$-$C_8$-alkyl, $C_1$-$C_8$-alkoxy, halogen and cyano, in particular hydrogen.

$C_6$-$C_{24}$aryl is typically phenyl, indenyl, azulenyl, naphthyl, biphenyl, as-indacenyl, sindacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of $C_6$-$C_{12}$aryl are phenyl, 1-naphthyl, 2-naphthyl, 3- or 4-biphenyl, 2- or 9-fluorenyl or 9-phenanthryl, which may be unsubstituted or substituted.

$C_7$-$C_{25}$aralkyl is typically benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, 3-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, 3-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted. Preferred examples are benzyl, 2-phenylethyl, 3-phenylpropyl, naphthylethyl, naphthylmethyl, and cumyl.

The term "carbamoyl group" is typically a $C_{1-18}$carbamoyl radical, preferably $C_{1-8}$carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

Heteroaryl is typically $C_2$-$C_{20}$heteroaryl, i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, a carbamoyl group, a nitro group or a silyl group, especially $C_1$-$C_8$alkyl, $C_1$-$C_8$alkoxy, $C_1$-$C_8$alkylthio, halogen, halo-$C_1$-$C_8$alkyl, or a cyano group.

$C_1$-$C_{18}$alkyl interrupted by one or more O is, for example, $(CH_2CH_2O)_{1-9}$—$R^x$, where $R^x$ is H or $C_1$-$C_{10}$alkyl, $CH_2$—$CH(OR^{y'})$—$CH_2$—O—$R^y$, where $R^y$ is $C_1$-$C_{18}$alkyl, and $R^{y'}$ embraces the same definitions as $R^y$ or is H.

If a substituent, such as, for example $R^1$, or $R^{104}$, occurs more than one time in a group, it can be different in each occurrence.

Copolymers of formula IV can be obtained, for example, by the Suzuki reaction. The condensation reaction of an aromatic boronate and a halogenide, especially a bromide, commonly referred to as the "Suzuki reaction", is tolerant of the presence of a variety of organic functional groups as reported by N. Miyaura and A. Suzuki in Chemical Reviews, Vol. 95, pp. 457-2483 (1995). Preferred catalysts are 2-dicyclohexylphosphino-2',6'-dialkoxybiphenyl/palladium(II)acetates, tri-alkyl-phosphonium salts/palladium (0) derivatives and tri-alkylphosphine/palladium (0) derivatives. Especially preferred catalysts are 2-dicyclohexylphosphino-2',6'-di-methoxybiphenyl (sPhos)/palladium(II)acetate and, tri-tert-butylphosphonium tetrafluoroborate ($(t\text{-}Bu)_3P{*}HBF_4$)/tris (dibenzylideneacetone) dipalladium (0) ($Pd_2(dba)_3$) and tri-tert-butylphosphine $(t\text{-}Bu)_3P$/tris(dibenzylideneacetone) dipalladium (0) ($Pd_2(dba)_3$). This reaction can be applied to preparing high molecular weight polymers and copolymers.

To prepare polymers corresponding to formula II a dihalogenide of formula $X^{10}$-A-$X^{10}$ is reacted with an equimolar amount of a diboronic acid or diboronate corresponding to formula $X^{11}$-[COM$^1$]-$X^{11}$, or a dihalogenide of formula $X^{11}$-[COM$^1$]-$X^{10}$ is reacted with an equimolar amount of a diboronic acid or diboronate corresponding to formula $X^{11}$-A-$X^{11}$, wherein $X^{10}$ is halogen, especially Br, and $X^{11}$ is independently in each occurrence —$B(OH)_2$, —$B(OY^1)_2$,

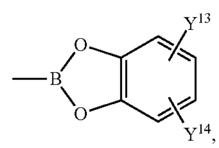

or

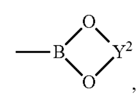

, wherein $Y^1$ is independently in each occurrence a $C_1$-$C_{10}$alkyl group and $Y^2$ is independently in each occurrence a $C_2$-$C_{18}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{11}$, and $Y^{12}$ are independently of each other hydrogen, or a $C_1$-$C_{10}$alkyl group, especially —$C(CH_3)_2C(CH_3)_2$—, —$C(CH_3)_2CH_2C(CH_3)_2$—, or —$CH_2C(CH_3)_2CH_2$—, and $Y^{13}$ and $Y^{14}$ are independently of each other hydrogen, or a $C_1$-$C_{10}$alkyl group, in a solvent and in the presence of a catalyst. The reaction is typically conducted at about 0° C. to 180° C. in an aromatic hydrocarbon solvent such as toluene, xylene. Other solvents such as dimethylformamide, dioxane, dimethoxyethan and tetrahydrofuran can also be used alone, or in mixtures with an aromatic hydrocarbon. An aqueous base, preferably sodium carbonate or bicarbonate, potassium phosphate, potassium carbonate or bicarbonate is used as activation agent for the boronic acid, boronate and as the HBr scavenger. A polymerization reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252. Control of molecular weight is possible by using either an excess of dibromide, diboronic acid, or diboronate, or a chain terminator.

According to the process described in European patent application no. 09176497.7 [PCT/EP2010/ . . . ] the polymerisation is carried out in presence of a) a catalyst/ligand system comprising a palladium catalyst and an organic phosphine or phosphonium compound, b) a base, c) a solvent or a mixture of solvents, characterized in that the organic phosphine is a trisubstituted phosphine of formula (VI)

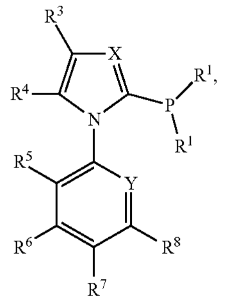

or phosphonium salt thereof, wherein X independently of Y represents a nitrogen atom or a C—$R^2$ group and Y independently of X represents a nitrogen atom or a C—$R^9$ group, $R^1$ for each of the two $R^1$ groups independently of the other represents a radical selected from the group $C_1$-$C_{24}$-alkyl, $C_3$-$C_{20}$-cycloalkyl, which includes especially both monocyclic and also bi- and tri-cyclic cycloalkyl radicals, $C_5$-$C_{14}$-aryl, which includes especially the phenyl, naphthyl, fluorenyl radical, $C_2$-$C_{13}$-heteroaryl, wherein the number of hetero atoms, selected from the group N, O, S, may be from 1 to 2, wherein the two radicals $R^1$ may also be linked to one another, and wherein the above-mentioned radicals $R^1$ may themselves each be mono- or poly-substituted independently of one another by substituents selected from the group hydrogen, $C_1$-$C_{20}$-alkyl, $C_2$-$C_{20}$-alkenyl, $C_3$-$C_8$-cycloalkyl, $C_2$-$C_9$-hetero-alkyl, $C_2$-$C_9$-heteroaryl, wherein the number of hetero atoms from the group N, O, S may be from 1 to 4, $C_1$-$C_{20}$-alkoxy, $C_1$-$C_{10}$-haloalkyl, hydroxy, amino of the forms NH—($C_1$-$C_{20}$-alkyl), NH—($C_5$-$C_{10}$-aryl), N($C_1$-$C_{20}$-alkyl)$_2$, N($C_1$-$C_{20}$-alkyl) ($C_5$-$C_{10}$-aryl), N($C_5$-$C_{10}$-aryl)$_2$, N($C_1$-$C_{20}$-alkyl/$C_5$-$C_{10}$-aryl$_3$)$_3^+$, NH—CO—$C_1$-$C_{20}$-alkyl, NH—CO—$C_5$-$C_{10}$-aryl, carboxylato of the forms COOH and COOQ (wherein Q represents either a monovalent cation or $C_1$-$C_8$-alkyl), $C_1$-$C_6$-acyloxy, sulfinato, sulfonato of the forms $SO_3H$ and $SO_3Q'$ (wherein Q' represents either a monovalent cation, $C_1$-$C_{20}$-alkyl, or $C_5$-$C_{10}$-aryl), tri-$C_1$-$C_6$-alkylsilyl, wherein two of the mentioned substituents may also be bridged with one another, $R^2$—$R^9$ represent a hydrogen, alkyl, alkenyl, cycloalkyl, aromatic or heteroaromatic aryl, O-alkyl, NH— alkyl, N-(alkyl)$_2$, O-(aryl), NH-(aryl), N-(alkyl)(aryl), O—CO-alkyl, O—CO-aryl, F, Si(alkyl)$_3$, $CF_3$, CN, $CO_2H$, COH, $SO_3H$, $CONH_2$, CONH(alkyl), CON(alkyl)$_2$, $SO_2$(alkyl), SO(alkyl), SO(aryl), $SO_2$(aryl), $SO_3$(alkyl), $SO_3$(aryl), S-alkyl, S-aryl, NH—CO(alkyl), $CO_2$(alkyl), $CONH_2$, CO(alkyl), NHCOH, $NHCO_2$(alkyl), CO(aryl), $CO_2$(aryl) radical, wherein two or more adjacent radicals, each independently of the other (s), may also be linked to one another so that a condensed ring system is present and wherein in $R^2$ to $R^9$ alkyl represents a hydrocarbon radical having from 1 to 20 carbon atoms which may in each case be linear or branched, alkenyl represents a mono- or poly-unsaturated hydrocarbon radical having from 2 to 20 carbon atoms which may in each case be linear or branched, cycloalkyl represents a hydrocarbon having from 3 to 20 carbon atoms, aryl represents a 5- to 14-membered aromatic radical, wherein from one to four carbon atoms in the aryl radical may also be replaced by hetero atoms from the group nitrogen, oxygen and sulfur so that a 5- to 14-membered heteroaromatic radical is present, wherein the radicals $R^2$ to $R^9$ may also carry further substituents as defined for $R^1$.

The organic phosphines and their synthesis are described in WO2004101581.

Preferred ° manic phosphines are selected from trisubstituted phosphines of formula

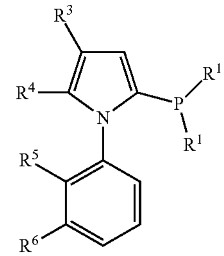

| Cpd. | $R^1$ | $R^5$ | $R^6$ | $R^3$ | $R^4$ |
|---|---|---|---|---|---|
| A-1 | 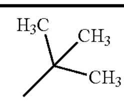 | H | H | H | H |
| A-2 | cyclohexyl | H | H | H | H |
| A-3 | phenyl | H | H | H | H |
| A-4 | adamantyl | H | H | H | H |
| A-5 | cyclohexyl | —$OCH_3$ | H | H | H |
| A-6 | cyclohexyl | 1) | 1) | H | H |
| A-7 | 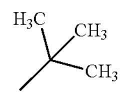 | 1) | 1) | H | H |
| A-8 | phenyl | 1) | 1) | H | H |
| A-9 | adamantyl | 1) | 1) | H | H |
| A-10 | cyclohexyl | H | H | 2) | 2) |
| A-11 | 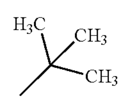 | H | H | 2) | 2) |
| A-12 | phenyl | H | H | 2) | 2) |
| A-13 | adamantyl | H | H | 2) | 2) |

1) $R^5$ and $R^6$ together form a ring 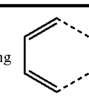.

2) $R^3$ and $R^4$ together form a ring 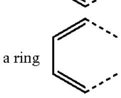.

Examples of preferred catalysts include the following compounds:

palladium(II) acetylacetonate, palladium(0) dibenzylideneacetone complexes, palladium(II) propionate, $Pd_2(dba)_3$: [tris(dibenzylideneacetone) dipalladium(0)], $Pd(dba)_2$: [bis(dibenzylideneacetone) palladium(0)], $Pd(PR_3)_2$, wherein $PR^3$ is a trisubstituted phosphine of formula VI, $Pd(OAc)_2$: [palladium(II) acetate], palladium(II) chloride, palladium(II) bromide, lithium tetrachloropalladate(II), $PdCl_2(PR_3)_2$; wherein $PR_3$ is a trisubstituted phosphine of formula VI; palladium(0) diallyl ether complexes, palladium(II) nitrate, $PdCl_2(PhCN)_2$: [dichlorobis(benzonitrile) palladium(II)], $PdCl_2(CH_3CN)$: [dichlorobis(acetonitrile) palladium(II)], and $PdCl_2$(COD): [dichloro(1,5-cyclooctadiene) palladium(II)].

Especially preferred are $PdCl_2$, $Pd_2(dba)_3$, $Pd(dba)_2$, $Pd(OAc)_2$, or $Pd(PR_3)_2$. Most preferred are $Pd_2(dba)_3$ and $Pd(OAc)_2$.

The palladium catalyst is present in the reaction mixture in catalytic amounts. The term "catalytic amount" refers to an amount that is clearly below one equivalent of the (hetero) aromatic compound(s), preferably 0.001 to 5 mol-%, most preferably 0.001 to 1 mol-%, based on the equivalents of the (hetero)aromatic compound(s) used.

The amount of phosphines or phosphonium salts in the reaction mixture is preferably from 0.001 to 10 mol-%, most preferably 0.01 to 5 mol-%, based on the equivalents of the (hetero)aromatic compound(s) used. The preferred ratio of Pd:phosphine is 1:4.

The base can be selected from all aqueous and nonaqueous bases and can be inorganic, or organic. It is preferable that at least 1.5 equivalents of said base per functional boron group is present in the reaction mixture. Suitable bases are, for example, alkali and alkaline earth metal hydroxides, carboxylates, carbonates, fluorides and phosphates such as sodium and potassium hydroxide, acetate, carbonate, fluoride and phosphate or also metal alcoholates. It is also possible to use a mixture of bases. The base is preferably a lithium salt, such as, for example, lithium alkoxides (such as, for example, lithium methoxide and lithium ethoxide), lithium hydroxide, carboxylate, carbonate, fluoride and/or phosphate.

The at present most preferred base is aqueous LiOHx$H_2O$ (monohydrate of LiOH) and (waterfree) LiOH.

The reaction is typically conducted at about 0° C. to 180° C., preferably from 20 to 160° C., more preferably from 40 to 140° C. and most preferably from 40 to 120° C. A polymerization reaction may take 0.1, especially 0.2 to 100 hours.

In a preferred embodiment of the present invention the solvent is THF, the base is LiOH*$H_2O$ and the reaction is conducted at reflux temperature of THF (about 65° C.).

The solvent is for example selected from toluene, xylenes, anisole, THF, 2-methyltetrahydrofuran, dioxane, chlorobenzene, fluorobenzene or solvent mixtures comprising one or more solvents like e.g. THF/toluene and optionally water. Most preferred is THF, or THF/water.

Advantageously, the polymerisation is carried out in presence of a) palladium(II) acetate, or $Pd_2(dba)_3$, (tris(dibenzylideneacetone)dipalladium(0)) and an organic phosphine A-1 to A-13,
b) LiOH, or LiOHx$H_2O$; and
c) THF, and optionally water. If the monohydrate of LiOH is used, no water needs to be added.

Most preferred the polymerisation is carried out in presence of a) palladium(II) acetate, or $Pd_2(dba)_3$ (tris(dibenzylideneacetone)dipalladium(0)) and

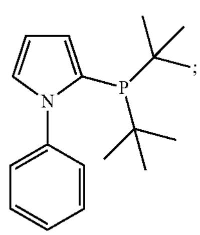
;

b) LiOHx$H_2O$; and
c) THF. The palladium catalyst is present in an amount of preferably about 0.5 mol-%, based on the equivalents of the (hetero)aromatic compound(s) used. The amount of phosphines or phosphonium salts in the reaction mixture is preferably about 2 mol-%, based on the equivalents of the (hetero)aromatic compound(s) used. The preferred ratio of Pd:phosphine is about 1:4.

Preferably the polymerization reaction is conducted under inert conditions in the absence of oxygen. Nitrogen and more preferably argon are used as inert gases.

The process described in European patent application no. 09176497.7 is suitable for large-scale applications, is readily accessible and convert starting materials to the respective polymers in high yield, with high purity and high selectivity. The process can provide polymers having weight average molecular weights of at least 10,000, more preferably at least 20,000, most preferably at least 30,000. The at present most preferred polymers have a weight average molecular weight of 30,000 to 80,000 Daltons. Molecular weights are determined according to high-temperature gel permeation chromatography (HT-GPC) using polystyrene standards. The polymers preferably have a polydispersibility of 1.01 to 10, more preferably 1.1 to 3.0, most preferred 1.5 to 2.5.

If desired, a monofunctional halide, boronate, such as, for example, a monofunctional aryl halide, or aryl boronate, may be used as a chain-terminator in such reactions, which will result in the formation of a terminal aryl group:

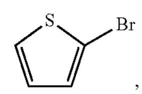
,
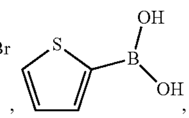
,
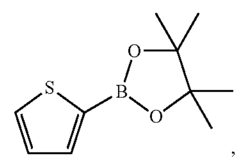
,
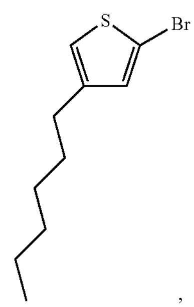
,
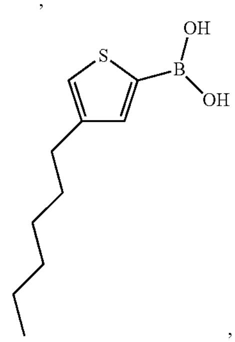
,
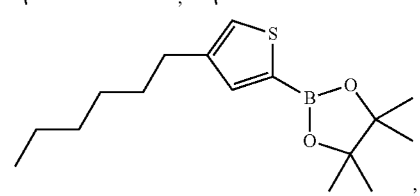
,
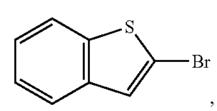
,
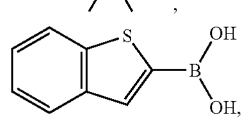
,
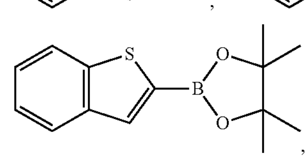
,
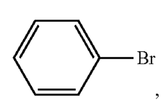
, -continued

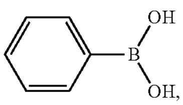

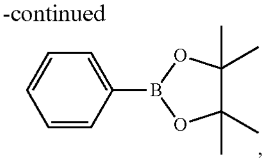

,

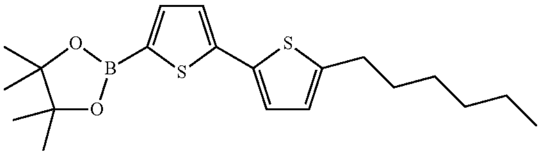

,

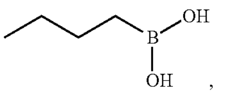

,

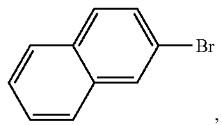

,

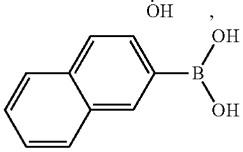

and

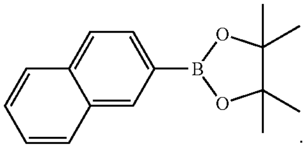 [SMILES: CC1(C)OB(c2ccc3ccccc3c2)OC1(C)C]

.

It is possible to control the sequencing of the monomeric units in the resulting copolymer by controlling the order and composition of monomer feeds in the Suzuki reaction.

The polymers of the present invention can also be synthesized by the Stille coupling (see, for example, Babudri et al, J. Mater. Chem., 2004, 14, 11-34; J. K. Stille, Angew. Chemie Int. Ed. Engl. 1986, 25, 508). To prepare polymers corresponding to formula II a dihalogenide of formula $X^{10}$-A-$X^{10}$ is reacted with an equimolar amount of an organo tin compound corresponding to formula $X^{11'}$-[COM$^1$]-$X^{11'}$, or a dihalogenide of formula $X^{10'}$-[COM$^1$]-$X^{10}$ is reacted with an equimolar amount of an organo tin compound corresponding to formula $X^{11'}$-A-$X^{11'}$, wherein $X^{11}$ is independently in each occurrence —Sn$R^{207}R^{208}R^{209}$, wherein $R^{207}$, $R^{208}$ and $R^{209}$ are identical or different and are H or $C_1$-$C_6$alkyl, or two of the groups $R^{207}$, $R^{208}$ and $R^{209}$ form a ring and these groups are optionally branched, in an inert solvent at a temperature in range from 0° C. to 200° C. in the presence of a palladium-containing catalyst. It must be ensured here that the totality of all monomers used has a highly balanced ratio of organotin functions to halogen functions. In addition, it may prove advantageous to remove any excess reactive groups at the end of the reaction by end-capping with monofunctional reagents. In order to carry out the process, the tin compounds and the halogen compounds are preferably introduced into one or more inert organic solvents and stirred at a temperature of from 0 to 200° C., preferably from 30 to 170° C. for a period of from 1 hour to 200 hours, preferably from 5 hours to 150 hours. The crude product can be purified by methods known to the person skilled in the art and appropriate for the respective polymer, for example repeated re-precipitation or even by dialysis.

Suitable organic solvents for the process described are, for example, ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, benzene, toluene and xylene, alcohols, for example methanol, ethanol, 1-propanol, 2-propanol, ethylene glycol, 1-butanol, 2-butanol and tertbutanol, ketones, for example acetone, ethyl methyl ketone and isobutyl methyl ketone, amides, for example dimethylformamide (DMF), dimethylacetamide and N-methylpyrrolidone, nitriles, for example acetonitrile, propionitrile and butyronitrile, and mixtures thereof.

The palladium and phosphine components should be selected analogously to the description for the Suzuki variant.

Alternatively, the polymers of the present invention can also be synthesized by the Negishi reaction using zinc reagents A-$(ZnX^{22})_2$, wherein $X^{22}$ is halogen and halides, and COM$^1$-$(X^{23})_2$, wherein $X^{23}$ is halogen or triflate, or using A-$(X^{23})_2$ and COM$^1$-$(ZnX^{22})_2$. Reference is, for example, made to E. Negishi et al., Heterocycles 18 (1982) 117-22.

Alternatively, the polymers of the present invention can also be synthesized by the Hiyama reaction using organosilicon reagents A-$(SiR^{210}R^{211}R^{212})_2$, wherein $R^{210}$, $R^{211}$ and $R^{212}$ are identical or different and are halogen, $C_1$-$C_6$alkyl and COM$^1$-$(X^{23})_2$, wherein $X^{23}$ is halogen or triflate, or using A-$(X^{23})_2$ and COM$^1$-$(SiR^{210}R^{211}R^{212})_2$. Reference is, for example, made to T. Hiyama et al., Pure Appl. Chem. 66 (1994) 1471-1478 and T. Hiyama et al., Synlett (1991) 845-853.

Homopolymers of the type (A), can be obtained via Yamamoto coupling of dihalides $X^{10}$-A-$X^{10}$, where $X^{10}$ is halogen, preferably bromide. Alternatively homopolymers of the type $(A)_n$ can be obtained via oxidative polymerization of units $X^{10}$-A-$X^{10}$, where $X^{10}$ is hydrogen, e.g. with $FeCl_3$ as oxidizing agent.

The polymers, wherein $R^1$ and/or $R^2$ are hydrogen can be obtained by using a protecting group which can be removed after polymerization (see, for example, EP-A-0 648 770, EP-A-0 648 817, EP-A-0 742 255, EP-A-0 761 772, WO98/32802, WO98/45757, WO98/58027, WO99/01511, WO00/17275, WO00/39221, WO00/63297 and EP-A-1 086 984). Conversion of the pigment precursor into its pigmentary form is carried out by means of fragmentation under known conditions, for example thermally, optionally in the presence of an additional catalyst, for example the catalysts described in WO00/36210. An example of such a protecting group is group of formula

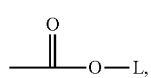

wherein L is any desired group suitable for imparting solubility. L is preferably a group of formula

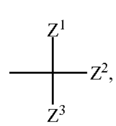

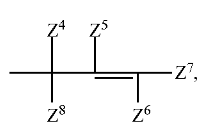

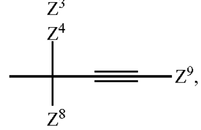

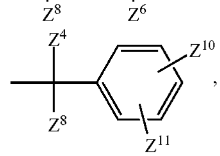

, or

-continued

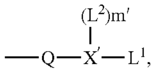

wherein $Z^1$, $Z^2$ and $Z^3$ are independently of each other $C_1$-$C_6$alkyl, $Z^4$ and $Z^8$ are independently of each other $C_1$-$C_6$alkyl, $C_1$-$C_6$alkyl interrupted by oxygen, sulfur or $N(Z^{12})_2$, or unsubstituted or $C_1$-$C_6$alkyl-, $C_1$-$C_6$alkoxy-, halo-, cyano- or nitro-substituted phenyl or biphenyl, $Z^5$, $Z^6$ and $Z^7$ are independently of each other hydrogen or $C_1$-$C_6$alkyl, $Z^9$ is hydrogen, $C_1$-$C_6$alkyl or a group of formula

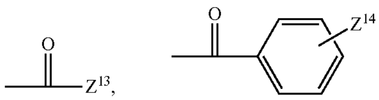

or

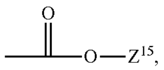

$Z^{10}$ and $Z^{11}$ are each independently of the other hydrogen, $C_1$-$C_6$alkyl, $C_1$-$C_6$alkoxy, halogen, cyano, nitro, $N(Z^{12})_2$, or unsubstituted or halo-, cyano-, nitro-, $C_1$-$C_6$alkyl- or $C_1$-$C_6$alkoxy-substituted phenyl, $Z^{12}$ and $Z^{13}$ are $C_1$-$C_6$alkyl, $Z^{14}$ is hydrogen or $C_1$-$C_6$alkyl, and $Z^{15}$ is hydrogen, $C_1$-$C_6$alkyl, or unsubstituted or $C_1$-$C_6$alkyl-substituted phenyl, Q is p,q-$C_2$-$C_6$alkylene unsubstituted or mono- or poly-substituted by $C_1$-$C_6$alkoxy, $C_1$-$C_6$alkylthio or $C_2$-$C_{12}$dialkylamino, wherein p and q are different position numbers, X' is a hetero atom selected from the group consisting of nitrogen, oxygen and sulfur, m' being the number 0 when X' is oxygen or sulfur and m being the number 1 when X' is nitrogen, and $L^1$ and $L^2$ are independently of each other unsubstituted or mono- or poly-$C_1$-$C_{12}$alkoxy-, —$C_1$-$C_{12}$alkylthio-, —$C_2$-$C_{24}$dialkylamino-, —$C_6$-$C_{12}$aryloxy-, —$C_6$-$C_{12}$arylthio-, —$C_7$-$C_{24}$alkylarylamino- or —$C_{12}$-$C_{24}$diarylamino-substituted $C_1$-$C_6$alkyl or [-(p',q'-$C_2$-$C_8$alkylene)-Z—]$_{n'}$—$C_1$-$C_6$alkyl, n' being a number from 1 to 1000, p' and q' being different position numbers, each Z independently of any others being a hetero atom oxygen, sulfur or $C_1$-$C_{12}$alkyl-substituted nitrogen, and it being possible for $C_2$-$C_6$alkylene in the repeating [—$C_2$-$C_6$alkylene-Z-] units to be the same or different, and $L^1$ and $L^2$ may be saturated or unsaturated from one to ten times, may be uninterrupted or interrupted at any location by from 1 to 10 groups selected from the group consisting of —(C═O)— and —$C_6H_4$—, and may carry no further substituents or from 1 to 10 further substituents selected from the (Noun consisting of halogen, cyano and nitro. Most preferred L is a group of formula

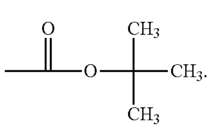

The synthesis of the compounds of formula Br-A-Br is described in WO08/000,664, and PCT/EP2008/062586, or can be done in analogy to the methods described therein. The synthesis of N-aryl substituted compounds of formula Br-A-Br can be done in analogy to the methods described in U.S. Pat. No. 5,354,869 and WO03/022848.

A mixture containing a polymer of the present invention results in a semi-conducting layer comprising a polymer of the present invention (typically 5% to 99.9999% by weight, especially 20 to 85% by weight) and at least another material. The other material can be, but is not restricted to a fraction of the same polymer of the present invention with different molecular weight, another polymer of the present invention, a semi-conducting polymer, organic small molecules, such as, for example, carbon nanotubes, a fullerene derivative, inorganic particles (quantum dots, quantum rods, quantum tripods, $TiO_2$, ZnO etc.), conductive particles (Au, Ag etc.), insulator materials like the ones described for the gate dielectric (PET, PS etc.).

Accordingly, the present invention also relates to an organic semiconductor material, layer or component, comprising a polymer according to the present invention.

The polymers of the present invention can be blended with small molecules described, for example, in PCT/EP2010/053655, WO09/047,104, U.S. Pat. No. 6,690,029, WO2007082584, and WO2008107089:

WO2007082584:

(I1)

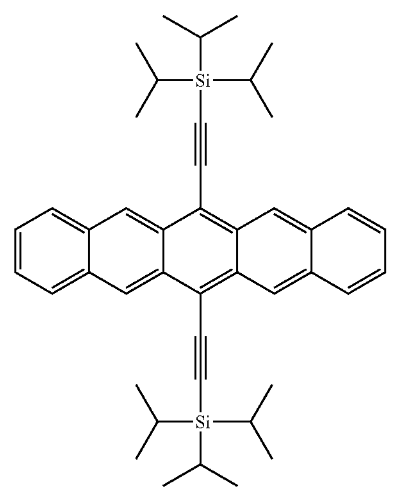

(I2)

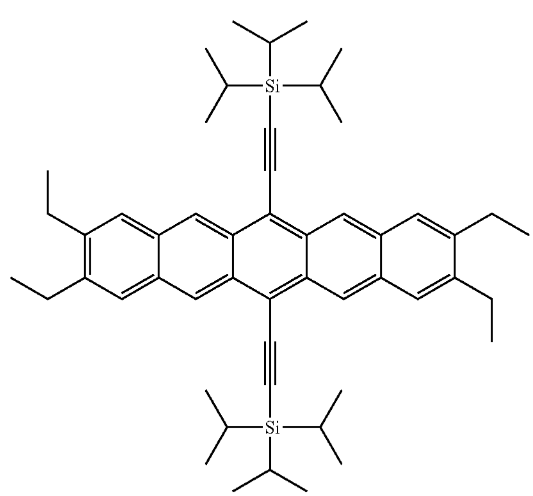

-continued
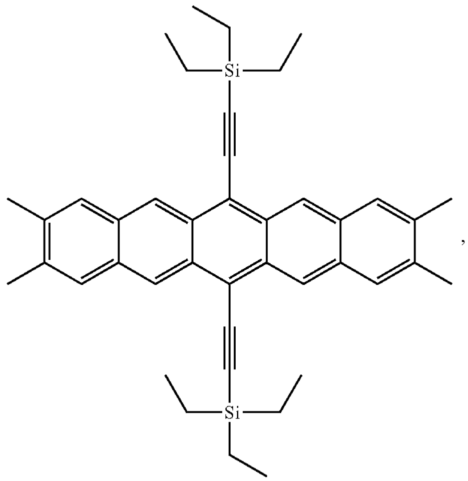
(I3)
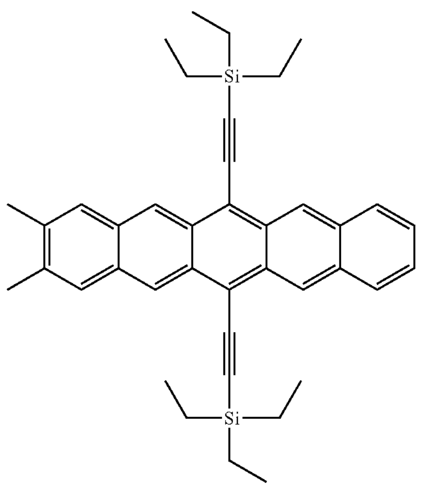
(I4)
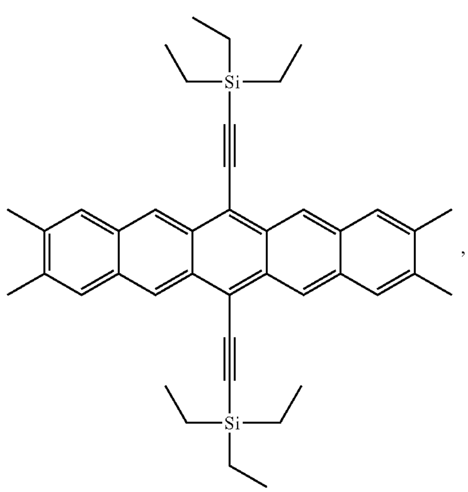
(I5)
-continued
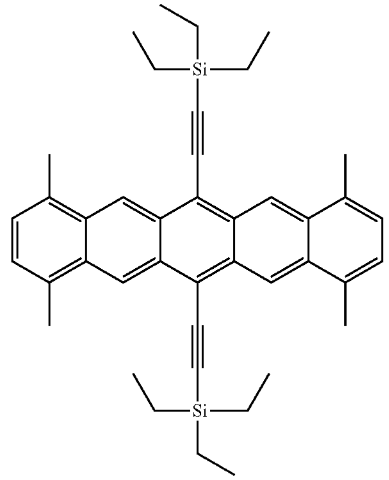
(I6)
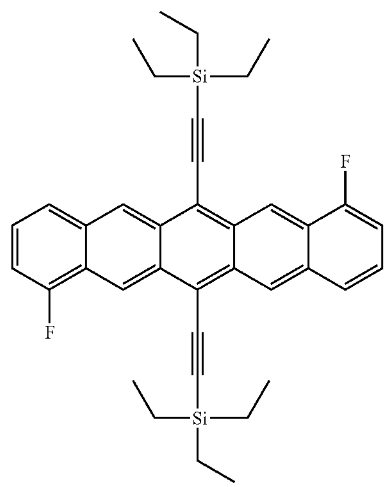
(I7)
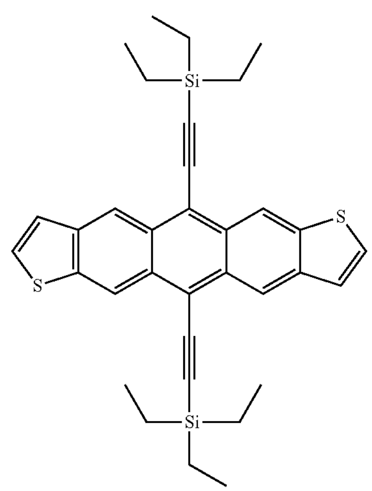
(I8)

-continued (I9)

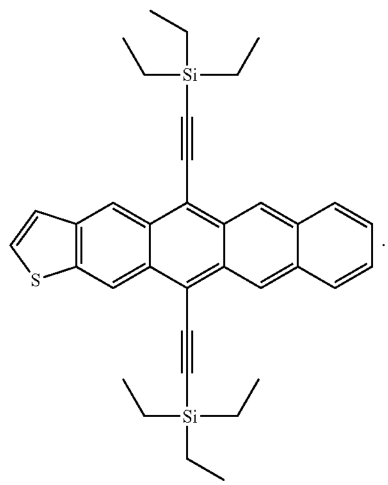

WO2008107089:

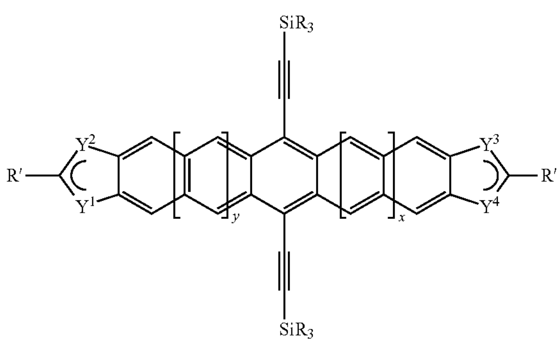

wherein one of $Y^1$ and $Y^2$ denotes —CH═ or ═CH— and the other denotes —X—, one of $Y^3$ and $Y^4$ denotes —CH═ or ═CH— and the other denotes —X—, X is —O—, —S—, —Se— or R is cyclic, straight-chain or branched alkyl or alkoxy having 1 to 20 C-atoms, or aryl having 2-30 C-atoms, all of which are optionally fluorinated or perfluorinated, R' is H, F, Cl, Br, I, CN, straight-chain or branched alkyl or alkoxy having 1 to 20 C-atoms and optionally being fluorinated or perfluorinated, optionally fluorinated or perfluorinated aryl having 6 to 30 C-atoms, or $CO_2R''$, with R'' being H, optionally fluorinated alkyl having 1 to 20 C-atoms, or optionally fluorinated aryl having 2 to 30 C-atoms, R''' is H or cyclic, straight-chain or branched alkyl with 1 to 10 C-atoms, y is 0, or 1, x is 0, or 1.

A1

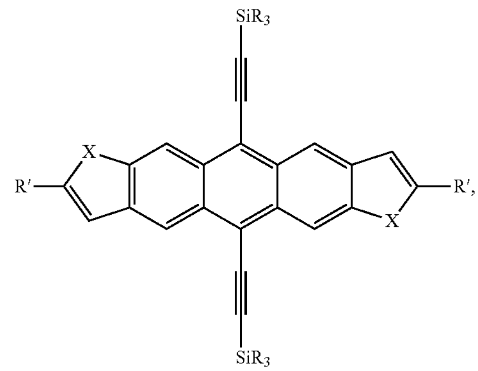

A2

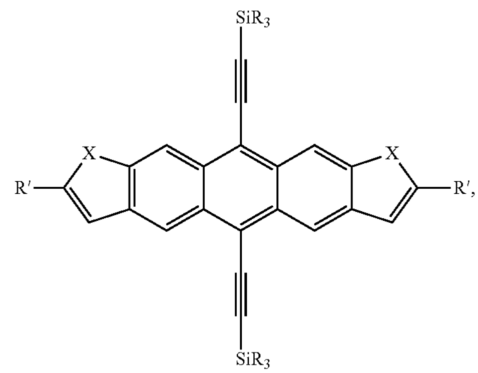

B1

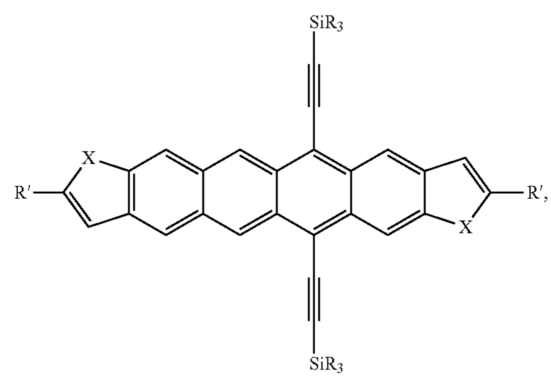

B2

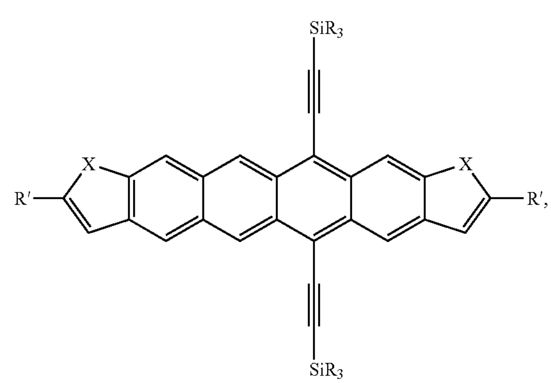

-continued

C1

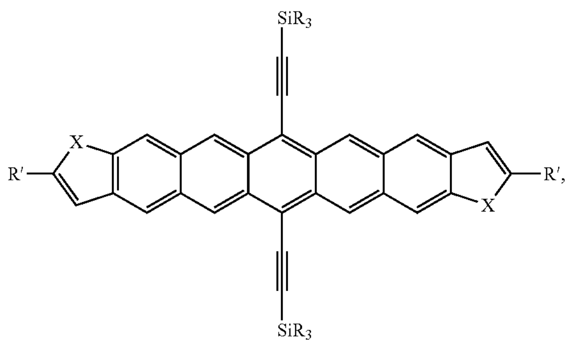

C2

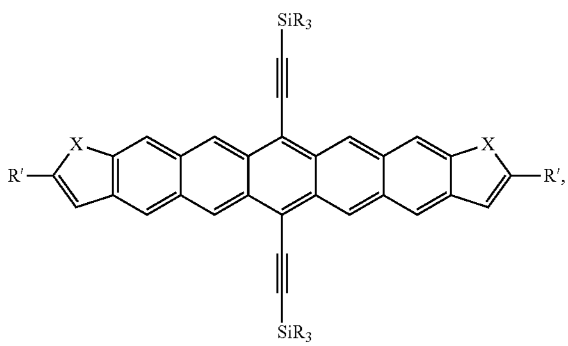

The polymer can contain a small molecule, or a mixture of two, or more small molecule compounds.

The polymers of the invention according to the present invention can be used as the semiconductor layer in semiconductor devices. Accordingly, the present invention also relates to semiconductor devices, comprising a polymer of the present invention, or an organic semiconductor material, layer or component. The semiconductor device is especially an organic photovoltaic (PV) device (solar cell), a photodiode, or an organic field effect transistor.

There are numerous types of semiconductor devices. Common to all is the presence of one or more semiconductor materials. Semiconductor devices have been described, for example, by S. M. Sze in Physics of Semiconductor Devices, $2^{nd}$ edition, John Wiley and Sons, New York (1981). Such devices include rectifiers, transistors (of which there are many types, including p-n-p, n-p-n, and thin-film transistors), light emitting semiconductor devices (for example, organic light emitting diodes in display applications or backlight in e.g. liquid crystal displays), photoconductors, current limiters, solar cells, thermistors, p-n junctions, field-effect diodes, Schottky diodes, and so forth. In each semiconductor device, the semiconductor material is combined with one or more metals, metal oxides, such as, for example, indium tin oxide (ITO), and/or insulators to form the device. Semiconductor devices can be prepared or manufactured by known methods such as, for example, those described by Peter Van Zant in Microchip Fabrication, Fourth Edition, McGraw-Hill, New York (2000). In particular, organic electronic components can be manufactured as described by D. R. Gamota et al. in Printed Organic and Molecular Electronics, Kluver Academic Publ., Boston, 2004.

A particularly useful type of transistor device, the thin-film transistor (TFT), generally includes a gate electrode, a gate dielectric on the gate electrode, a source electrode and a drain electrode adjacent to the gate dielectric, and a semiconductor layer adjacent to the gate dielectric and adjacent to the source and drain electrodes (see, for example, S. M. Sze, Physics of Semiconductor Devices, $2^{nd}$ edition, John Wiley and Sons, page 492, New York (1981)). These components can be assembled in a variety of configurations. More specifically, an OFET has an organic semiconductor layer.

Typically, a substrate supports the OFET during manufacturing, testing, and/or use. Optionally, the substrate can provide an electrical function for the OFET. Useful substrate materials include organic and inorganic materials. For example, the substrate can comprise silicon materials inclusive of various appropriate forms of silicon, inorganic glasses, ceramic foils, polymeric materials (for example, acrylics, polyester, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS)), filled polymeric materials (for example, fiber-reinforced plastics (FRP)), and coated metallic foils.

The gate electrode can be any useful conductive material. For example, the gate electrode can comprise doped silicon, or a metal, such as aluminum, chromium, gold, silver, nickel, palladium, platinum, tantalum, and titanium. Conductive oxides, such as indium tin oxide, or conducting inks/pastes comprised of carbon black/graphite or colloidal silver dispersions, optionally containing polymer binders can also be used. Conductive polymers also can be used, for example polyaniline or poly(3,4-ethylenedioxythiophene)/poly(styrene sulfonate) (PEDOT:PSS). In addition, alloys, combinations, and multilayers of these materials can be useful. In some OFETs, the same material can provide the gate electrode function and also provide the support function of the substrate. For example, doped silicon can function as the gate electrode and support the OFET.

The gate dielectric is generally provided on the gate electrode. This gate dielectric electrically insulates the gate electrode from the balance of the OFET device. Useful materials for the gate dielectric can comprise, for example, an inorganic electrically insulating material.

The gate dielectric (insulator) can be a material, such as, an oxide, nitride, or it can be a material selected from the family of ferroelectric insulators (e.g. organic materials such as poly(vinylidene fluoride/trifluoroethylene or poly(m-xylylene adipamide)), or it can be an organic polymeric insulator (e.g. poly(methacrylate)s, poly(acrylate)s, polyimides, benzocyclobutenes (BCBs), parylenes, polyvinylalcohol, polyvinylphenol (PVP), polystyrenes, polyester, polycarbonates) as for example described in J. Veres et al. Chem. Mat. 2004, 16, 4543 or A. Facchetti et al. Adv. Mat. 2005, 17, 1705. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulphide, including but not limited to $PbZr_xTi_{1-x}O_3$ (PZT), $Bi_4Ti_3O_{12}$, $BaMgF_4$, $Ba(Zr_{1-x}Ti_x)O_3$ (BZT). In addition, alloys, hybride materials (e.g. polysiloxanes or nanoparticle-filled polymers) combinations, and multilayers of these materials can be used for the gate dielectric. The thickness of the dielectric layer is, for example, from about 10 to 1000 nm, with a more specific thickness being about 100 to 500 nm, providing a capacitance in the range of 0.1-100 nanofarads (nF).

The source electrode and drain electrode are separated from the gate electrode by the gate dielectric, while the organic semiconductor layer can be over or under the source electrode and drain electrode. The source and drain electrodes can be any useful conductive material favourably providing a low resistance ohmic contact to the semiconductor layer. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof. Some of these materials are appropriate for use with n-type semiconductor materials and others are appropriate for use with p-type semiconductor materials, as is known in the art.

The thin film electrodes (that is, the gate electrode, the source electrode, and the drain electrode) can be provided by any useful means such as physical vapor deposition (for example, thermal evaporation or sputtering) or (ink jet) printing methods. The patterning of these electrodes can be accomplished by known methods such as shadow masking, additive photolithography, subtractive photolithography, printing, microcontact printing, and pattern coating.

The present invention further provides an organic field effect transistor device comprising a plurality of electrically conducting gate electrodes disposed on a substrate; a gate insulator layer disposed on said electrically conducting gate electrodes; a plurality of sets of electrically conductive source and drain electrodes disposed on said insulator layer such that each of said sets is in alignment with each of said gate electrodes; an organic semiconductor layer disposed in the channel between source and drain electrodes on said insulator layer substantially overlapping said gate electrodes; wherein said organic semiconductor layer comprises a polymer of the present invention, or an organic semiconductor material, layer or component.

The present invention further provides a process for preparing a thin film transistor device comprising the steps of:

depositing a plurality of electrically conducting gate electrodes on a substrate;

depositing a gate insulator layer on said electrically conducting gate electrodes;

depositing a plurality of sets of electrically conductive source and drain electrodes on said layer such that each of said sets is in alignment with each of said gate electrodes; depositing a layer of a polymer of the present invention on said insulator layer such that said layer of the compound of the present invention, or a mixture containing a polymer of the present invention, substantially overlaps said gate electrodes; thereby producing the thin film transistor device.

Alternatively, an OFET is fabricated by, for example, by solution deposition of a polymer on a highly doped silicon substrate covered with a thermally grown oxide layer followed by vacuum deposition and patterning of source and drain electrodes.

In yet another approach, an OFET is fabricated by deposition of source and drain electrodes on a highly doped silicon substrate covered with a thermally grown oxide and then solution deposition of the polymer to form a thin film.

The gate electrode could also be a patterned metal gate electrode on a substrate or a conducting material such as, a conducting polymer, which is then coated with an insulator applied either by solution coating or by vacuum deposition on the patterned gate electrodes.

Any suitable solvent can be used to dissolve, and/or disperse the polymers of the present application, provided it is inert and can be removed partly, or completely from the substrate by conventional drying means (e.g. application of heat, reduced pressure, airflow etc.). Suitable organic solvents for processing the semiconductors of the invention include, but are not limited to, aromatic or aliphatic hydrocarbons, halogenated such as chlorinated or fluorinated hydrocarbons, esters, ethers amides, such as chloroform, tetrachloroethane, tetrahydrofuran, toluene, tetraline, decaline, anisole, xylene, ethyl acetate, methyl ethyl ketone, dimethyl formamide, chloroform, chlorobenzene, dichlorobenzene, trichlorobenzene, propylene glycol monomethyl ether acetate (PGMEA) and mixtures thereof. Preferred solvents are xylene, toluene, tetraline, decaline, chlorinated ones such as chloroform, chlorobenzene, ortho-dichlorobenzene, trichlorobenzene and mixtures thereof. The solution, and/or dispersion is then applied by a method, such as, spin-coating, dip-coating, screen printing, microcontact printing, doctor blading or other solution application techniques known in the art on the substrate to obtain thin films of the semiconducting material.

The term "dispersion" covers any composition comprising the semiconductor material of the present invention, which is not fully dissolved in a solvent. The dispersion can be done selecting a composition including at least a polymer of the present invention, or a mixture containing a polymer of the present invention, and a solvent, wherein the polymer exhibits lower solubility in the solvent at room temperature but exhibits greater solubility in the solvent at an elevated temperature, wherein the composition gels when the elevated temperature is lowered to a first lower temperature without agitation;

dissolving at the elevated temperature at least a portion of the polymer in the solvent; lowering the temperature of the composition from the elevated temperature to the first lower temperature; agitating the composition to disrupt any gelling, wherein the agitating commences at any time prior to, simultaneous with, or subsequent to the lowering the elevated temperature of the composition to the first lower temperature; depositing a layer of the composition wherein the composition is at a second lower temperature lower than the elevated temperature; and drying at least partially the layer.

The dispersion can also be constituted of (a) a continuous phase comprising a solvent, a binder resin, and optionally a dispersing agent, and (b) a disperse phase comprising a polymer of the present invention, or a mixture containing a polymer of the present invention. The degree of solubility of the polymer of the present invention in the solvent may vary for example from 0% to about 20% solubility, particularly from 0% to about 5% solubility.

Preferably, the thickness of the organic semiconductor layer is in the range of from about 5 to about 1000 nm, especially the thickness is in the range of from about 10 to about 100 nm.

The polymers of the invention can be used alone or in combination as the organic semiconductor layer of the semiconductor device. The layer can be provided by any useful means, such as, for example, vapor deposition (for materials with relatively low molecular weight) and printing techniques. The compounds of the invention may be sufficiently soluble in organic solvents and can be solution deposited and patterned (for example, by spin coating, dip coating, ink jet printing, gravure printing, flexo printing, offset printing, screen printing, microcontact (wave)-printing, drop or zone casting, or other known techniques).

The polymers of the invention can be used in integrated circuits comprising a plurality of OTFTs, as well as in various electronic articles. Such articles include, for example, radiofrequency identification (RFID) tags, backplanes for flexible displays (for use in, for example, personal computers, cell phones, or handheld devices), smart cards, memory devices, sensors (e.g. light-, image-, bio-, chemo-, mechanical- or temperature sensors), especially photodiodes, or security devices and the like. Due to its ambi-polarity the material can also be used in Organic Light Emitting Transistors (OLET).

A further aspect of the present invention is an organic semiconductor material, layer or component comprising one or more polymers of the present invention. A further aspect is the use of the polymers or materials of the present invention in an organic photovoltaic (PV) device (solar cell), a photodiode, or an organic field effect transistor (OFET). A further aspect is an organic photovoltaic (PV) device (solar cell), a photodiode, or an organic field effect transistor (OFET) comprising a polymer or material of the present invention.

The polymers of the present invention are typically used as organic semiconductors in form of thin organic layers or films, preferably less than 30 microns thick. Typically the semiconducting layer of the present invention is at most 1 micron (=1 μm) thick, although it may be thicker if required. For various electronic device applications, the thickness may also be less than about 1 micron thick. For example, for use in an OFET the layer thickness may typically be 100 nm or less. The exact thickness of the layer will depend, for example, upon the requirements of the electronic device in which the layer is used.

For example, the active semiconductor channel between the drain and source in an OFET may comprise a layer of the present invention.

An OFET device according to the present invention preferably comprises:

- a source electrode,
- a drain electrode,
- a gate electrode,
- a semiconducting layer,
- one or more gate insulator layers, and
- optionally a substrate, wherein the semiconductor layer comprises one or more polymers of the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device.

Suitable structures and manufacturing methods of an OFET device are known to the skilled in the art and are described in the literature, for example in WO03/052841.

The gate insulator layer may comprise for example a fluoropolymer, like e.g. the commercially available Cytop 809M®, or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont), or Fluoropel® (from Cytonix) or the perfluorosolvent FC 43® (Acros, No. 12377).

The semiconducting layer comprising a polymer of the present invention may additionally comprise at least another material. The other material can be, but is not restricted to another polymer of the present invention, a semi-conducting polymer, a polymeric binder, organic small molecules different from a polymer of the present invention, carbon nanotubes, a fullerene derivative, inorganic particles (quantum dots, quantum rods, quantum tripods, $TiO_2$, ZnO etc.), conductive particles (Au, Ag etc.), and insulator materials like the ones described for the gate dielectric (PET, PS etc.). As stated above, the semiconductive layer can also be composed of a mixture of one or more polymers of the present invention and a polymeric binder. The ratio of the polymers of the present invention to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA). With this technique, a degradation of the electrical performance can be avoided (cf. WO2008/001123A1).

The polymers of the present invention are advantageously used in organic photovoltaic (PV) devices (solar cells). Accordingly, the invention provides PV devices comprising a polymer according to the present invention. A device of this construction will also have rectifying properties so may also be termed a photodiode. Photoresponsive devices have application as solar cells which generate electricity from light and as photodetectors which measure or detect light.

The PV device comprise in this order:

(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the polymers of the present invention. Preferably, the photoactive layer is made of a conjugated polymer of the present invention, as an electron donor and an acceptor material, like a fullerene, particularly a functionalized fullerene PCBM, as an electron acceptor. For heterojunction solar cells the active layer comprises preferably a mixture of a polymer of the present invention and a fullerene, such as [60]PCBM (=6,6-phenyl-$C_{61}$-butyric acid methyl ester), or [70]PCBM, in a weight ratio of 1:1 to 1:3.

The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{60}$ to $C_{96}$. Most preferably the fullerene is $C_{60}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of any semi-conducting polymer, such as, for example, a polymer of the present invention, provided that the polymers retain acceptor-type and electron mobility characteristics, organic small molecules, carbon nanotubes, inorganic particles (quantum dots, quantum rods, quantum tripods, TiO2, ZnO etc.).

The photoactive layer is made of a polymer of the present invention as an electron donor and a fullerene, particularly functionalized fullerene PCBM, as an electron acceptor. These two components are mixed with a solvent and applied as a solution onto the smoothing layer by, for example, the spin-coating method, the drop casting method, the Langmuir-Blodgett ("LB") method, the ink jet printing method and the dripping method. A squeegee or printing method could also be used to coat larger surfaces with such a photoactive layer.

Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and mixtures thereof.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006) and WO2004/112161.

A so called 'tandem solar cell' comprise in this order:

(a) a cathode (electrode),
(b) optionally a transition layer, such as an alkali halogenide, especially lithium fluoride,
(c) a photoactive layer,
(d) optionally a smoothing layer,
(e) a middle electrode (such as Au, Al, ZnO, $TiO_2$ etc.)
(f) optionally an extra electrode to match the energy level,
(g) optionally a transition layer, such as an alkali halogenide, especially lithium fluoride,
(h) a photoactive layer,
(i) optionally a smoothing layer,
(j) an anode (electrode),
(k) a substrate.

The PV device can also be processed on a fiber as described, for example, in US20070079867 and US 20060013549.

Due to their excellent self-organising properties the materials or films comprising the polymers of the present invention can also be used alone or together with other materials in or as alignment layers in LCD or OLED devices, as described for example in US2003/0021913.

The following examples are included for illustrative purposes only and do not limit the scope of the claims. Unless otherwise stated, all parts and percentages are by weight. Weight-average molecular weight (Mw) and polydispersity (Mw/Mn=PD) are determined by High Temperature Gel Permeation Chromatography (HT-GPC) [Apparatus: GPC PL 220 from Polymer laboratories (Church Stretton, UK; now Varian) yielding the responses from refractive index (RI), Chromatographic conditions: Column: 3 "PLgel Olexis" column from Polymer Laboratories (Church Stretton, UK); with an average particle size of 13 μm (dimensions 300×8 mm I.D.) Mobile phase: 1,2,4-trichlorobenzene purified by vacuum distillation and stabilised by butylhydroxytoluene (BHT, 200 mg/l), Chromatographic temperature: 150° C.; Mobile phase flow: 1 ml/min; Solute concentration: about 1 mg/ml; Injection volume: 200 μl; Detection: RI, Procedure of molecular weight calibration: Relative calibration is done by use of a set of 10 polystyrene calibration standards obtained from Polymer Laboratories (Church Stretton, UK) spanning the molecular weight range from 1'930'000 Da-5'050 Da, i.e., PS1'930'000, PS1'460'000, PS1'075'000, PS 560'000, PS 330'000, PS 96'000, PS 52'000, PS 30'300, PS10'100, PS 5'050 Da. A polynomic calibration is used to calculate the molecular weight.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES

Example 1

Synthesis of Polymer 2

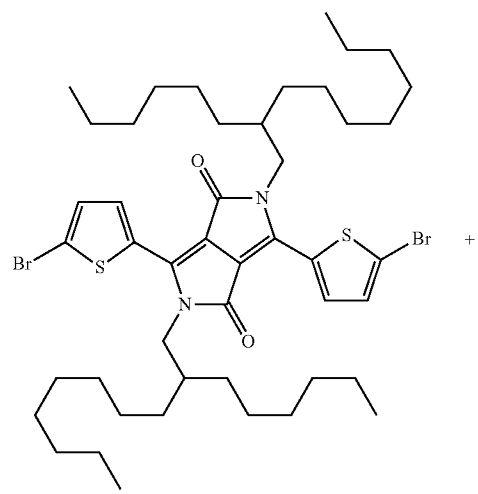

1

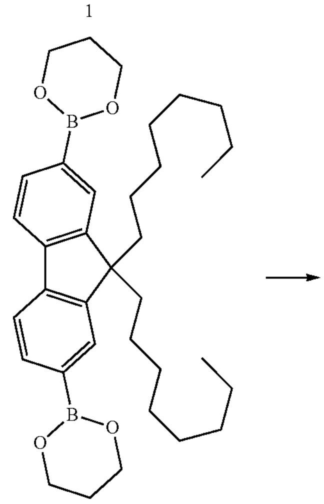

-continued

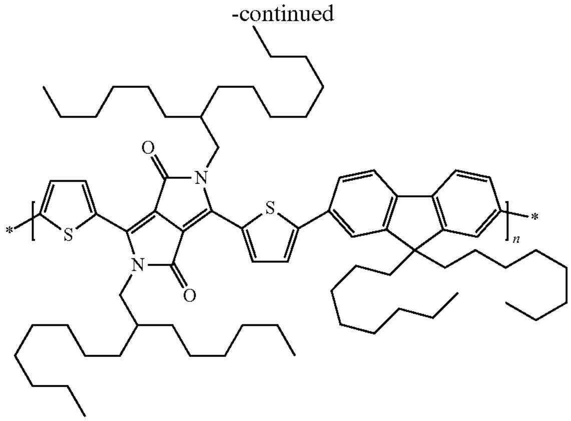

2

The starting material 1 is prepared according to Example 2a of WO2008000664. In a three neck-flask, 0.71 g of potassium phosphate ($K_3PO_4$) dissolved in 2.1 ml of water (previously degassed with argon) is added to a degassed solution of 1.00 g of 1, 0.63 g of 9,9-dioctylfluorene-2,7-diboronic acid bis(1,3-propanediol)ester 16.0 mg of tri-tert-butylphosphonium tetrafluoroborate ($(t\text{-}Bu)_3P{*}HBF_4$) and 26.0 mg of tris (dibenzylideneacetone) dipalladium (0) ($Pd_2(dba)_3$) in 10 ml of tetrahydrofuran. The reaction mixture is heated to 50° C. for 13 hours. Subsequently, 18 mg bromo-thiophene and 20 minutes later 23 mg thiophene-boronic acid pinacol ester are added to stop the polymerisation reaction. The reaction mixture is cooled to room temperature and precipitated in methanol. The residue is purified by soxhlet extraction using pentane and the polymer is then extracted with cyclohexane to give 0.96 g of a dark powder. Mw=27'500, Polydispersity=2.0 (measured by HT-GPC).

The performance of polymer 2 in organic field effect transistors is summarized in table 1.

Example 2

Synthesis of polymer 4

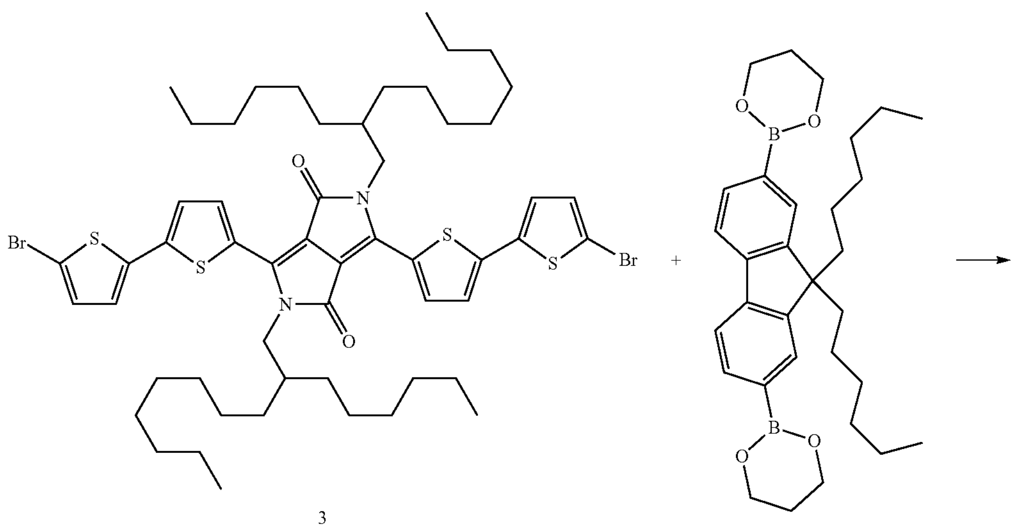

3

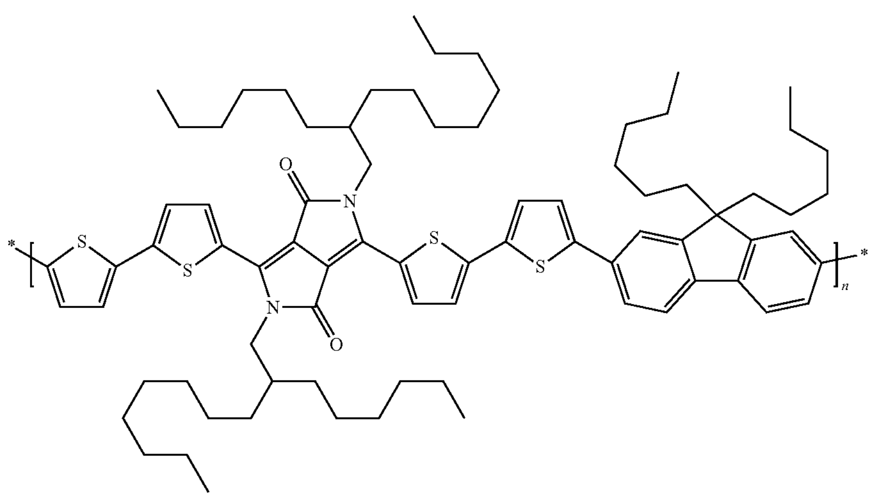

4

The starting material 3 is prepared according to Example 40b of WO2009047104. According to the procedure for the synthesis of polymer 2,9,9-dihexylfluorene-2,7-diboronic acid bis(1,3-propanediol) ester and 3 have been reacted to give polymer 4. The purification is achieved by soxhlet extraction using diethylether and the polymer is then extracted with THF to give 4 as a dark powder. Mw=57600, Polydispersity=2.4 (measured by HT-GPC).

Organic field effect transistor application example: Polymer 4

Bottom-gate thin film transistor (TFT) structures with p-Si gate (10 cm) are used for all experiments. A high-quality thermal $SiO_2$ layer of 300 nm thickness served as gate-insulator of $C_i$=32.6 nF/cm$^2$ capacitance per unit area. Source and drain electrodes are patterned by photolithography directly on the gate-oxide. Gold source drain electrodes defining channels of width W=10 mm and varying lengths L=4, 8, 15, 30 m are used. Prior to deposition of the organic semiconductor the $SiO_2$ surface is derivatized either with hexadimethylsilazane (HMDS) by exposing to a saturated silane vapour at 160° C. for 2 hours, by spin coating the HMDS at a spinning speed of 800 rpm (rounds per minute) for about a minute or by treating the substrate at 60° C. with a 0.1 M solution of octadecyltrichlorosilane (OTS) in toluene for 20 minutes. After rinsing with iso-propanol the substrates are dried.

The semiconductor thin film is prepared either by spin-coating or drop casting the DPP derivative of the formula 4 obtained in example 2 in a 0.5% (w/w) solution in orthodichlorobenzene. The spin coating is accomplished at a spinning speed of 1000 rpm (rounds per minute) for about 60 seconds in ambient conditions. The devices are evaluated as-deposited and after drying at 100° C. or 120° C. for 15 minutes.

Transistor Performance in Ortho-Dichlorobenzene

The transistor behaviour is measured on an automated transistor prober (TP-10).

From a linear fit to the square root of the saturated transfer characteristics a field effect mobility of $8.4\times10^{-4}$ cm$^2$/Vs with an on/off current ratio of $4.4\times10^4$ can be determined after drying. The threshold voltage is at −2.2 V.

Organic Bulk Heterojunction Solar Cells Application Example: Polymer 4

The solar cell has the following structure: Al electrode/LiF layer/organic layer, including compound of the invention/[poly(3,4-ethylenedioxy-thiophene) (PEDOT): poly(styrenesulfonic acid) (PSS)]/ITO electrode/glass substrate. The solar cells are made by spin coating a layer of the PEDOT:PSS on a pre-patterned ITO on glass substrate. Then a 1:1 mixture of the compound of formula 4 (1% by weight): [60]PCBM or [70]PCBM (a substituted $C_{60}$ or $C_{70}$ fullerene) is spin coated (organic layer). LiF and Al are sublimed under high vacuum through a shadow-mask.

Solar Cell Performance

The solar cell characteristics are measured with a solar light simulator under AM1.5 conditions. The current is also calculated from the with the External Quantum Efficiency (EQE) measurement. This leads to a value of Jsc=2.5 mA/cm$^2$, FF=0.49 and Voc=0.75 V for an estimated overall efficiency of 0.9%.

Example 3

Synthesis of Polymer 6

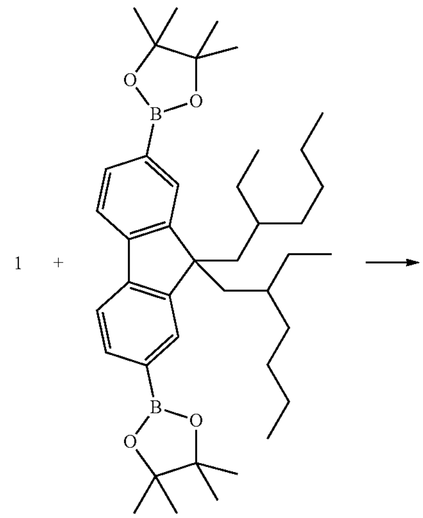

5

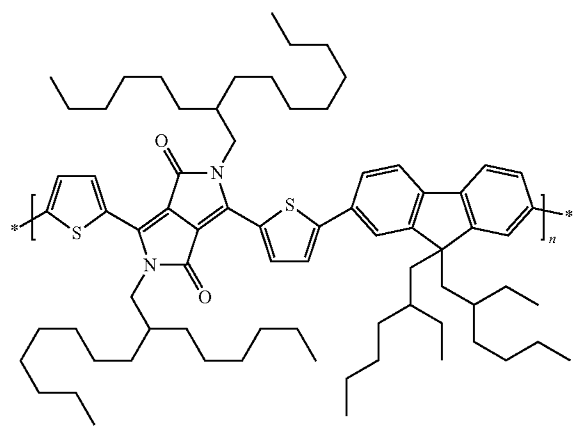

6

According to the procedure for the synthesis of polymer 2,9,9-di(2'-ethylhexyl)fluorene-2,7-diboronic acid bispinacol ester (prepared out of 9,9-di(2'-ethylhexyl)fluorene-2,7-diboronic acid by azeotropic refluxing with pinacol in toluene according to Tetrahedron Lett., 2003, 44, 19, 3863-3866) and 1 have been reacted to give polymer 6. The purification is achieved by soxhlet extraction using pentane and the polymer is then extracted with cyclohexane to give 6 as a dark powder. Mw=71'100, Polydispersity=1.9 (measured by HT-GPC).

The performance of polymer 6 in organic field effect transistors is summarized in table 1.

Example 4

Synthesis of Polymer 7

1 + 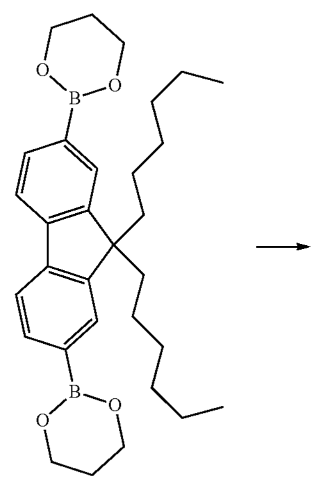

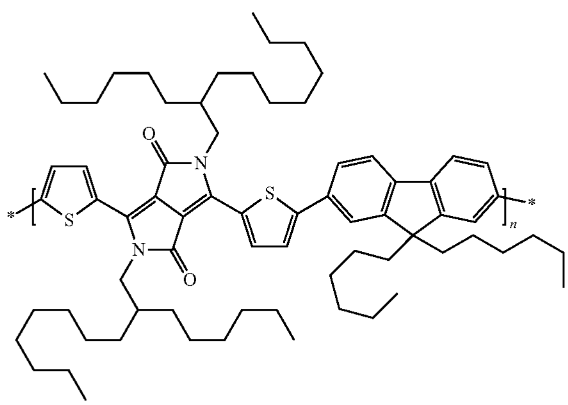

7

According to the procedure for the synthesis of polymer 2,9,9-dihexylfluorene-2,7-diboronic acid bis(1,3-propanediol) ester and 1 have been reacted to give polymer 7. The purification is achieved by soxhlet extraction using pentane and the polymer is then extracted with cyclohexane to give 7 as a dark powder. Mw=27'700, Polydispersity=2.1 (measured by HT-GPC).

The performance of polymer 7 in organic field effect transistors is summarized in table 1.

Example 5

Synthesis of Polymer 9

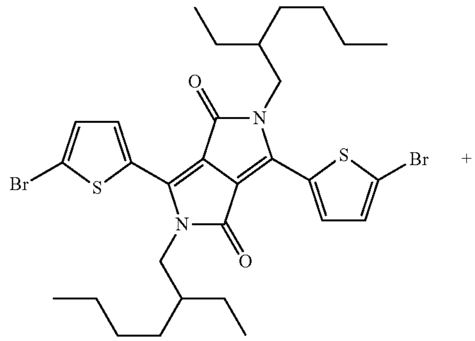

8

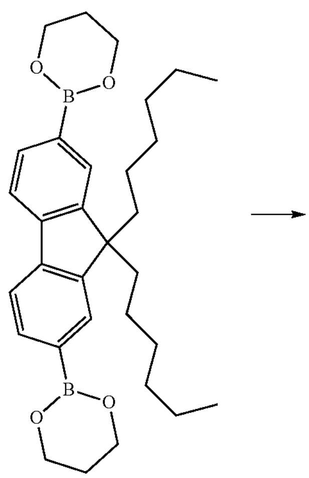

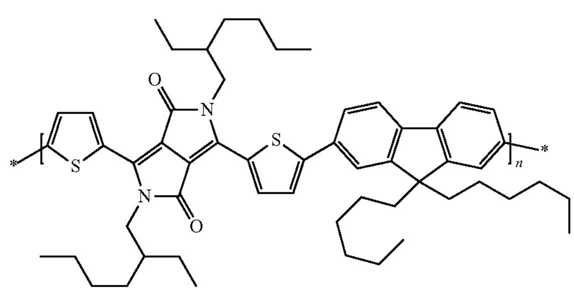

9

The starting material 8 is prepared according to Example 1a of WO2008000664. According to the procedure for the synthesis of polymer 2,9,9-dihexylfluorene-2,7-diboronic acid bis(1,3-propanediol) ester and 8 have been reacted to give polymer 9. The purification is achieved by soxhlet extraction using diethylether and cyclohexane and the polymer is then extracted with chloroform to give 9 as a dark powder. Mw=38000, Polydispersity=2.4 (measured by HT-GPC).

The performance of polymer 9 in organic field effect transistors and organic bulk hetero-junctions solar cells are summarized in table 1 and table 2, respectively.

Example 6

Synthesis of Polymer 11

1 +

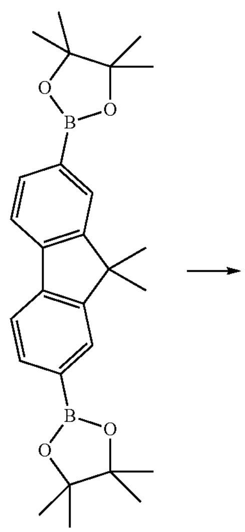

10

-continued

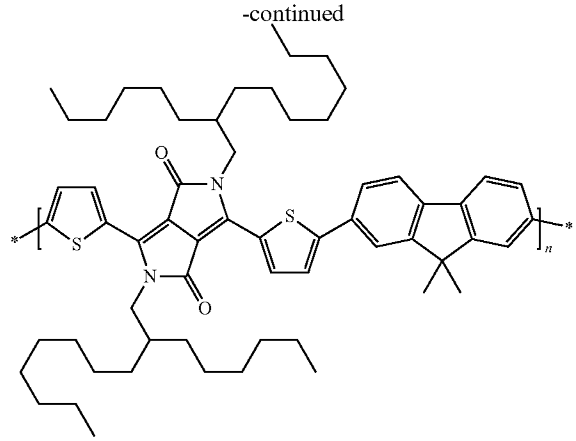

11

According to the procedure for the synthesis of polymer 2,9,9-dimethylfluorene-2,7-diboronic acid bispinacol ester (10, prepared according to J. Mat. Chem., 2004, 14, 17, 2622-2626) and 1 have been reacted to give polymer 11. The purification is achieved by soxhlet extraction using pentane, cyclohexane and THF the polymer is then extracted with chloroform to give 11 as a dark powder. Mw=98200, Polydispersity=2.4 (measured by HT-GPC).

The performance of polymer 11 in organic field effect transistors is summarized in table 1.

Example 7

Synthesis of Polymer 13

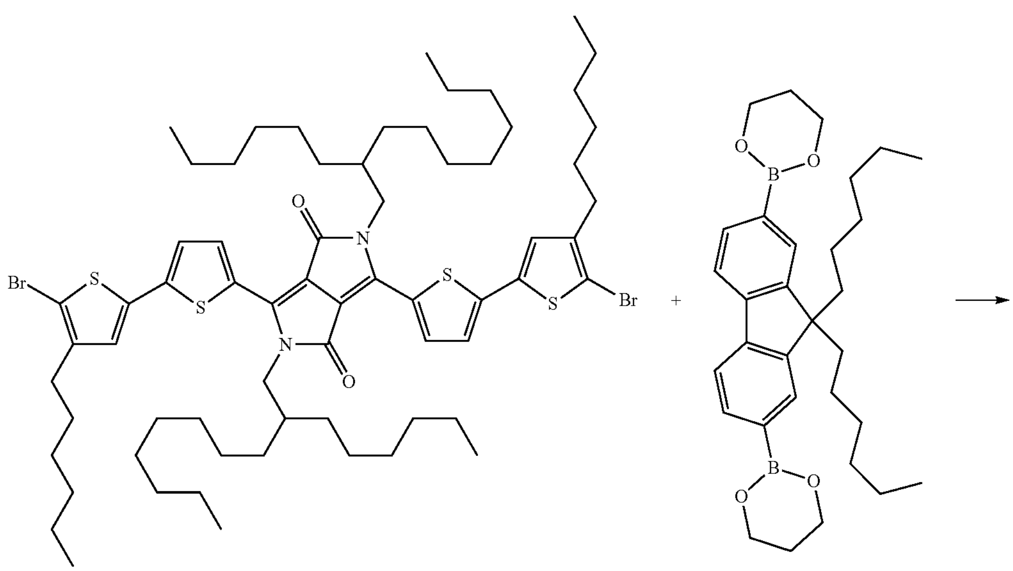

12

-continued

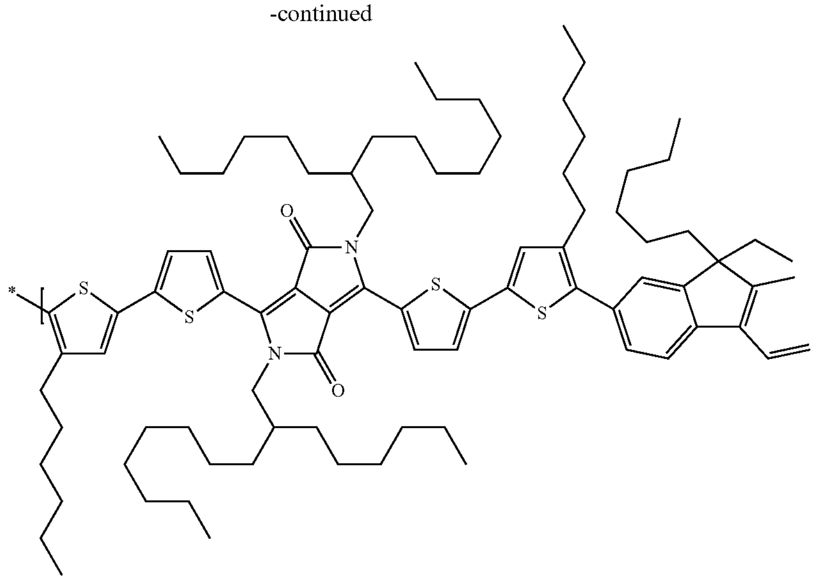

13

The starting material 12 is prepared according to Example 1a of WO2008000664. According to the procedure for the synthesis of polymer 2,9,9-dihexylfluorene-2,7-diboronic acid bis(1,3-propanediol) ester and 12 have been reacted to give polymer 13. The purification is achieved by soxhlet extraction using methanol and the polymer is then extracted with pentane to give 13 as a dark powder. Mw=19800, Polydispersity=2.6 (measured by HT-GPC).

The performance of polymer 13 in organic field effect transistors is summarized in table 1.

Example 8

Synthesis of Polymer 16

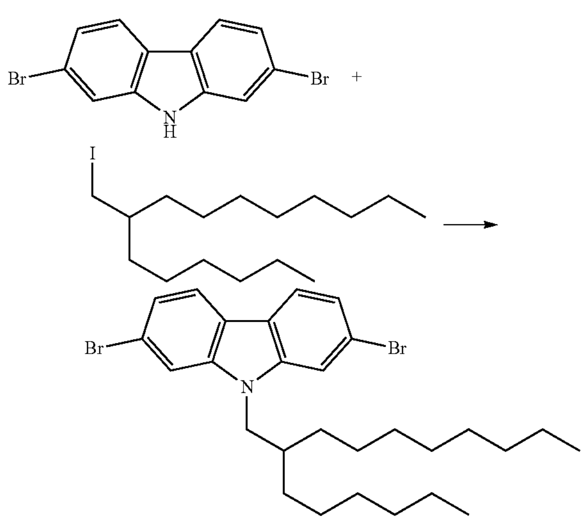

14 a) 7.02 g of 2,7-dibromocarbazole and 1.04 g sodium hydride were added to 70 ml of dimethylformamide at room temperature and then heated to 50° C. for 1 h. Then the reaction mixture was cooled to room temperature and 11.41 g 2-hexyl-1-decyl iodide were added. The reaction mixture was stirred for 5 hours and then diluted with water and the product was extracted with methylene chloride. The organic phase was dried and evaporated and the product was purified by column chromatography over silica gel.

$^1$H-NMR data (ppm, $CDCl_3$): 7.91 2H d, 7.52 2H s, 7.35 2H d, 4.06 2H d, 2.10 1H m, 1.31-1.24 24H m, 0.90 3H t, 0.88 3H t;

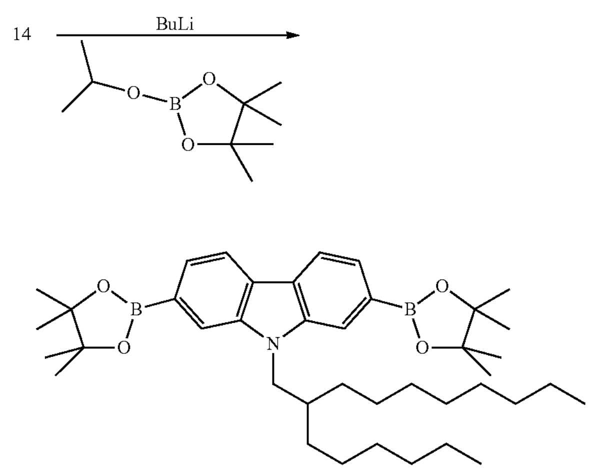

15 b) 7.36 g of 14 was dissolved in 250 ml tetrahydrofuran and the solution was cooled to −78° C. Then 10.17 ml of 2.7M butyllithium in hexane was added and the solution stirred for 1 hour. Then 5.5 g of 2-Isopropoxy-4,4,5,5-tetramethyl-1,3,2-dioxaborolane were added dropwise and the mixture was stirred another 1 hour before the temperature was rised to room temperature. The reaction mixture was poured on ice and then extracted with tertbutyl-methylether. The organic phase was dried and evaporated and the product was purified by column chromatography over silica gel.

$^1$H-NMR data (ppm, $CDCl_3$): 8.16 2H d, 7.94 2H s, 7.72 2H d, 4.30 2H d, 2.25 1H m, 1.44 24H s, 1.31-1.24 24H m, 0.92 3H t, 0.90 3H t;

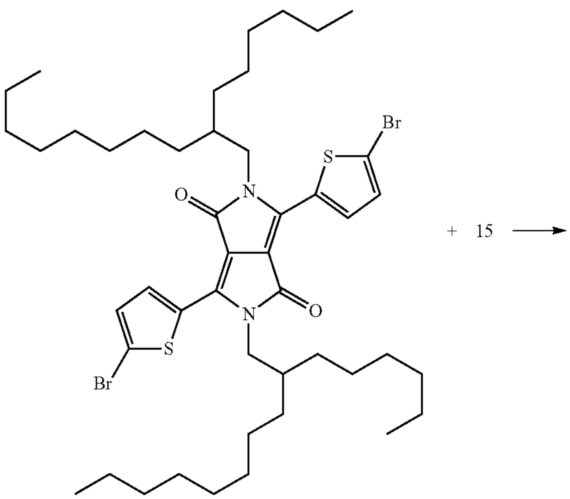

1

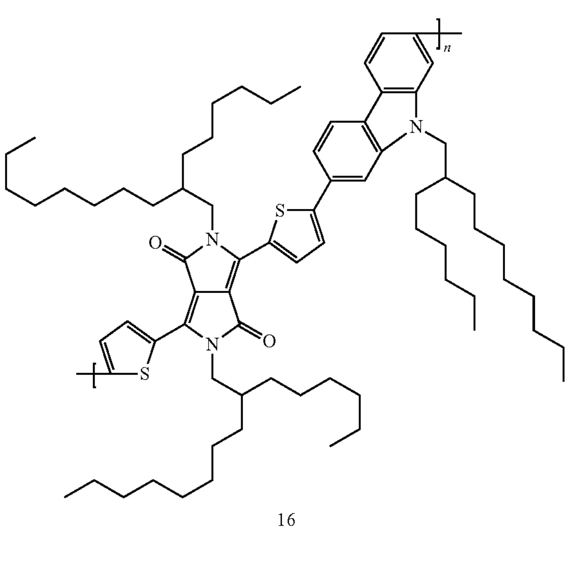

16

Under Argon 1.41 g of 1, 1.00 g of compound 15, 26 mg of Pd(acetate)$_2$, 22 mg of 2-(di-tertbutyl-phosphino)-1-phenylpyrrole were mixed with 60 ml of tetrahydrofuran and warmed to 40° C. Then a solution of 0.644 g potassium carbonate in 14 ml of degassed water was added to the reaction mixture. The reaction mixture was then brought to reflux for 4 hours and cooled to room temperature. The green-blue mixture was precipitated with methanol and filtered. The filtrate was dissolved in chloroform and refluxed with a 1% NaCN water solution for 3 hours. The organic phase was washed with water and then dried and evaporated. The polymer was precipitated with methanol and the precipitate was fractionated in a Soxhlet with hexane, then toluene. The toluene fraction contained the desired polymer. Mw=86'500, Polydispersity=2.15 (measured by HT-GPC).

Example 9

Synthesis of Polymer 19

17

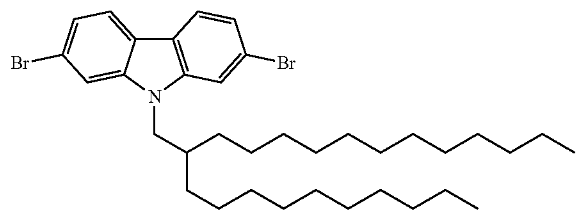

a) Compound 17 was synthesized according to compound 14 starting from 2,7-dibromocarbazole and 2-decyl-1-tetradecyliodide.

$^1$H-NMR data (ppm, $CDCl_3$): 7.81 2H d, 7.44 2H s, 7.29 2H d, 3.96 2H d, 2.03 1H m, 1.25-1.20 40H m, 0.88 6H t;

18

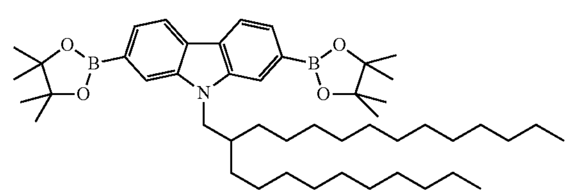

b) Compound 18 was synthesized according to compound 15 starting from compound 17.

$^1$H-NMR data (ppm, $CDCl_3$): 8.15 2H d, 7.93 2H s, 7.71 2H d, 4.29 2H d, 2.25 1H m, 1.44 24H s, 1.31-1.20 40H m, 0.92 6H t;

19

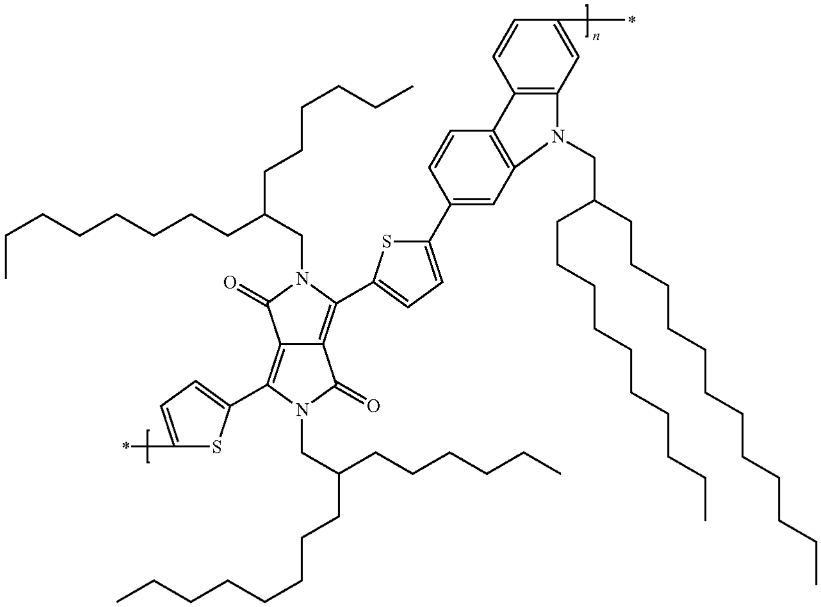

Compound 19 was synthesized according to compound 16 starting from compound 18 and the thiophene-diketopyrrolopyrrol 1. Mw=64'500, Polydispersity=2.22 (measured by HT-GPC).

TABLE 1

| Organic field effect transistors application examples | | | | |
|---|---|---|---|---|
| Example | Polymer | Mobility [cm$^2$/Vs] | On/off ratio | Threshold Voltage (V) |
| 1 | 2 | $5.6 \times 10^{-4}$ | $9.9 \times 10^{4}$ | −9.3 |
| 2 | 4 | $8.4 \times 10^{-4}$ | $4.4 \times 10^{4}$ | −2.2 |
| 3 | 6 | $8.2 \times 10^{-4}$ | $4.4 \times 10^{6}$ | −3.1 |
| 4 | 7 | $6.0 \times 10^{-4}$ ($CHCl_3$) | $2.4 \times 10^{6}$ | −4.3 |
| 5 | 9 | $1.0 \times 10^{-3}$ | $6.4 \times 10^{4}$ | −4.1 |
| 6 | 11 | $8.0 \times 10^{-3}$ | $2.30 \times 10^{4}$ | −4.6 |
| 7 | 13 | $5.5 \times 10^{-5}$ | $1.2 \times 10^{4}$ | −7.9 |
| 8 | 16 | $1.3 \times 10^{-3}$ | $7.1 \times 10^{6}$ | −9.6 |

Additional organic field effect transistors are prepared according to example 2 by replacing polymer 4 by polymers 2, 6, 7, 9, 11, 13 and 16. Reference is made to table 1.

TABLE 2

| Bulk heterojunction solar cell application examples | | | | | |
|---|---|---|---|---|---|
| Example | Polymer | Overall eff. [%] | Jsc [mA/cm$^2$] | Fill Factor [%] | Voc [V] |
| 2 | 4 | 0.9 | 2.5 | 0.49 | 0.75 |
| 5 | 9 | 0.3 | 1.7 | 0.26 | 0.75 |

Additional bulk heterojunction solar cell are prepared according to example 2 by replacing polymer 4 by polymer 9. Reference is made to table 2.

Example 10

Synthesis of Building Block 21

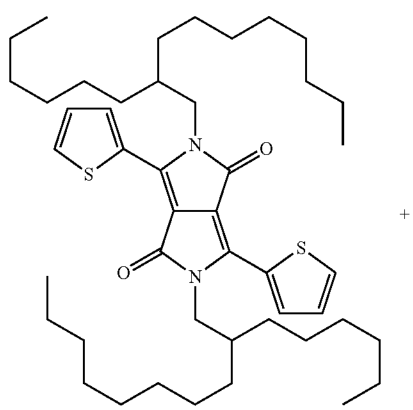

20

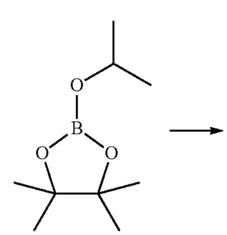

-continued

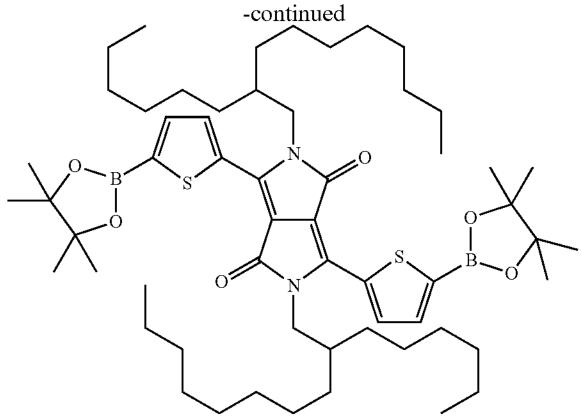

21

To a solution of 5.0 g Dithienyl-DPP (20) and 3.73 g 2-Isopropoxy-4,4,5,5-tetramethyl-1,3,2-dioxoborolane in 30 ml THF under nitrogen at −25° C. is added drop-wise a freshly prepared LDA solution (from 5.4 ml butyllithium 2.7 M and 2.2 ml diisopropylamin in 20 ml THF,) over 15 minutes. The resulting reaction mixture is stirred for 1 hour at 0° C. and then quenched with 100 ml 1 M HCl. The product is extracted with 2×50 ml TBME and the combined organic layers are washed twice with brine and dried with sodium sulfate. After evaporation of the solvent the residue is dissolved in 20 ml methylenechloride and then slowly added to 200 ml of heavily stirred acetone. The precipitate is collected by filtration, washed several times with acetone and dried at 40° C. in a vacuum-oven, affording 6.3 g of pinkish-violet powder.

Example 11

Synthesis of Building Block 26

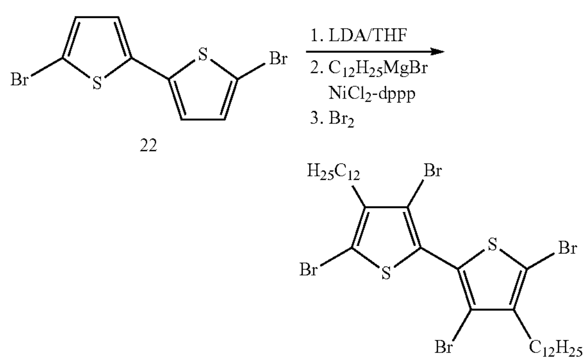

a) A solution of 40 g of 22 in 200 ml of dry tetrahydrofuran (THF) is added rapidly to a solution of lithium diisopropylamide (LDA, prepared from 100 ml of 2.7 M solution of butyllithium in hexane and 28.8 g diisopropylamine in 200 ml of dry THF) at −70° C. under nitrogen atmosphere. After the colour of the mixture has become orange-brown, the mixture is allowed to warm to −20° C. and then 100 ml of water are added. The organic phase is separated, washed with brine, dried and evaporated. The residue is recrystallized from methanol to obtain 36.5 g of 4,4'-dibromo-2,2'-dithiophene as an off-white powder (yield: 91.2%). A solution of n-dodecyl magnesium bromide in ether (prepared from 9 g of magnesium turnings and 87.0 g n-dodecylbromide in 200 ml of diethylether) is slowly added to a solution of 40 g of 4,4'-dibromo-2,2'-dithiophene. 1 mol % $NiCl_2$(dppp) (dppp=$Ph2PCH_2Ch2CH_2PPh_2$) in 200 ml of diethylether is added in such a way, that the internal temperature does not exceed 20° C. Then the mixture is stirred at room temperature for 2 hours and 200 ml of water are added thereto. The organic phase is separated, washed with diluted hydrochloric acid and brine, dried and evaporated. The residue is suspended in methanol and 55.8 g of 4,4'-n-didodecyl-2,2-dithiophene is obtained as a beige powder by filtration (yield: 70%). 12.8 g of bromine are added dropwise to a solution of 10.1 g 4,4'-n-didodecyl-2,2-dithiophene in 100 ml chloroform and 40 ml acetic acid at 0° C. under nitrogen atmosphere. The mixture is heated at 60° C. for 16 hours. After cooling to room temperature the mixture is treated with 50 ml of a saturated solution of sodium sulfite. The organic phase is separated, washed with a saturated aqueous solution of sodium hydrogen carbonate and brine, dried and evaporated. The residue is suspended in methanol and 14.5 g of 23 is obtained as a beige powder by filtration. $^1$H-NMR: δ (ppm) 0.89 (t, 6H), 1.27 (m, 36H (18×$CH_2$)), 1.56 (m, 4H), 2.67 (dd, 4H); $^{13}$C-NMR: δ (ppm) 14.51 ($CH_3$), 23.08 ($CH_2$), 28.93-32.31 (9×$CH_2$), 111.28 (C5), 114.82 (C3), 128.80 (C4), 141.68 (C2)

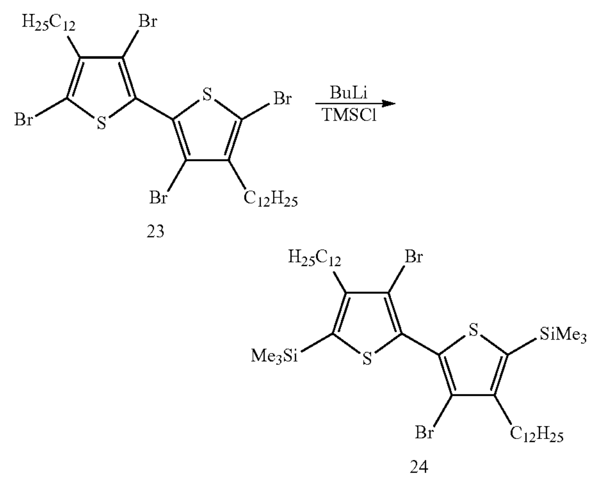

b) 10 g of 23 are dissolved in 150 ml dry THF and 70 ml heptane under nitrogen atmosphere and the solution is cooled to −20° C. After adding of 9.5 ml of a 2.7 M solution of butyllithium in heptane the obtained solution is stirred at −20° C. for 1 hour, 3 ml of trimethylsilyl chloride (TMSCl) is added thereto, the resulting mixture is stirred at −20° for 15 minutes and then allowed to warm to room temperature. After stirring for an additional hour 50 ml of water are added. The organic phase is separated, washed with brine, dried and evaporated to obtain 9.9 g of 24 as an orange-brown semisolid residue (yield: 100%).

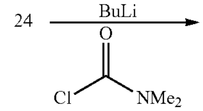

-continued

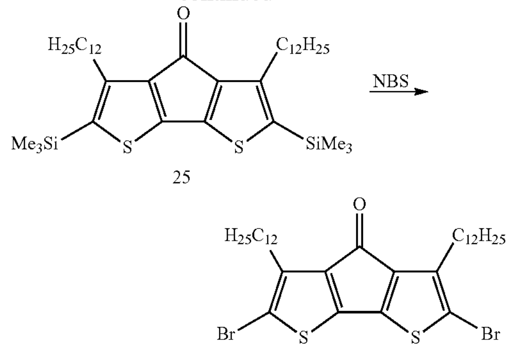

25

26 c) Intermediate 24 is dissolved in 500 ml of dry THF under nitrogen atmosphere and the solution is cooled to −60° C. A 2.7 M solution of BuLi in heptane are added at once and the mixture is allowed to warm to −30° C. followed by addition of 11.5 ml dimethylcarbamyl chloride. After stirring at −20° C. for 15 minutes the mixture is allowed to warm to 0° C. and 100 ml of water are added thereto. The organic phase is separated, washed with brine, dried and evaporated to obtain 25 as a red residue (yield: 58%). $^{1}$H-NMR: δ (ppm) 0.35 (s, 18 H), 0.90 (t, 6H), 1.28 (m, 36H (18×$CH_2$)), 1.61 (m, 4H), 2.69 (dd, 4H); $^{13}$C-NMR: δ (ppm) 0.00 (TMS), 13.72 ($CH_3$), 22.23 (CH2), 28.95-31.52 (9×$CH_2$), 136.45, 142.98, 146.82, 152.40, 183.66 d) For the further reaction to 26, it is not necessary to isolate 25. The organic phase of c) is separated and washed with brine. 37.4 g of N-bromosuccinimide (NBS) are added thereto at 0° C., the mixture is stirred at 0° C. for 30 minutes and at room temperature for an additional hour. After evaporation the residue is washed with water and suspended in 200 ml of methanol. The mixture is heated under reflux for 1 hour and after cooling to room temperature. The product 26 is obtained as dark-violett flakes by filtration (yield: 55%).

$^{1}$H-NMR: δ (ppm) 0.88 (t, 6H), 1.26 (m, 36H (18×$CH_2$)), 1.59 (m, 4H), 2.57 (dd, 4H)

$^{13}$C-NMR: δ (ppm) 14.50 ($CH_3$), 23.09 ($CH_2$), 29.40-32.31 (9×$CH_2$), 111.10 (C—Br), 137.31, 139.78, 147.35, 182.13.

Example 12

Synthesis of Building Block 27

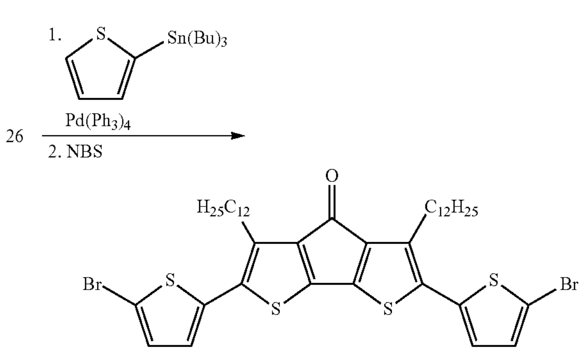

27

0.94 g of tetrakistriphenylphosphino palladium are added to a degassed solution of 11.13 g of 26 and 15.1 g of 2-(tributyltin)-thiophene in 100 ml of toluene and the mixture is heated under reflux for 16 h, cooled to room temperature and filtered through silica gel. The filtrate is evaporated, the residue is suspended in 100 ml of methanol, stirred for 1 hour and 10.5 g of the 3,5-didodecyl-2,6-di(thien-2-yl)-cyclopenta[2,1-b;3,4-b]dithiophen-4-one are obtained as dark-bluish solid by filtration (yield: 95%). $^{1}$H-NMR: δ (ppm) 0.93 (t, 6H), 1.32 (m, 36H (18×$CH_2$)), 1.65 (m, 4H), 2.83 (dd, 4H), 7.06 (m, 2H), 7.10 (m. 2H), 7.32 (dd, 2H). $^{13}$C-NMR: δ (ppm) 14.51 ($CH_3$), 23.08 ($CH_2$), 28.60-32.31 (9×$CH_2$), 126.02, 126.32, 127.68, 134.15, 135.32, 141.04, 146.84, 184.20 (C═O) 11.15 g of the preceding product are dissolved in 100 ml of THF and the solution is cooled to 0° C. 5.7 g NBS are added thereto, and the resulting mixture is stirred at 0° C. for 30 minutes and at room temperature for an additional hour. The solvent is evaporated, the residue is suspended in methanol and 13.0 g of 27 are obtained as dark-bluish solid by filtration (yield: 95%).

Example 13

Synthesis of Building Block 28

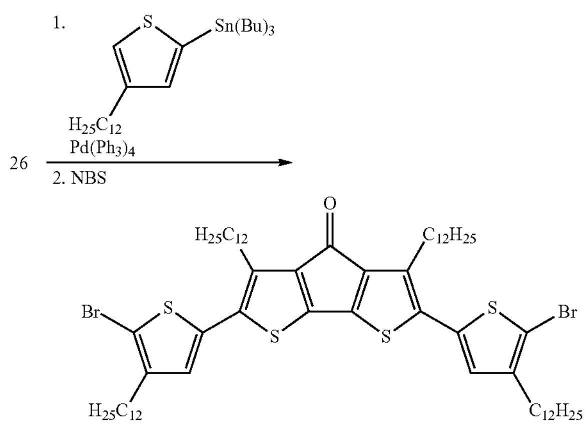

28

Using 4-dodecyl-2-(tributyltin)-thiophene, the corresponding dialkylated variants 28 are obtained in an analogous procedure. $^{1}$H-NMR: δ (ppm) 0.85 (2xt, 12H), 1.1-1.4 (m, 40H), 1.59 (m, 8H), 2.48 (dd, 8H), 7.77 (s, 2H)

Example 14

Synthesis of Building Block 30

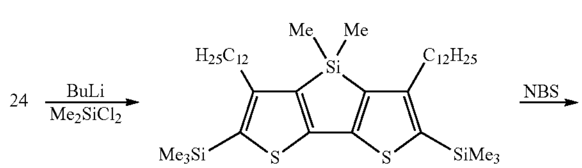

29

-continued

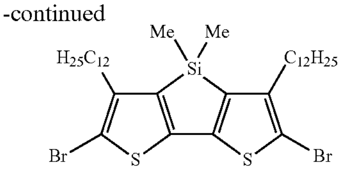

30 a) A solution of 24 in 150 ml of dry THF is cooled to −40° C. 16 ml of a 2.7 M solution of BuLi in heptane are added and the resulting solution is stirred at −20° C. for 15 minutes. 2.58 g of dimethyl dichloro silane are added thereto and the mixture is stirred at 0° C. for 30 minutes and at room temperature for an additional hour followed by adding of 50 ml of 1 N hydrochloric acid. The organic phase is separated, washed with brine, dried and evaporated to obtain 29 as colourless liquid (yield: 95%).

b) Bromination using NBS in analogy to the method shown in example 11d yields 30.

Example 15

Synthesis of Building Block 31

31

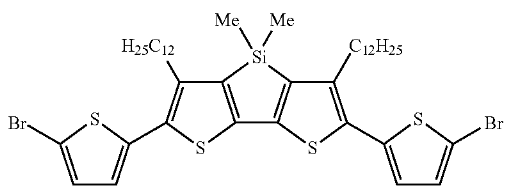

The same reaction sequence shown in example 12, but using the starting material 30 yielding in 31:

$^{41}$H-NMR: δ (ppm) 0.40 (s, 6H), 0.78 (t, 6H), 1.1-1.3 (m, 36H), 1.45 (m, 4H), 2.61 (dd, 4H), 6.73 (d, 2H), 6.87 (d, 2H) $^{13}$C-NMR: δ (ppm) 0.00, 17.20, 25.77, 31-38 (tot. 20 C), 114.40, 127.95, 133.05, 133.50, 140.71, 147.83, 148.19, 149.58

Example 16

Synthesis of Building Block 32

32

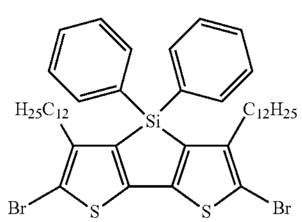

The same reaction sequence shown in example 14, but replacing dimethyl dichloro silane with the equivalent amount of diphenyl dichloro silane, gives 32 in 90% overall yield. $^{13}$C-NMR: δ (ppm) 0.02, 17.30, 25.89, 31-38 (tot. 20 C), 111.186, 144.48, 147.95, 150.01

Example 17

Synthesis of Building Block 33

33

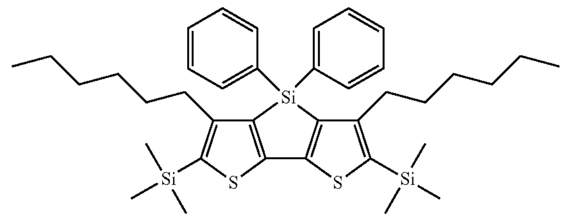

In an analogous process (example 14 and 16), compound 33 can be synthesized.

$^1$H-NMR: δ (ppm) 0.34 (s, 18H), 0.87 (t, 6H), 1.1-1.4 (m, 16H), 2.41 (dd, 4H), 7.3-7.4 (m, 8H), 7.65 (m, 2H). $^{13}$C-NMR: δ (ppm) 0.00, 14.72, 23.15, 28.72, 29.31, 29.89, 31.56, 129.84, 135.02, 136.01, 141.08, 141.41, 155.18

Example 18

Synthesis of Building Block 35

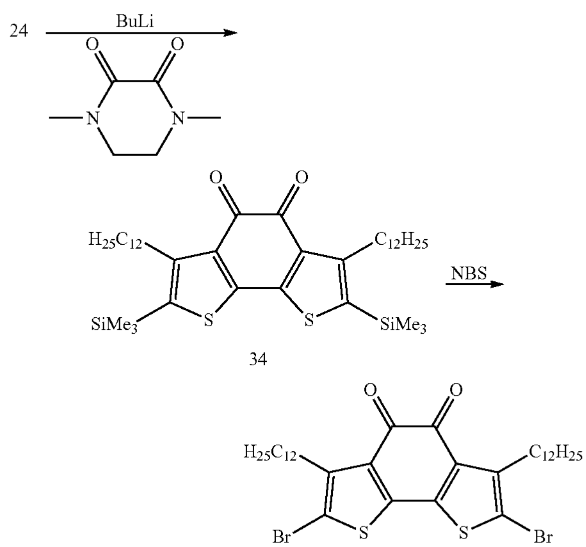

35 a) 34 is obtained as red powder (yield: 40%) according to example 12 with the exception that 3.20 g of 1,4-dimethylpiperazine-2,3-dione are used instead of dichlorodimethylsilane.

$^1$H-NMR: δ (ppm) 0.00 (s, 18H), 0.87 (t, 6H), 1.24 (m, 36H (18×$CH_2$)), 1.62 (m, 4H), 2.57 (dd, 4H). $^{13}$C-NMR: δ (ppm) 0.00 (TMS), 13.79 ($CH_3$), 21.97 ($CH_2$), 28.63-31.72 (10×$CH_2$), 136.45, 142.98, 146.82, 152.40, 174.83 b) Bromination using NBS in analogy to the method shown in example 11d yields 35.

Example 19

Synthesis of Building Block 39

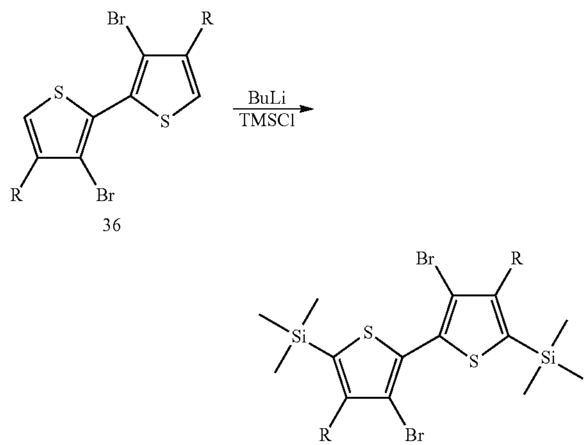

(R = H)

a) To a freshly prepared LDA solution (82 ml butyllithium [2.7 m in heptane], 22.6 g diisopropyl amine and 300 ml dry THF) at −78° C. under a nitrogen atmosphere, a solution of 32.4 g 3,3'-dibromo-2,2'-dithiophene 36 in 150 ml of dry THF is slowly added. The solution is slowly warmed to −20° C., stirred for 15 minutes and then re-cooled to −78° C. 27.2 g trimethyl silylchloride is added at once and the solution is slowly allowed to warm to 0° C. After stirring for 1 hour at 0° C. the reaction mixture is quenched by adding 100 ml water. The phases are separated and the organic phase is washed twice with brine and dried over sodium sulphate. The residue is suspended in methanol and the formed solid is recovered by filtration and dried under vacuum. Affords 43 g (92%) of the title compound 37 as an off-white powder.

$^{1}$H-NMR: δ (ppm) 0.00 (s, 18H), 6.81 (s, 2H); $^{13}$C-NMR: δ (ppm) 0.00 (TMS), 113.14 (C3), 134.11, 137.15, 143.05

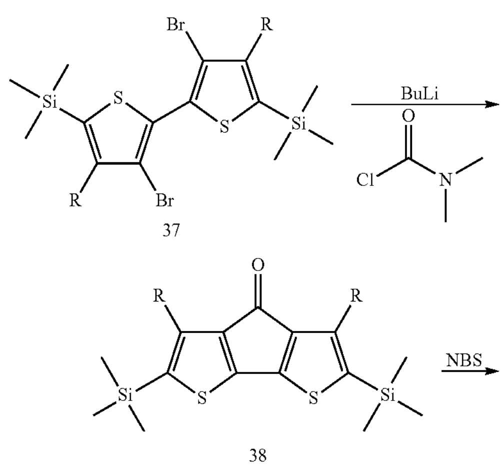

-continued

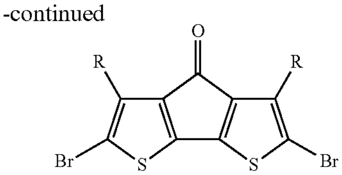

(R = H)

b) 46.8 g 3,3'-dibromo-5,5'-di-trimethylsilyl-2,2'-dithiophene 37 is dissolved in 500 ml of dry THF under a nitrogen atmosphere and cooled to −60° C. 78 ml butyl lithium (2.7 M in heptane) is added at once. The temperature rises to approximately −40° C. The dry ice bath is removed and the reaction mixture is slowly warmed to −30° C. At this point 11.5 ml dimethyl carbamoylchloride in 20 ml dry THF is added at once. The temperature rises to approximately −20° C. and the reaction mixture is stirred at that temperature for 15 minutes and then slowly warmed to 0° C. The reaction mixture is quenched by adding 100 ml water. The phases are separated and the organic phase is washed twice with brine and dried over sodium sulphate. Evaporation of the solvent affords 33.1 g of a red residue, which contains approximately 90% product 38 (NMR; corresponds to 88.5% yield). Purification can be achieved either by flash chromatography or suspension in methanol.

$^{1}$H-NMR: δ (ppm) 7.05 (s, 2H); $^{13}$C-NMR: δ (ppm) 125.41 (C4), 141.08 (C2), 147.42 (C3), 152.21 (C5), 180.51 (C═O)

c) The organic phase from reaction step b) can be directly used for the bromination step by adding 37.4 g N-bromo succinimide are added to the organic phase at once at 0° C. The reaction mixture is stirred for 30 minutes at 0° C. and 1 hour at room temperature. After evaporation to dryness the residue is washed twice with 200 ml water each, which is decanted, and then boiled for 1 hour in 200 ml methanol. After cooling to room temperature the product is collected by filtration. Affords 30.1 g (85.2%) of the title compound 39 as dark-violet flakes. $^{1}$H-NMR: δ (ppm) 6.99 (s, 2H); $^{13}$C-NMR: δ (ppm) 114.17 (C5), 124.62 (C4), 139.74 (C2), 148.80 (C3), 180.51 (C═O)

Example 20

Synthesis of Building Block 40

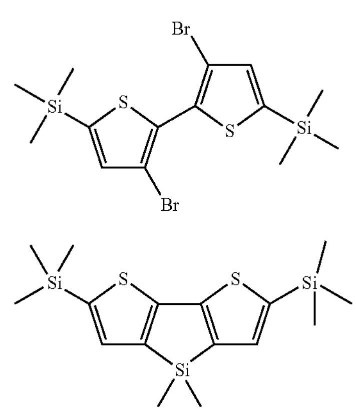

37

40

A solution of 9.37 g 3,3'-dibromo-5,5'-di-trimethylsilyl-2,2'-dithiophene (37) in 150 ml dry THF is cooled to −40° C. 16 ml butyl lithium (2.7 M in heptane) are added at once and the resulting solution is stirred for 15 minutes at −20° C. 2.58 g dimethyl dichloro silane are added at once and the reaction mass is stirred for 30 minutes at 0° C. and 1 hour at room temperature. The reaction mixture is quenched by adding 50 ml 1 N HCl. The phases are separated and the organic phase is washed twice with brine and dried over sodium sulphate. Evaporation of the solvent affords 6.95 g (95% of th.) of the title compound 40 as colourless liquid, which is almost pure as determined by NMR. $^{1}$H-NMR: δ (ppm) 0.00 (s, 18H), 0.08 (s, 6H), 6.83 (s, 2H)

Example 21

Synthesis of Building Blocks 45 and 46

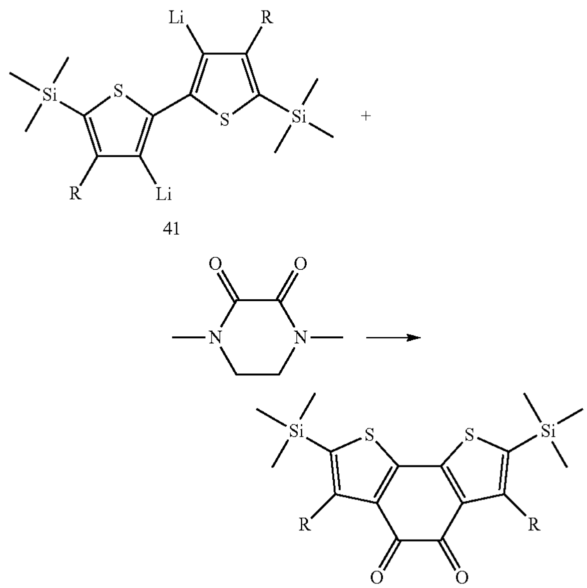

41

42

(R = H)

a) A solution of 9.37 g 3,3'-dibromo-5,5'-di-trimethylsilyl-2,2'-dithiophene (41) in 150 ml dry THF is cooled to −40° C. 16 ml butyl lithium (2.7 M in heptane) are added at once and the resulting solution is stirred for 15 minutes at −20° C. 3.20 g of 1,4-Dimethyl-piperazine-2,3-dione are added in one portion and the reaction mixture is allowed to warm to room temperature and stirred for an additional hour at this temperature. The reaction mixture is quenched by adding 50 ml 1 N HCl. The phases are separated and the organic phase is washed twice with brine and dried over sodium sulphate. Evaporation of the solvent affords a red residue, which is suspended in hexane. The obtained slurry is stirred for 1 hour and then filtered. The filter cake is washed with hexane and dried under vacuum. Affords 3.4 g (46% of th.) of the title compound 42 as a dark red powder. $^{1}$H-NMR: δ (ppm) 0.00 (s, 18H), 7.23 (s, 2H); $^{13}$C-NMR: δ (ppm) 0.00, 134.53, 136.08, 142.68, 148.47, 175.31

43

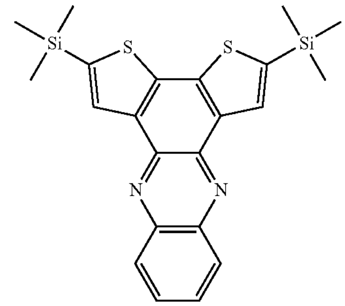

44

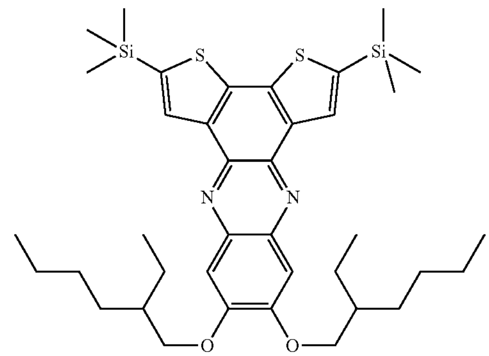

b) By reacting the above product 42 with o-diaminobenzene, the following compound 43 is obtained; using 1,2-diamino-4,5-di(2-ethylhexyloxy)-benzene instead of o-diaminobenzene yields 44. General procedure: 10 mmol 42 and 10 mmol of the aromatic ortho-diamine are dissolved in 50 ml of ethanol and refluxed for 2 hours. After cooling to 0° C. the yellow precipitate is filtered and washed with cold ethanol and dried in a vacuum oven affording the corresponding quinoxaline 43 or 44.

NMR-spectrum of 43: $^{1}$H-NMR: δ (ppm) 0.20 (s, 18H), 7.47 (dd, 2H), 7.94 (dd, 2H), 8.17 (s, 2H); $^{13}$C-NMR: δ (ppm) 0.00, 129.08, 131.48, 135.64, 139.82, 140.01, 140.45, 141.26

45

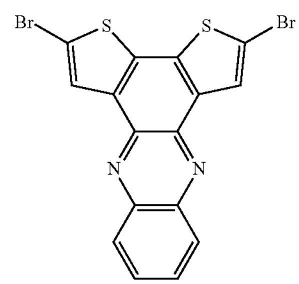

46

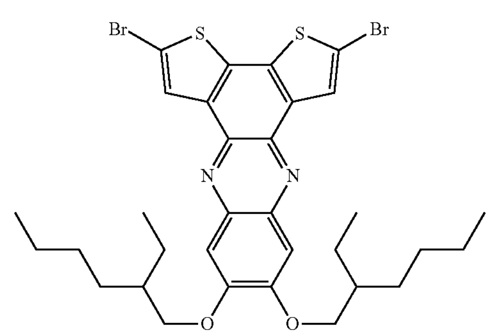

To a solution of 43 or 44 in 100 ml THF, 2 equivalents of N-bromo-succinimide are added in one portion and the reaction mixture is heated to 40° C. and stirred at this temperature for 16 hours. The solvent is then evaporated and residue is washed several times with water and then recrystallized from ethanol. The corresponding quinoxaline 45 or 46 in 60-80% yield.

NMR-spectrum of 46: $^{1}$H-NMR: δ (ppm) 0.98 (t, 6H), 1.06 (t, 6H), 1.42 (m, 8H), 1.62 (m, 8H), 1.96 (m, 2H), 4.13 (d, 4H), 7.19 (s, 2H), 7.97 (s, 2H)

$^{13}$C-NMR: δ (ppm) 23.15, 24.09, 24.12, 29.18, 30.73, 30.74, 39.34, 71.58, 105.65, 112.51, 126.93, 133.24, 134.48, 135.53, 139.87, 154.10

Example 22

Synthesis of Building Block 49

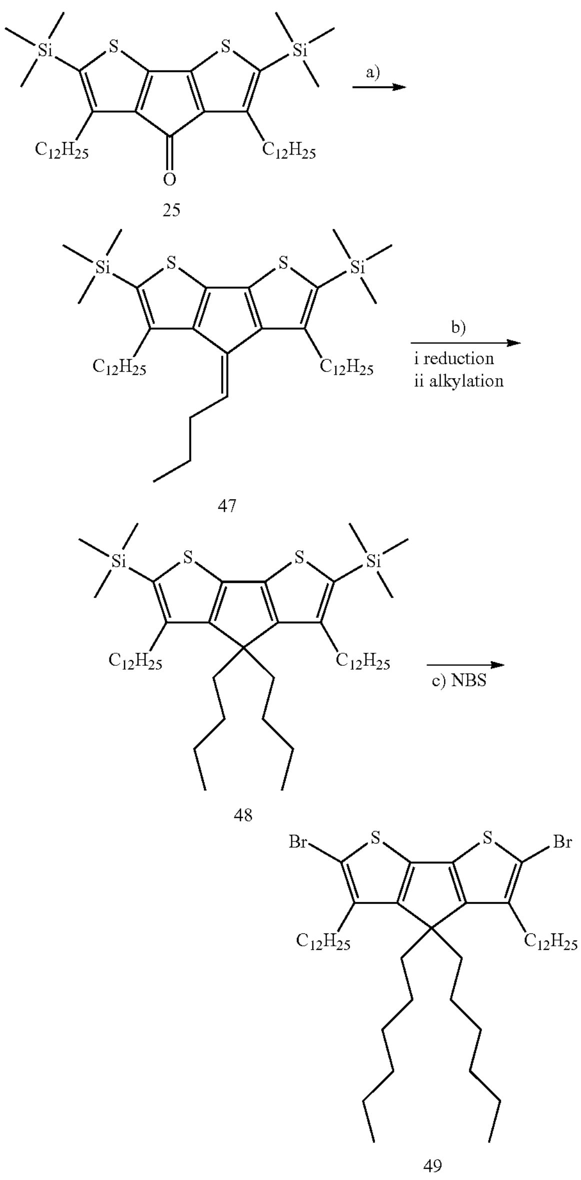

a) A solution of 0.5 g 25 in 5 ml THF is treated at −20° C. with 1.1 eq. butyl lithium and then slowly warmed to 0° C. The reaction is quenched by the addition of 1.1 eq. trifluoro acetic anhydride and stirred for an additional hour at room temperature.

10 ml tert.butylmethylether are added the reaction mixture is washed with sodium bicarbonate and brine. The organic phase is separated and dried over sodium sulphate and evaporated to dryness. The residue is dissolved in 5 ml DMSO and 0.1 ml trifluoroacetic acid and stirred for 5 hours at 70° C., cooled down and poured onto a saturated sodium bicarbonate solution. The aqueous slurry is extracted twice with tert.butyl-methylether, the combined organic phases are washed with brine, dried over sodium sulphate and evaporated to dryness. Afford 0.35 g 47 as a greyish-white solid.

b) A solution of the product from above in toluene is treated with 3 eq. Red-Al (1 M in THF) and stirred at 80° C. for 2 hours. After cooling down the reaction mixture is subsequently washed with diluted HCl and brine. The organic phase is dried over sodium sulphate and evaporated to dryness.

The residue from above is dissolved in DMSO and, after the addition of 1.5 eq. butyl bromide, 5 eq. KOH and a catalytical amount of KI, stirred for 16 hours at room temperature. The reaction mass is poured onto diluted HCl and the aqueous slurry is extracted twice with hexane. The combined organic phases are washed with brine, dried over sodium sulphate and evaporated to dryness. The residue is further purified by flash chromatography affording 0.29 g 48 as a white solid.

c) Bromination according to the method described in the last step of example 11d yields 49.

$^{1}$H-NMR: δ (ppm) 0.81 (2xt, 12H), 0.9 (m, 4H), 1.1-1.3 (m, 46H), 1.48 (m, 4H), 1.78 (m, 4H), 2.63 (dd, 4H)

Example 23

Synthesis of Building Block 50

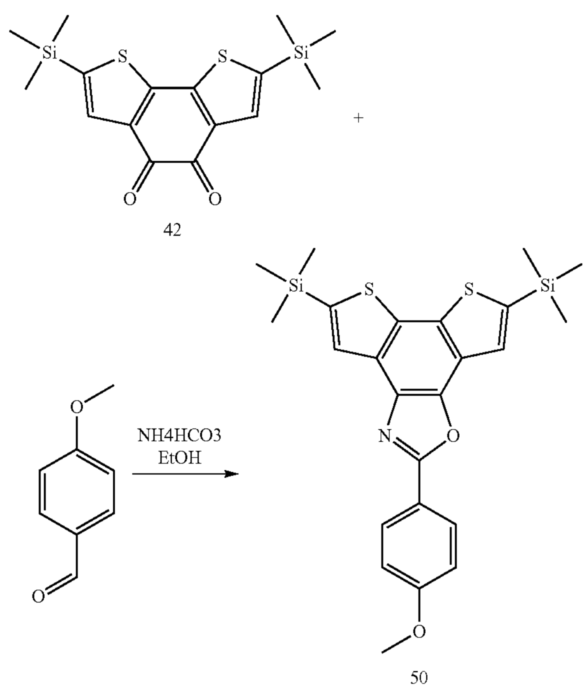

To 2.00 g (5.5 mmol) of 42 in 10 ml ethanol (abs) 1 ml (8.23 mmol) anisaldehyde and 2.17 g (27.42 mmol) ammoniumhydrocarbonate is added. The reaction mixture is heated at reflux under nitrogen overnight, cooled to 25° C., the product is filtered off and washed with ethanol (yield: 1.66 g (63%)).

Example 24

Synthesis of Building Blocks 51 and 52

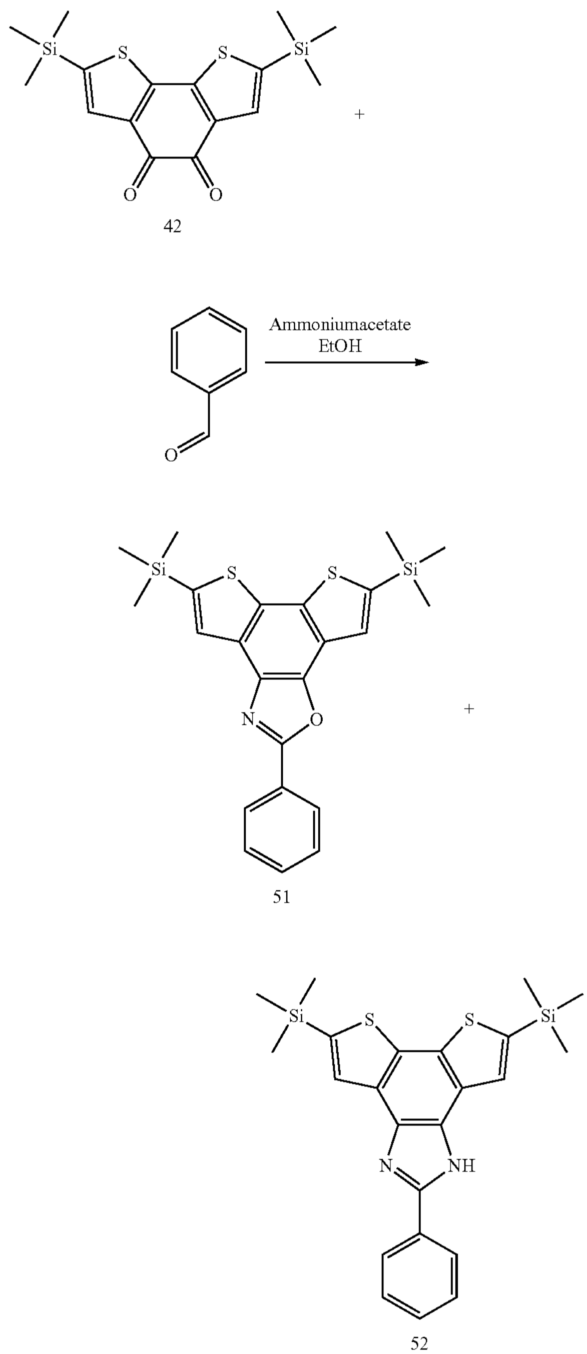

To 0.25 g (0.7 mmol) of 42 in 6 ml ethanol (abs) 0.11 g (1.0 mmol) benzaldehyde and 0.26 g (3.43 mol) ammonium acetate is added. The reaction mixture is heated at reflux under nitrogen overnight, cooled to 25° C., the products are filtered off and separated by column chromatography using a flash master (eluent heptane: ethyl acetate 5:1) (yield 51: 0.05 g (17%); yield 52: 0.24 g (83%)).

Example 25

Synthesis of Building Block 53

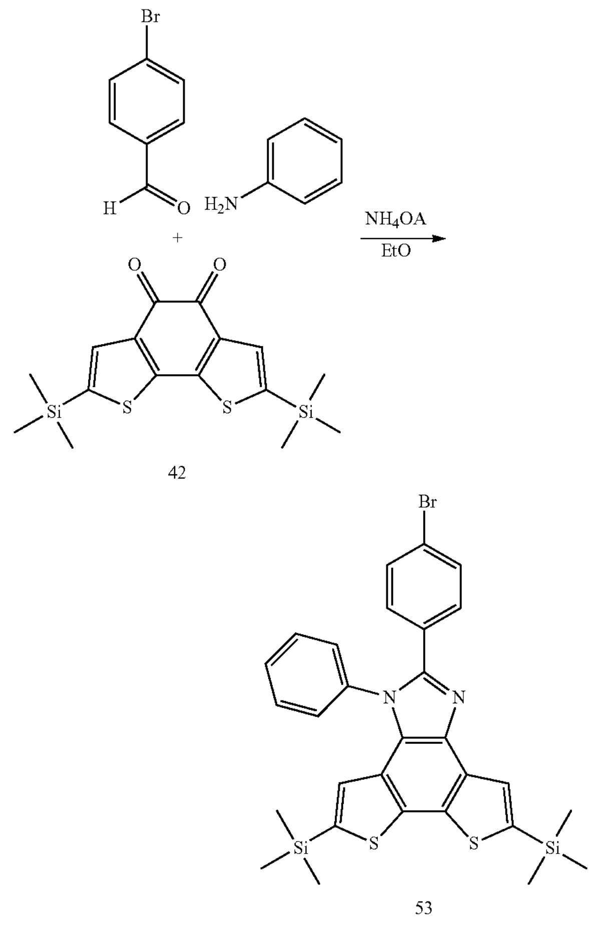

To 4.00 g (11.0 mmol) 42 in 80 ml acetic acid 2.23 g (12.1 mmol) 4-bromobenzaldehyde, 1.17 g (12.6 mmol) aniline and 3.38 g (43.9 mmol) ammonium acetate are added. The reaction mixture is stirred at 130° C. under nitrogen for 45 min., cooled to 25° C., and the product is filtered off and washed with AcOH/MeOH. (yield: 4.5 g (67.8%)).

Example 26

Synthesis of Polymer 55

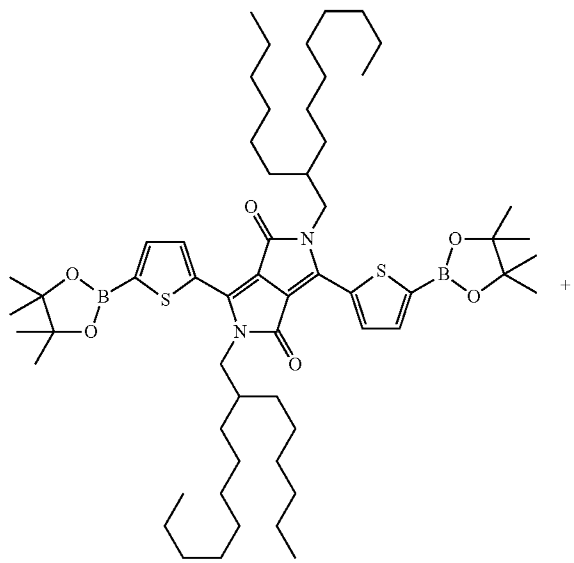

21

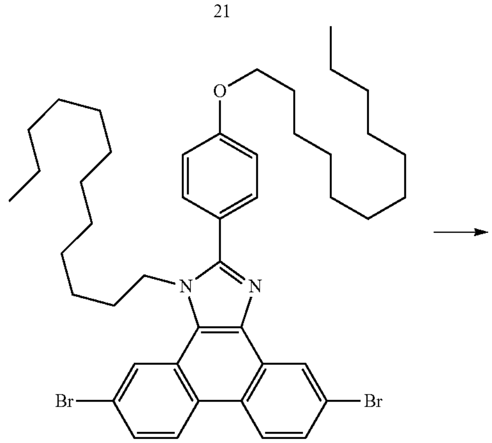

54

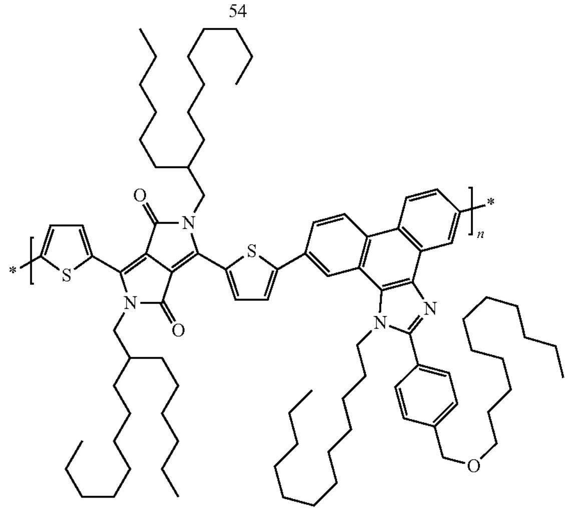

55

Compound 54 is synthesised according to example 9 of WO06/097419. According to the procedure for the synthesis of polymer 2, 0.62 g of 21, 0.50 g of 54 are reacted to give polymer 55. The purification is achieved by soxhlet extraction using pentane and cyclohexane and the polymer is then extracted with THF to give 0.82 g of 55 as a dark powder. Several polymer can be synthesized using the above described building blocks using Suzuki polymerization conditions (cf. Example 1). Therefore, all described building blocks containing a trimethyl-silyl protecting group such as 33, 40, 42, 50, 51, 52 and 53 can be trans-formed to the corresponding dibromide using similar conditions of example 11d. These corresponding dibromides and the already described dibromide 26, 27, 28, 30, 32, 35, 39, 45, 46 and 49 can used as monomers in combination of a DPP-bisboronic ester such as 21 to form polymers claimed by this invention. All these dibromides can be converted into bis boronic esters using known methods. These corresponding bis-boronic esters can then be used as monomers in combination of a DPP-dibromides such as 1, 3, 8 and 12 to form polymers claimed by this invention.

Example 26

Synthesis of Polymer 55

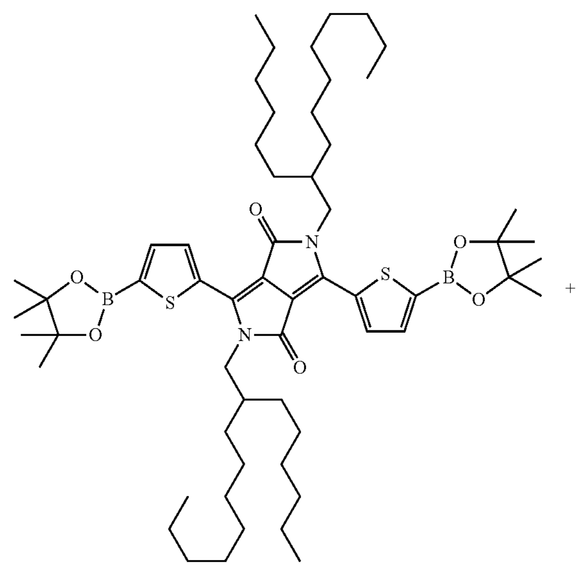

21

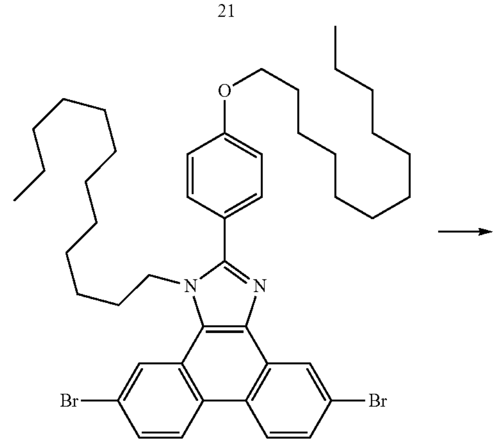

54

-continued

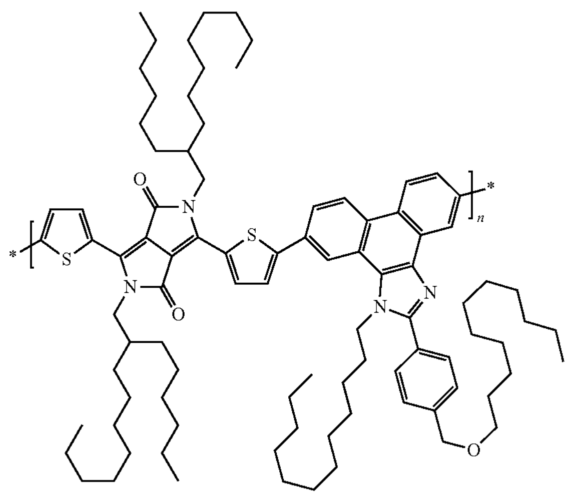

55

Compound 54 is synthesised according to example 9 of WO06/097419. According to the procedure for the synthesis of polymer 16, 0.62 g of 21, 0.50 g of 54 are reacted to give polymer 55. The purification is achieved by soxhlet extraction using pentane and cyclohexane and the polymer is then extracted with THF to give 0.82 g of 55 as a dark powder. Mw 130'000, Polydispersity 5.5.

Example 27

Synthesis of Polymer 58

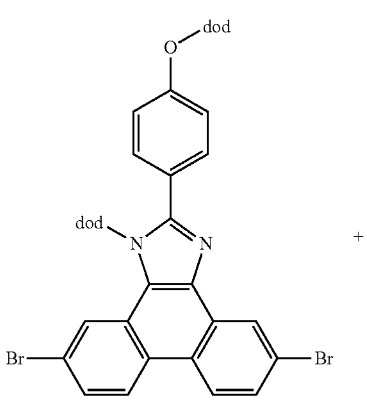

54

-continued

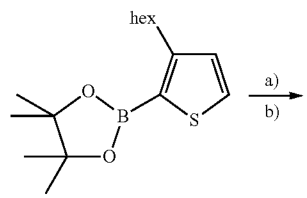

56

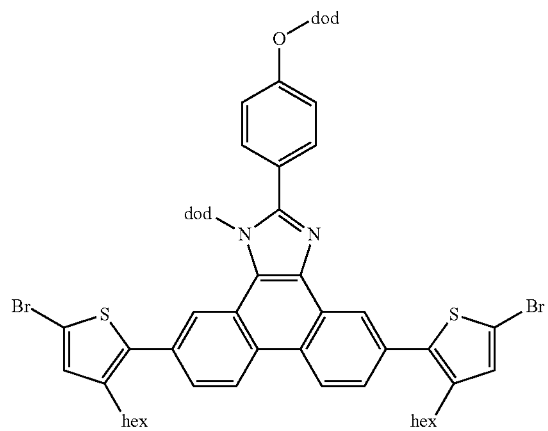

57 a) In a three neck-flask 3.95 g of potassium phosphate ($K_3PO_4$) dissolved in 15 ml of water (previously degassed with argon) is added to a degassed solution of 5.00 g of 54, 5.49 g of 56 0.17 mg of tri-tert-butylphosphonium tetrafluoroborate ($(t\text{-}Bu)_3P{*}HBF_4$) and 86 mg of tris(dibenzylideneacetone) dipalladium (0) ($Pd_2(dba)_3$) in 50 ml of tetrahydrofuran. The reaction mixture is heated to reflux overnight. The reaction mixture is cooled to room temperature. The water layer is extracted three times with dichloroethane and the combined organic layers are washed with water, dried and the solvent evaporated under reduce pressure. The crude product is filtered over silicagel with cyclohexane. 5.6 g of a brownish oil are obtained. 4 g of this oil are dissolved in 40 ml chloroform and cooled to 0° C. with an ice bad. 1.38 g of N-bromosuccinimide are added and the reaction mixture is allowed to warm to room temperature overnight. The reaction mixture is filtered, the filtrate is concentrated under reduced pressure. The filter cake is than dissolved with water/chloroform (1:1). The layers are separated, the water layer is than extracted once with chloroform and the combined organic layers are concentrated under reduce pressure. Further Purification by silica gel filtration with dichloromethane/hexane(1:2) results in 3.2 g of the desired product.

21 + 57 →

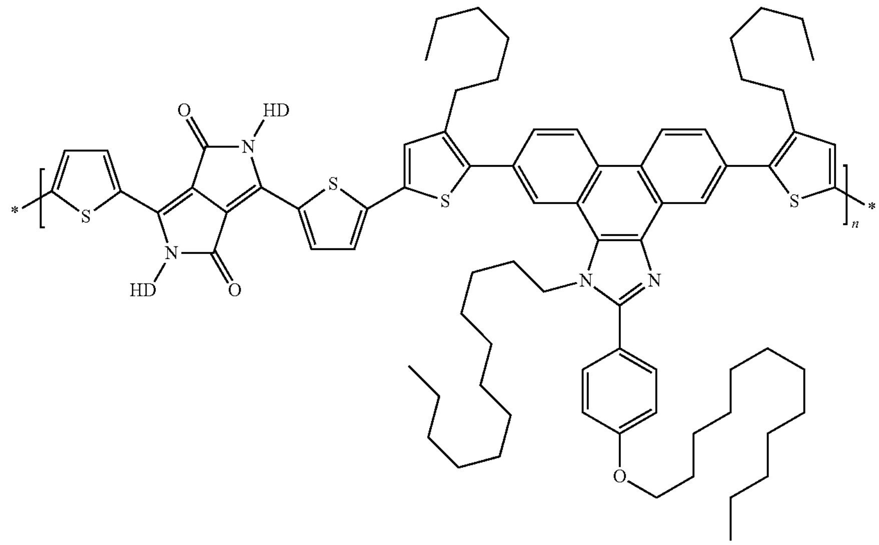

58 b) According to the procedure for the synthesis of polymer 16 1.0 g of 21 and 1.14 g of 57 are reacted to give polymer 58. The purification is achieved by soxhlet extraction using pentane and cyclohexane. The polymer is then extracted with THF to give 1.23 g of 58 as a dark powder. Mw 64'000, Polydispersity 2.5.

Example 28

Synthesis of Polymer 61

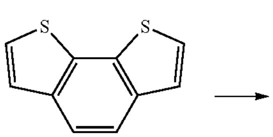

59

→

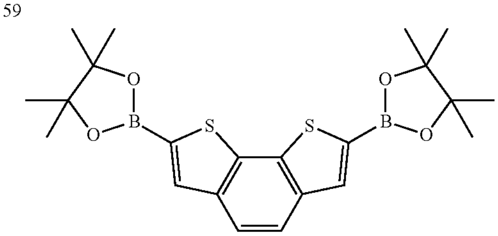

60 a) 8.5 ml butyl lithium (2.7 M in heptane) are added to a cooled (−20° C.) solution of 2.00 g 59 in 20 ml of dry THF. The resulting solution is stirred for 1 hour at room temperature and cooled to −40° C. 5.2 g 2-isopropoxy-4,4,5,5-tetramethyl-1,3,2-dioxoborolane are added in one portion, the solution is slowly warmed to 0° C. and stirring is continued for 30 minutes. The reaction is quenched by adding diluted HCl and the product is extracted twice with TBME. The combined organic extracts are dried and evaporated to give crude 60, which is purified by repetitive crystallisations from hexane. 2.3 g of compound 60 are obtained as white powder.

1 + 60 →

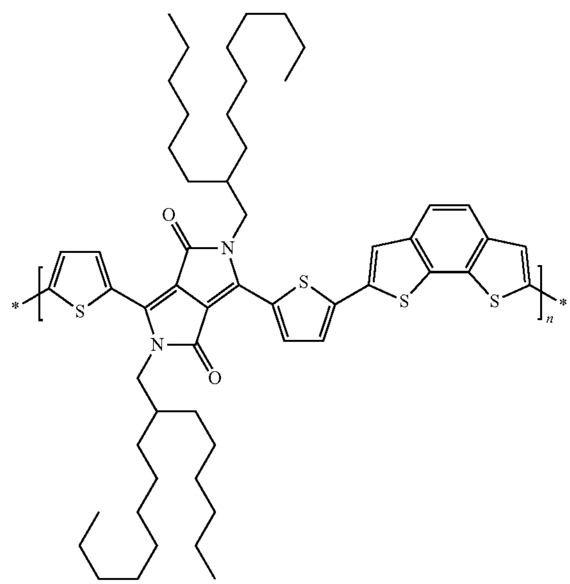

61 b) According to the procedure for the synthesis of polymer 16 1.0 g of 1 and 0.49 g of 60 are reacted to give polymer 58. The purification is achieved by soxhlet extraction using hexane, cyclohexane, THF and chloroform to give 1.7 g of 61 as a dark powder (0.8 g in THF and 0.9 g in chloroform fraction).

Example 29

Synthesis of Polymer 65

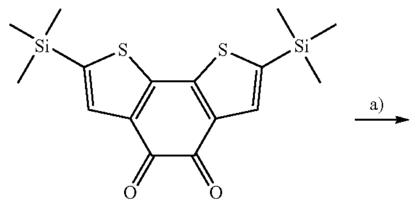

42

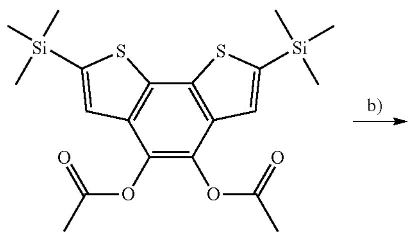

62

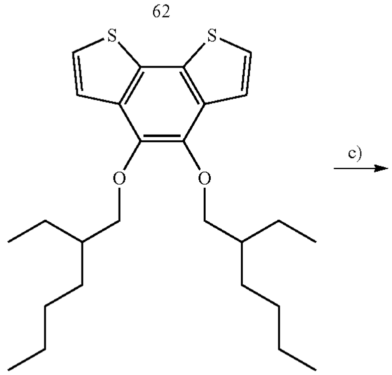

63

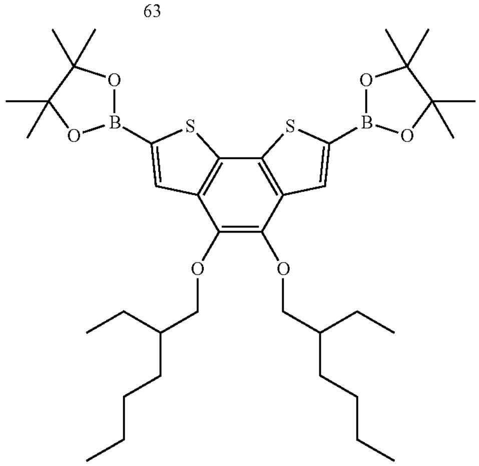

64 a) 3.71 g zinc powder, 5.4 ml acetic anhydride and 11 ml triethylamine are added to a solution of 2.0 g 42 in 50 ml dichloromethane. The reaction mixture is stirred at room temperature overnight and then subsequently washed with dil. HCl, dil. Sodium bicarbonate and water. Evaporation of the solvent affords 62 as a greenish oil, which is used in the next step without further purification.

b) 5.9 g Cesiumcarbonate and 5.3 ml ethyl-hexylbromide are added to a solution of 62 in acetonitril. The reaction mixture is refluxed overnight and then evaporated to dryness. The residue is suspended in TBME and subsequently washed with diluted HCl, water and brine and dried over sodium sulfate. Evaporation of the solvent and purification affords 63 as a yellow liquid.

c) 63 is converted to 64 in the same manner as described for monomer 60

1 + 64 →

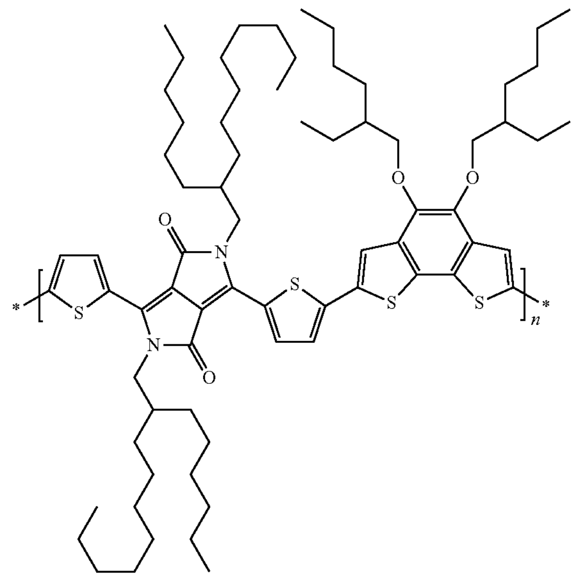

65 d) According to the procedure for the synthesis of polymer 16 1.0 g of 1 and 0.74 g of 64 are reacted to give polymer 65. The purification is achieved by soxhlet extraction, whereby 65 is obtained as a dark powder Example 30

Synthesis of Polymer 66

21 +

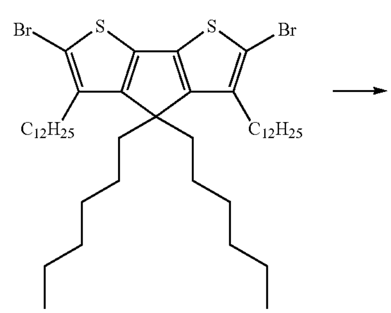

49

-continued
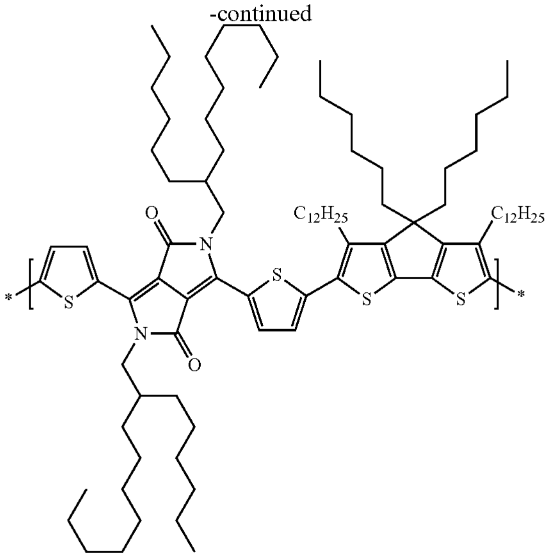
66
Polymer 66 is prepared according to the procedure of polymer 16
Example 31
Synthesis of Polymer 68
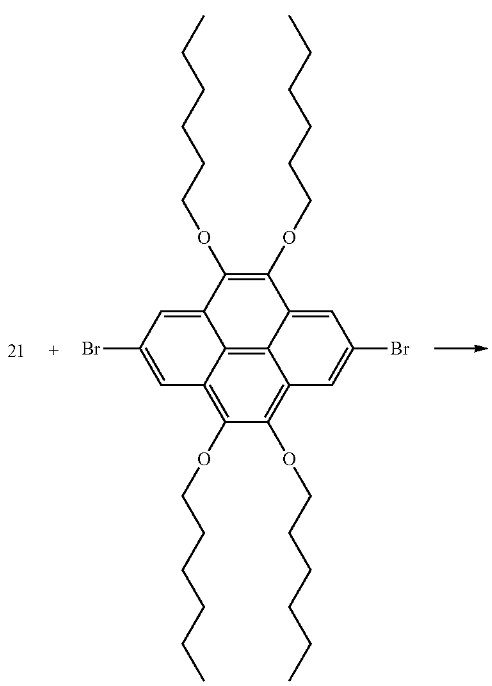
67
-continued
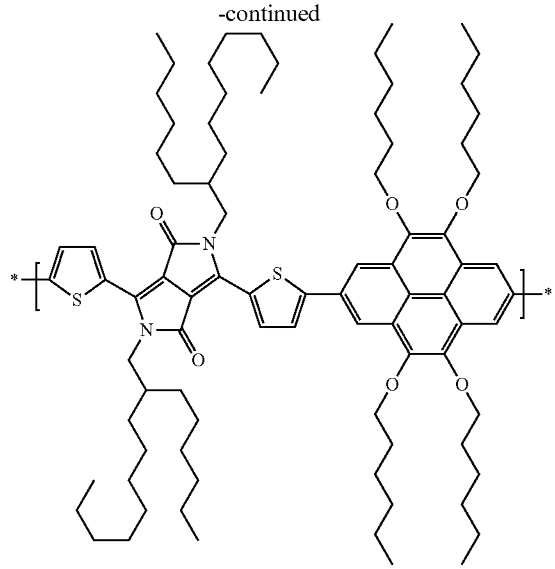
68
Compound 67 is prepared according to WO2010/006852. Polymer 68 is obtained according the procedure of polymer 16.
Example 32
Synthesis of Polymer 70
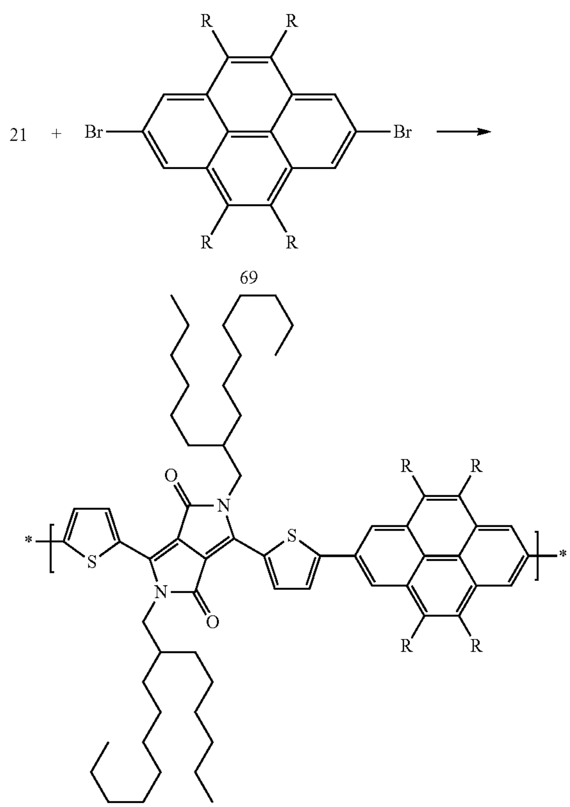
69
70

-continued

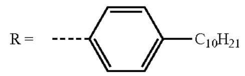

Compound 69 is prepared according to WO2010/006852. Polymer 70 is obtained according the procedure of polymer 16.

The invention claimed is:

1. A polymer, comprising:

a unit of formula *-[A]-*;

a unit of formula *-[$COM^1$]-*; and optionally, a unit of formula*-[$COM^2$]-*, wherein A is a repeating unit of formula (I)

(I)

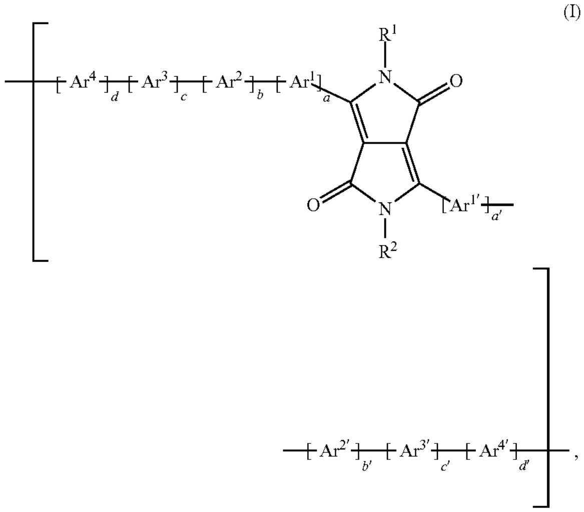

wherein a is 1, 2, or 3, a' is 0, 1, 2, or 3, b is 0, 1, 2, or 3, b' is 1, 2, or 3, c is 0, 1, 2, or 3, c' is 0, 1, 2, or 3, d is 0, 1, 2, or 3, d' is 0, 1, 2, or 3, with the proviso that b' is not 0, if a' is 0, $R^1$ and $R^2$ are the same or different and are (a) hydrogen, (b) a $C_1$-$C_{100}$ alkyl group, (c) —$COOR^{103}$, (c) a $C_1$-$C_{100}$ alkyl group which is at least one of (i) substituted by at least one halogen atom, hydroxyl group, nitro group, —CN, or $C_6$-$C_{18}$ aryl group and (ii) interrupted by —O—, —COO—, or —S—, (d) a $C_7$-$C_{100}$ arylalkyl group, (e) a carbamoyl group, (f) $C_5$-$C_{12}$ cycloalkyl, which is optionally substituted one to three times with at least one selected from the group consisiting of $C_1$-$C_8$ alkyl and $C_1$,-$C_8$ alkoxy, (g) a $C_6$-$C_{24}$ aryl group which is optionally substituted one to three times with at least one selected from the group consisting of $C_1$,-$C_8$ alkyl, $C_1$-$C_8$ thioalkoxy, and $C_1$-$C_8$ alkoxy, or (h) pentafluorophenyl, $R^{103}$ is $C_1$-$C_{50}$ alkyl, $Ar^1$ and $Ar^{1'}$ are independently of each other

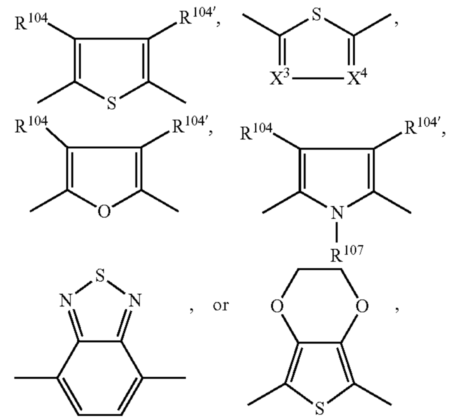

wherein one of $X^3$ and $X^4$ is N and the other is $CR^{99}$, $Ar^2$, $Ar^{2'}$, $Ar^3$, $Ar^{3'}$, $Ar^4$, and $Ar^{4'}$ have the meaning of $Ar^1$, or are independently of each other

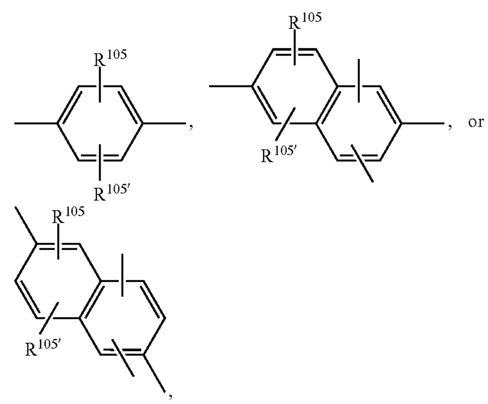

$R^{99}$, $R^{104}$, and $R^{104'}$ are independently of each other (i) hydrogen, (j) halogen, (k) a $C_1$-$C_{25}$ alkyl group which is optionally interrupted by at least one selected from the group consisting of an oxygen atom and a sulfur atom, (1) $C_7$-$C_{25}$ arylalkyl, or (m) a $C_1$-$C_{25}$ alkoxy group, $R^{105}$ and $R^{105'}$ independently of each other are (n) hydrogen, (o) halogen, (p) $C_1$-$C_{25}$ alkyl which is optionally interrupted by at least one selected from the group consisting of an oxygen atom and a sulfur atom, (q) $C_7$-$C_{25}$ arylalkyl, or (r) $C_1$-$C_{18}$ alkoxy, $R^{107}$ is (s) H, (t) $C_6$-$C_{18}$ aryl, $C_6$-$C_{18}$ aryl which is substituted by $C_1$-$C_{18}$ alkyl or $C_1$-$C_{18}$ alkoxy, (u) $C_1$-$C_{18}$ alkyl, or (v) $C_1$-$C_{18}$ alkyl which is interrupted by —O—, -$COM^1$- is a repeating unit of formula (Xa)

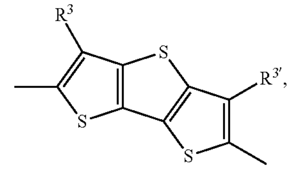

-continued (Xb)

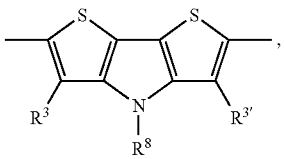

(Xc)

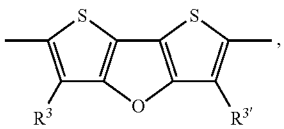

(Xd)

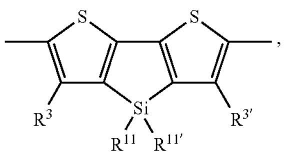

(Xe)

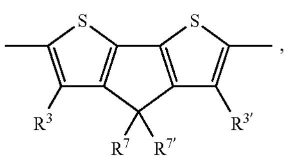

(Xf)

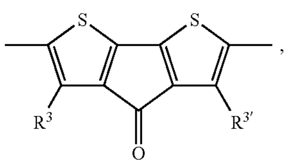

(Xg)

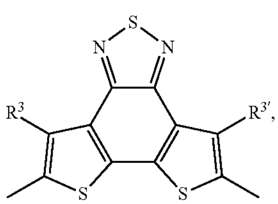

(Xh)

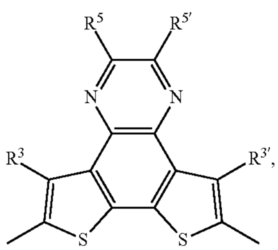

(Xi)

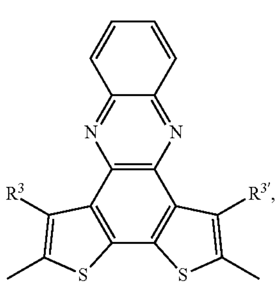

-continued (Xj)

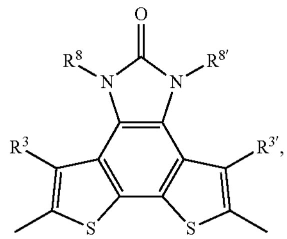

(Xk)

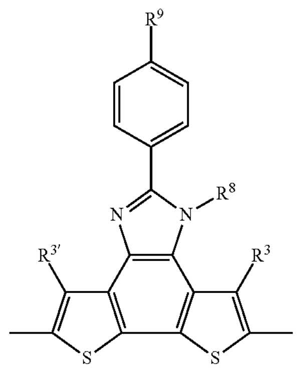

(Xl)

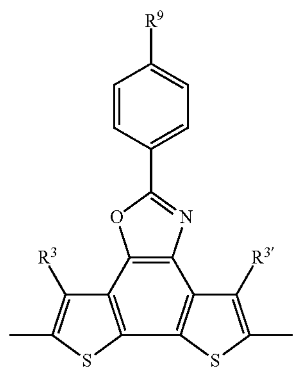

or (Xm)

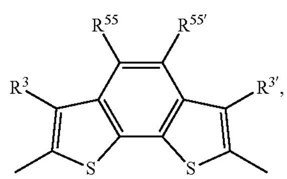

wherein $R^9$ is $C_1$-$C_{25}$ alkyl which is optionally interrupted by at least one selected from the group consisting of an oxygen atom and a sulfur atom, $C_1$-$C_{25}$ perfluoroalkyl, $C_1$-$C_{25}$ alkoxy, or CN, -$COM^2$- is a second repeating unit -$COM^1$- , which is different from the first repeating unit -$COM^1$-, a second repeating unit -A-, which is different from the first repeating unit -A-, or a repeating unit of formula

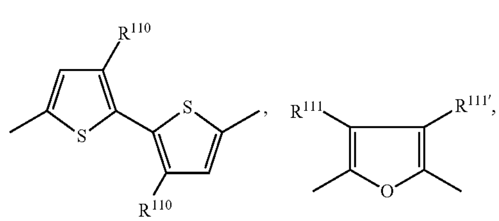

-continued

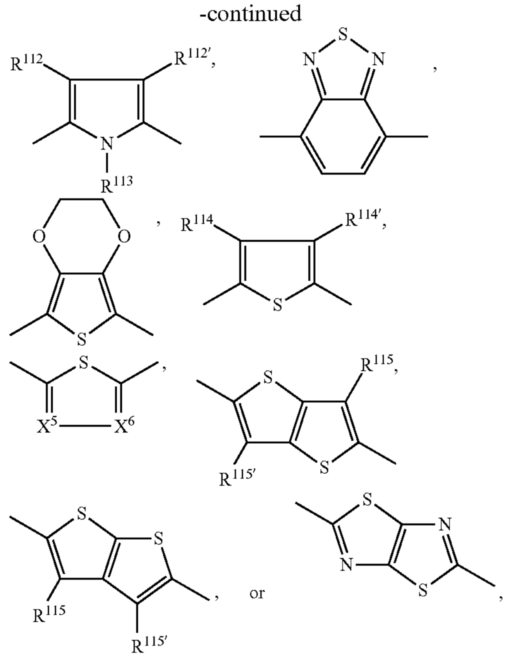

wherein one of $X^5$ and $X^6$ is N and the other is $CR^{114}$, $R^{110}$ is (w) a $C_1$-$C_{25}$ alkyl group which is optionally interrupted by at least one selected from the group consisting of an oxygen atom and a sulfur atom, (x) $C_7$-$C_{25}$ arylalkyl, or (y) a $C_1$-$C_{25}$ alkoxy group $R^{111}$, $R^{111'}$, $R^{112}$, and $R^{112'}$ are independently of each other (z) hydrogen, (aa) halogen, (ab) a $C_1$-$C_{25}$ alkyl group which is optionally interrupted by at least one selected from the group consisting of an oxygen atom and a sulfur atom, (ac) $C_7$-$C_{25}$ arylalkyl, or (ad) a $C_1$-$C_{25}$ alkoxy group, $R^{113}$ is (ae) $C_6$-$C_{18}$ aryl, (af) $C_6$-$C_{18}$ aryl which is substituted by $C_1$-$C_{18}$ alkyl, (ag) $C_1$-$C_{18}$ alkoxy or $C_1$-$C_{18}$ alkyl, or (ah) $C_1$-$C_{18}$ alkyl which is interrupted by —O—, $R^{114}$, $R^{114'}$, $R^{115}$ and $R^{115'}$ are independently of each other (ai) H or (aj) a $C_1$-$C_{25}$ alkyl group which is optionally interrupted by at least one oxygen atom, p is 0, 1, 2, or 3, r is 0 or 1, s is 0 or 1, one of $R^{106}$ and $R^{108}$ is hydrogen and the other is hydrogen, CN, $C_1$-$C_8$ alkyl, or —$COOR^{109}$, $R^{109}$ is (ak) $C_1$-$C_{25}$ alkyl which is optionally interrupted by at least one selected from the group consisting of an oxygen atom and a sulfur atom, (al) $C_7$-$C_{25}$ arylalkyl, or (am) $C_6$-$C_{24}$ aryl which is optionally substituted one to three times with at least one selected from the group consisting of $C_1$-$C_8$ alkyl and $C_1$-$C_8$ alkoxy;

$R^3$ and $R^{3'}$ are independently of each other (an) hydrogen, (ao) halogen, (ap) $C_1$-$C_{25}$ alkyl which is optionally interrupted by at least one selected from the group consisting of an oxygen atom and a sulfur atom, (aq) $C_7$-$C_{25}$ arylalkyl, or (ar) $C_1$-$C_{25}$ alkoxy, $R^4$ and $R^{4'}$ are independently of each other (as) halogen, (at) $C_1$-$C_{25}$ alkyl which is optionally interrupted by at least one selected from the group consisting of an oxygen atom and a sulfur atom, (au) $C_7$-$C_{25}$ arylalkyl, or (av) $C_1$-$C_{25}$ alkoxy;

or two neighboring $R^4$ and $R^{4'}$ groups form a ring with each other, $X^1$ and $X^2$ are independently of each other —O—, —S—, —$NR^8$—, —$Si(R^{11})(R^{11'})$—, —$C(R^7)(R^{7'})$—, —C(=O)—,

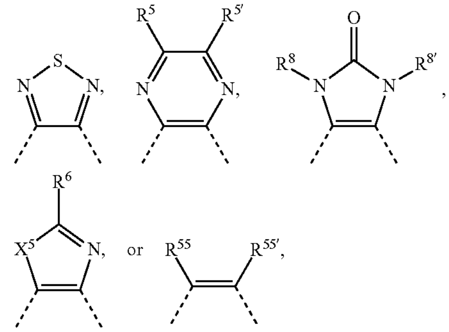

$X^5$ is —O— or —$NR^8$—, $R^5$ and $R^{5'}$ are independently of each other (aw) hydrogen, (ax) halogen, (ay) $C_1$-$C_{25}$ alkyl which is optionally interrupted by at least one selected from the group consisting of an oxygen atom and a sulfur atom, (az) $C_6$-$C_{24}$ aryl which is optionally substituted one to three times with at least one selected from the group consisting of $C_1$-$C_8$ alkyl and $C_1$-$C_8$ alkoxy, (ba) $C_7$-$C_{25}$ arylalkyl, (bb) CN, or (bc) $C_1$-$C_{25}$ alkoxy, or $R^5$ and $R^{5'}$ together form a ring, $R^{55}$ and $R^{55'}$ are independently of each other (bd) H, (be) F, (bf) $C_1$-$C_{18}$ alkyl, (bg) $C_1$-$C_{18}$ alkyl which is interrupted by O, (bh) $C_1$-$C_{18}$ alkoxy, (bi) $C_1$-$C_{18}$ alkoxy which is interrupted by O, (bj) $C_1$-$C_{18}$ perfluoroalkyl, (bk) $C_6$-$C_{24}$ aryl which is optionally substituted one to three times with at least one selected from the group consisting of $C_1$-$C_8$ alkyl and $C_1$-$C_8$ alkoxy, or (bl) $C_2$-$C_{20}$ heteroaryl which is optionally substituted one to three times with at least one selected from the group consisting of $C_1$-$C_8$ alkyl and $C_1$-$C_8$ alkoxy, $R^6$ is (bm) H, (bn) $C_1$-$C_{18}$ alkyl which is optionally interrupted by at least one selected from the group consisting of an oxygen atom and a sulfur atom, (bo) $C_1$-$C_{18}$ perfluoroalkyl, (bp) $C_6$-$C_{24}$ aryl which is optionally substituted one to three times with at least one selected from the group consisting of $C_1$-$C_8$ alkyl and $C_1$-$C_8$ alkoxy, (bq) $C_2$-$C_{20}$ heteroaryl which is optionally substituted one to three times with at least one selected from the group consisting of $C_1$-$C_8$ alkyl and $C_1$-$C_8$ alkoxy, or (br) CN, $R^7$ and $R^{7'}$ are independently of each other (bs) hydrogen, (bt) $C_1$-$C_{35}$ alkyl which is optionally interrupted by at least one selected from the group consisting of an oxygen atom and a sulfur atom, or (bu) $C_7$-$C_{25}$ arylalkyl, $R^8$ and $R^{8'}$ are independently of each other (by) hydrogen, (bw) $C_6$-$C_{18}$ aryl, (bx) $C_6$-$C_{18}$ aryl which is substituted by $C_1$-$C_{18}$ alkyl or $C_1$-$C_{1\ 8}$alkoxy, (by) $C_1$-$C_{25}$ alkyl which is optionally interrupted by at least one selected from the group consisting of an oxygen atom and a sulfur atom, or (bz) $C_7$-$C_{25}$ arylalkyl, $R^{11}$ and $R^{11'}$ are independently of each other (ca) $C_1$-$C_{35}$ alkyl group, (cb) $C_7C_{25}$ arylalkyl, or (cc) a phenyl group, which are each optionally substituted one to three times with at least one selected from the group consisting of $C_1$-$C_8$alkyl and $C_1$-$C_8$alkoxy, with the proviso that the following polymer is excluded

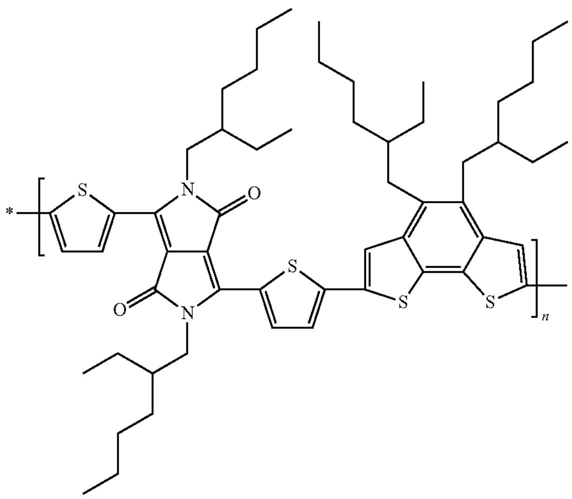

($M_n$=22.7 K; polydispersity=2.1).

2. The polymer of claim 1, wherein $Ar^1$ and $Ar^{1'}$ are a group of formula

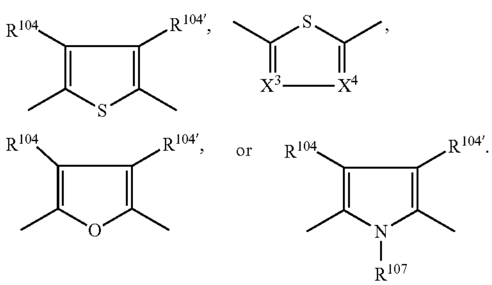

3. The polymer of claim 1, wherein -$COM^1$- is a repeating unit of formula (Xd)

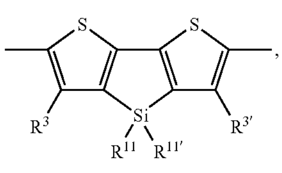

(Xe)

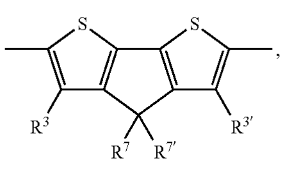

-continued (Xf)

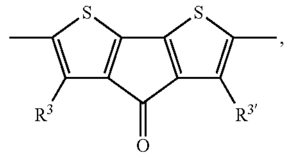

(Xg)

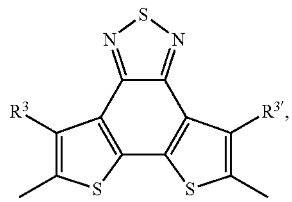

(Xh)

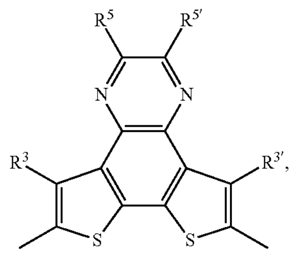

(Xk)

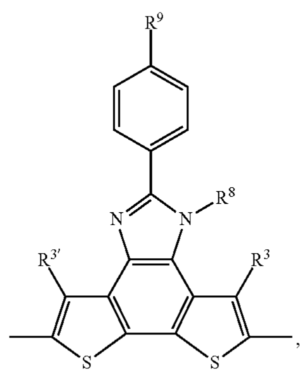

wherein $R^9$ is $C_1$-$C_{25}$ alkyl which is optionally interrupted by at least one selected from the group consisting of an oxygen atom and a sulfur atom, $C_1$-$C_{25}$ perfluoroalkyl, $C_1$-$C_{25}$ alkoxy, or CN.

4. The polymer of claim 1, wherein A is a group of formula
(Ia)
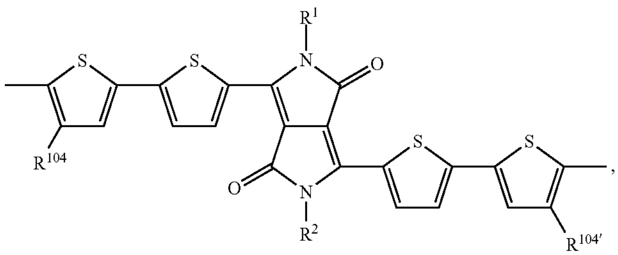
(Ib)
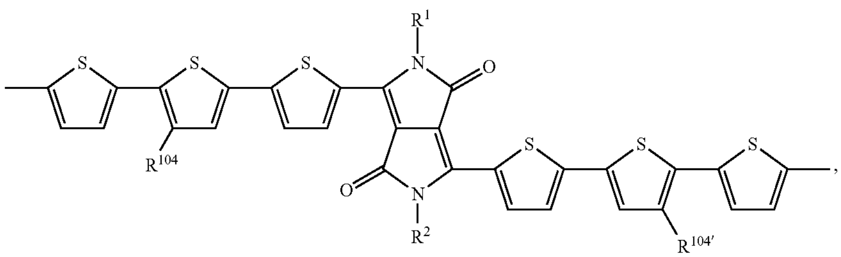
(Ic)
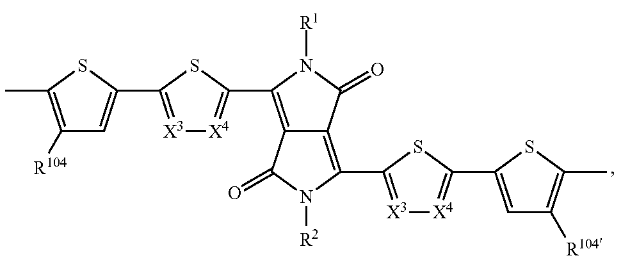
(Id)
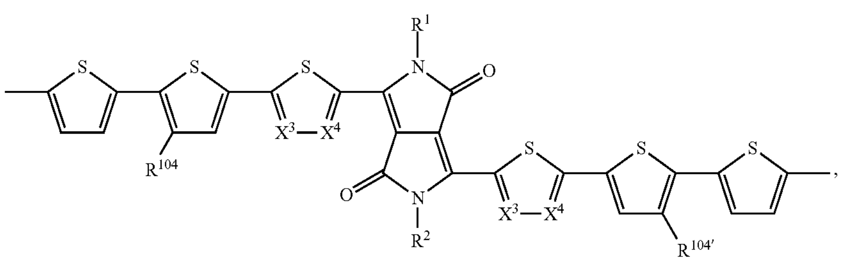
(Ie)
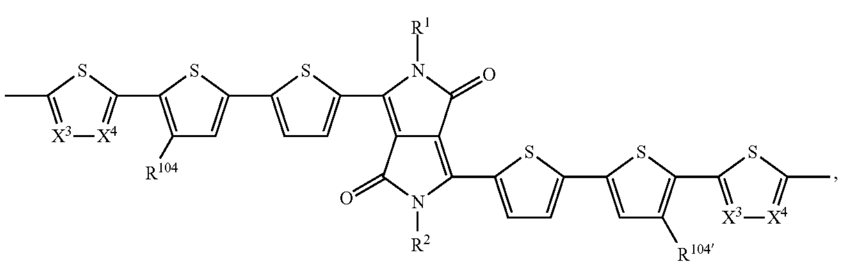
(If)
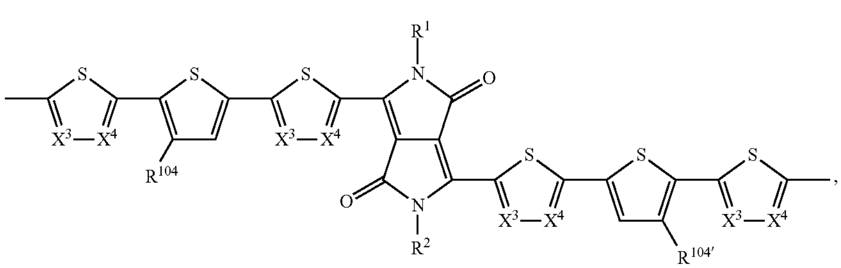

-continued
(Ig)
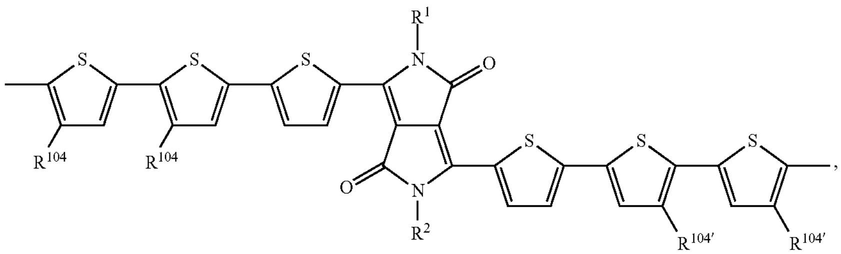
(Ih)
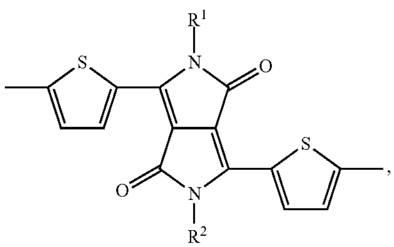
(Ii)
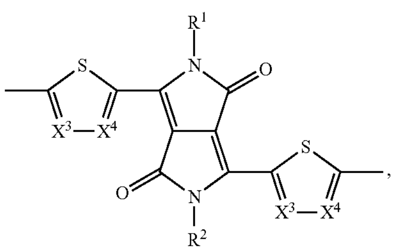
(Ij)
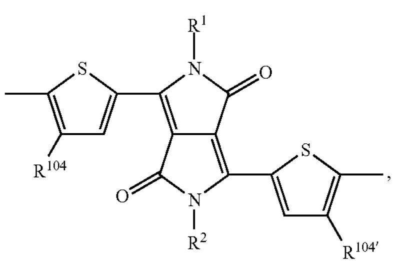
(Ik)
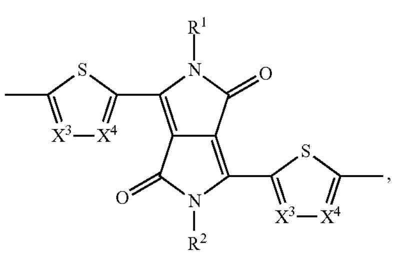
(Il)
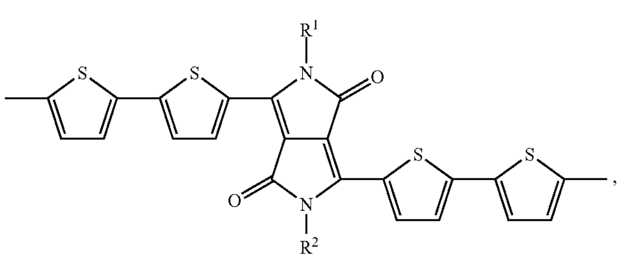

-continued
(Im)
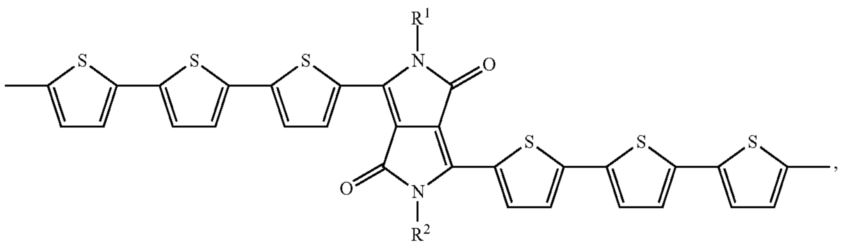
(In)
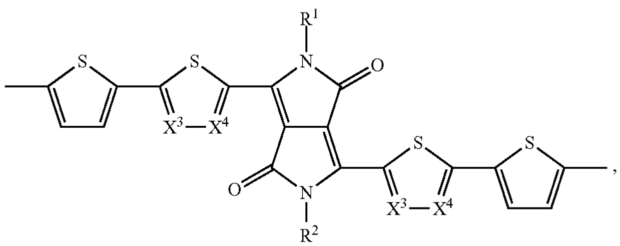
(Io)
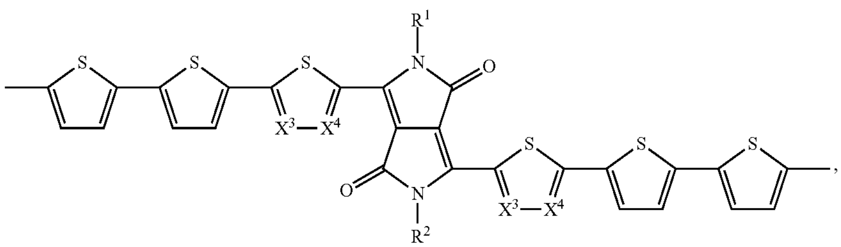
(Ip)
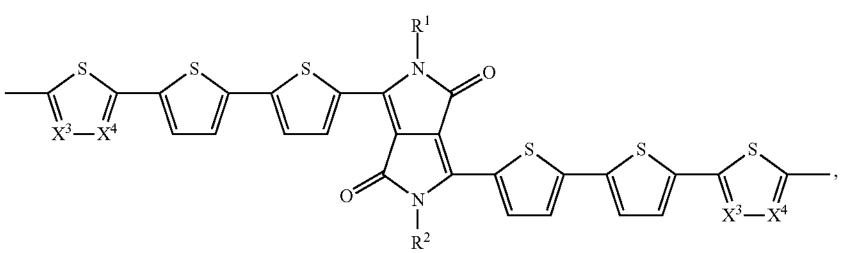
(Iq)
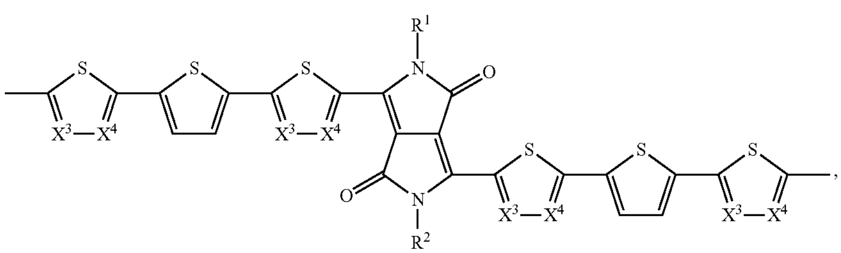
(Ir)
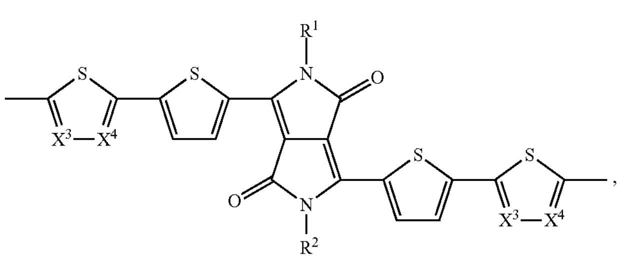

-continued (Is)

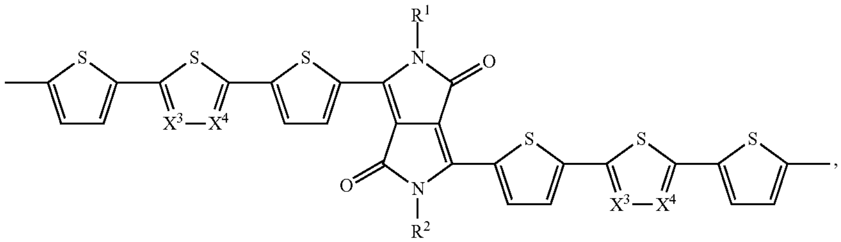

(It)

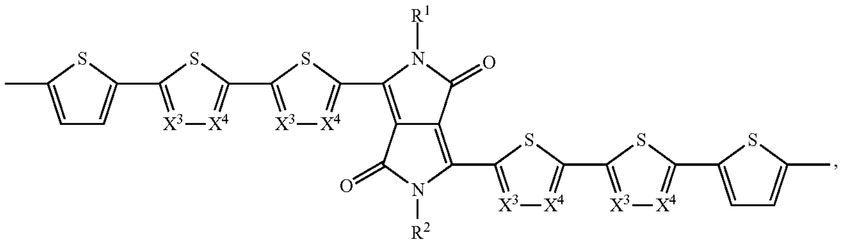

, or (Iu)

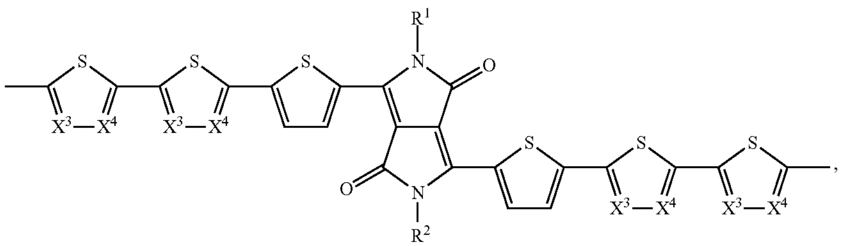

wherein $R^{104}$ and $R^{104'}$ are independently of each other hydrogen, a $C_1$-$C_{25}$ alkyl group which is optionally interrupted by at least one selected from the group consisting of an oxygen atom and a sulfur atom, $C_7$-$C_{25}$ arylalkyl, or a $C_1$-$C_{25}$alkoxy group.

5. The polymer of claim 1, wherein $R^1$ and $R^2$ independently from each other are $C_1$-$C_{100}$ alkyl, $C_5$-$C_{12}$ cycloalkyl which is optionally substituted one to three times with at least one selected from the group consisting of $C_1$-$C_8$ alkyl and $C_1$-$C_8$ alkoxy, phenyl which is optionally substituted one to three times with at least one selected from the group consisting of $C_1$-$C_8$ alkyl and $C_1$-$C_8$ alkoxy, 1-naphthyl which is optionally substituted one to three times with at least one selected from the group consisting of $C_1$-$C_8$ alkyl and $C_1$-$C_8$ alkoxy, 2-naphthyl which is optionally substituted one to three times with at least one selected from the group consisting of $C_1$-$C_8$ alkyl and $C_1$-$C_8$ alkoxy, or —$CR^{101}R^{102}$—$(CH_2)_u$-$A^3$, wherein $R^{101}$ and $R^{102}$ are hydrogen or $C_1$-$C_4$ alkyl, wherein $A^3$ is phenyl naphthyl which is optionally substituted one to three times with at least one selected from the group consisting of $C_1$-$C_8$ alkyl and $C_1$-$C_8$ alkoxy, 1-naphthyl which is optionally substituted one to three times with at least one selected from the group consisting of $C_1$-$C_8$ alkyl and $C_1$-$C_8$ alkoxy, 2-naphthyl which is optionally substituted one to three times with at least one selected from the group consisting of $C_1$-$C_8$ alkyl and $C_1$-$C_8$ alkoxy, and wherein u is 0, 1, 2, or 3.

6. The polymer of claim 1, which is a copolymer comprising $$*\!-\!\!\left[A\right]\!\!-\!* \text{ and } -\!\!\left[COM^1\right]\!\!-, \text{ or } *\!-\!\!\left[A\right]\!\!-\!*, -\!\!\left[COM^1\right]\!\!-, \text{ and } -\!\!\left[COM^2\right]\!\!-,$$

(I) wherein A is a group of formula (Ia)

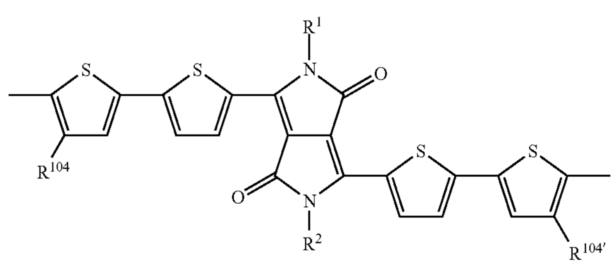

,

-continued
(Ib)
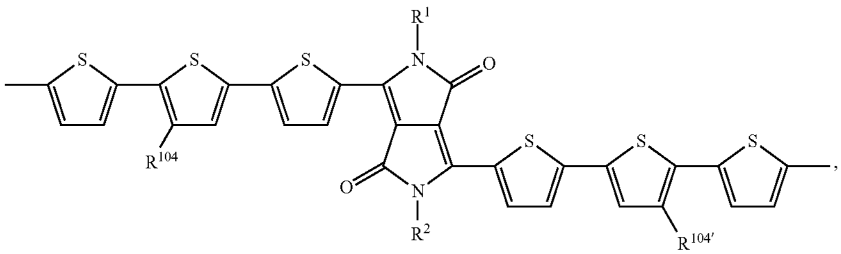
(Ic)
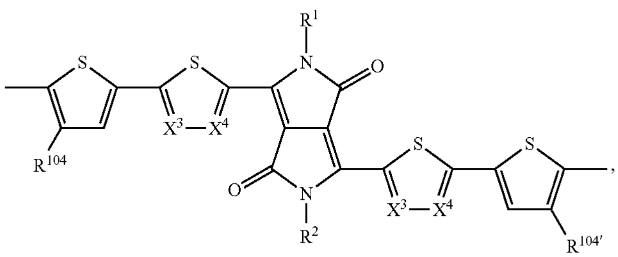
(Id)
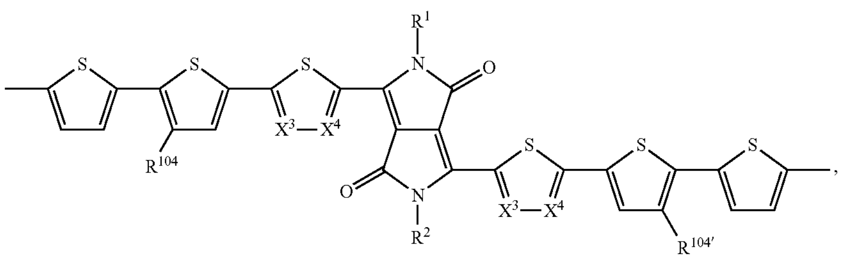
(Ie)
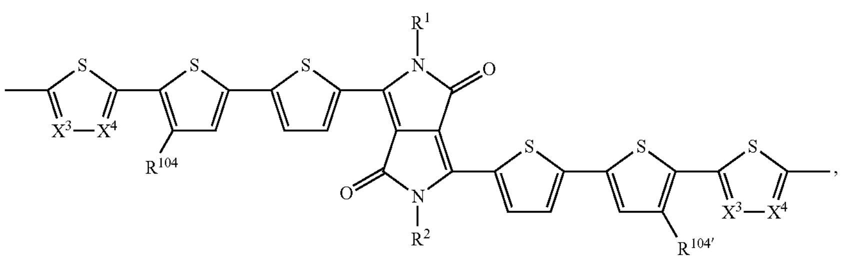
(If)
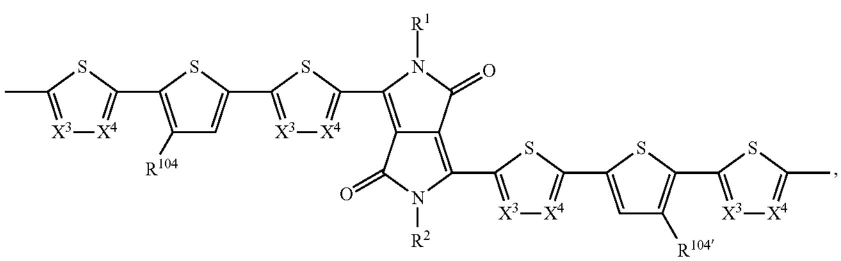
(Ig)
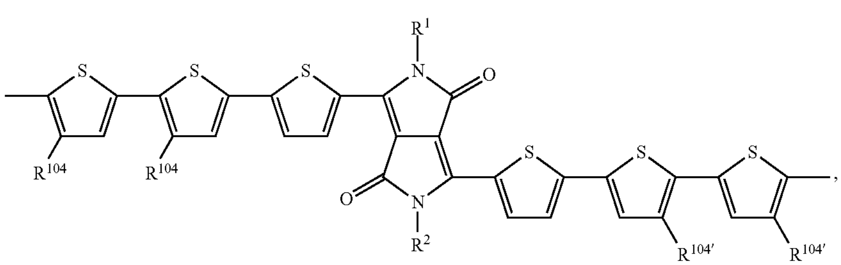

-continued
(Ih)
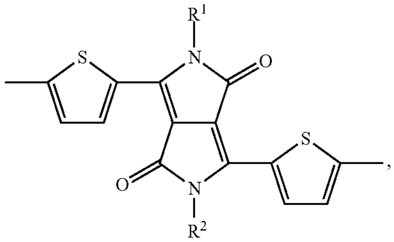
(Ii)
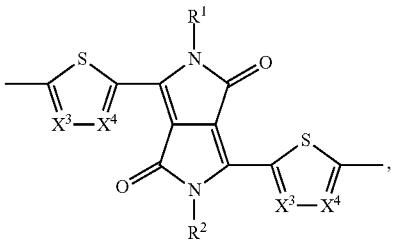
(Ij)
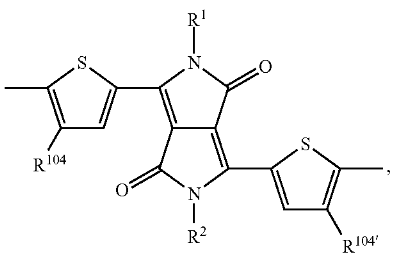
(Ik)
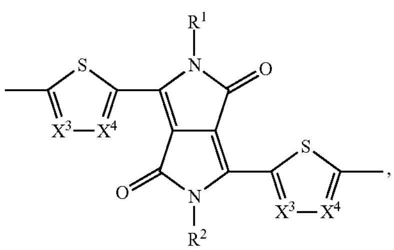
(Il)
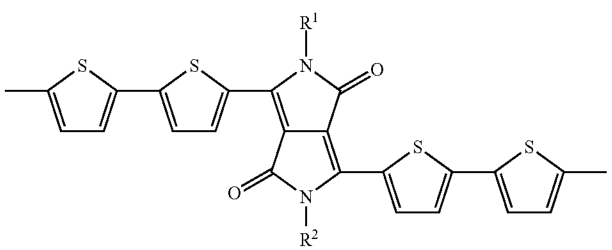
(Im)
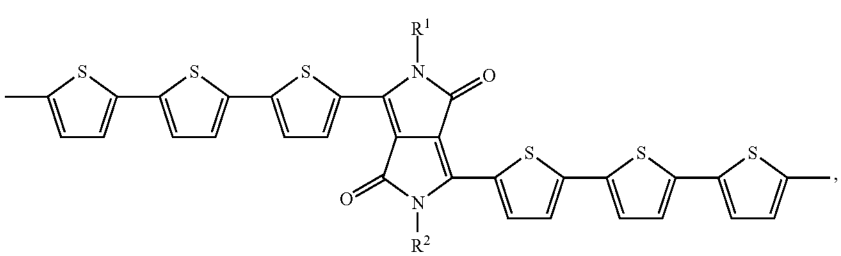

-continued
(In)
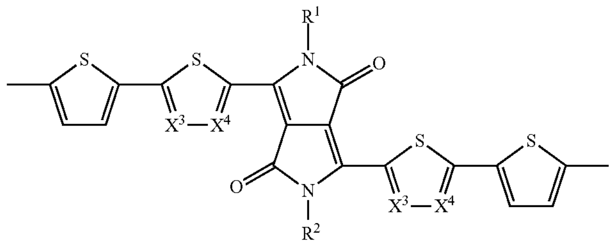
(Io)
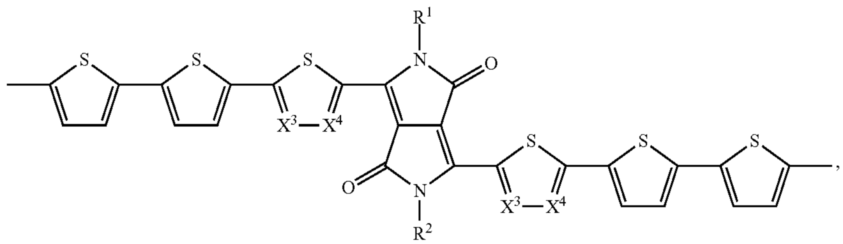
(Ip)
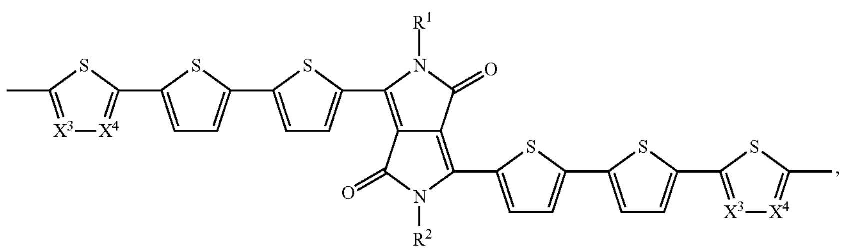
(Iq)
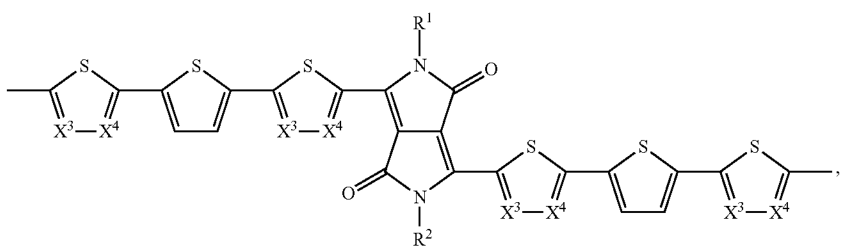
(Ir)
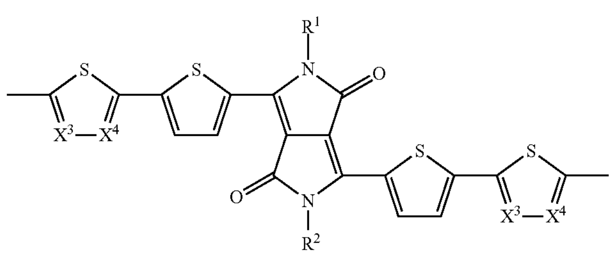
(Is)
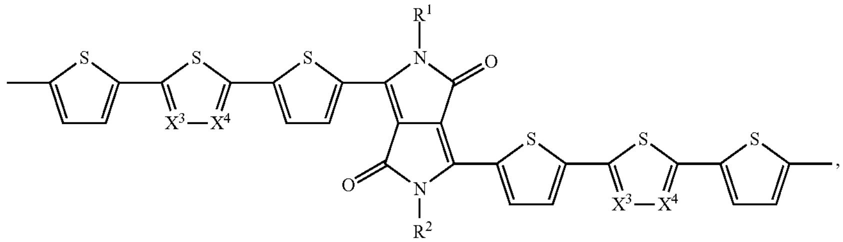

-continued
(It)
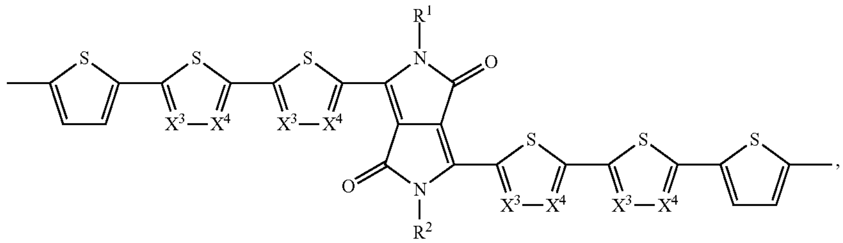
or
(Iu)
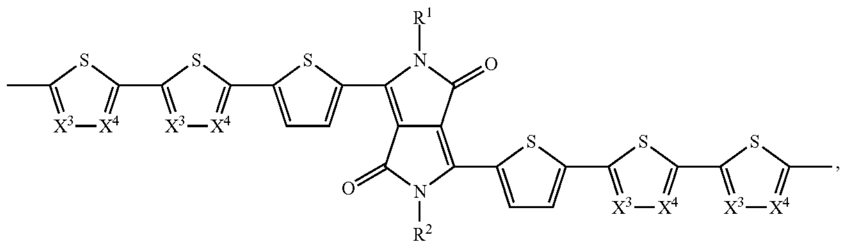
wherein $R^{104}$ and $R^{104'}$ are independently of each other hydrogen, a $C_1$-$C_{25}$ alkyl group which is optionally interrupted by at least one selected from the group consisting of an oxygen atom and a sulfur atom, $C_7$-$C_{25}$ arylalkyl, or a $C_1$-$C_{25}$ alkoxy group,
(II) wherein -COM$^1$- is a group of formula
(Xa)
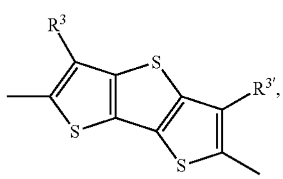
(Xb)
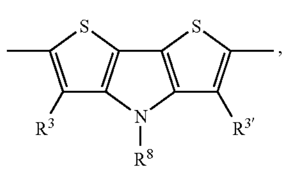
(Xc)
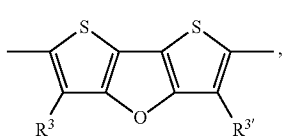
(Xd)
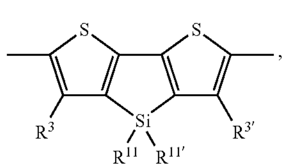
(Xe)
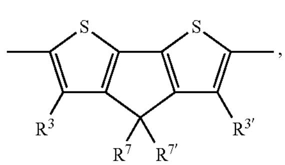
-continued
(Xf)
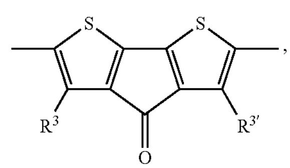
(Xg)
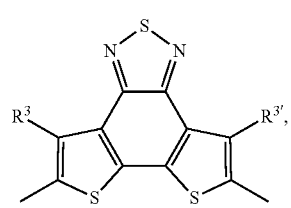
(Xh)
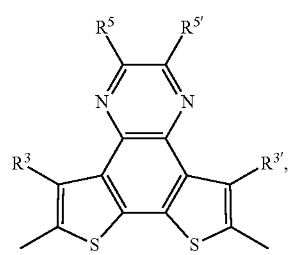
(Xi)
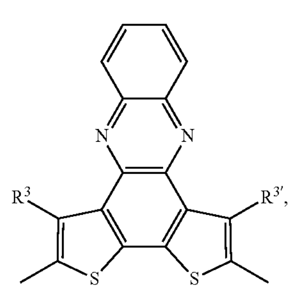

-continued (Xj)

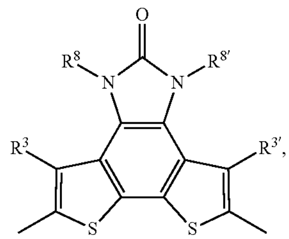

(Xk)

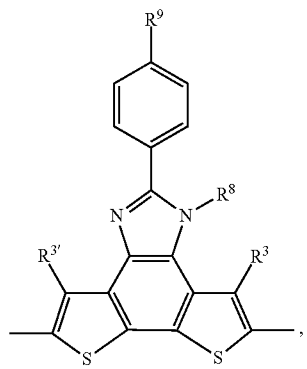

-continued (Xl)

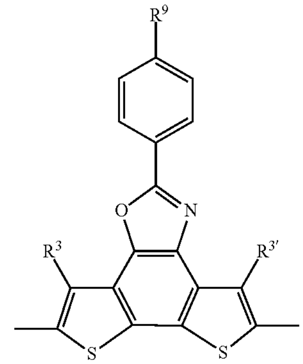

, or (Xm)

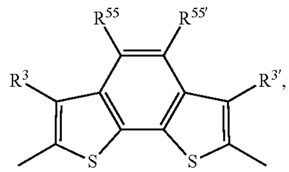

wherein $R^{56}$ and $R^{56'}$ independently of each other have the meaning of $R^{55}$, $R^9$ is $C_1$-$C_{25}$ alkyl which is optionally interrupted by at least one selected from the group consisting of an oxygen atom and a sulfur atom, $C_1$-$C_{25}$ perfluoroalkyl, $C_1$-$C_{25}$ alkoxy, or CN, (III) wherein -$COM^2$- is a second repeating unit -$COM^1$-, which is different from the first repeating unit -$COM^1$-.

7. The polymer of claim 6, having a formula (IIIa)

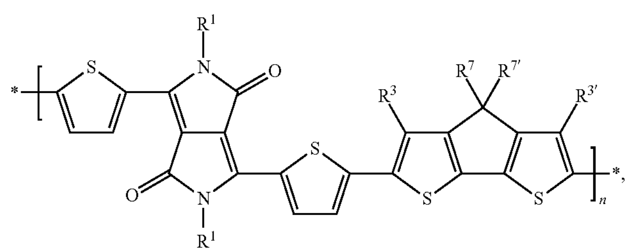

(IIIb)

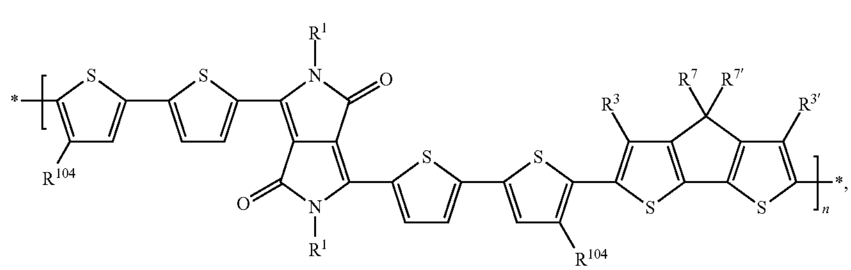

-continued
(IIIc)
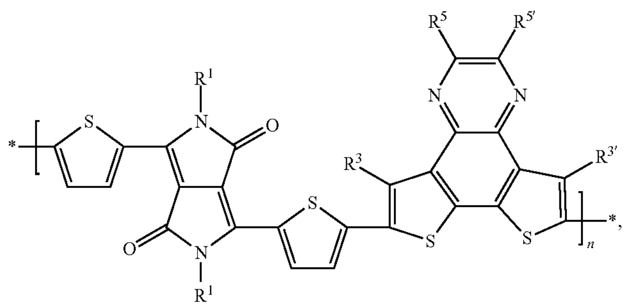
(IIId)
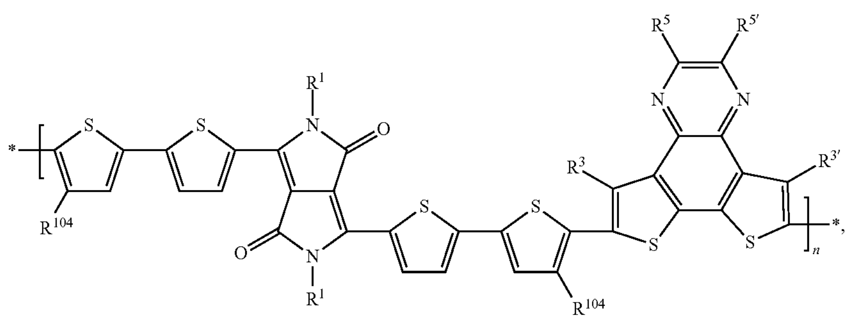
(IIIe)
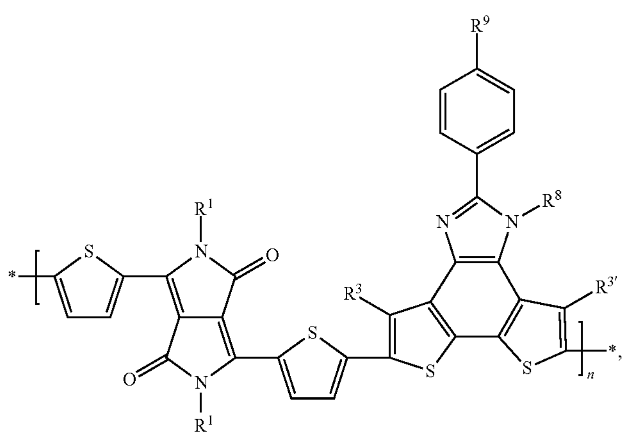
(IIIf)
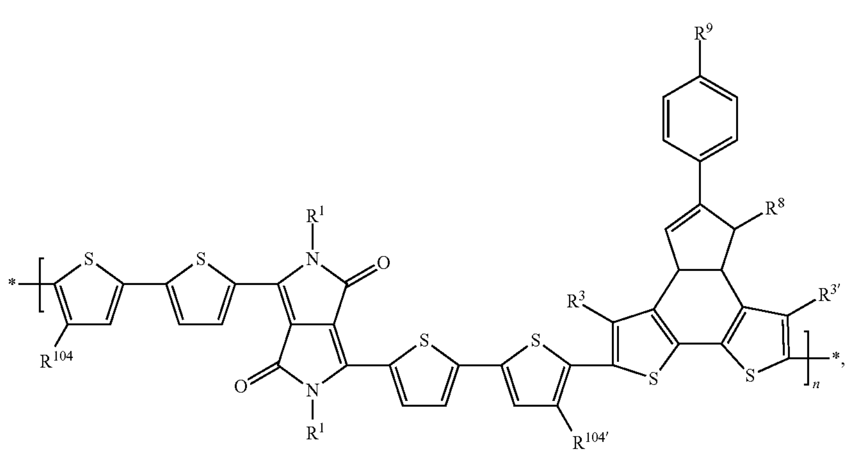

-continued
(IIIg)
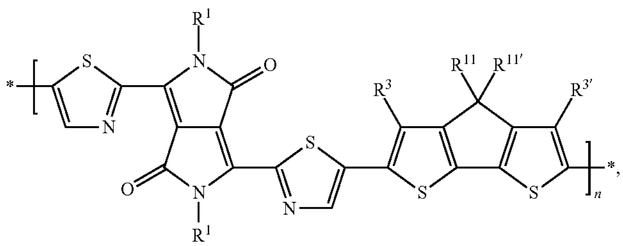
(IIIh)
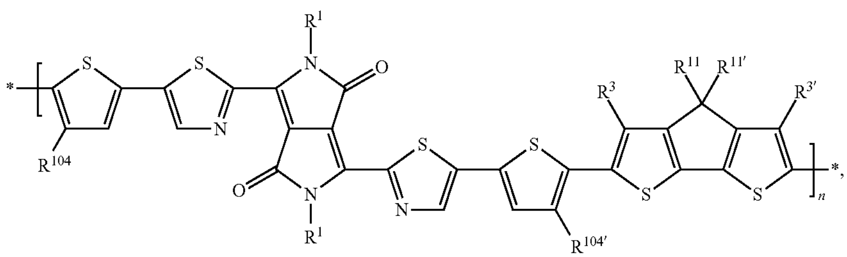
(IIIi)
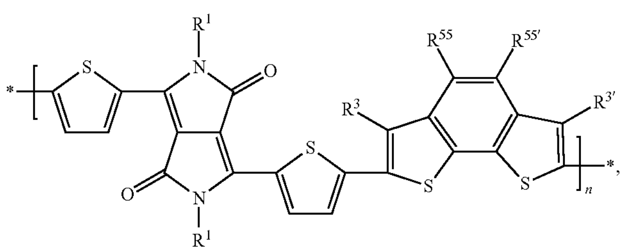
(IIIj)
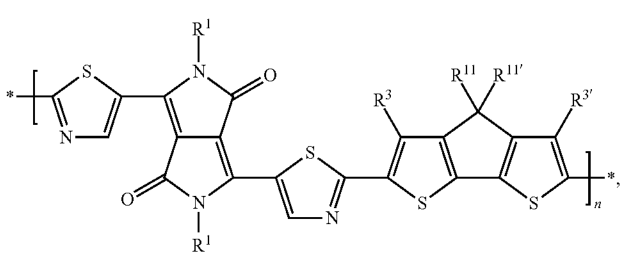
(IIIl)
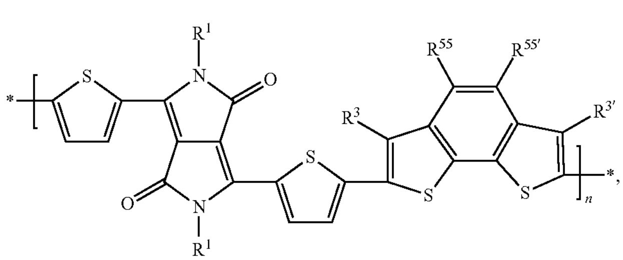
(IIIm)
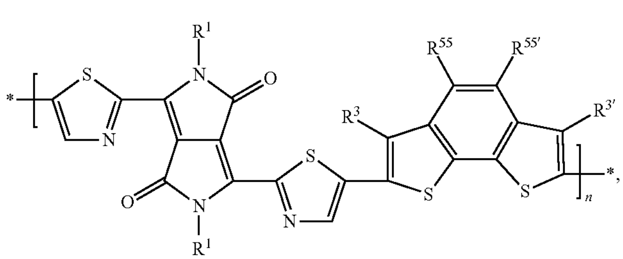

-continued (IIIn)

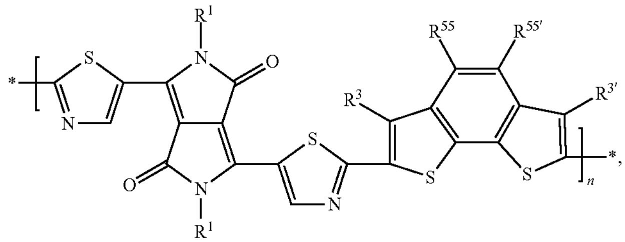

(IIIo)

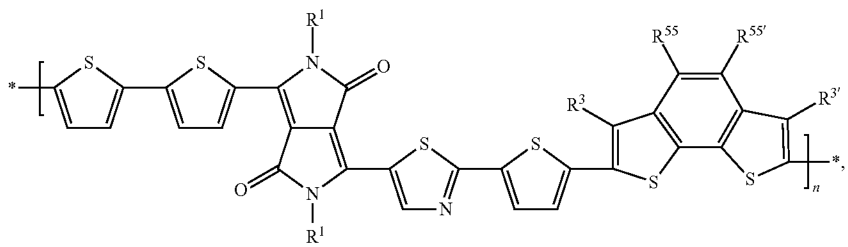

(IIIp)

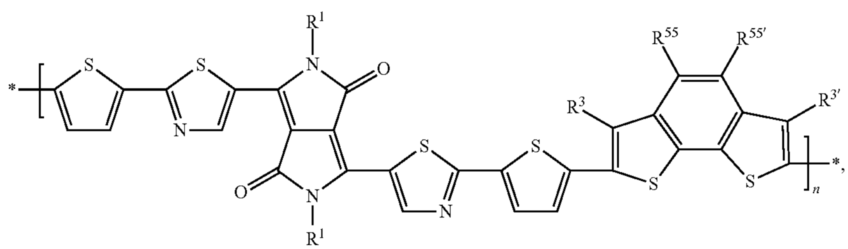

(IIIq)

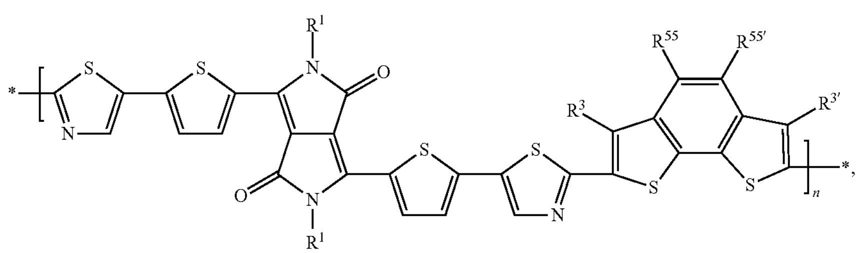

or (IIIr)

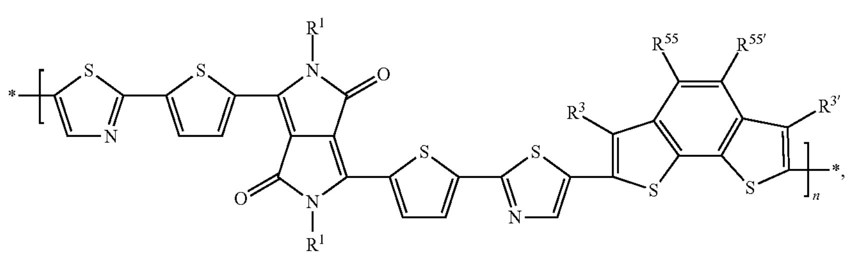

wherein n is 4 to 1000, m is 4 to 1000, $R^1$ is a $C_1$-$C_{35}$ alkyl group, $R^3$ and $R^{3'}$ are H or a $C_1$-$C_{25}$ alkyl group, $R^5$ and $R^{5'}$ are a $C_1$-$C_{25}$ alkyl group or a $C_1$-$C_{25}$ alkoxy group, $R^{55}$ and $R^{55'}$ are H, $R^{56}$ and $R^{56'}$ are H, a $C_1$-$C_{25}$ alkyl group, or a $C_1$-$C_{25}$ alkoxy group, $R^7$, $R^{7'}$, $R^{11}$, and $R^{11'}$ are a $C_1$-$C_{35}$ alkyl group, $R^8$ is a $C_1$-$C_{25}$ alkyl group, and $R^9$ is a $C_1$-$C_{25}$ alkyl group or a $C_1$-$C_{25}$ alkoxy group.

8. An organic semiconductor material, layer, or component, comprising the polymer of claim 1.

9. A semiconductor device, comprising at least one selected from the group consisting of the polymer of claim 1, and an organic semiconductor material, layer, or component comprising the polymer.

10. The device of claim 9, which is an organic photovoltaic (PV) device (solar cell), a photodiode, or an organic field effect transistor.

11. A process for preparing an organic semiconductor device, the process comprising:

applying at least one selected from the group consisting of (i) a solution and (ii) a dispersion of the polymer of claim 1, in an organic solvent, to a suitable substrate; and removing the solvent.

12. A process for preparing the polymer of claim 1, the process comprising:

(A1) reacting a dihalogenide of formula (a11)

$$X^{10}\text{-}A\text{-}X^{10} \quad \text{(a11)},$$

with an equimolar amount of a diboronic acid or diboronate of formula (a12)

$$X^{11}\text{-}[COM^1]\text{-}X^{11} \quad \text{(a12)},$$

or (A2) reacting a dihalogenide of formula (a21)

$$X^{10}\text{-}[COM^1]\text{-}X^{10} \quad \text{(a21)},$$

with an equimolar amount of a diboronic acid or diboronate of formula (a22)

$$X^{11}\text{-}A\text{-}X^{11} \quad \text{(a22)},$$

in a solvent and in the presence of a catalyst;

or (A3) reacting a dihalogenide of formula (a31)

$$X^{10}\text{-}A\text{-}X^{10} \quad \text{(a31)},$$

with an equimolar amount of an organo tin compound of formula (a32)

$$X^{11'}\text{-}[COM^1]\text{-}X^{11'} \quad \text{(a32)}$$

or (A4) reacting a dihalogenide of formula $$X^{10}\text{-}[COM^1]\text{-}X^{10} \quad \text{(a41)},$$

with an equimolar amount of an organo tin compound formula $$X^{11'}\text{-}A\text{-}X^{11'} \quad \text{(a42)},$$

to obtain the polymer has a formula (II')

$$*\text{-}[A]\text{-}[COM^1]\text{-}* \quad \text{(II')},$$

wherein $X^{10}$ is halogen, $X^{11}$ is independently at each occurrence —$B(OH)_2$, —$B(OY^1)_2$,

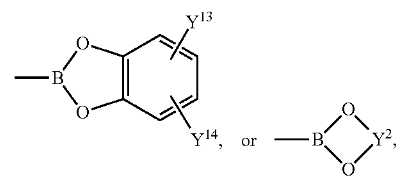

$Y^1$ is independently at each occurrence a $C_1$-$C_{10}$ alkyl group, $Y^2$ is independently at each occurrence a $C_2$-$C_{10}$ alkylene group, optionally substituted with at least one $C_1$-$C_{10}$ alkyl group, $Y^{13}$ and $Y^{14}$ are independently of each other hydrogen or a $C_1$-$C_{10}$ alkyl group, $X^{11'}$ is independently at each occurrence —$SnR^{207}R^{208}R^{209}$, $R^{207}$, $R^{208}$, and $R^{209}$ are identical or different and are H or optionally branched $C_1$-$C_6$alkyl, or two of $R^{207}$, $R^{208}$, and $R^{209}$ form a ring.

13. The polymer of claim 1, wherein at least one selected from the group consisting of $R^1$ and $R^2$ is phenyl, 1-naphthyl, or 2-naphthyl.

14. The polymer of claim 1, wherein at least one selected from the group consisting of $R^{99}$, $R^{104}$, and $R^{104'}$, is F.

15. The polymer of claim 7, wherein at least one selected from the group of m and n is 4 to 200.

16. The polymer of claim 7, wherein at least one selected from the group of m and n is 5 to 100.

17. The polymer of claim 7, wherein $R^1$ is a $C_8$-$C_{35}$ alkyl group.

* * * * *